(12) United States Patent
Fujimaki et al.

(10) Patent No.: US 8,343,709 B2
(45) Date of Patent: Jan. 1, 2013

(54) PROCESSED PIGMENT, PIGMENT-DISPERSED COMPOSITION, COLORED PHOTOSENSITIVE COMPOSITION, COLOR FILTER, LIQUID CRYSTAL DISPLAY ELEMENT, AND SOLID IMAGE PICKUP ELEMENT

(75) Inventors: Kazuhiro Fujimaki, Haibara-gun (KR); Koichi Sugihara, Haibara-gun (JP); Shigekazu Suzuki, Haibara-gun (JP); Hidenori Takahashi, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 879 days.

(21) Appl. No.: 12/204,397

(22) Filed: Sep. 4, 2008

(65) Prior Publication Data

US 2009/0068575 A1 Mar. 12, 2009

(30) Foreign Application Priority Data

Sep. 6, 2007 (JP) ................. 2007-231695
Sep. 26, 2007 (JP) ................. 2007-250044
Sep. 27, 2007 (JP) ................. 2007-251628

(51) Int. Cl.
G03F 7/00 (2006.01)
G03F 7/004 (2006.01)
C08K 5/00 (2006.01)

(52) U.S. Cl. .............. 430/270.15; 430/270.1; 430/7; 430/281.1; 106/493

(58) Field of Classification Search ............ 430/270.1, 430/281.1, 270.15, 7; 522/113; 106/493
See application file for complete search history.

(56) References Cited

U.S. PATENT DOCUMENTS

| | | | |
|---|---|---|---|
| 4,035,557 A | 7/1977 | Jones | |
| 4,846,893 A | 7/1989 | Akasaki et al. | |
| 5,271,769 A | 12/1993 | Bugnon et al. | |
| 5,348,580 A | 9/1994 | Chassot | |
| 5,872,164 A | 2/1999 | Koide et al. | |
| 6,001,168 A | 12/1999 | Hall-Goulle et al. | |
| 6,100,312 A | 8/2000 | Suzuki et al. | |
| 2003/0203458 A1 | 10/2003 | Kozaki et al. | |
| 2004/0265756 A1 | 12/2004 | Horie | |
| 2006/0060109 A1 | 3/2006 | Yamada et al. | |
| 2008/0002004 A1 | 1/2008 | O'Donnell et al. | |
| 2009/0050014 A1* | 2/2009 | Sujeeth et al. .............. 106/31.77 |
| 2009/0059138 A1 | 3/2009 | Matsumoto et al. | |
| 2009/0069473 A1 | 3/2009 | Kusano et al. | |
| 2009/0190073 A1 | 7/2009 | Yoshino et al. | |

FOREIGN PATENT DOCUMENTS

| | | |
|---|---|---|
| CN | 1576322 A | 2/2005 |
| EP | 0612796 | 8/1994 |
| EP | 0725285 A1 | 8/1996 |
| EP | 1029898 A2 | 8/2000 |
| EP | 1535971 A1 | 6/2005 |
| JP | A 63-191864 | 8/1988 |
| JP | A 1-138271 | 5/1989 |
| JP | A 5-222313 | 8/1993 |
| JP | A 6-166827 | 6/1994 |
| JP | A 6-256678 | 9/1994 |
| JP | 3130217 B2 | 1/2001 |
| JP | 2003-26950 A | 1/2003 |
| JP | A 2003-012957 | 1/2003 |
| JP | A 2003-253151 | 9/2003 |
| JP | A 2004-091502 | 3/2004 |
| JP | 2004-233727 A | 8/2004 |
| JP | A 2006-089569 | 4/2006 |
| JP | A 2007-231247 | 9/2007 |
| WO | WO 2006-064193 A1 | 6/2006 |
| WO | WO 2006-121016 A1 | 11/2006 |
| WO | WO 2007-013475 A1 | 2/2007 |
| WO | WO 2007-013599 A1 | 2/2007 |
| WO | WO 2010022377 A2 * | 2/2010 |

OTHER PUBLICATIONS

Chinese Office Action issued Sep. 3, 2012, in corresponding Chinese Patent Application No. 200810212768.X, and an English translation thereof.
Japanese Office Action dated Aug. 21, 2012 in Japanese Patent Application No. 2007-231695 with Partial English Translation.
Japanese Office Action dated Aug. 21, 2012 in Japanese Patent Application No. 2007-250044 with Partial English Translation.
Japanese Office Action dated Aug. 21, 2012 in Japanese Patent Application No. 2007-251628 with Partial English Translation.

* cited by examiner

Primary Examiner — Amanda C. Walke
(74) Attorney, Agent, or Firm — Buchanan Ingersoll & Rooney PC

(57) ABSTRACT

Provided are a processed pigment excellent in dispersibility and dispersion stability, a pigment-dispersed composition excellent in dispersibility and dispersion stability of a pigment that uses the processed pigment, a colored photosensitive composition using the pigment-dispersed composition, and a color filter having improved color properties that uses the colored photosensitive composition, in which a pigment is covered with at least one of a specific polymer compound selected from the following (SP-1) to (SP-3);

(SP-1) A polymer compound having a heterocycle on a side chain,
(SP-2) A graft polymer compound having a weight average molecular weight of from 1,000 to 100000,
(SP-3) A polymer compound represented by the following formula (3-1),

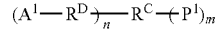

Formula (3-1)

wherein, $R^C$, $R^D$, $A^1$ and $P^1$ respectively represent an organic linkage group, a single bond or a divalent organic linkage group, a monovalent organic group containing such as an organic dye structure, and a polymer skeleton.

15 Claims, No Drawings

PROCESSED PIGMENT, PIGMENT-DISPERSED COMPOSITION, COLORED PHOTOSENSITIVE COMPOSITION, COLOR FILTER, LIQUID CRYSTAL DISPLAY ELEMENT, AND SOLID IMAGE PICKUP ELEMENT

CROSS-REFERENCE TO RELATED APPLICATION

This application claims priority under 35 USC 119 from Japanese Patent Application (JP-A) No. 2007-231695, JP-A No. 2007-250044,and JP-A No. 2007-251628, the disclosures of which are incorporated by reference herein.

BACKGROUND OF THE INVENTION

1. Field of the Invention

The present invention relates to a processed pigment, a pigment-dispersed composition and a colored photosensitive composition using the same, a color filter using the colored photosensitive composition, and a liquid crystal display element and a solid image pickup element provided with the color filter.

2. Description of the Related Art

A color filter is produced by preparing a pigment-dispersed composition in which an organic pigment or an inorganic pigment is dispersed, or a colored photosensitive composition containing a polyfunctional monomer, a polymerization initiator, an alkali-soluble resin, and other components, and forming a colored pattern or a black matrix by a photolithography method or an ink jet method using the composition.

In recent years, uses for liquid crystal display elements (LCDs) have expanded beyond monitors to include television (TVs). Together with this expansion has come increased demands for improvements in the properties of color filters with respect to chromacity and contrast. Similarly, demands have increased for color filters used in image sensors (solid image pickups) to have improved color properties such as reduced color variation and improved color resolution.

In response to the aforementioned requirement, it has been further required that the pigment contained in the colored photosensitive composition is dispersed in a finer state (better dispersibility), and is dispersed in a more stable state (better dispersion stability). When dispersibility of the pigment is insufficient, problems occur such as a fringe (serration at an edge) or surface irregularity generated at a colored pixel formed by a photolithography method, and developer (residue) remaining on the substrate, whereby chromaticity or dimensional precision of a manufactured color filter is reduced, and contrast is remarkably deteriorated.

When the dispersion stability of a pigment is insufficient, then, in particular during the manufacturing processes of the color filter, uniformity of layer thickness in the colored curable composition coating process may readily fall, sensitivity in the exposure process may readily fall, and/or the alkali solubility in the development process may readily fall. When there is poor dispersion stability of the pigment, this may cause aggregation of the components of the colored curable composition and cause a rise in viscosity over time, leading to an extremely short pot-life.

Although it is somewhat effective to make the particle size of a pigment finer in order to improve coloring characteristics, such as the contrast of a color filter, since the surface area of the pigment particles becomes larger when the particle size of a pigment is made finer, the cohesive force between pigment particles increases, and it has been difficult in many cases to achieve both a high level of dispersibility and a high level of dispersion stability.

The following techniques are known for making pigment particles finer and for improving the dispersibility of pigment particles. Generally, a method (salt milling method) is known for making the primary particles of a pigment finer by mechanically mixing and kneading, using a kneader or the like, a pigment, a water soluble inorganic salt, and a water soluble organic solvent which does not dissolve substantially such as an inorganic salt. The primary particle mixture of the obtained fine pigment is added to water and agitated, using a mixer or the like, to form a slurry state. Next, by filtering this slurry, washing with water and drying, a fine pigment is obtained as a secondary aggregate, which is an aggregate of the primary particles of the pigment. The dispersion process in ordinary dispersion machines, such as a sand mill, a ball mill, or the like, is a process that loosens the secondary aggregate, which is an aggregate of the primary particles of pigment, obtaining a dispersion body state that is close to that of the primary particles.

However, when a primary particle of the pigment is miniaturized, the particle is easily aggregated, and a slurry, or an aggregate (secondary aggregate) is easily generated when drying. In addition, as the primary particle of the pigment is further miniaturized, strong secondary aggregation occurs. For this reason, it is generally very difficult to re-disperse the miniaturized pigment to a primary particle. Since a color filter formed using a dispersion in which a large amount of a secondary aggregate is present has great scattering of light, remarkably reduced contrast, and produces fluctuations in color density, a composition as a pigment-dispersed composition in which a primary particle is stably dispersed without aggregation is preferable, and also preferable is that the composition is easily handled.

For the purpose of suppressing strong secondary aggregation of this miniaturized pigment, a technique of adding rosin or a rosin derivative, or a non-water-soluble monomer or an oligomer to treat the pigment at a salt milling step, and using a dispersion of the pigment to obtain a color filter having a high contrast, has been proposed (see Japanese Patent No. 3130217 and Japanese Patent Application Laid-Open (JP-A) No. 2004-233727).

In addition, a technique of using a polymer compound having a heterocycle on a side chain as a pigment dispersion at a dispersion step, to obtain a color filter having a high contrast by a pigment-dispersed composition excellent in dispersion stability, and a colored photosensitive composition using the same, has been proposed (e.g. see JP-A No. 2003-26950).

However, these methods may not sufficiently respond to the further increased demands with respect to contrast from the market; moreover, higher dispersity and dispersion stability in the fine pigment have been desired.

SUMMARY OF THE INVENTION

The present invention has been made in view of the above circumstances and provides a processed pigment, a pigment-dispersed composition, a colored photosensitive composition, a color filter, a liquid crystal display element, and a solid image pickup element.

A first aspect of the present invention provides a processed pigment in which a pigment is covered with at least one of a specific polymer compound selected from the following (SP-1) to (SP-3);

(SP-1) A polymer compound having a heterocycle on a side chain, (SP-2) A graft-type polymer compound having a weight average molecular weight of from 1,000 to 100000, (SP-3) A polymer compound represented by the following formula (3-1),

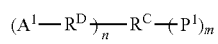

Formula (3-1)

$$(A^1\!-\!R^D)_{\overline{n}}\!-\!R^C\!-\!(P^1)_m$$

wherein in the formula (3-1), $R^C$ represents a (m+n)-valent organic linkage group; $R^D$ represents a single bond or a divalent organic linkage group; $A^1$ represents a monovalent organic group containing at least one of a site selected from an organic dye structure, a heterocyclic structure, an acidic group, a group having a basic nitrogen atom, an urea group, an urethane group, a group having a coordinating oxygen atom, a hydrocarbon group having 4 or more carbon atoms, an alkoxysilyl group, an epoxy group, an isocyanate group, a hydroxy group, and an ionic functional group; n $A^1$s and $R^D$s may be each independently the same or different; m represents 1 to 8; n represents 2 to 9; m+n satisfies 3 to 10; $P^1$ represents a polymer skeleton; and m $P^1$s may be the same or different.

A second aspect of the present invention provides a pigment-dispersed composition in which the processed pigment according to first aspects is dispersed in an organic solvent.

A third aspect of the present invention provides a colored photosensitive composition comprising the pigment-dispersed composition according to the second aspect, a photopolymerizable compound, and a photopolymerization initiator.

A fourth aspect of the present invention provides a color filter having a colored region formed by the colored photosensitive composition according to the third aspect on a substrate.

A fifth aspect of the present invention provides a device element comprising the color filter according to the fourth aspect.

DETAILED DESCRIPTION OF THE INVENTION

That is, the invention has been made in view of the aforementioned background art, and is to achieve the following objects.

A first object of the invention is to provide a processed pigment in which formation of a secondary aggregate is suppressed even in a miniaturized pigment, dispersity is excellent due to dispersion in the primary particle state, and the dispersed primary particle is stably maintained, being excellent in dispersion stability.

A second object of the invention is to provide a pigment-dispersed composition using the processed pigment having excellent dispersity and dispersion stability of the pigment, and a colored photosensitive composition using the pigment-dispersed composition.

A third object of the invention is to provide a color filter using the colored photosensitive composition and having a high contrast and a small color concentration variation, and having better color property, and a liquid crystal display element and a solid image pickup element provided with the color filter.

It was found out that the aforementioned objects may be attained by the following method, leading to the present invention.

That is, the processed pigment of the invention is characterized in that a pigment is covered with at least one kind specific polymer compound selected from the following (SP-1) to (SP-3).

(SP-1) A polymer compound having a heterocycle on a side chain.

(SP-2) A graft-type polymer compound having a weight average molecular weight of from 1,000 to 100,000, (SP-3) A polymer compound represented by the following formula (3-1).

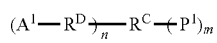

Formula (3-1)

$$(A^1\!-\!R^D)_{\overline{n}}\!-\!R^C\!-\!(P^1)_m$$

In the formula (3-1), $R^C$ represents a (m+n)-valent organic linkage group, and $R^D$ represents a single bond or a divalent organic linkage group. $A^1$ represents a monovalent organic group containing at least one kind site selected from an organic dye structure, a heterocyclic structure, an acidic group, a group having a basic nitrogen atom, an urea group, an urethane group, a group having a coordinating oxygen atom, a hydrocarbon group with 4 or more carbon atoms, an alkoxysilyl group, an epoxy group, an isocyanate group, a hydroxy group, and an ionic functional group. And, n $A^1$s and $R^D$s may be each independently the same or different, m represents 1 to 8, n represents 2 to 9, and m+n satisfies 3 to 10. $P^1$ represents a polymer skeleton, and m $P^1$s may be the same or different.

It is preferable that the processed pigment of the invention is of the following aspect.

An average primary particle diameter is from 5 to 25 nm.

The specific polymer compound has further a carboxyl group in a range of from 50 mg KOH/g to 200 mg KOH/g.

The specific polymer compound has a weight average molecular weight of from 1,000 to 100,000.

When the specific polymer compound is (SP-2), it further contains a copolymerization unit derived from a polymerizable oligomer having an ethylenic unsaturated double bond at an end.

When the specific polymer compound is (SP-2), it further contains a heterocyclic group.

When the processed pigment is washed with 1-methoxy-2-propanol, a release amount of the specific polymer compound is 30% by mass or less.

The processed pigment is produced by adding the specific polymer compound at a step of miniaturizing the pigment (salt milling).

The pigment-dispersed composition of the invention is characterized in that the processed pigment of the invention is dispersed in an organic solvent, and it is preferable that the composition further contains a pigment dispersion and a pigment derivative.

In addition, in a preferable aspect, the pigment-dispersed composition of the invention is used in forming a colored region in a color filter.

The colored photosensitive composition of the invention is characterized in that it contains the pigment-dispersed composition of the invention, a photopolymerizable compound, and a photopolymerization initiator, and it is preferable that the composition further contains an alkali-soluble resin.

The color filter of the invention is characterized in that it has a colored region using the colored photosensitive composition of the invention, on a substrate. Herein, the colored region includes a colored pattern containing a pixel, and a light shielding region containing a black matrix. In addition, it is preferable that the color filter of the invention is used in a liquid crystal display element and a solid image pickup element.

The processed pigment of the invention is such that a pigment surface is covered with the specific polymer compound. It is thought that this processed pigment covered with the specific polymer compound may effectively suppress production of a secondary particle which is an aggregate of a primary particle of the pigment, or may effectively weaken an aggregating force of a secondary particle (aggregate). For this reason, when this processed pigment is formulated into a dispersion, it may be dispersed in the state near a primary particle, and further, the dispersed state may be maintained. That is, when the processed pigment of the invention is used, since dispersibility and dispersion stability are more excellent than the previous one, a pigment-dispersed composition and a colored photosensitive composition having a high contrast and a small color concentration variation may be obtained. In addition, by using these pigment-dispersed composition and colored photosensitive composition, a color filter having better color property may be obtained.

This is because since the specific polymer compound has a plurality of sites exhibiting adsorbability due to strong electrostatic interaction and an intermolecular force on the pigment, it is strongly adsorbed onto a primary particle of the pigment and, as a result, aggregation of a primary particle may be suppressed. In addition, this is because when the specific polymer compound is a graft-type polymer compound, its branch chain part has relatively low adsorbability, the compound is present on a pigment surface while an extent of a distance is maintained, a distance between adjacent particles is maintained and, as a result, aggregation of a primary particle may be suppressed. In addition, when the specific polymer compound in the invention is a graft-type polymer compound, its adsorption onto the pigment becomes more remarkable in the case where a carboxyl group or a heterocyclic group excellent in pigment absorbability is introduced into a stem chain of the graft-type polymer compound. Particularly, the processed pigment of the invention is produced via a salt milling step, and since the specific polymer compound is not detached from the pigment upon formulation into a slurry and also upon subjection to filtration or water-washing, aggregation between primary particles of the pigment may be effectively suppressed.

The processed pigment of the invention is such that the pigment is covered with a specific polymer compound, and it is particularly effective that this covering is performed at the same time with a step of miniaturizing a primary particle of the pigment.

As one of procedures of enhancing dispersibility and dispersion stability of the pigment, as in JP-A No. 2003-26950, there is a method of using a graft polymer compound containing a heterocycle as a pigment dispersant at a dispersion step after a miniaturizing step and adsorbing this polymer compound onto a pigment surface. To the contrary, in the invention, it is thought that since the specific polymer compound is adsorbed on a new interface of the pigment having high surface activity produced in miniaturization by a strong electrostatic action to form a firm covering layer of the polymer compound, the processed pigment having higher dispersibility and dispersion stability may be obtained. That is, in the invention, even when the processed pigment is washed with an organic solvent which may dissolve the specific polymer compound, the covering polymer compound is hardly released. To the contrary, in the pigment in JP-A No. 2003-26950, when washed with an organic solvent, since many of polymer compounds as a pigment dispersant are detached from the pigment, the pigment becomes easy to aggregate, and high dispersion stability is not obtained. In addition, in the processed pigment of the invention, in the case where the specific polymer compound is a graft-type polymer compound, particularly, since when dispersed in an organic solvent, a side chain part having relatively weak adsorbability with a pigment is extended in the solvent, aggregation between adjacent pigments in the solvent is effectively suppressed and, at the same time, the effect is continued.

In addition, the color filter manufactured using the pigment-dispersed composition or colored photosensitive composition containing the processed pigment of the invention can solve problems that a colored pattern is clouded under high-temperature and high-humidity, and a colored pattern is clouded at manufacturing of a color filter. These problems are considered to be phenomenon caused by aggregation of fine pigment particles in the colored pattern to grow a crystal, and as a primary particle of the pigment is finer, the phenomenon occurs easily. Since the processed pigment of the invention is excellent in its dispersibility and dispersion stability as described above, aggregation between pigment particles may be effectively suppressed even in the colored pattern and, as a result, clouding of the colored pattern may be prevented.

The color filter manufactured using the pigment-dispersed composition or the colored photosensitive composition containing the processed pigment of the invention is excellent in a voltage retainability rate of the liquid crystal. Reduction in the voltage retainability rate of the liquid crystal easily occurs in the case where a metal ion concentration in the color pattern of the color filter is high. Particularly, this is a problem which easily occurs when a pigment miniaturized using a salt milling method is used, and this is thought that an inorganic salt (ion) used in a salt milling step is adsorbed onto a pigment particle during the step, and the salt is dissolved out from the pigment particle after a step of manufacturing the color filter or manufacturing of a liquid crystal display element. As a primary particle of the pigment is finer, an ionic compound is easily included, and removal at water washing/filtration becomes difficult. In the processed pigment of the invention, since the specific polymer compound is strongly absorbed onto a fine pigment for the aforementioned reason, dissolution out of the ionic compound may be suppressed and, as a result, it is thought that a voltage retainability rate of a liquid crystal is excellent.

In addition, upon manufacturing of the color filter using the colored photosensitive composition containing the processed pigment of the invention, there is an advantage that a precipitate is generated in a developer with difficulty in a developing step. A precipitate is an aggregate of a pigment particle in many cases. Precipitation of the pigment particle is thought to be phenomenon in which a dispersant is detached from the pigment dispersed with a dispersant, by an alkali developer, and the pigment particle is aggregated to grow a crystal, resulting in precipitation. In the processed pigment of the invention, for the aforementioned reason, since the specific polymer compound is strongly adsorbed onto a fine pigment, it is thought that the polymer compound is not detached even with an alkali developer, and a precipitate is generated with difficulty in a developer.

When the polymer compound having a heterocycle on the side chain disclosed in JP-A No. 2003-26950 is used as a pigment dispersant in a dispersion step, since adsorption onto the pigment is insufficient as compared with the processed pigment of the invention, these effects may not be sufficiently manifested, not leading to improvement in these performances.

DESCRIPTION OF THE PREFERRED EMBODIMENT

The present invention will be explained in detail below.
<Processed Pigment>

The processed pigment of the invention is characterized in that the pigment is covered with the specific polymer compound.

The "covering" in the invention means that a part or all of a surface of the pigment is covered with the specific polymer compound.

The processed pigment of the invention is characterized in that the pigment particle such as an organic pigment is covered with the specific polymer compound, and firm covering of a part or all of a pigment particle surface with the specific polymer compound exerts the effect of the invention, and is different from adsorption of a general polymer dispersant onto the pigment. This covering state may be confirmed by measuring a release amount (release rate) of the specific polymer compound by washing with an organic solvent shown below. That is, almost, specifically, 65% of mass or more of a polymer compound which has been simply adsorbed is released and removed by washing with an organic solvent, but in the case of the processed pigment of which surface is covered with the specific polymer compound as in the invention, a release amount is extremely small, being 30% by mass or less.

That is, in the processed pigment of the invention, it is preferable that a release amount of the specific polymer compound when washed with 1-methoxy-2-propanol is 30% by mass or less.

Herein, the "release amount" is a value (% by mass) obtained by dividing an amount of a surface treating agent (the specific polymer compound in the invention) dissolved into a solvent of 1-methoxy-2-propanol after the processed pigment is immersed in the solvent by an amount of the surface treating agent used.

Herein, a method of measuring a release amount will be explained.

First, 10 g of the processed pigment was placed in 100 ml of 1-methoxy-2-propanol, and this was shaken at room temperature for 3 hours using a shaker. Thereafter, the pigment was settled at 80,000 rpm using a centrifuge over 8 hours, and a solid matter of the supernatant part was obtained from a drying method. Thereby, an amount of the specific polymer compound released from the pigment is obtained by this treatment. In addition, by a ratio of a mass of this released specific polymer compound, and a mass of the specific polymer compound used upon manufacturing of the processed pigment, a release amount (% by mass) was calculated.

On the other hand, a release amount of a commercially available processed pigment after manufacturing may be measured by the following method.

That is, after a total processed pigment is dissolved with a solvent which dissolves the pigment (e.g. dimethyl sulfoxide, dimethylformamide, formic acid, sulfuric acid etc.), this is separated into a polymer compound and the pigment with an organic solvent utilizing difference in solubility, and "mass of the specific polymer compound used upon manufacturing of the processed pigment" is calculated.

Separately, the processed pigment is washed with 1-methoxy-2-propanol, and the release amount obtained is divided by this "mass of the specific polymer compound used upon manufacturing of the processed pigment" to obtain the release amount (% by mass).

As the release amount is smaller, a covering rate on the pigment is higher, and dispersibility and dispersion stability are better. A preferable range of the release amount is 30% by mass or less, more preferably 20% by mass or less, most preferably 15% by mass or less, ideally 0% by mass.

As described above, since in the processed pigment of the invention, a pigment surface is covered with the specific polymer compound firm, and this specific polymer compound is released with difficulty even when immersed in an organic solvent, the processed pigment excellent in dispersibility and dispersion stability is obtained, and its application range is wide, and the pigment is particularly useful in preparing a pigment-dispersed composition.

[(SP-1) Polymer Compound Having Heterocycle on Side Chain]

The polymer compound of (SP-1) among the specific polymer compounds used in the invention is not particularly limited as far as it is a polymer compound having a heterocycle on the side chain. Such polymer compound is preferably a polymer including a polymerization unit derived from a monomer represented by the following formula (1), or a monomer consisting of maleimide or a maleimide derivative, particularly preferably a polymer including a polymerization unit derived from a monomer represented by the following formula (1).

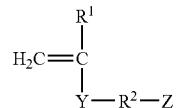

Formula (1)

In the formula (1), $R^1$ represents a hydrogen atom, or a substituted or unsubstituted alkyl group. $R^2$ represents a single bond, or a divalent linkage group. Y represents —CO—, —C(=O)O—, —CONH—, —OC(=O)—, or a phenylene group. Z represents a group having a nitrogen-containing heterocycle structure.

As the alkyl group of $R^1$, an alkyl group with 1 to 12 carbon atoms is preferable, an alkyl group with 1 to 8 carbon atoms is more preferable, and an alkyl group with 1 to 4 carbon atoms is particularly preferable.

When the alkyl group represented by $R^1$ has a substituent, examples of the substituent include a hydroxy group, and an alkoxy group (preferably, with 1 to 5 carbon atoms, more preferably with 1 to 3 carbon atoms), a methoxy group, an ethoxy group, and a cyclohexyloxy group.

Specific examples of the preferable alkyl group represented by $R^1$ include, specifically, a methyl group, an ethyl group, a propyl group, a n-butyl group, an i-butyl group, a t-butyl group, a n-hexyl group, a cyclohexyl group, a 2-hydroxyethyl group, a 3-hydroxypropyl group, a 2-hydroxypropyl group, and a 2-methoxyethyl group.

As $R^1$, a hydrogen atom or a methyl group is most preferable.

In the formula (1), $R^2$ represents a single bond or divalent linkage group. As the divalent linkage group, a substituted or unsubstituted alkylene group is preferable. As the alkylene group, an alkylene group with 1 to 12 carbon atoms is preferable, an alkylene group with 1 to 8 carbon atoms is further preferable, and an alkylene group having 1 to 4 carbon atoms is particularly preferable.

The alkylene group represented by $R^2$ may be such that two or more alkylene groups are bound via a hetero atom (e.g. oxygen atom, nitrogen atom, or sulfur atom).

Specific examples of the preferable alkylene group represented by $R^2$ include, specifically, a methylene group, an ethylene group, a propylene group, a trimethylene group, and a tetramethylene group.

When the preferable alkylene group represented by $R^2$ has a substituent, examples of the substituent include a hydroxy group.

The divalent linkage group represented by $R^2$ may have a hetero atom or a partial structure containing a hetero atom selected from —O—, —S—, —C(=O)O—, —CONH—, —C(=O)S—, —NHCONH—, —NHC(=O)O—, —NHC(=O)S—, —OC(=O)—, —OCONH—, and —NHCO—, and may be bound with Z via the hetero atom or the partial structure containing the hetero atom.

In the formula (1), Z represents a group having a heterocyclic structure. Examples of the group having a heterocyclic structure include phthalocyanine-based, insoluble azo-based, azolake-based, anthraquinone-based, quinacridone-based, dioxazine-based, diketopyrrolopyrrole-based, anthrapyridine-based, anthanthrone-based, indanethrone-based, flavanthrone-based, perynone-based, perylene-based, and thioindigo-based dye structures, and heterocyclic structures such as thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, succinimide, phthalimide, naphthalimide, hydantoin, indole, quinoline, carbazole, acridine, acridone, anthraquinone, pyrazine, tetrazole, phenothiazine, phenoxazine, benzimidazole, benztriazole, cyclic amide, cyclic urea, and cyclic imide. These heterocyclic structures may have a substituent and examples of the substituent include an alkyl group, an alkoxy group, a halogen atom, an aliphatic ester group, an aromatic ether group, and an alkoxycarbonyl group.

Z is more preferably a group having a nitrogen-containing heterocyclic structure with 6 or more carbon atoms, particularly preferably a group having a nitrogen-containing heterocyclic structure having from 6 to 12 carbon atoms. As the nitrogen-containing heterocyclic structure having 6 or more carbon atoms, specifically a phenothiazine ring, a phenoxazine ring, an acridone ring, an anthraquinone ring, a benzimidazole structure, a benztriazole structure, a benzthiazole structure, a cyclic amide structure, a cyclic urea structure, and a cyclic imide structure are preferable, and a structure represented by the following (2), (3) or (4) is particularly preferable.

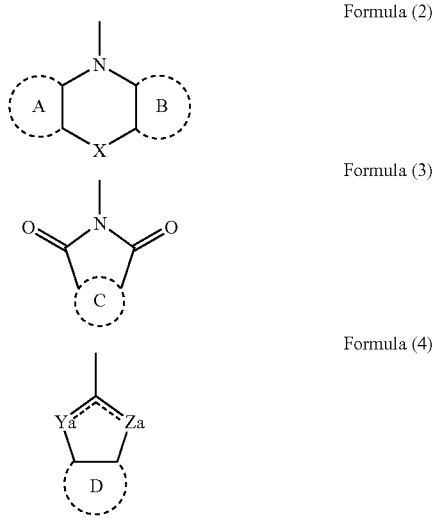

Formula (2)

Formula (3)

Formula (4)

In the formula (2), X is any selected from the group consisting of a single bond, an alkylene group (e.g. methylene group, ethylene group, propylene group, trimethylene group, tetramethylene group etc.), —O—, —S—, —$NR^A$—, and —C(=O)—. Herein, $R^A$ represents a hydrogen atom or an alkyl group. The alkyl group when $R^A$ represents an alkyl group is preferably an alkyl group having 1 to 18 carbon atoms, more preferably an alkyl group having 1 to 6 carbon atoms, and examples include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among them, as X in the formula (2), a single bond, a methylene group, —O—, or —C(=O)— is preferable, and —C(=O)— is particularly preferable.

In the formula (4), Ya and Za each represent independently —N=, —NH—, —N($R^B$)—, —S—, or —O—. $R^B$ represents an alkyl group, the alkyl group when $R^B$ represents an alkyl group is preferably an alkyl group having 1 to 18 carbon atoms, more preferably an alkyl group having 1 to 6 carbon atoms, and examples include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among them, as Ya and Za in the formula (4), —N=, —NH—, and —N($R^B$)— are particularly preferable. Examples of a combination of Ya and Za include a combination in which any one of Ya and Za is —N=, and the other is —NH—, and an imidazolyl group.

In the formulas (2), (3) and (4), the ring A, the ring B, the ring C, and the ring D each represent independently an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring and, among them, a benzene ring, a naphthalene ring, an anthracene ring, a pyridine ring, a phenoxazine ring, an acridine ring, a phenothiazine ring, an acridone ring, and an anthraquinone ring are preferable, and a benzene ring, a naphthalene ring, and a pyridine ring are particularly preferable.

Specifically, examples of the ring A and the ring B in the formula (2) include a benzene ring, a naphthalene ring, a pyridine ring, and a pyrazine ring. Examples of the ring C in the formula (3) include a benzene ring, a naphthalene ring, a pyridine ring, and a pyrazine ring. Examples of the ring D in the formula (4) include a benzene ring, a naphthalene ring, a pyridine ring, and a pyrazine ring.

Among a structure represented by the formulas (2), (3) and (4), from a viewpoint of dispersibility, and stability of dispersion with time, a structure having a benzene ring or a naphthalene ring is more preferable and, in the formula (2) or (4), a benzene ring is further preferable and, in the formula (3), a naphthalene ring is further preferable.

In possession of a heterocycle on a side chain of (SP-1) of the invention, preferable examples of a monomer, maleimide, and a maleimide derivative represented by the formula (1) are listed below, but the invention is not limited to them.

M-1

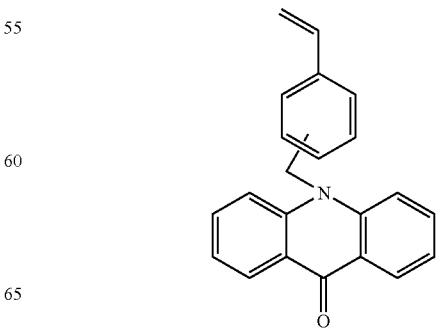

-continued
M-2
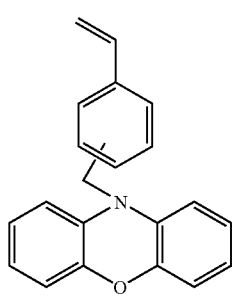
M-3
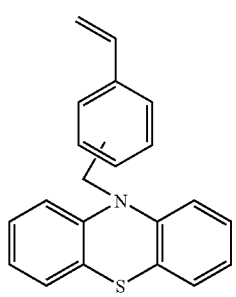
M-4
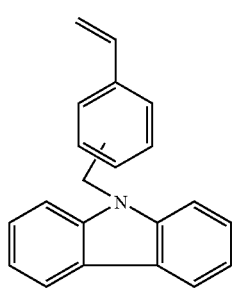
M-5
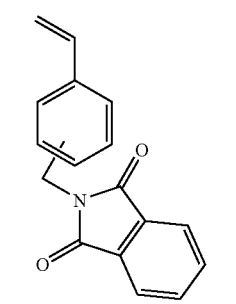
M-6
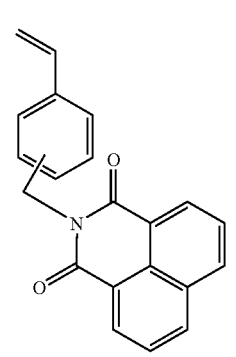
-continued
M-7
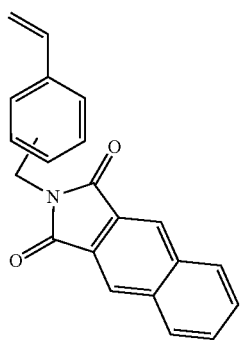
M-8
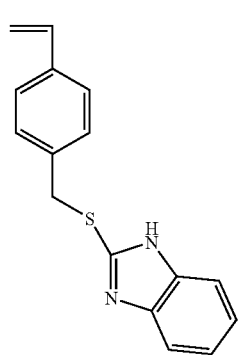
M-9
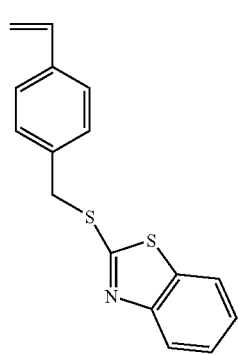
M-10
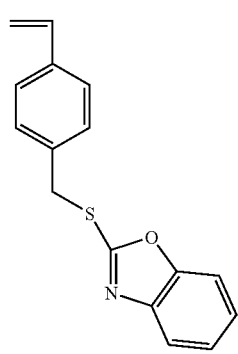
M-11
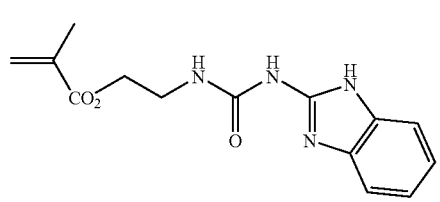

M-12
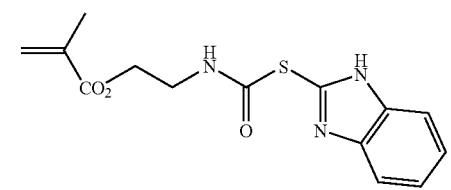
M-13
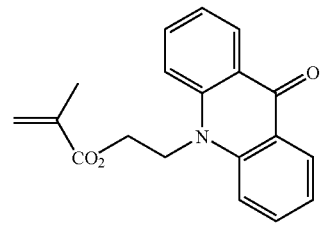
M-14
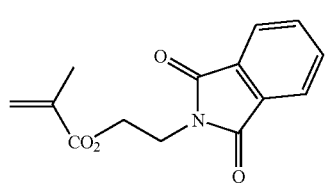
M-15
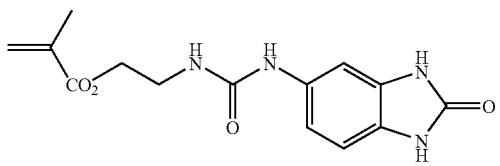
M-16
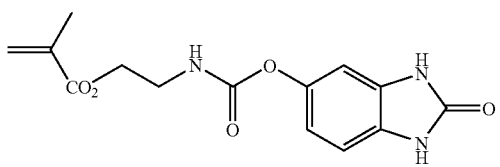
M-17
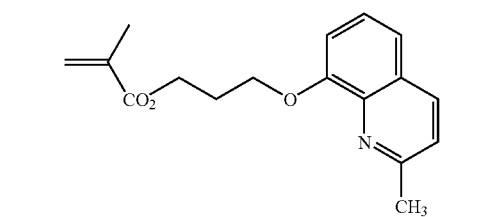
M-18
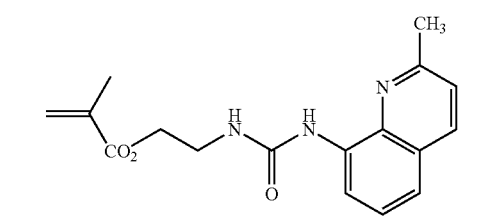
M-19
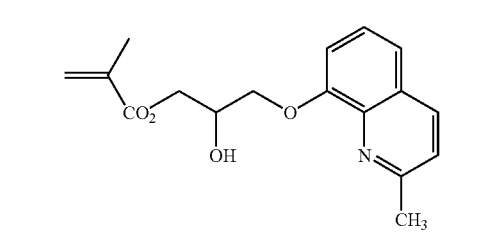
M-20
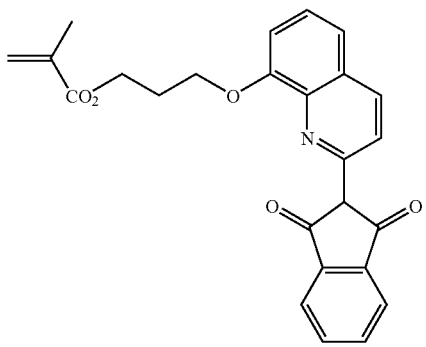
M-21
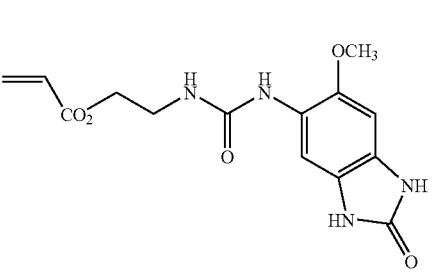
M-22
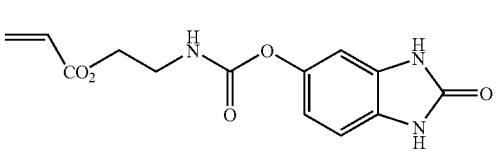
M-23
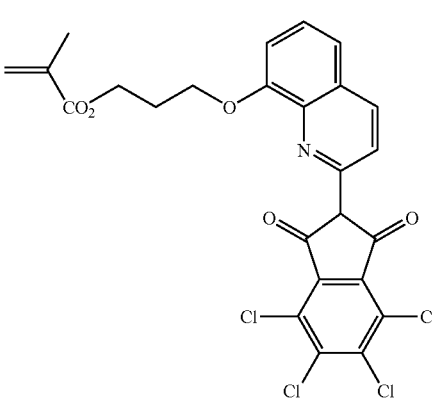
M-24
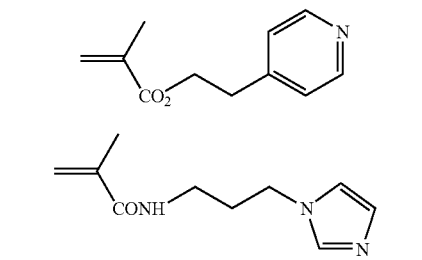
M-25
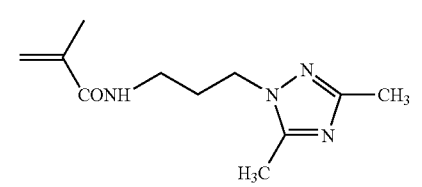
M-26

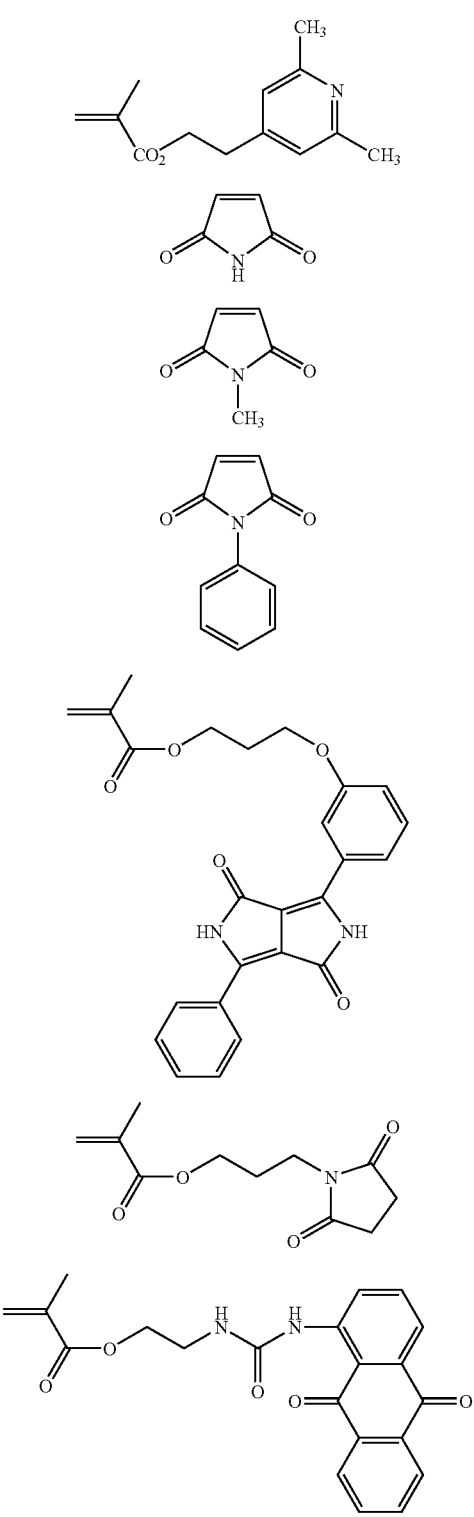

The polymer compound having a heterocycle on a side chain of (SP-1) used in the invention may contain only one or two or more of the copolymerization unit derived from a monomer, maleimide, or a maleimide derivative represented by the formula (1).

In the polymer compound having a heterocycle on a side chain of (SP-1) of the invention, a content of the copolymerization unit derived from a monomer, maleimide, or a maleimide derivative represented by the formula (1) is not particularly limited, but letting a total structural unit contained in the polymer compound having a heterocycle on a side chain of (SP-1) of the invention to be 100% by mass, the polymer compound contains preferably 5% by mass or more, more preferably 10 to 50% by mass of the copolymerization unit derived from a monomer, maleimide, or a maleimide derivative represented by the formula (1). Among a monomer, maleimide, and a maleimide derivative represented by the formula (1), a monomer represented by the formula (1) is preferable due to high adsorbability onto the pigment.

That is, in order to effectively suppress production of a secondary aggregate which is an aggregate of a primary particle of the pigment, or effectively weaken an aggregating force of a secondary aggregate, a content of the copolymerization unit derived from a monomer, maleimide, or a maleimide derivative represented by the formula (1) is preferably 5% by mass or more. In addition, from a viewpoint of developability upon manufacturing of the color filter from the colored photosensitive composition containing the pigment-dispersed composition, a content of the copolymerization unit derived from a monomer represented by the formula (1) is preferably 50% by mass or less.

[(SP-2) Graft-Type Polymer Compound Having Weight Average Molecular Weight of from 1,000 to 100000, (Hereinafter, Also Referred to as Specific Graft-Type Polymer Compound)]

Then, the specific graft-type polymer compound of (SP-2) among the specific polymer compound used in the invention will be explained.

The polymer compound of (SP-2) used in the invention is not particularly limited as far as it is a graft-type polymer compound having a weight average molecular weight of from 1,000 to 100000, that is, a polymer compound having a structure in which a side chain (branch polymer) having a predetermined molecular weight is bound to a main chain (stem polymer) structure.

Examples of a stem part (main chain) of the specific graft-type polymer compound include preferably stem parts constructed by polystyrene, polyethylene oxide, polypropylene oxide, poly (meth)acrylic acid ester, polycaprolactone, polyurethane, polyamide, or polyester.

In addition, examples of a branch part (graft chain) of the specific graft-type polymer compound include preferably branch parts constructed by polystyrene, polyethylene oxide, polypropylene oxide, poly(meth)acrylic acid ester, polycaprolactone, polyurethane, polyamide, or polyester.

In the specification, when one or both of "acryl", "methacryl" and "acrylate", "methacrylate" is (are) indicated, it is described as "(meth)acryl" and "(meth)acrylate", respectively.

Like this, the stem part and the branch part may be formed with the same polymer species, or they may be different from each other as far as the part is of a structure having a graft chain. In addition, a polymer chain of the stem part or the branch part may contain various partial structures depending on the purpose. For example, by introducing a functional group excellent in pigment absorbability onto the stem part, absorbability of the specific graft-type polymer compound onto a pigment surface may be further improved.

When the specific graft-type polymer compound which may be suitably used in the invention, it is preferable to copolymerize a structural unit derived from a polymerizable oligomer having an ethylenic unsaturated double bond at an end together with a structural unit derived from a monomer forming a main chain from a viewpoint that a chain length and property of an introduced graft chain are controlled, and a polymer compound excellent in adsorbability onto the pigment, and excellent in stability with time is obtained.

The polymerizable oligomer having an ethylenic unsaturated double bond which is useful in forming a side chain structure in the graft-type polymer compound is a compound having a predetermined molecular weight, therefore, is also called macromonomer. In the following explanation, the "polymerizable oligomer having an ethylenic unsaturated bond at an end" in the invention is conveniently referred to as "polymerizable oligomer" or "macromonomer" in some cases.

The polymerizable oligomer optionally used in the invention consists of a polymer chain part, and a polymerizable functional group part having an ethylenic unsaturated double bond at its end. Such group having an ethylenic unsaturated double bond preferably has the bond only on one end of the polymer chain from a viewpoint that a desired graft polymer is obtained. As the group having an ethylenic unsaturated double bond, a (meth)acryloyl group and a vinyl group are preferable, and a (meth)acryloyl group is particularly preferable.

The macromonomer used in synthesizing the specific graft-type polymer compound of (SP-2) of the invention has a number average molecular weight (Mn) in terms of polystyrene in a range of preferably 500 to 10000, particularly preferably 1000 to 9000.

From a viewpoint of dispersibility and dispersion stability of the pigment contained in the pigment-dispersed composition, and a contrast of the color filter obtained by application of the pigment-dispersed composition, a number average molecular weight (Mn) of the macromonomer is preferably 500 or more. In addition, from a viewpoint of developability upon manufacturing of the color filter from the colored photosensitive composition containing the pigment-dispersed composition, a number average molecular weight (Mn) of the macromonomer is preferably 10000 or less.

A part of a polymer chain in the macromonomer may be a homopolymer or a copolymer formed of at least one monomer selected from the group consisting of alkyl(meth)acrylate, (meth)acrylamide, N-alkyl(meth)acrylamide, N,N'-dialkyl(meth)acrylamide, styrene, (meth)acrylonitrile, vinyl acetate, and butadiene, or polyethylene oxide, polypropylene oxide, or polycaprolactone. These polymer chains may further have a substituent, and examples of the substituent which may be introduced include a halogen atom, an alkenyl group, an aryl group, a hydroxy group, an alkoxy group, an alkoxycarbonyl group, an amino group, an acylamino group, and a carbamoyl group.

Specific examples of the alkyl group in alkyl (meth)acrylate, and N-alkyl(meth)acrylamide forming the polymer chain include a methyl group, an ethyl group, a propyl group, a butyl group, a heptyl group, a hexyl group, an octyl group, a decyl group, a dodecyl group, a tridecyl group, a tetradecyl group, a hexadecyl group, an octadecyl group, a 2-chloroethyl group, a 2-bromoethyl group, a 2-methoxycarbonylethyl group, a 2-methoxyethyl group, a 2-bromoproply group, a 2-butenyl group, a 2-pentenyl group, a 3-methyl-2-pentenyl group, a 2-hexenyl group, a 4-methyl-2-hexenyl group, a benzyl group, a phenethyl group, a 3-phenylpropyl group, a naphthylmethyl group, a 2-naphthylethyl group, a chlorobenzyl group, a bromobenzyl group, a methylbenzyl group, an ethylbenzyl group, a methoxybenzyl group, a dimethylbenzyl group, a dimethoxybenzyl group, a cyclohexyl group, a 2-cyclohexylethyl group, a 2-cyclopentylethyl group, a bicyclo [3.2.1]oct-2-yl group, a 1-adamantyl group, a dimethylaminopropyl group, an acetylaminoethyl group, and a N,N-dibutylaminocarbamoylmethyl group.

Among such alkyl group, an unsubstituted alkyl group, or an alkyl group substituted with a halogen atom, an aryl group, or a hydroxy group is preferable, and an unsubstituted alkyl group is particularly preferable.

Among these polymer chains, from a viewpoint of dispersion stability of the resulting graft-type polymer compound, and developability, a homopolymer or a copolymer formed of at least one monomer selected from the group consisting of alkyl(meth)acrylate which is unsubstituted or has a hydroxy group or an alkoxy group with 1 to 4 carbon atoms as a substituent, (meth)acrylamide, N-alkyl(meth)acrylamide which is unsubstituted, or has an alkyl group with 1 to 4 carbon atoms as a substituent, N,N'-dialkyl(meth)acrylamide which is unsubstituted, or has an alkyl group with 1 to 4 carbon atoms as a substituent, styrene which is unsubstituted, or has an alkyl group with 1 to 4 carbon atoms or an alkoxy group with 1 to 4 carbon atoms as a substituent, and (meth) acrylonitrile, polycaprolactone, polyethylene oxide, and polypropylene oxide are preferable, and a homopolymer or a copolymer formed of at least one monomer selected from the group consisting of alkyl(meth)acrylate which is unsubstituted, or has a hydroxy group, or an alkoxy group with 1 to 4 carbon atoms as a substituent, N,N'-dialkyl(meth)acrylamide which is unsubstituted, or has an alkyl group with 1 to 4 carbon atoms as a substituent, styrene which is unsubstituted, or has an alkoxy group with 1 to 4 carbon atoms as a substituent, and (meth)acrylonitrile, and polycaprolactone are particularly preferable.

Examples of the macromonomer useful in synthesizing the graft-type polymer compound include preferably an oligomer represented by the following formula (5).

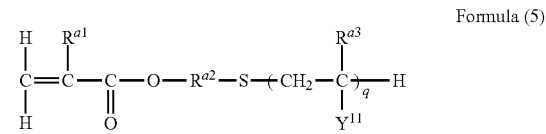

Formula (5)

In the formula (5), $R^{a1}$ and $R^{a3}$ each represent independently a hydrogen atom or a methyl group.

$R^{a2}$ represents a linkage group containing an alkylene group with 1 to 12 carbon atoms, and the linkage group may be an alkylene group with 1 to 12 carbon atoms, or may be such that a plurality of the alkylene groups are bound via an ester bond, an ether bond, or an amide bond. The alkylene group in $R^{a2}$ is preferably an alkylene group with 2 to 4 carbon atoms. The alkylene group in $R^{a2}$ may further have a substituent such as a hydroxy group and an alkoxy group.

$Y^{11}$ represents a phenyl group optionally having a substituent, —COOR$^{a4}$, a cyano group, or —CONR$^{a5}$R$^{a6}$. Herein, $R^{a4}$ represents an alkyl with 1 to 12 carbon atoms, a phenyl group or an aryl alkyl group with 7 to 10 carbon atoms. $R^{a5}$ and $R^{a6}$ represent a hydrogen atom, or an alkyl group with 1 to 6 carbon atoms. When $R^{a4}$, $R^{a5}$, $R^{a6}$ and $Y^{11}$ represent an alkyl group, or a phenyl group, these may further have a substituent, and examples of the substituent which may be introduced include a hydroxy group, an alkoxy group, and a halogen atom.

$Y^{11}$ is preferably a phenyl group, a cyano group or —COOR$^{a4}$, wherein $R^{a4}$ represents an alkyl group with 1 to 12 carbon atoms. $Y^{11}$ is most preferably —COOR$^{a4}$, or a cyano group from a viewpoint of dispersion stability and developability.

And, q represents an integer of 10 to 200.

In the macromonomer of the formula (5), q structural units which are bound may be only one, or may be a copolymer containing two or more of structural units and, when a plurality of spices of structural units are contained, two or more which are different from each other as $R^{a3}$ and $Y^{11}$ may be present.

Specific examples of the polymerizable oligomer include poly-2hyroxyethyl(meth)acrylate, polystyrene polymer, polymethyl(meth)acrylate, poly-n-butyl(meth)acrylate, poly-i-butyl(meth)acrylate, polyacrylonitrile, polyacetoacetoxyethyl methacrylate, poly-2-methoxyethyl methacrylate, poly-2-methoxyethoxyethyl methacrylate, polyacrylamide, N,N'-dimethylacrylamide and a copolymer thereof, preferably a polymer in which a (meth)acryloyl group is bond to one of molecular ends.

The polymerizable oligomer may be a commercially available product, or may be an appropriate synthesized product, and examples of the commercially available product include one end methacryloylated polystyrene oligomer (Mn=6000, trade name: AS-6, manufactured by Toagosei Co. LTD.), one end methacryloylated polymethyl methacrylate oligomer (Mn=6000, trade name: AA-6, manufactured by Toagosei Co. LTD.), one end methacryloylated poly-n-butyl acrylate oligomer (Mn=6000, trade name: AB-6, manufactured by Toagosei Co. LTD.), one end methacryloylated polymethyl metacarylate/2-hyrodxyethyl methacrylate oligomer (Mn=7000, trade name: AA-714, manufactured by Toagosei Co. LTD.), one end methacryloylated polybutyl methacrylate/2-hydroxyethyl methacrylate oligomer (Mn=7000, trade name: 707S, manufactured by Toagosei Co. LTD.), and one end methacryloylated poly 2-ethylhexyl methacylate/2-hydroxyethyl methacrylate oligomer (Mn=7000, trade name: AY-707S, AY-714S, manufactured by Toagosei Co. LTD.).

The specific graft-type compound may contain only one kind, or two or more of copolymerization units derived from a polymerizable oligomer having an ethylenic unsaturated double bond at an end.

A content of the copolymerization unit in the specific graft-type polymer compound is such that the polymerizable oligomer is 20 to 80% by mass, preferably 40 to 80% by mass. When the content of the polymerizable oligomer is in the range, it becomes possible to appropriately maintain solubility in a dispersion solvent, and sufficiently maintain a necessary adsorption layer for dispersion stability and, even when this processed pigment is used to form a curable composition, developability is not deteriorated.

Then, a main chain structure of the specific graft-type polymer compound according to the invention will be explained.

A stem part (main chain) of the specific graft-type polymer compound may be constructed by any of polystyrene, polyethylene oxide, polypropylene oxide, poly(meth)acrylic acid ester, polycaprolactone, polyurethane, polyamide, and polyester, and is preferably a polystyrene or poly(meth)acrylic acid ester skeleton.

For the purpose of enhancing adsorption of the specific graft-type polymer compound onto the pigment, it is preferable to obtain the specific graft-type polymer compound by further copolymerizing a monomer having a functional group adsorbable onto the pigment, in addition to the monomer forming a main chain skeleton and the macromonomer for forming a graft.

Specific examples of the monomer having a functional group adsorbable onto the pigment include a monomer having an organic dye structure or a heterocyclic structure, a monomer having an acidic group, a monomer having a basic nitrogen atom, and a monomer having an ionic group.

Herein, these functional groups adsorbable onto the pigment may be directly bound to a polymerizable partial structure forming a main chain structure, or may be bound via the following structural units, or a linkage group constructed by a combination of the structural units.

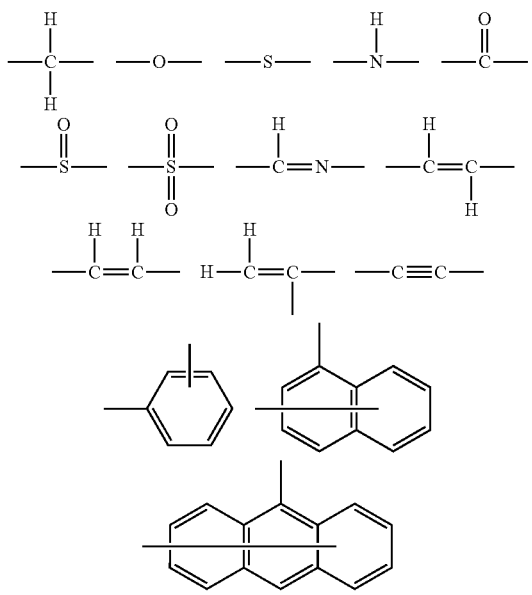

As the monomer having an organic dye structure or a heterocyclic structure, a monomer represented by the formula (1), or maleimide, or a maleimide derivative is preferable, and a monomer represented by the formula (1) is particularly preferable.

The specific graft-type polymer compound of (SP-2) according to the invention may be synthesized by containing only one, or two or more of monomers having a functional group having pigment adsorbability, a representative of which is a polymerization unit derived from a monomer represented by the formula (1), maleimide, or a maleimide derivative.

In the specific graft-type polymer compound, a content of a copolymerization unit derived from the monomer represented by the formula (1), maleimide, or the maleimide derivative is not particularly limited, but when a total structural unit contained in a polymer is made to be 100% by mass, the compound contains the copolymerization unit derived from the monomer represented by the formula (1), maleimide, or the maleimide derivative at preferably 5% by mass or more, more preferably from 10% to 50% by mass.

That is, in order to effectively suppress generation of a secondary aggregate which is an aggregate of a primary particle of the pigment, or effectively weaken an aggregating force of a secondary aggregate, a content of the copolymerization unit derived from the monomer represented by the formula (1), maleimide, or the maleimide derivative is preferably 5% by mass or more. In addition, from a viewpoint of developability upon manufacturing of the color filter from the colored photosensitive composition containing the pigment-dispersed composition, a content of the copolymerization unit derived from the monomer represented by the formula (1) is preferably 50% by mass or less.

It is preferable that the polymer compound of (SP-1), or the polymer compound of (SP-2) has an acidic group as a functional group adsorbable onto the pigment and, for this reason, it is preferable to copolymerize a monomer having an acidic group upon synthesis.

Preferable examples of the "acidic group" include a carboxylic acid group, a sulfonic acid group, a monosulfuric acid ester group, a phosphoric acid group, a monophosphoric acid ester group, and a boric acid group. A carboxylic acid group, a sulfonic acid group, a monosulfuric acid ester group, a phosphoric acid group, and a monophosphoric acid ester group are more preferable, and a carboxylic acid group, a sulfonic acid group, and a phosphoric acid group are particularly preferable.

Examples of the monomer having an acidic group usable in synthesis include a vinyl monomer having a carboxyl group, and a vinyl monomer having a sulfonic acid group.

Examples of the vinyl monomer having a carboxyl group include (meth)acrylic acid, vinylbenzoic acid, maleic acid, maleic acid monoalkyl ester, fumaric acid, itaconic acid, crotonic acid, cinnamic acid, and acrylic acid dimer. Alternatively, an adduct reaction product of a monomer having a hydroxy group such as 2-hydroxyethyl(meth)acrylate, and cyclic anhydride such as maleic anhydride, phthalic anhydride, and cyclohexanedicarboxylic anhydride, and co-carboxy-polycaprolactone mono(meth)acrylate may be utilized. Alternatively, as a precursor of a carboxyl group, a monomer containing an anhydride such as maleic anhydride, itaconic anhydride, and citraconic anhydride may be used. Among them, from a viewpoint of copolymerizabilty, the cost and solubility, (meth)acrylic acid is particularly preferable.

In addition, examples of the vinyl monomer having a sulfonic acid group include 2-acrylamido-2-methylpropanesulfonic acid, and examples of the vinyl monomer having a phosphoric group include phosphoric acid mono(2-acryloyloxyethyl ester), and phosphoric acid mono(1-methyl-2-acryloyloxyethyl ester).

By possession of an acrylic group by the specific graft-type polymer compound, development removability of an unexposed part is excellent when the pigment-dispersed composition is applied to the colored photosensitive composition.

The specific monomer may contain only one, or two or more of copolymerization units derived from the monomer containing an acidic group.

It is preferable that the polymer compound of (SP-1) or the polymer compound of (SP-2) in the invention contains an acidic group, more preferably a carboxyl group in its molecule, and a content thereof is preferably such that an acidic group, a representative of which is a carboxyl group, is contained in a range of from 50 mgKOH/g to 200 mgKOH/g. That is, in order to suppress generation of a precipitate in a developer when applied to the colored photosensitive composition and subjected to development and, further, effectively suppress generation of a secondary aggregate which is an aggregate of a primary particle of the pigment, or effectively weaken an aggregating force of a secondary aggregate, it is preferable that a carboxyl group is contained in a range of from 50 mgKOH/g to 200 mgKOH/g.

In addition, as the functional group adsorbable onto the pigment, a basic nitrogen atom is also preferably exemplified, and preferable examples of the "group having a basic nitrogen atom" in the monomer having a basic nitrogen atom usable in synthesis of the polymer compound of (SP-1) or the polymer compound of (SP-2) include an amino group ($-NH_2$), a substituted imino group ($-NHR^8$, $-NR^9R^{10}$, wherein $R^8$, $R^9$ and $R^{10}$ each represent independently an alkyl group with 1 to 20 carbon atoms, an aryl group with 6 or more carbon atoms, or an aralkyl group with 7 or more carbon atoms), a guanidyl group represented by the following formula (a), and an amidinyl group represented by the following formula (a2).

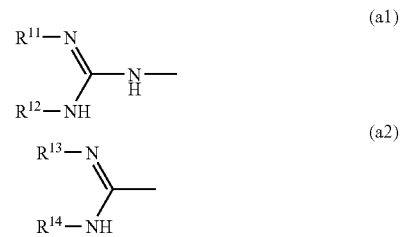

In the formula (a1), $R^{11}$ and $R^{12}$ each represent independently an alkyl group with 1 to 20 carbon atoms, an aryl group with 6 or more carbon atoms and aralkyl group with 7 or more carbon atoms.

In the formula (a2), $R^{13}$ and $R^{14}$ each represent independently an alkyl group with 1 to 20 carbon atoms, an aryl group with 6 or more carbon atoms, or an aralkyl group with 7 or more carbon atoms.

Among them, an amino group ($-NH_2$), a substituted imino group ($-NHR^8$, $-NR^9R^{10}$, wherein $R^8$, $R^9$ and $R^{10}$ each represent independently an alkyl group with 1 to 10 carbon atoms, a phenyl group or a benzyl group), a guanidyl group represented by the formula (a1) [in the formula (a1), $R^{11}$ and $R^{12}$ each represent independently an alkyl group with 1 to 10 carbon atoms, a phenyl group, or a benzyl group], and an amidinyl group represented by the formula (a2) [in the formula (a2), $R^{13}$ and $R^{14}$ each represent independently an alkyl group with 1 to 10 carbon atoms, a phenyl group , or a benzyl group] are more preferable.

Particularly, an amino group ($-NH_2$), a substituted imino group ($-NHR^8$, $-NR^9R^{10}$, wherein $R^8$, $R^9$ and $R^{10}$ each represent independently an alkyl group with 1 to 5 carbon atoms, a phenyl group, a benzyl group), a guanidyl group represented by the formula (a1) [in the formula (a1), $R^{11}$ and $R^{12}$ each represent independently an alkyl group with 1 to 5 carbon atoms, a phenyl group, or a benzyl group], and an amidinyl group represented by the formula (a2) [in the formula (a2), $R^{13}$ and $R^{14}$ each represent independently an alkyl group with 1 to 5 carbon atoms, a phenyl group, or a benzyl group] are preferably used.

Specific examples of the monomer having a basic nitrogen atom include, as (meth)acrylic acid ester, N,N-dimethylaminoethyl(meth)acrylate, N,N-dimethylaminopropyl(meth)acrylate, 1-(N,N-dimethylamino)-1,1-dimethylmethyl (meth)acrylate, N,N-dimethylaminohexyl(meth)acrylate, N,N-diethylaminoethyl(meth)acrylate, N,N-diisopropylaminoethyl(meth)acrylate, N,N-di-n-butylaminoethyl(meth)acrylate, N,N-di-i-butylaminoethyl(meth)acrylate, morpholinoethyl(meth)acrylate, piperidinoethyl(meth)acrylate, 1-pyrrolidinoethyl(meth)acrylate, N,N-methyl-2-pyrrolidylaminoethyl(meth)acrylate, and N,N-methylphenylaminoethyl(meth)acrylate.

In addition, examples of (meth)acrylamides include N—(N',N'-dimethylaminoethyl)acrylamide, N—(N',N'-dimethylaminoethyl)methacrylamide, N—(N',N'-diethylaminoethyl)acrylamide, N—(N',N'-diethylaminoethyl)methacrylamide, N—(N',N'-dimethylaminopropyl)acrylamide, N—(N',N'-dimethylaminopropyl)methacrylamide, N—(N',N'-diethylaminopropyl)acrylamide, N—(N',N'-diethylaminopropyl)methacrylamide, 2-(N,N-dimethylamino)ethyl(meth)acrylamide, 2-(N,N- diethylamino)ethyl(meth)acrylamide, 3-(N,N-diethylamino)propyl(meth)acrylamide, 3-(N,N-dimethylamino)propyl (meth)acrylamide, 1-(N,N-dimethylamino)-1,1-dimethylmethyl(meth)acrylamide and 6-(N,N-diethylamino)hexyl (meth)acrylamide, morpholino(meth)acrylamide, piperidino (meth)acrylamide, and N-methyl-2-pyrrolidyl(meth)acrylamide, and examples of styrene include N,N-dimethylaminostyrene, and N,N-dimethylaminomethylstyrene.

Alternatively, upon synthesis of the polymer compound of (SP-1) or the polymer compound of (SP-2), it is also possible to use a monomer having an urea group, an urethane group, a group having a coordinating oxygen atom, a hydrocarbon group with 4 or more carbon atoms, an alkoxysilyl group, an epoxy group, an isocyanate group, a hydroxy group, or an ionic functional group as the functional group adsorbable onto the pigment.

As the "urea group", for example, —NR$^{15}$CONR$^{16}$R$^{17}$ (wherein R$^{15}$, R$^{16}$ and R$^{17}$ each represent independently a hydrogen atom, an alkyl group with 1 to 20 carbon atoms, an aryl group with 6 or more carbon atoms, or an aralkyl group with 7 or more carbon atoms) is exemplified as a preferable example, —NR$^{15}$CONHR$^{17}$ (wherein R$^{15}$ and R$^{17}$ each represent independently a hydrogen atom, an alkyl group with 1 o 10 carbon atoms, an aryl group with 6 or more carbon atoms, an aralkyl group with 7 or more carbon atoms) is more preferable and —NHCONHR$^{17}$ (wherein R$^{17}$ represents a hydrogen atom, an alkyl group with 1 to 10 carbon atoms, an aryl group with 6 or more carbon atoms, or an aralkyl group with 7 or more carbon atoms) is particularly preferable.

As the "urethane group", for example, —NHCOOR$^{18}$, —NR$^{19}$COOR$^{20}$, —OCONHR$^{21}$, and —OCONR$^{22}$R$^{23}$ (wherein R$^{18}$, R$^{19}$, R$^{20}$ R$^{21}$, R$^{22}$ and R$^{23}$ each represent independently an alkyl group with 1 to 20 carbon atoms, an aryl group with 6 or more carbon atoms, an aralkyl group with 7 or more carbon atoms) are exemplified as a preferable example, —NHCOOR$^{18}$, and —OCONHR$^{21}$ (wherein R$^{18}$ and R$^{21}$ each represent independently an alkyl group with 1 to 20 carbon atoms, an aryl group with 6 or more carbon atoms, or an aralkyl group with 7 or more carbon atoms) are more preferable, and —NHCOOR$^{18}$, and —OCONHR$^{21}$ (wherein R$^{18}$ and R$^{21}$ each represent independently an alkyl group with 1 to 10 carbon atoms, an aryl group with 6 or more carbon atoms, or an aralkyl group with 7 or more carbon atoms) are particularly preferable.

Examples of the "group having a coordinating oxygen atom" include an acetylacetonato group, and a crown ether.

Preferable examples of the "hydrocarbon group with 4 or more carbon atoms" include an alkyl group with 4 or more carbon atoms, an aryl group with 6 or more carbon atoms, and an aralkyl group with 7 or more carbon atoms, an alkyl group with 4 to 20 carbon atoms, an aryl group with 6 to 20 carbon atoms, an aralkyl group with 7 to 20 carbon atoms are more preferable, and an alkyl group with 4 to 15 carbon atoms (e.g. octyl group, dodecyl group etc.), an aryl group with 6 to 15 carbon atoms (e.g. phenyl group, naphthyl group etc.), and an aralkyl group with 7 to 15 carbon atoms (e.g. benzyl group) are particularly preferable.

Examples of the "alkoxysilyl group" include a trimethoxysilyl group, and a triethyoxysilyl group.

As the monomer having an urea group, an urethane group, a group having a coordinating oxygen atom, a hydrocarbon group with 4 or more carbon atoms, an alkoxysilyl group, an epoxy group, an isocyanate group or a hydroxy group, specifically, monomers having the following structures may be exemplified.

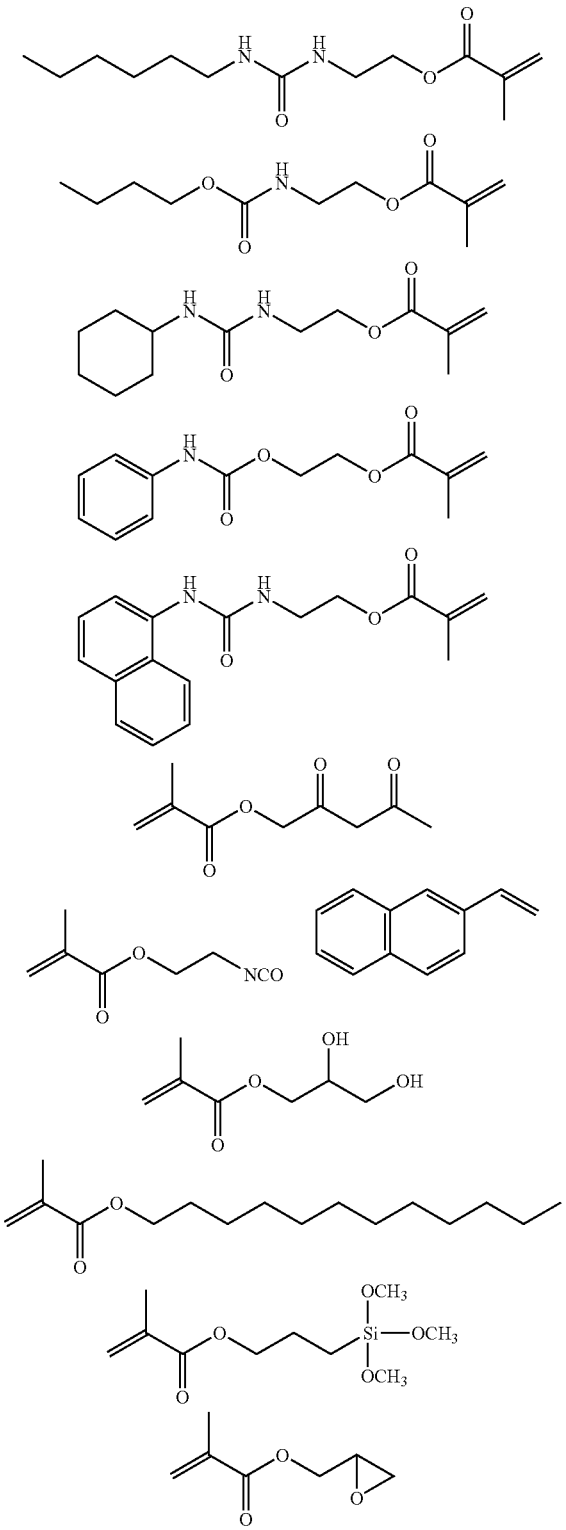

As the "ionic functional group" adsorbable on the pigment, there are an anionic functional group and a cationic functional group.

Examples of the anionic functional group include an alkali metal salt of an acidic group such as a carboxylic acid group, a sulfonic acid group, a monosulfuric acid ester group, a phosphoric acid group, a monophosphoric acid ester group, and a boric acid group, and a salt of the acidic group and organic amine.

Examples of the alkali metal salt of the acidic group include a Na salt, and a K salt, and examples include —COO$^-$Na$^+$, —COO$^-$K$^+$, and —SO$_3^-$Na$^+$.

Examples of the salt of the acidic group and the organic amine include —COO$^-$HN$^+$R$^{32}$R$^{33}$R$^{34}$ and —SO$_3^-$HN$^+$R$^{35}$R$^{36}$R$^{37}$ (R$^{32}$, R$^{33}$, R$^{34}$, R$^{35}$, R$^{36}$ and R$^{37}$ each represent independently a hydrogen atom or a substituent (e.g. hydroxy group, sulfonamide group, N-sulfonylamide group, acyloxyl group with 1 to 6 carbon atoms, alkoxy group with 1 to 6 carbon atoms, alkoxycarbonyl group with 2 to 7 carbon atoms, cyano group, carbonic acid ester group etc.)).

As the cationic functional group, a salt represented by the following formula may be suitably exemplified.

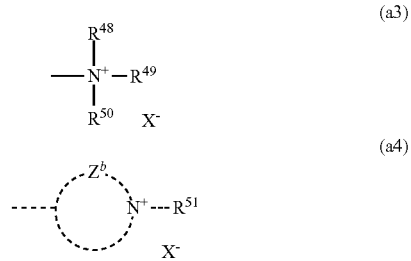

In the formulas (a3) and (a4), R$^{48}$, R$^{49}$, R$^{50}$ and R$^{51}$ each represent independently a hydrogen atom, an alkyl group with 1 to 18 carbon atoms which may have a substituent, or may bind to form a saturated or unsaturated cyclic structure, an aryl group, or an aralkyl group.

X$^-$ represents an anion such as a halogen anion (e.g. Cl$^-$, Br$^-$, I$^-$), and an organic acid anion such as RCOO$^-$, and RSO$_3^-$ (R may be an alkyl group which may have a substituent or may bind to form a saturated or unsaturated cyclic structure, an aryl group, or an aralkyl group).

Z$^b$ represents an atomic group which is taken together with nitrogen to form a heterocyclic group.

Examples of the ionic vinyl monomer having an ionic group which is a functional group adsorbable on the pigment include, as an anionic vinyl monomer, an alkali metal salt of the vinyl monomer having an acidic group, and a salt with organic amine (e.g. tertiary amine such as triethylamine, dimethylaminoethanol etc.).

Examples of the cationic vinyl monomer include a monomer obtained by quaternarizing the nitrogen-containing vinyl monomer with alkyl halide (alkyl group with 1 to 18 carbon atoms: halogen atom: chlorine atom, bromine atom or iodine atom); benzyl halide such as benzyl chloride, and benzyl bromide; ester of alkylsulfonic acid (alkyl group with 1 to 18 carbon atoms) such as methanesulfonic acid; alkyl ester (alkyl group with 1 to 18 carbon atoms) of arylsulfonic acid such as benzenesulfonic acid and toluenesulfonic acid; dialkyl sulfate (alkyl group with 1 to 4 carbon atoms), and a dialkyldiallyl ammonium salt.

The monomer having a functional group adsorbable onto the pigment may be appropriately selected depending on the pigment to be dispersed. That is, it is more preferable to select a monomer having the same skeleton as, or a similar skeleton to a skeleton possessed by the covering organic pigment, and a monomer which easily forms interaction with a functional group present in the pigment. When monomers having a functional group adsorbable onto the pigment are used in synthesizing the specific graft-type polymer compound, these monomers may be used alone, or two or more thereof may be used together, depending on the purpose.

The polymer compound of (SP-1) or the polymer compound of (SP-2) may further contain a copolymerization unit derived from a copolymerizable vinyl monomer in such a range that the effect thereof is not deteriorated.

Herein, the usable vinyl monomer is not particularly limited, but for example, (meth)acrylic acid esters, crotonic acid esters, vinyl esters, maleic acid diesters, phthalic acid diesters, itaconic acid diesters, (meth)acrylamides, vinyl ethers, vinyl alcohol esters, styrenes and (meth)acrylonitrile are preferable. Specific examples of such vinyl monomer include the following compounds are exemplified.

Examples of (meth)acrylic acid esters include methyl (meth)acrylate, ethyl(meth)acrylate, n-propyl(meth)acrylate, isopropyl(meth)acrylate, n-butyl(meth)acrylate, isobutyl (meth)acrylate, t-butyl(meth)acrylate, n-hexyl(meth)acrylate, cyclohexyl(meth)acrylate, t-butyl cyclohexyl(meth) acrylate, 2-ethylhexyl(meth)acrylate, t-octyl(meth)acrylate, dodecyl(meth)acrylate, octadecyl(meth)acrylate, acetoxy ethyl(meth)acrylate, phenyl(meth)acrylate, 2-hydroxyethyl (meth)acrylate, 2-methoxyethyl(meth)acrylate, 2-ethoxyethyl(meth)acrylate, 2-(2-methoxyethoxy)ethyl(meth)acrylate, 3-phenoxy-2-hydroxypopyl(meth)acrylate, benzyl (meth)acrylate, diethylene glycol monomethyl ether(meth) acrylate, diethylene glycol monoethyl ether(meth)acrylate, triethylene glycol monomethyl ether(meth)acrylate, triethylene glycol monoethyl ether(meth)acrylate, polyethylene glycol monomethyl ether(meth)acrylate, polyethylene glycol monoethyl ether(meth)acrylate, β-phenoxyethoxyethyl (meth)acrylate, nonylphenoxy polyethylene glycol(meth) acrylate, dicyclopentenyl(meth)acrylate, dicyclopentenyloxyethyl(meth)acrylate, trifluoroethyl(meth)acrylate, octafluoropentyl(meth)acrylate, perfluorooctyl ester(meth) acrylate, dicyclopentanyl(meth)acrylate, tribromophenyl (meth)acrylate, and tribromophenyloxyethyl(meth)acrylate.

Examples of crotonic acid esters include butyl crotonate, and hexyl crotonate.

Examples of vinyl esters include vinyl acetate, vinyl propionate, vinyl butyrate, vinyl methoxyacetate, and vinyl benzoate.

Examples of maleic acid diesters include dimethyl maleate, diethyl maleate, and dibutyl maleate.

Examples of fumaric acid diesters include dimethyl fumarate, diethyl fumarate, and dibutyl fumarate.

Examples of itaconic acid diesters include dimethyl itaconate, diethyl itaconate, and dibutyl itaconate.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N,N-butyl(meth)acrylamide, N-t-butyl(meth) acrylamide, N-cyclohexyl(meth)acrylamide, N-(2-methoxyethyl)(meth)acrylamide, N,N-dimethyl(meth) acrylamide, N,N-diethyl(meth)acrylamide, N-phenyl(meth) acrylamide, N-benzyl(meth)acrylamide, (meth) acryloylmorpholine, and diacetoneacrylamide.

Examples of vinyl ether include methyl vinyl ether, butyl vinyl ether, hexyl vinyl ether, and methoxyethyl vinyl ether.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected with a group which may be deprotected with an acidic substance (e.g. t-Boc etc.), methyl vinylbenzoate, and α-methylstyrene.

A preferable aspect of the specific graft-type polymer compound of the invention is a compound obtained by copolymerizing at least the macromonomer, and the monomer having an organic dye structure or a heterocyclic structure, further preferably a compound obtained by copolymerizing at least the macromonomer represented by the formula (5), the monomer represented by the formula (1), and a monomer having an acidic group.

By this aspect, a processed pigment excellent in pigment adsorbability and excellent in developability may be afforded.

[Polymer Compound Represented by the Formula (3-1) ((SP-3) Specific Polymer Compound)]

The polymer compound represented by the formula (3-1) (also referred to as (SP-3) specific polymer compound in some cases) will be explained.

Since the polymer compound represented by the following formula (3-1) has a plurality of monovalent organic groups containing at least one kind of a site selected from an organic dye structure, a heterocyclic structure, an acidic group, a group having a basic nitrogen atom, an urea group, an urethane group, a group having a coordinating oxygen atom, a hydrocarbon group with 4 or more carbon atoms, an alkoxysilyl group, an epoxy group, an isocyanate group, a hydroxy group, and an ionic functional group on an end of the polymer, it has various characteristics that it has excellent adsorbability onto a solid surface, excellent micelle forming ability, and surface activity ability. From these points, by covering the pigment to obtain a processed pigment, dispersibility and dispersion stability of this processed pigment may be improved.

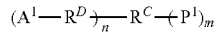

Formula (3-1)

In the formula (3-1), $A^1$ represents a monovalent organic group containing at least one of site selected from an organic dye structure, a heterocyclic structure, an acidic group, a group having a basic nitrogen atom, an urea group, an urethane group, a group having a coordinating oxygen atom, a hydrocarbon group with 4 or more carbon atoms, and alkoxysilyl group, an epoxy group, an isocyanate group, a hydroxy group, and an ionic functional group, and n $A^1$s may be the same or different.

That is, the $A^1$ represents a monovalent organic group containing at least one of a functional group having adsorbability onto the pigment, such as an organic coloring structure, a structure having adsorbability onto the pigment such as a heterocyclic structure, an acidic group, a group having a basic nitrogen atom, an urea group, an urethane group, a group having a coordinating oxygen atom, a hydrocarbon group with 4 or more carbon atoms, and alkoxysilyl group, an epoxy group, an isocyanate group, a hydroxy group, and an ionic functional group.

Hereinafter, this site having adsorbability onto the pigment (the above structure and functional group) is appropriately called collectively as "adsorption site", and will be explained.

At least one, or two or more of the adsorption sites may be contained in one $A^1$.

In the invention, the "monovalent organic group containing at least one of adsorption site" is a monovalent organic group in which the adsorption site, and an organic linkage group consisting of 1 to 200 carbon atoms, 0 to 20 nitrogen atoms, 0 to 100 oxygen atoms, 1 to 400 hydrogen atoms, and 0 to 40 sulfur atoms are bound. When the adsorption site itself may constitute a monovalent organic group, the adsorption site itself may be a monovalent organic group represented by $A^1$.

First, the adsorption site constituting the $A^1$ will be explained below.

Preferable examples of the "organic dye structure" include phthalocyanine-based, insoluble azo-based, azolake-based, anthraquinone-based, quinacridone-based, dioxazine-based, diketopyrrolopyrrole-based, anthrapyridine-based, anthanthrone-based, indanethrone-based, flavanthrone-based, perynone-based, perylene-based, and thioindigo-based dye structures, phthalocyanine-based, azolake-based, anthraquinone-based, dioxazine-based, and diketopyrrolopyrrole-based dye structures are more preferable, and phthalocyanine-based, anthraquinone-based and diketopyrrolopyrrole-based dye structures are particularly preferable.

Preferable examples of the "heterocyclic structure" include thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, succinimide, phthalimide, naphthalimide, hydantoin, indole, quinoline, carbazole, acridine, acridone, and anthraquinone, and pyrroline, pyrrolidine, pyrazole, pyrazoline, pyrazolidine, imidazole, triazole, pyridine, piperidine, morpholine, pyridazine, pyrimidine, piperazine, triazine, isoindolinone, isoindoline, benzimidazolone, benzothiazole, succinimide, phthalimide, naphathalimide, hydantoin, carbazole, acridine, acridone, and anthraquinone are more preferable.

The "organic dye structure" or the "heterocyclic structure" may further have a substituent, and examples of the substituent include an alkyl group with 1 to 20 carbon atoms such as a methyl group, and an ethyl group, an aryl group with 6 to 16 carbon atoms such as a phenyl group, and a naphthyl group, a hydroxy group, an amino group, a carboxyl group, a sulfonamide group, a N-sulfonylamide group, an acyloxy group with 1 to 6 carbon atoms such as an acetoxy group, an alkoxy group with 1 to 20 carbon atoms such as a methoxy group and an ethoxy group, a halogen atom such as chlorine and bromine, an alkoxycarbonyl group with 2 to 7 carbon atoms such as a methoxycarbonyl group, an ethoxycarbonyl group, and cyclohexyloxylcarbonyl group, a cyano group, and a carbonic acid ester group such as t-butyl carbonate. Herein, these substituents may be bound to the organic dye structure or the heterocycle via a linkage group constructed by the following structural units, or a combination of the structural units.

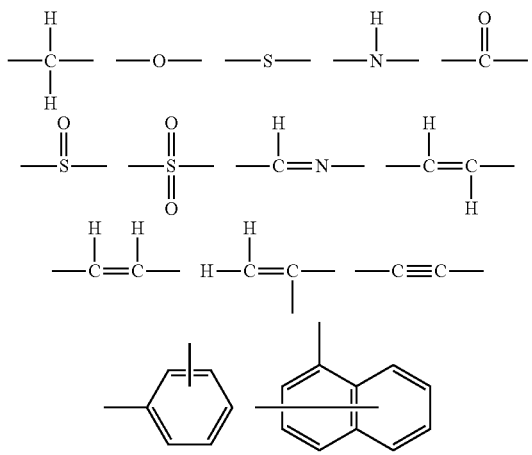

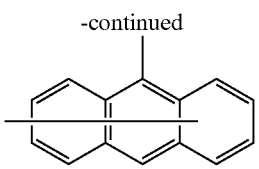

Preferable examples of the "acidic group" include a carboxylic acid group, a sulfonic acid group, a monosulfuric acid ester group, a phosphoric acid group, a monophosphoric acid ester group, and a boric acid group. A carboxylic acid group, a sulfonic acid group, a monosulfuric acid ester group, a phosphoric acid group, and a monophosphoric acid ester group are more preferable, and a carboxylic acid group, a sulfonic acid group, and a phosphoric acid group are particularly preferable.

Preferable examples of the "group having a basic nitrogen atom" include a group listed as the "group having a basic nitrogen atom in the monomer having a basic nitrogen atom usable in synthesis of the polymer compound of (SP-1) or (SP-2).

As the "urea group", for example, —$NR^{15}CONR^{16}R^{17}$ (wherein $R^{15}$, $R^{16}$ and $R^{17}$ each represent independently a hydrogen atom, an alkyl group with 1 to 20 carbon atoms, an aryl group with 6 or more carbon atoms, or an aralkyl group 7 or more carbon atoms) is exemplified as a preferable example, —$NR^{15}CONHR^{17}$ (wherein $R^{15}$ and $R^{17}$ each represent independently a hydrogen atom, an alkyl group with 1 to 10 carbon atoms, an aryl group with 6 or more carbon atoms, an aralkyl group with 7 or more carbon atoms) is more preferable and —$NHCONHR^{17}$ (wherein $R^{17}$ represents a hydrogen atom, an alkyl group with 1 to 10 carbon atoms, an aryl group with 6 or more carbon atoms, or an aralkyl group with 7 or more carbon atoms) is particularly preferable.

As the "urethane group", for example, —$NHCOOR^{18}$, —$NR^{19}COOR^{20}$, —$OCONHR^{21}$, and —$OCONR^{22}R^{23}$ (wherein $R^{18}$, $R^{19}$, $R^{20}$ $R^{21}$, $R^{22}$ and $R^{23}$ each represent independently an alkyl group with 1 to 20 carbon atoms, an aryl group with 6 or more carbon atoms, an aralkyl group with 7 or more carbon atoms) are exemplified as a preferable example, —$NHCOOR^{18}$, and —$OCONHR^{21}$ (wherein $R^{18}$ and $R^{21}$ each represent independently an alkyl group with 1 to 20 carbon atoms, an aryl group with 6 or more carbon atoms, or an aralkyl group with 7 or more carbon atoms) are more preferable, and —$NHCOOR^{18}$, and —$OCONHR^{21}$ (wherein $R^{18}$ and $R^{21}$ each represent independently an alkyl group with 1 to 10 carbon atoms, an aryl group with 6 or more carbon atoms, or an aralkyl group with 7 or more carbon atoms) are particularly preferable.

Examples of the "group having a coordinating oxygen atom" include an acetylacetonato group, and a crown ether.

Preferable examples of the "hydrocarbon group with 4 or more carbon atoms" include an alkyl group with 4 or more carbon atoms, an aryl group with 6 or more carbon atoms, and an aralkyl group with 7 or more carbon atoms, an alkyl group with 4 to 20 carbon atoms, an aryl group with 6 to 20 carbon atoms, and an aralkyl group with 7 to 20 carbon atoms are more preferable, and an alkyl group with 4 to 15 carbon atoms (e.g. octyl group, dodecyl group etc.), an aryl group with 6 to 15 carbon atoms (e.g. phenyl group, naphthyl group etc.), and an aralkyl group with 7 to 15 carbon atoms (e.g. benzyl group) are particularly preferable.

Examples of the "alkoxysilyl group" include a trimethoxysilyl group, and a triethyoxysilyl group.

As the "ionic functional group", there are an anionic functional group and a cationic functional group, and preferable examples include an ionic functional group listed in the monomer having an ionic functional group listed upon synthesis of the polymer compound of (SP-1) or (SP-2).

As the organic linkage group binding with the adsorption site is preferably a single bond, or an organic linkage group consisting of 1 to 100 carbon atoms, 0 to 10 nitrogen atoms, 0 to 50 oxygen atoms, 1 to 200 hydrogen atoms, and 0 to 20 sulfur atoms is preferable, and this organic linkage group may be unsubstituted, or may further have a substituent.

Specific examples of this organic linkage group include the following structural units, or a group constructed by a combination of the structural units.

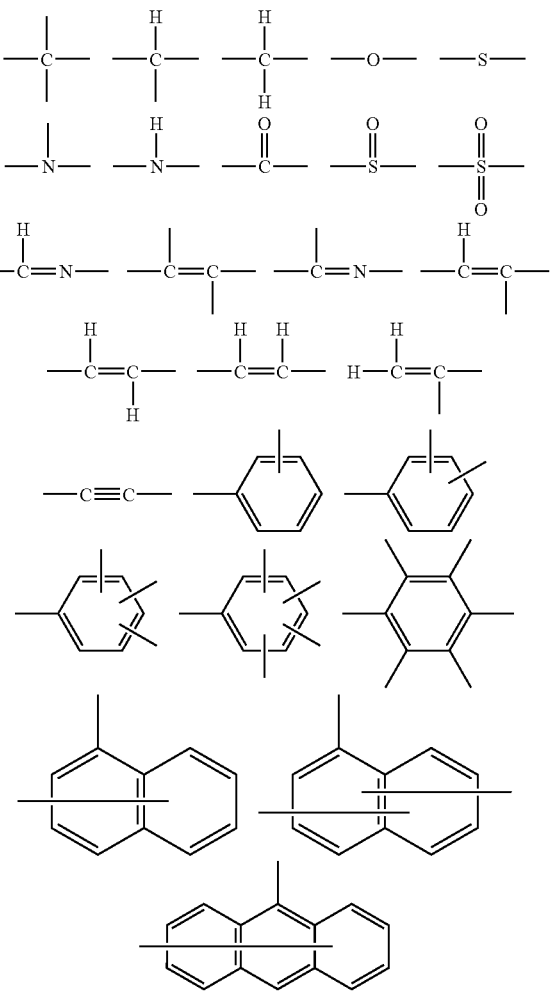

When the organic linkage group has a substituent, examples of the substituent include an alkyl group with 1 to 20 carbon atoms such as a methyl group, and an ethyl group, an aryl group with 6 to 16 carbon atoms such as a phenyl group, and a naphthyl group, a hydroxy group, an amino group, a carboxyl group, a sulfonamide group, a N-sulfonylamide group, an acyloxy group with 1 to 6 carbon atoms such as an acetoxy group, an alkoxy group with 1 to 6 carbon atoms such as a methoxy group and an ethoxy group, a halogen atom such as chlorine, and bromine, an alkoxycarbonyl group with 2 to 7 carbon atoms such as a methoxycarbonyl group an ethoxycarbonyl group and a cyclohexyloxycarobnyl group, a cyano group, and a carbonic acid ester group such as a t-butyl carbonate.

Among them, a monovalent organic group containing at least one site selected from an organic dye structure, a heterocyclic structure, an acidic group, a group having a basic nitrogen atom, an urea group, and a hydrocarbon group with 4 or more carbon atoms as the $A^1$ is preferable.

The $A^1$ is more preferably a monovalent organic group represented by the following formula (3-2).

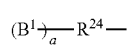
Formula (3-2)

In the formula (3-2), $B^1$ represents the adsorption site (i.e. site selected from organic dye structure, heterocyclic structure, acidic group, group having basic nitrogen atom, urea group, urethane group, group having coordinating oxygen atom, hydrocarbon group with 4 or more carbon atoms, alkoxysilyl group, epoxy group, isocyanate group, hydroxy group, and ionic functional group), $R^{24}$ represents a single bond or a (a+1)-valent organic linkage group, a represents an integer of 1 to 10, and a $B^1$s may be the same or different.

Examples of the adsorption site represented by $B^1$ include the same adsorption site as that constituting $A^1$ of the formula (3-1), and this is also true in a preferable example.

In alia, a site selected from an organic dye structure, a heterocyclic group, an acidic group, a group having a basic nitrogen atom, a urea group, and a hydrocarbon group with 4 or more carbon atoms is preferable.

$R^{24}$ represents a single bond or a (a+1)-valent organic linkage group, and a represents 1 to 10, preferably 1 to 7, more preferably 1 to 5, particularly preferably 1 to 3.

The (a+1)-valent organic linkage group includes a group consisting of 1 to 100 carbon atoms, 0 to 10 nitrogen atoms, 0 to 50 oxygen atoms, 1 to 200 hydrogen atoms, and 0 to 20 sulfur atoms, and may be unsubstituted, or may further have a substituent.

Specific examples of the (a+1)-valent organic linkage group include a group (which may form a ring structure) constructed by the following structural units, or a combination of the structural units.

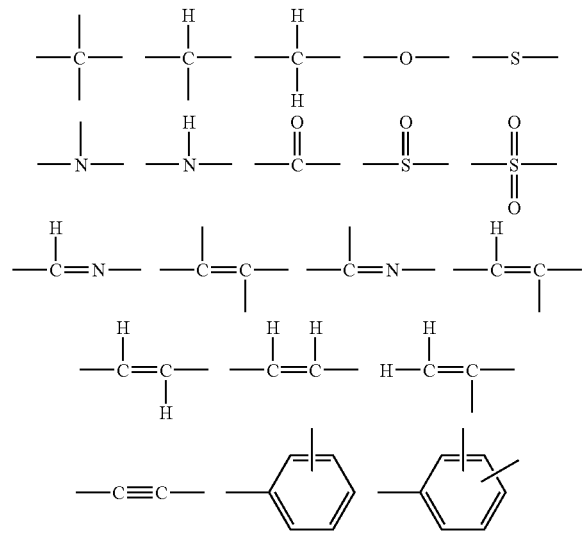

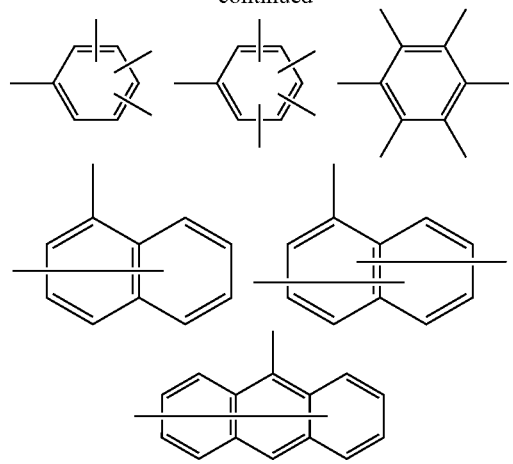

As $R^{24}$, a single bond or a (a+1)-valent organic linkage group consisting of 1 to 50 carbon atoms, 0 to 8 nitrogen atoms, 0 to 25 oxygen atoms, 1 to 100 hydrogen atoms, and 0 to 10 sulfur atoms is preferable, a single bond, or a (a+1)-valent organic linkage group consisting of 1 to 30 carbon atoms, 0 to 6 nitrogen atoms, 0 to 15 oxygen atoms, 1 to 50 hydrogen atoms, and 0 to 7 sulfur atoms is more preferable, and a single bond, or a (a+1)-valent organic linkage group consisting of 1 to 10 carbon atoms, 0 to 5 nitrogen atoms, 0 to 10 oxygen atoms, 1 to 30 hydrogen atoms, and 0 to 5 sulfur atoms is particularly preferable.

Among the foregoing, when the (a+1)-valent organic linkage group has a substituent, examples of the substituent include an alkyl group with 1 to 20 carbon atoms such as methyl group, and an ethyl group, an aryl group with 6 to 16 carbon atoms such as a phenyl group, and a naphthyl group, a hydroxy group, an amino group, a carboxyl group, a sulfonamide group, a N-sulfonylamide group, an acyloxy group with 1 to 6 carbon atoms such as an acetoxy group, an alkoxy group with 1 to 6 carbon atoms such as a methoxy group, and an ethoxy group, a halogen atom such as chlorine and bromine, an alkoxycarbonyl group with 2 to 7 carbon atoms such as a methoxycarbonyl group, an ethoxycarbonyl group, and a cyclohexyloxycarbonyl group, a cyano group, and a carbonic acid ester group such as a t-butyl carbonate.

In the formula (3-1), $R^D$ represents a single bond, or a divalent organic linkage group, and $n R^D$s may be the same or different.

The divalent organic linkage group includes a group consisting of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

Examples of the divalent organic linkage group include a group constructed by the following structural units or a combination of the structural units.

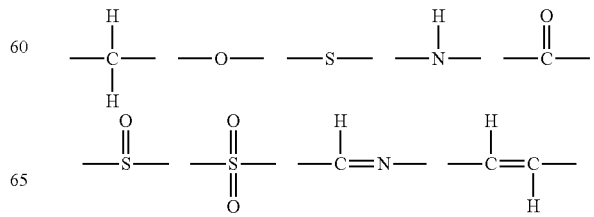

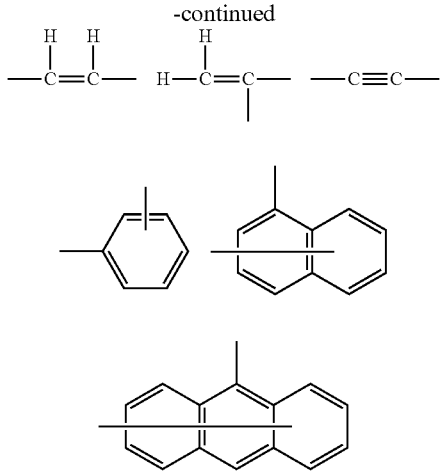

As $R^D$, a single bond, or a divalent organic linkage group consisting of 1 to 50 carbon atoms, 0 to 8 nitrogen atoms, 0 to 25 oxygen atoms, 1 to 100 hydrogen atoms, and 0 to 10 sulfur atoms is preferable, a single bond, or a divalent organic linkage group consisting of 1 to 30 carbon atoms, 0 to 6 nitrogen atoms, 0 to 15 oxygen atoms, 1 to 50 hydrogen atoms, and 0 to 7 sulfur atoms is more preferable, and a single bond, or a divalent organic linkage group consisting of 1 to 10 carbon atoms, 0 to 5 nitrogen atoms, 0 to 10 oxygen atoms, 1 to 30 hydrogen atoms, and 0 to 5 sulfur atoms is particularly preferable.

Among the foregoing, when the divalent organic linkage group has a substituent, examples of the substituent include an alkyl group with 1 to 20 carbon atoms such as a methyl group, and an ethyl group, an aryl group with 6 to 16 carbon atoms such as a phenyl group, and a naphthyl group, a hydroxy group, an amino group, a carboxyl group, a sulfonamide group, a N-sulfonylamide group, an acyloxy group with 1 to 6 carbon atoms such as an acetoxy group, an alkoxy group with 1 to 6 carbon atoms such as a methoxy group, and an ethoxy group, a halogen atom such as chlorine, and bromine, an alkoxycarbonyl group with 2 to 7 carbon atoms such as a methoxycarbonyl group, an ethoxycarbonyl group, and a cyclohexyloxycarbonyl group, a cyano group, and a carbonic acid ester group such as t-butyl carbonate.

In the formula (3-1), $R^C$ represents a (m+n)-valent organic linkage group, and m+n satisfies 3 to 10.

The (m+n)-valent organic linkage group represented by $R^C$ includes a group consisting of 1 to 100 carbon atoms, 0 to 10 nitrogen atoms, 0 to 50 oxygen atoms, 1 to 200 hydrogen atoms, and 0 to 20 sulfur atoms, and may be unsubstituted, or may further have a substituent.

Specific examples of the (m+n)-valent organic linkage group include a group (which may form a ring structure) constructed by the following structural units, or a combination of the structural units.

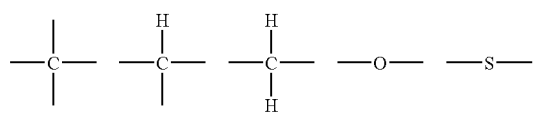

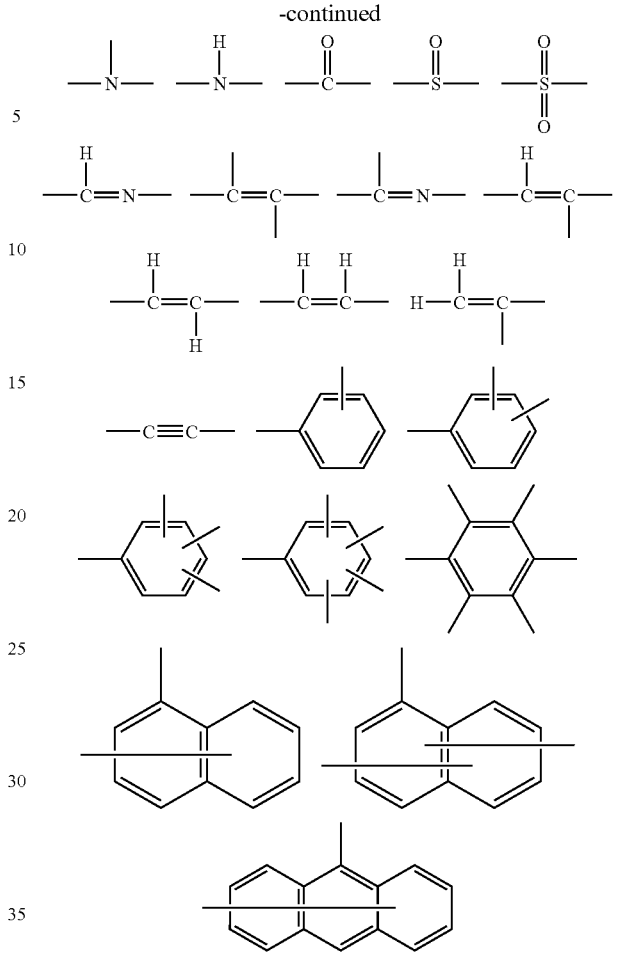

As the (m+n)-valent organic linkage group, a group consisting of 1 to 60 carbon atoms, 0 to 10 nitrogen atoms, 0 to 40 oxygen atoms, 1 to 120 hydrogen atoms, and 0 to 10 sulfur atoms is preferable, a group consisting of 1 to 50 carbon atoms, 0 to 10 nitrogen atoms, 0 to 30 oxygen atoms, 1 to 100 hydrogen atoms, and 0 to 7 sulfur atoms is more preferable, and a group consisting of 1 to 40 carbon atoms, 0 to 8 nitrogen atoms, 0 to 20 oxygen atoms, 1 to 80 hydrogen atoms, and 0 to 5 sulfur atoms is particularly preferable.

Among the foregoing, when the (m+n)-valent organic linkage group has a substituent, examples of the substituent include an alkyl group with 1 to 20 carbon atoms such as a methyl group, and an ethyl group, an aryl group with 6 to 16 carbon atoms such as a phenyl group, and a naphthyl group, a hydroxy group, an amino group, a carboxyl group, a sulfonamide group, a N-sulfonylamide group, an acyloxy group with 1 to 6 carbon atoms such as an acetoxy group, an alkoxy group with 1 to 6 carbon atoms such as a methoxy group, and an ethoxy group, a halogen atom such as chlorine, and bromine, an alkoxycarbonyl group with 2 to 7 carbon atoms such as a methoxycarbonyl group, an ethoxycarbonyl group, and a cyclohexyloxycarbonyl group, a cyano group, and a carbonic acid ester group such as t-butyl carbonate.

Specific examples of the (m+n)-valent organic linkage group represented by $R^C$ (Examples (1) to (17)) are as follows. However, the present invention is not limited to them.

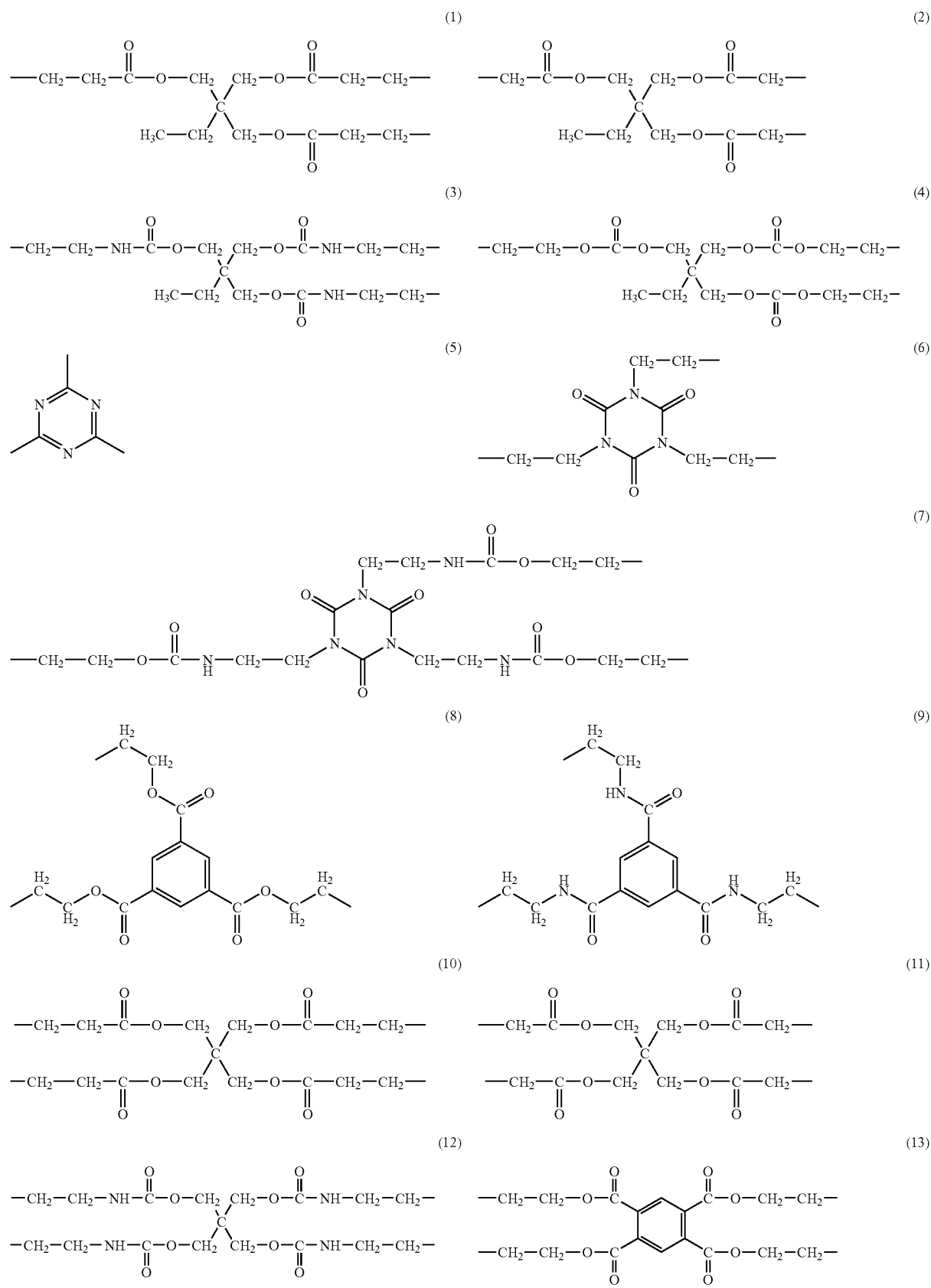

-continued
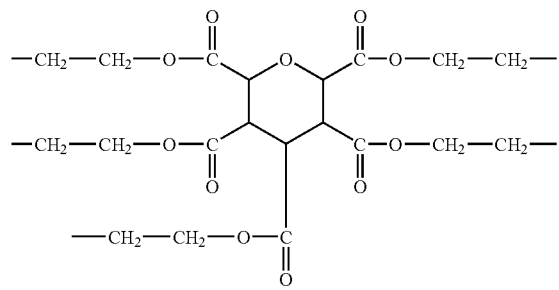 (14)
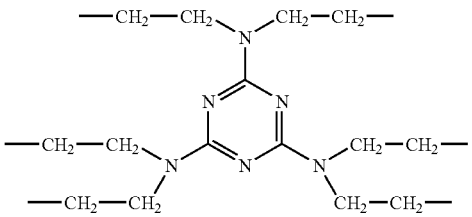 (15)
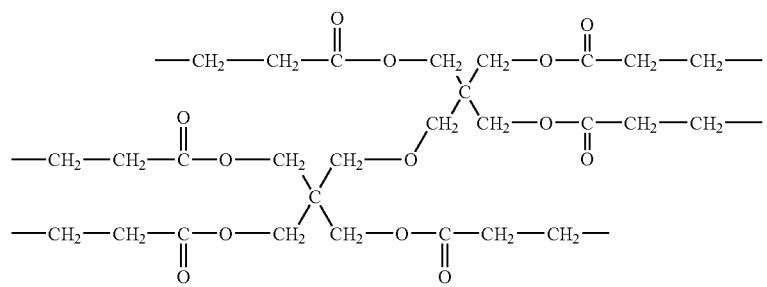 (16)
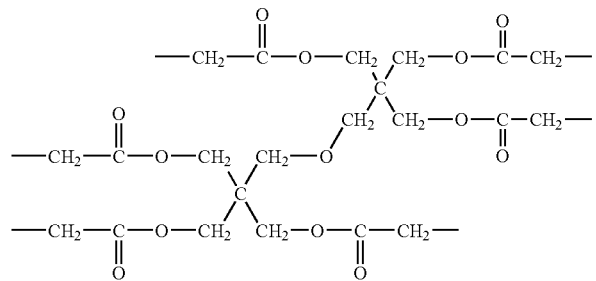 (17)
Among the aforementioned specific examples, from a viewpoint of easy availability of a raw material, easiness of synthesis, and solubility in the various solvents, a most preferable (m+n)-valent organic linkage group is the following group.
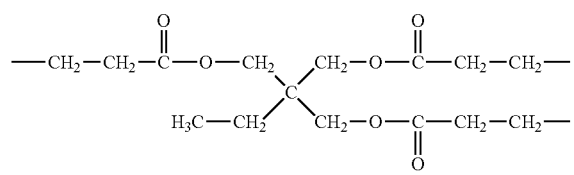 (1)
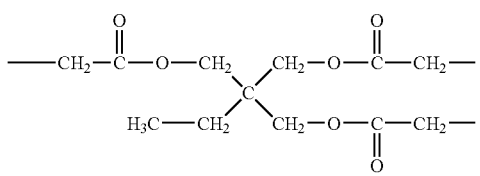 (2)
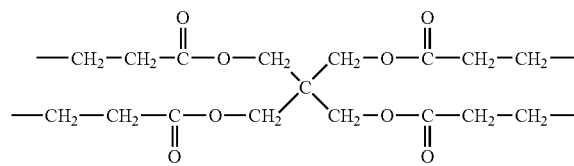 (10)
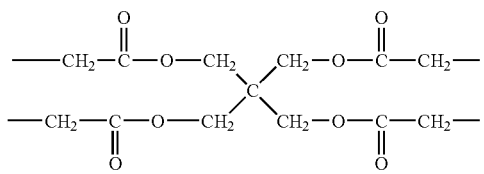 (11)

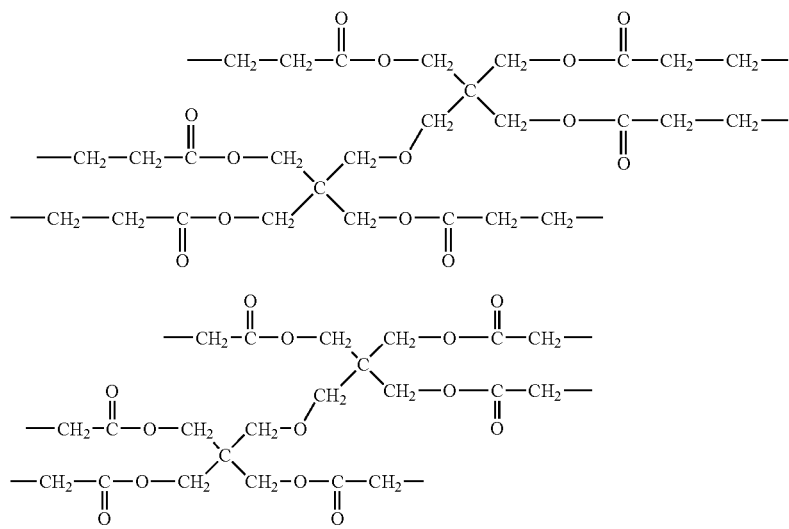

(16)

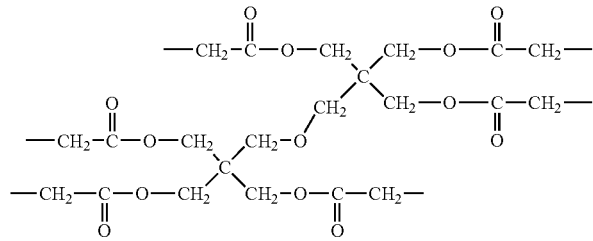

(17)

In the formula (3-1), m represents 1 to 8. As m, 1 to 5 is preferable, 1 to 4 is more preferable, and 1 to 3 is particularly preferable.

In addition, in the formula (3-1), n represents 2 to 9. As n, 2 to 8 is preferable, 2 to 7 is more preferable, and 3 to 6 is particularly preferable.

In the formula (3-1), $P^1$ represents a polymer skeleton, and may be selected from the known polymers depending on the purpose, and m $P^1$s may be the same of different.

Among the polymers, for constituting the polymer skeleton, at least one selected from the group consisting of a vinyl monomer or copolymer, an ester-based polymer, an ether-based polymer, an urethane-based polymer, an amide-based polymer, an epoxy-based polymer, a silicone-based polymer, and a modified material thereof, or a copolymer thereof [e.g. including a polyether/polyurethane copolymer, a copolymer of a polymer of a polyether/vinyl monomer (which may be any of random copolymer, block copolymer, and graft copolymer)] is preferable, at least one selected from the group consisting of a vinyl monomer polymer or copolymer, an ester-based polymer, an ether-based polymer, an urethane-based polymer, and a modified material thereof, or a copolymer thereof is more preferable, and a vinyl monomer polymer or copolymer is particularly preferable.

Further, it is preferable that the polymer is soluble in an organic solvent. If affinity with the organic solvent is low, for example, when used as a pigment dispersant, affinity with a dispersing medium is weakened, and a sufficient adsorption layer for dispersion stabilization may not be contained in some cases.

The vinyl monomer is not particularly limited, but (meth) acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, (meth)acrylonitrile, and a vinyl monomer having an acidic group are preferable.

Preferable examples of these vinyl monomers will be explained below. In the present specification, when one or both of "acryl, and methacryl" is indicated, this is described as "(meth)acryl" in some cases.

Examples of (meth)acrylic acid esters include methyl (meth)acrylate, ethyl(meth)acrylate, n-propyl(meth)acrylate, isopropyl(meth)acrylate, n-butyl(meth)acrylate, isobutyl (meth)acrylate, t-butyl(meth)acrylate, amyl(meth)acrylate, n-hexyl(meth)acrylate, cyclohexyl(meth)acrylate, t-butylcyclohexyl(meth)acrylate, 2-ethylhexyl(meth)acrylate, t-octyl (meth)acrylate, dodecyl(meth)acrylate, octadecyl(meth) acrylate, acetoxyethyl(meth)acrylate, phenyl(meth)acrylate, 2-hydroxylethyl(meth)acrylate, 2-hydroxypropyl(meth) acrylate, 3-hydroxypropyl(meth)acrylate, 4-hydroxybutyl (meth)acrylate, 2-methoxyethyl(meth)acrylate, 2-ethoxyethyl(meth)acrylate, 2-(2-methoxyethoxy)ethyl(meth) acrylate, 3-phenoxy-2-hydroxypropyl(meth)acrylate, 2-chloroethyl(meth)acrylate, glycidyl(meth)acrylate, 3,4-epoxycyclohexylmethyl(meth)acrylate, vinyl(meth)acrylate, 2-phenylvinyl(meth)acrylate, 1-propenyl(meth)acrylate, allyl(meth)acrylate, 2-allyloxyethyl(meth)acrylate, propargyl(meth)acrylate, benzyl(meth)acrylate, diethylene glycol monomethyl ether(meth)acrylate, diethylene glycol monoethyl ether(meth)acrylate, triethylene glycol monomethyl ether (meth)acrylate, triethylene glycol monoethyl ether(meth) acrylate, polyethylene glycol monomethyl ether(meth) acrylate, polyethylene glycol monoethyl ether(meth) acrylate, β-phenoxyethoxyethyl(meth)acrylate, nonylphenoxy polyethylene glycol(meth)acrylate, dicyclopentenyl(meth)acrylate, dicyclopentenyloxyethyl(meth) acrylate, trifluoroethyl(meth)acrylate, octafluoropentyl (meth)acrylate, perfluorooctylethyl(meth)acrylate, dicyclopentanyl(meth)acrylate, tribromophenyl(meth)acrylate, tribromophenyloxyethyl(meth)acrylate, and γ-butyrolactone(meth)acrylate.

Examples of crotonic acid esters include butyl crotonate, hexyl crotonate, and the like. Examples of vinyl esters include vinyl acetate, vinylchloro acetate, vinyl propionate, vinyl butyrate, vinyl methoxy acetate, vinyl benzoate, and the like. Examples of maleic acid diesters include dimethyl maleate, diethyl maleate, dibutyl maleate, and the like. Examples of fumaric acid diesters include dimethyl fumarate, diethyl fumarate, dibutyl fumaric, and the like. Examples of itaconic acid diesters include dimethyl itaconate, diethyl itaconate, dibutyl itaconate, and the like.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl acrylic(meth)amide, N-t-butyl(meth) acrylamide, N-cyclohexyl(meth)acrylamide, N-(2-methoxy ethyl)(meth)acrylamide, N,N-dimethyl(meth)acrylamide, N,N-diethyl(meth)acrylamide, N-phenyl(meth)acrylamide, N-nitrophenyl acrylamide, N-ethyl-N-phenylacrylamide, N-benzyl(meth)acrylamide, (meth)acryloyl morpholine, diacetone acrylamide, N-methylolacrylamide, N-hydroxyethylacrylamide, vinyl(meth)acrylamide, N,N-diaryl(meth) acrylamide, N-allyl(meth)acrylamide, and the like.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, protected hydroxystyrenes that can be deprotected using an acidic group (for example, t-Boc or the like), vinylbenzoic acid methyl ester and α-methylstyrene, and the like.

Examples of vinyl ethers include methyl vinyl ether, ethyl vinyl ether, 2-chloroethyl vinyl ether, hydroxyethyl vinyl ether, propylvinyl ether, butyl vinyl ether, hexyl vinyl ether, octyl vinyl ether, methoxyethyl vinyl ether, phenyl vinyl ether, and the like.

Examples of vinyl ketones include methyl vinyl ketone, ethyl vinyl ketone, propyl vinyl ketone, phenyl vinyl ketone, and the like. Examples of olefins include ethylene, propylene, isobutylene, butadiene, isoprene, and the like. Examples of maleimides include maleimide, butylmaleimide, cyclohexyl maleimide, phenyl maleimide, and the like.

(Meth)acrylonitrile, a heterocyclic compound substituted with a vinyl group (e.g. vinylpyridine, N-vinylpyrrolidone, vinyl carbazole, N-vinylimidazole, vinylcaprolactone etc.), and N-vinylamides (e.g. N-vinylformamide, N-vinylacetamide etc.) may be used.

In addition to the aforementioned compounds, a vinyl monomer having a functional group such as an urethane group, an urea group, a sulfonamide group, a phenol group, and an imido group may be used. Such monomer having a urethane group or an urea group may be appropriately synthesized by utilizing an addition reaction of an isocyanate group and a hydroxy group or an amino group. Specifically, the monomer may be appropriately synthesized by an addition reaction of an isocyanate group-containing monomer and a compound having one hydroxy group or a compound containing one primary or secondary amino group, or an addition reaction of a hydroxy group-containing monomer or a primary or secondary amino group-containing monomer and monoisocyanate.

Examples of the vinyl monomer having an acidic group include a vinyl monomer having a carboxyl group and a vinyl monomer having a sulfonic acid group.

Examples of the vinyl monomer having a carboxyl group include (meth)acrylic acid, vinylbenzoic acid, maleic acid, maleic acid monoalkylester, fumaric acid, itaconic acid, crotonic acid, cinnamic acid, and acrylic acid dimer. Alternatively, an addition reaction product of a monomer having a hydroxy group such as 2-hydroxyethyl(meth)acrylate, and a cyclic anhydride such as maleic anhydride, phthalic anhydride, and cyclohexanedicarboxylic anhydride, and ω-carboxy-polycaprolactone mono(meth)acrylate may be utilized. Alternatively, as a precursor of a carboxyl group, an anhydride-containing monomer such as maleic anhydride, itaconic anhydride, and citraconic anhydride may be used. Among them, from a viewpoint of copolymerizability, the cost and solubility, (meth)acrylic acid is particularly preferable.

In addition, examples of the vinyl monomer having a sulfonic acid group include 2-acrylamido-2-methylpropanesulfonic acid, and examples of the vinyl monomer having a phosphoric acid group include mono(2-acryloyloxyethyl ester)phosphate, and mono(1-methyl-2-acryloyloxyethyl ester)phosphate.

Further, as the vinyl monomer having an acidic group, a vinyl monomer containing a phenolic hydroxyl group, and a vinyl monomer containing a sulfonamide group may be utilized.

Among the polymer compound represented by the formula (3-1), a polymer compound represented by the following formula (3-3) is preferable.

$$(A^2\text{-}R^F\text{---}S\text{---})_n\text{---}R^E\text{---}(S\text{---}R^G\text{---}P^2)_m \qquad \text{Formula (3-3)}$$

In the formula (3-3), $A^2$ represents a monovalent organic group containing at least one site selected from an organic dye structure, a heterocyclic structure, an acidic group, a group having a basic nitrogen atom, an urea group, an urethane group, a group having a coordinating oxygen atom, a hydrocarbon group with 4 or more carbon atoms, an alkoxysilyl group, an epoxy group, an isocyanate group, and a hydroxy group, and n $A^2$s may be the same or different.

$A^2$ has the same meaning as that of the $A^1$ in the formula (3-1), and this is also true in a preferable aspect.

In the formula (3-3), $R^F$ and $R^G$ each represent independently a single bond or a divalent organic linkage group, n $R^F$s may be the same or different and m $R^G$s may be the same or different.

As the divalent organic linkage group represented by $R^F$ or $R^G$, the same group as that listed as the divalent organic linkage group represented by $R^D$ of the formula (3-1) is used, and this is also true in a preferable aspect.

In the formula (3-3), $R^E$ represents a (m+n)-valent organic linkage group, and m+n satisfies 3 to 10.

The (m+n)-valent organic linkage group represented by $R^E$ includes a group consisting of 1 to 60 carbon atoms, 0 to 10 nitrogen atoms, 0 to 50 oxygen atoms, 1 to 100 hydrogen atoms, and 0 to 20 sulfur atoms, and may be unsubstituted, or may further have a substituent.

As the (m+n)-valent organic linkage group represented by $R^E$, specifically, the same group as that listed as the (m+n)-valent organic linkage group represented by $R^C$ of the formula (3-1) is used, and this is also true in a preferable aspect.

In the formula (3-3), m represents 1 to 8. As m, 1 to 5 is preferable, 1 to 4 is more preferable, and 1 to 3 is particularly preferable.

In the formula (3-3), n represents 2 to 9. As n, 2 to 8 is preferable, 2 to 7 is more preferable, and 3 to 6 is particularly preferable.

In addition, $P^2$ in the formula (3-3) represents a polymer skeleton, and may be selected from the known polymers depending on the purpose, and m $P^2$s may be the same or different. A preferable aspect of the polymer is the same as $P^1$ in the formula (3-1).

Among the polymer compound represented by the formula (3-3), a compound satisfying all of the following $R^E$, $R^F$, $R^G$, $P^2$, m and n is most preferable.

$R^E$: The specific examples (1), (2), (10), (11), (16), or (17)

$R^F$: A single bond, or a divalent organic linkage group consisting of "1 to 10 carbon atoms, 0 to 5 nitrogen atoms, 0 to 10 oxygen atoms, 1 to 30 hydrogen atoms, and 0 to 5 sulfur atoms" constructed by the following structural units or a combination of the structural units (the linkage group may have a substituent, and examples of the substituent include an alkyl group with 1 to 20 carbon atoms such as a methyl group, and an ethyl group, an aryl group with 6 to 16 carbon atoms such as a phenyl group, and a naphthyl group, a hydroxy group, an amino group, a carboxyl group, a sulfonamide group, a N-sulfonylamide group, an acyloxy group with 1 to 6 carbon atoms such as an acetoxy group, an alkoxy group with 1 to 6 carbon atoms such as a methoxy group, and an ethoxy group, a halogen atom such as chlorine, and bromine, an alkoxycarbonyl group with 2 to 7 carbon atoms such as a methoxycarbonyl group, an ethoxycarbonyl group, and a cyclohexyloxycarbonyl group, a cyano group, and a carbonic acid ester group such as t-butyl carbonate.)

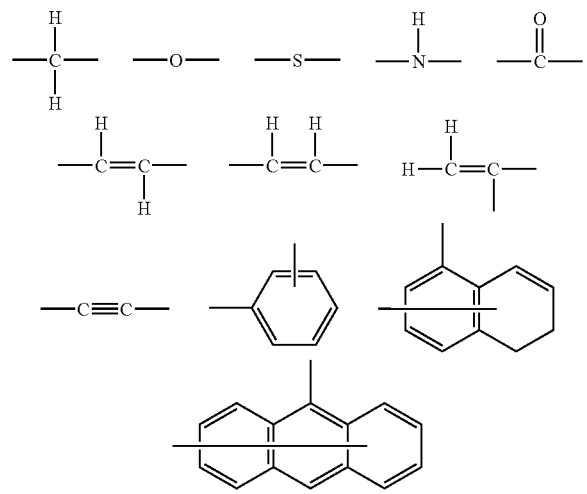

$R^G$: A single bond, an ethylene group, a propylene group, the following group (a), or the following group (b)

In the following group, $R^{25}$ represents a hydrogen atom or a methyl group, and l represents 1 to 2.

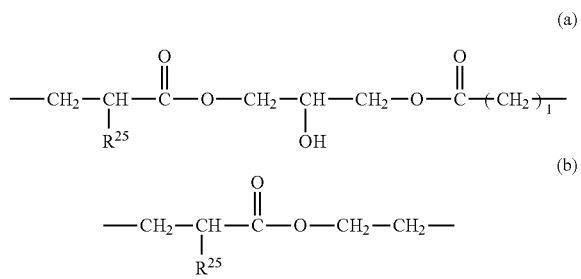

$P^2$: A vinyl monomer polymer or copolymer, an ester-based polymer, an ether-based polymer, a urethane-based polymer and a modified polymer thereof m: 1 to 3
n: 3 to 6

Among a preferable form of the polymer compound represented by the formula (3-3) (the form satisfying all of $R^E$, $R^F$, $R^G$, $P^2$, m and n), a form in which $A^2$ is a monovalent organic group containing at least one site selected from an organic dye structure, a heterocyclic structure, an acidic group having a basic nitrogen atom, an urea group, and a hydrocarbon group with 4 or more carbon atoms is preferable.

Inter alia, a form in which $A^2$ is an organic dye structure or a heterocyclic structure is particularly preferable because of strong adsorption onto the pigment.

Particularly, a form in which $A^2$ has any heterocyclic structure of the formula (2) to the formula (4) is preferable because of particularly strong adsorption onto the pigment.

It is preferable that the specific polymer compound in the invention contains a carboxyl group in a range of from 50 mg KOH/g to 200 mg KOH/g in its molecule. That is, in order to suppress generation of a precipitate in a developer when the colored photosensitive composition is applied and this is subjected to development and, further, effectively suppress generation of a secondary aggregate which is an aggregate of a primary particle of the pigment, or effectively weaken an aggregating force of a secondary aggregate, a carboxyl group is preferably contained in a range of from 50 mg KOH/g to 200 mg KOH/g.

A preferable molecular weight of the specific polymer compound according to the invention is preferably such that a weight average molecular weight (Mw) is in a range of 1,000 to 100,000, and a number average molecular weight (Mn) is in a range of 400 to 50,000. It is more preferable that a weight average molecular weight (Mw) is in a range of 5,000 to 50,000, and a number average molecular weight (Mn) is in a range of 2,000 to 30,000. Particularly, it is most preferable that a weight average molecular weight (Mw) is in a range of 8,000 to 30,000, and a number average molecular weight (Mn) is in a range of 4,000 to 12,000.

That is, from a viewpoint of generation of a secondary aggregate which is an aggregate of a primary particle of the pigment is effectively suppressed, or an aggregating force of a secondary aggregate is effectively weakened, a weight average molecular weight (Mw) of the specific polymer compound of the invention is 1,000 or more. In addition, from a viewpoint of developability upon manufacturing of the coloring filter from the photocuring composition containing the pigment-dispersed composition, it is preferable that a weight average molecular weight (Mw) of the specific polymer compound of the invention is 100,000 or less.

A content of the specific polymer compound according to the invention in the pigment-dispersed composition of the invention is preferably i) pigment: iv) specific polymer compound=1:0.01 to 1:2, more preferably 1:0.05 to 1:1, further preferably 1:0.1 to 1:0.6 as expressed by a mass ratio.

(Synthesis Method)

The (SP-1) polymer compound of the invention may be produced by a conventional radical polymerization method using, for example, the monomer represented by the formula (1), the polymerizable oligomer (macromonomer), and other radical polymerization compound as a copolymerization component. Generally, a suspension polymerization method or a solution polymerization method is used.

The (SP-2) specific graft-type polymer compound of the invention may be produced by a conventional radical polymerization method using a polymerizable monomer for forming a main chain structure, a polymerizable oligomer (macromonomer) for forming a branch of a polymer and, preferably, a monomer having a functional group adsorbable onto the pigment, a representative of which is the monomer represented by the formula (1) and, further, optionally, other radical polymerizable compound as a copolymerization component. Generally, a suspension polymerization method or a solution polymerization method is used.

The polymer compound represented by the formula (3-1) of the invention (including the compound represented by the formula (3-3)) may be synthesized by the following method or the like without any limitation.

1. A method of polymer-reacting a polymer with a functional group selected from a carboxyl group, a hydroxyl group and an amino group introduced at an end acid halide having a plurality of the adsorption sites, alkyl halide having a plurality of the adsorption sites, or isocyanate having a plurality of the adsorption sites.

2. A method of Michael addition-reacting a polymer with a carbon-carbon double bond introduced at an end and mercaptan having a plurality of the adsorption sites.

3. A method of reacting a polymer with a carbon-carbon double bond introduced at an end and mercaptan having the adsorption site in the presence of a radical generator.

4. A method of reacting a polymer with a plurality of mercaptans introduced at an end and a compound having a carbon-carbon double bond and a compound having the adsorption site in the presence of a radical generator.

5. A method of radical-polymerizing a vinyl monomer in the presence of a mercaptan compound having a plurality of the adsorption sites.

Among the foregoing, for the specific polymer compound of (SP-3) of the invention, 2, 3, 4 and 5 synthesis methods are preferable, and 3, 4 and 5 synthesis methods are more preferably from easiness of the synthesis. Particularly, when the specific polymer compound of (SP-3) of the invention has a structure represented by the formula (3-3), it is most preferable to synthesize the compound by the synthesis method 5 from easiness of synthesis.

As the synthesis method 5, more specifically, a method of radical-polymerizing a vinyl monomer in the presence of the compound represented by the following formula (3-4).

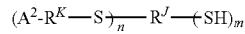

Formula (3-4)

The formula (3-4), $R^J$, $R^K$, $A^3$, m and n have the same meanings as those of $R^E$, $R^F$, $A^2$, m and n in the formula (3-3), respectively, and a preferable form thereof is the same as that of the formula (3-3).

The compound represented by the formula (3-4) may be synthesized by the following method, but from easiness of synthesis, the following method 7 is more preferable.

6. A method of converting a halide compound having a plurality of the adsorption sites into a mercaptan compound (examples include a method of reacting with thiourea to hydrolyze the compound, a method of directly reacting with NaSH, and a method of reacting with $CH_3COSNa$ to hydrolyze the compound).

7. A method of addition-reacting a compound having 3 to 10 mercapto groups in one molecule, and a compound having the adsorption sites, and a functional group capable of reacting with a mercapto group.

Preferable examples of the "functional group capable of reacting with a mercapto group" in the synthesis method 7 include acid halide, alkyl halide, isocyanate, and a carbon-carbon double bond.

It is particularly preferable that the "functional group capable of reacting with a mercapto group" is a carbon-carbon double bond, and the addition reaction is a radical addition reaction. As the carbon-carbon double bond, a mono-substituted or di-substituted vinyl group is more preferable from a viewpoint of reactivity with a mercapto group.

Specific examples [Specific Examples (18) to (34)] of the compound having 3 to 10 mercapto groups in one molecule include the following compounds.

(18)

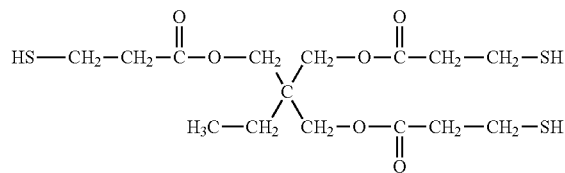

(19)

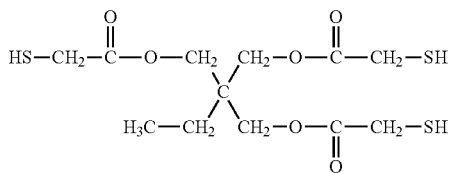

(20)

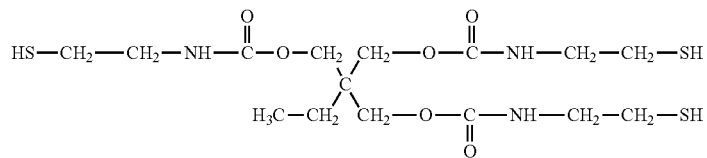

(21)

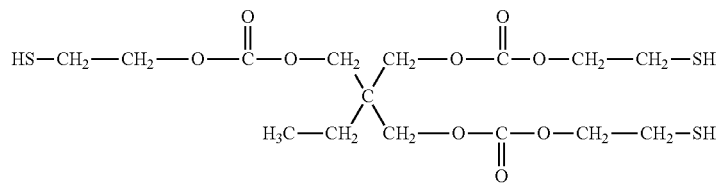

(22)

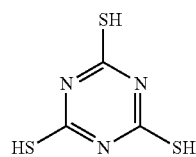

(23)

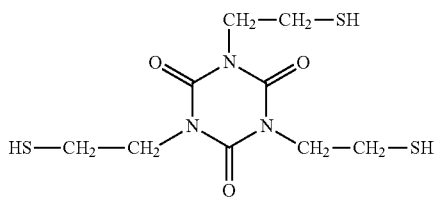

(24)
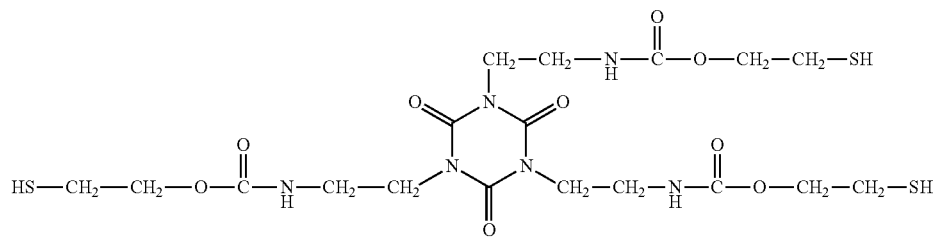
(25)
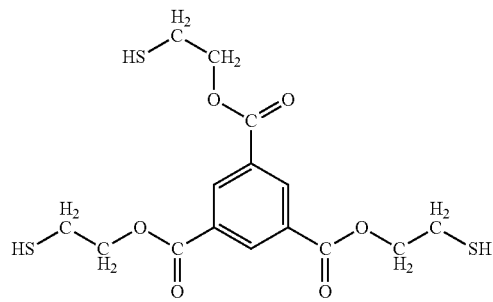
(26)
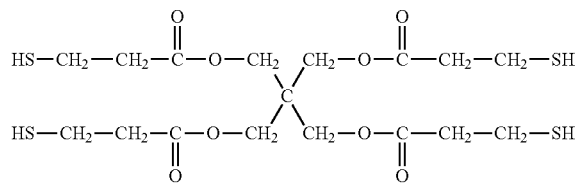
(27)
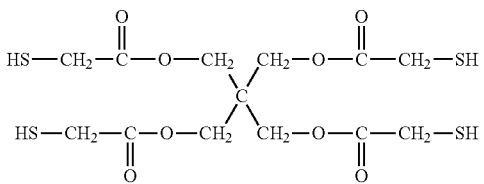
(28)
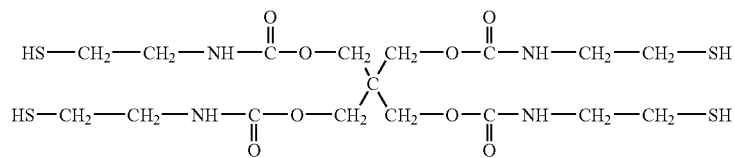
(29)
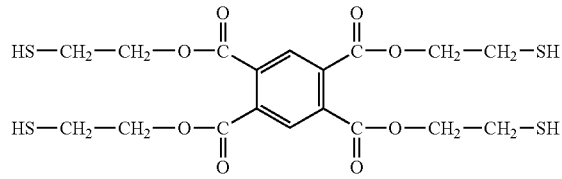
(30)
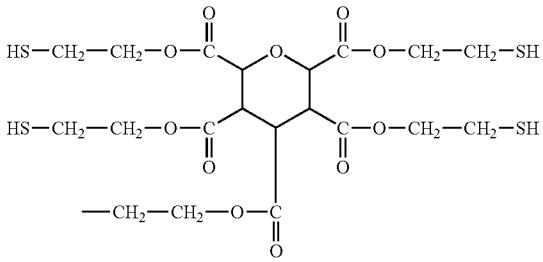
(31)
(32)
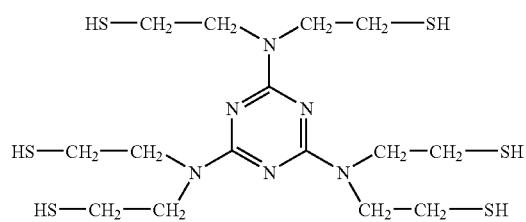

-continued
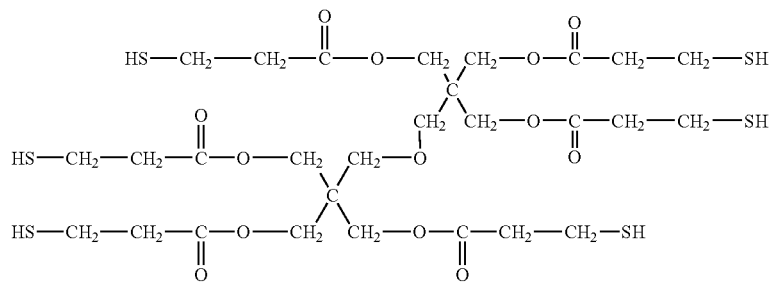
(33)
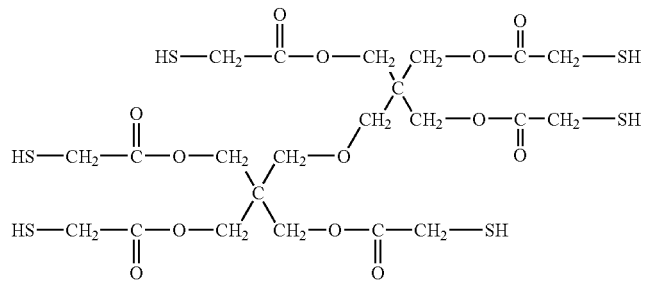
(34)
Among the foregoing, from a viewpoint of availability of a raw material, easiness of synthesis, and solubility in various solvents, a particularly preferable compound is the following the compound.
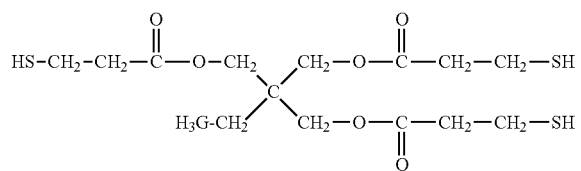
(18)
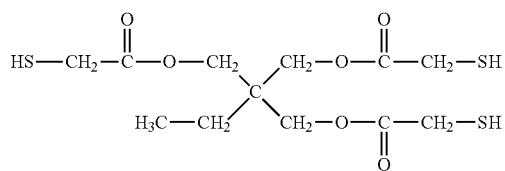
(19)
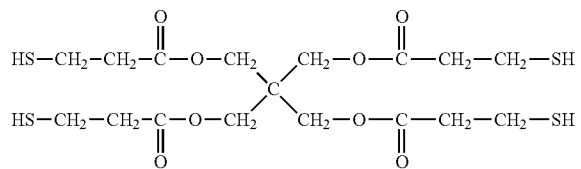
(27)
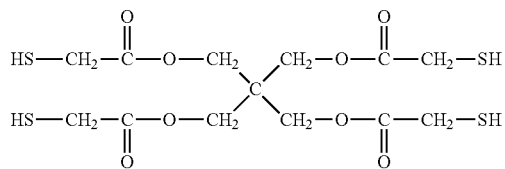
(28)
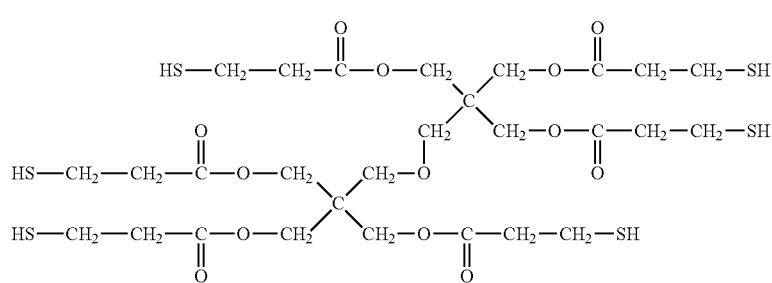
(33)

-continued (34)

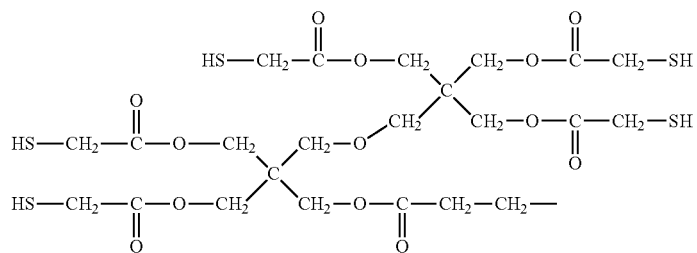

Examples of the compound having the adsorption site and having a carbon-carbon double bond (specifically, a compound having at least one site selected from an organic dye structure, a heterocyclic structure, an acidic group, a group having a basic nitrogen atom, an urea group, an urethane group, a group having a coordinating oxygen atom, a hydrocarbon group with 4 or more carbon atoms, an alkoxysilyl group, and an epoxy group, an isocyanate group, and a hydroxy group, and having a carbon-carbon double bond) are not particularly not limited, but include the following compounds.

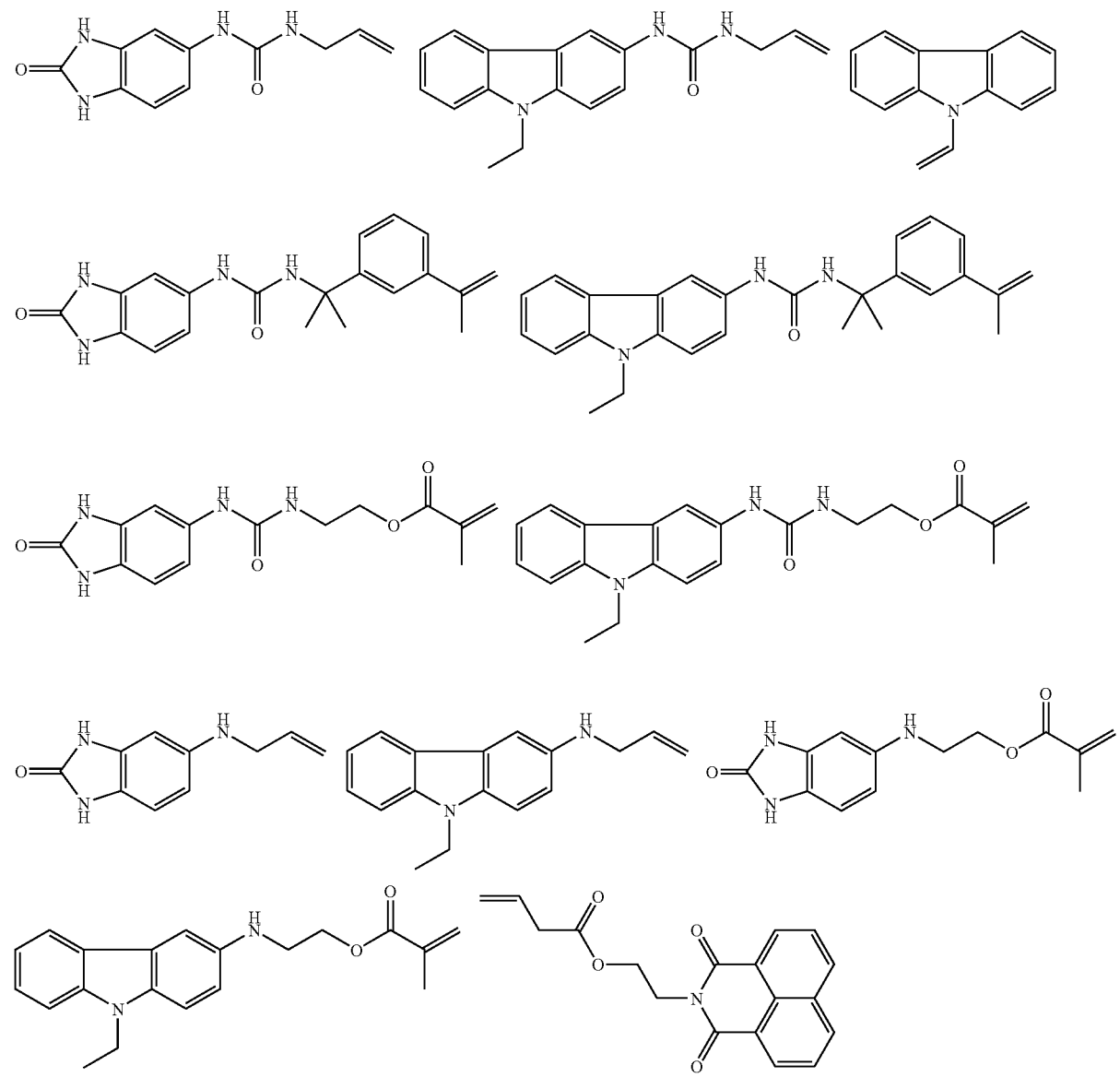

-continued
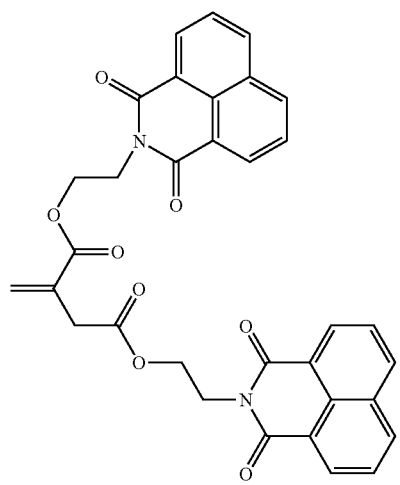
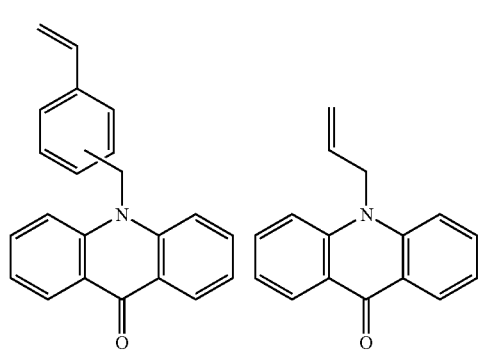
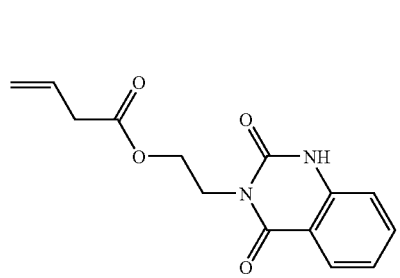
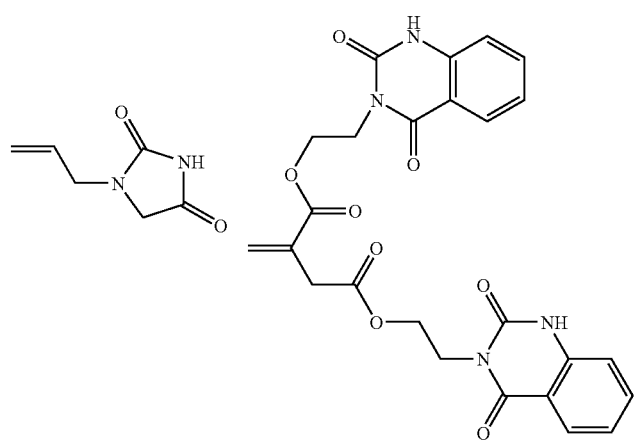
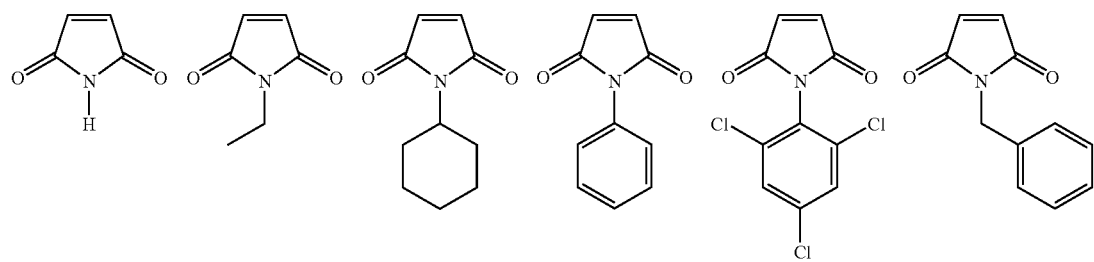
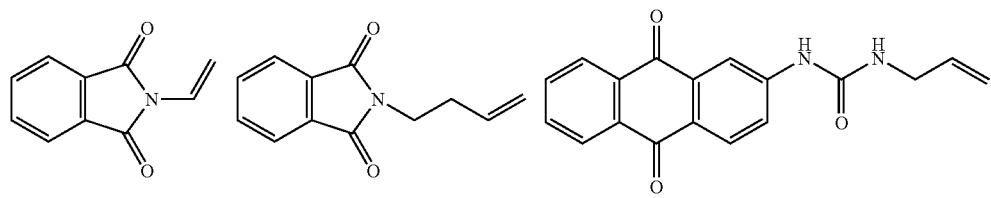
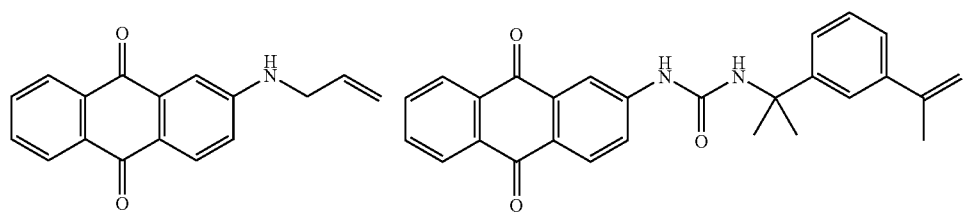

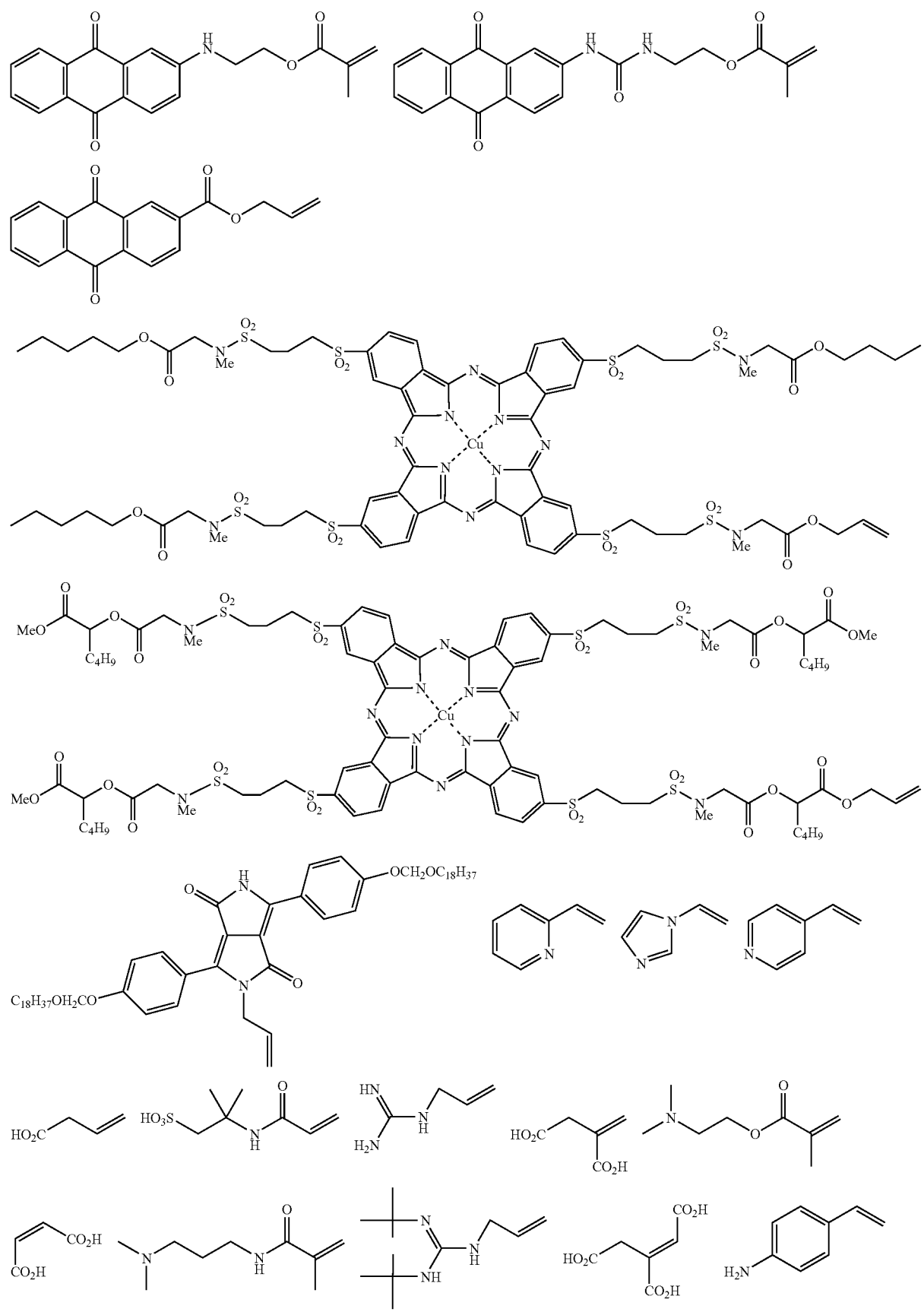
-continued

-continued
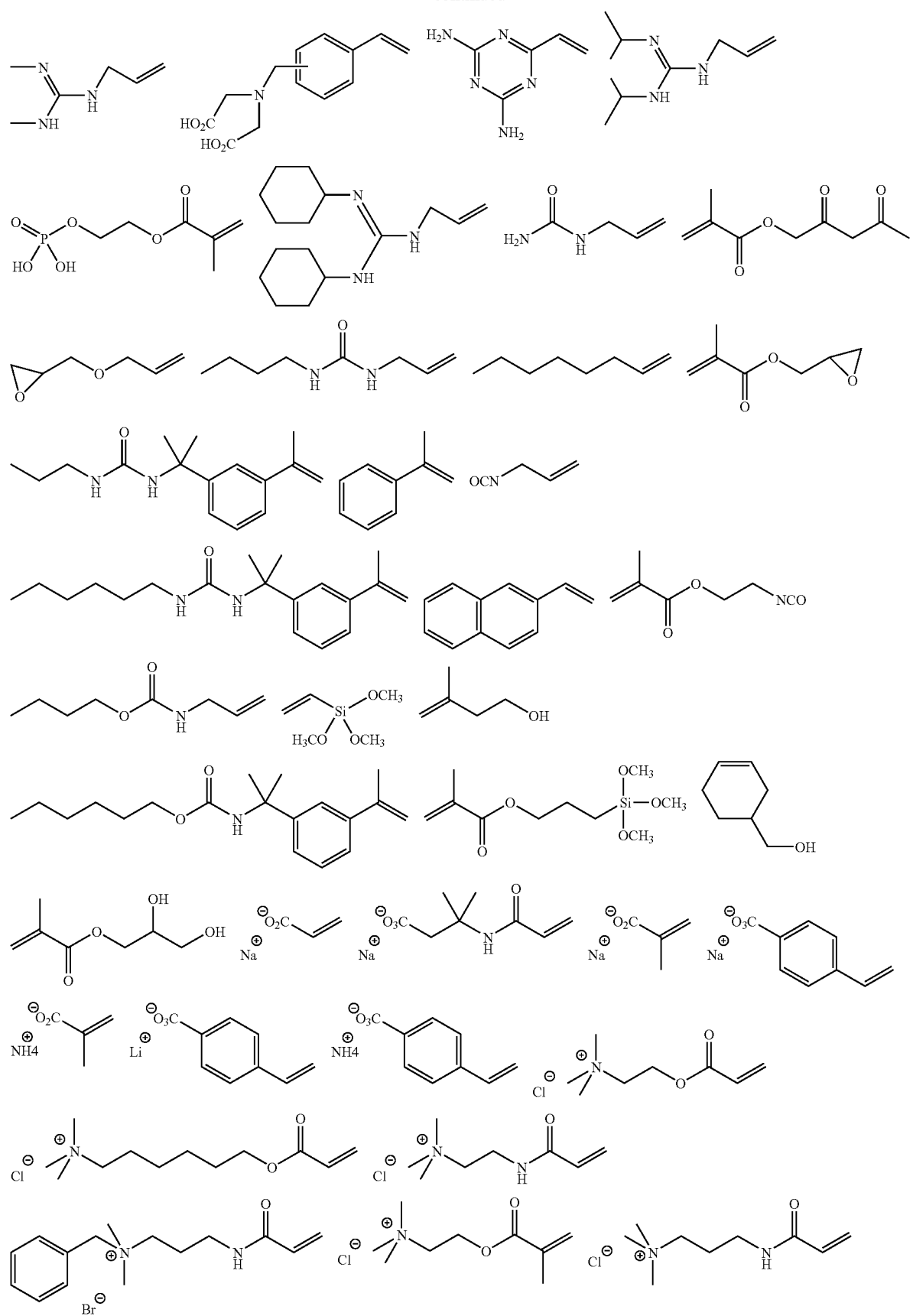

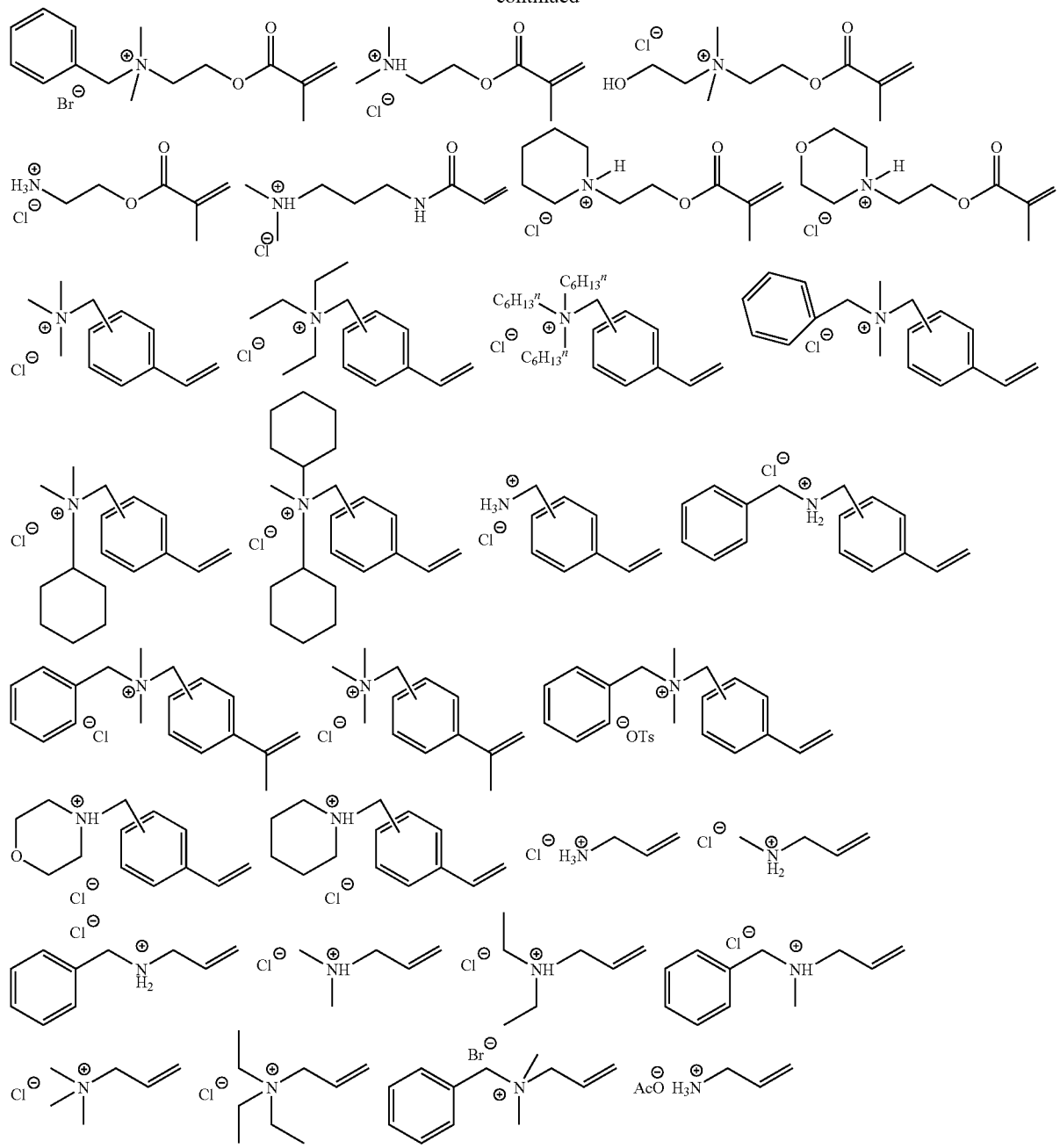

-continued

A radical addition reaction product of the "compound having 3 to 10 mercapto groups in one molecule", and the "compound having the adsorption site and having a carbon-carbon double bond" is obtained by utilizing a method of dissolving the "compound having 3 to 10 mercapto groups in one molecule" and the "compound having the adsorption site, and having a carbon-carbon double bond" in a suitable solvent, and adding a radical generator thereto to perform addition at about 50° C. to 100° C. (thiol-ene reaction method).

An example of a suitable solvent used in the thiol-ene reaction method may be arbitrarily selected depending on solubilities of the "compound having 3 to 10 mercapto groups in one molecule", the "compound having the adsorption site, and having a carbon-carbon double bond" and a "produced radical addition reaction product" used.

Examples include methanol, ethanol, propanol, isopropanol, 1-methoxy-2-propanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. These solvents may be used by mixing two or more of solvents.

As the radical generator, an azo compound such as 2,2'-azobis(isobutyronitrile) (AIBN), 2,2'-azobis-(2,4'-dimethylvaleronitorile), and dimethyl 2,2'-azobisisobutyrate, peroxide such as benzoyl peroxide, and a persulfate salt such as potassium persulfate, and ammonium persulfate may be utilized.

The vinyl monomer used in the 5 synthesis method is not particularly limited, but for example, the same vinyl monomer as that used when a polymer skeleton represented by $P^1$ of the formula (3-1) is obtained, is used.

Only one of the vinyl monomer is polymerized, or two or more may be used together to copolymerized them.

In addition, when applied to a photosensitive composition requiring alkali development treatment, it is more preferable that the specific polymer compound of (SP-3) of the invention is obtained by copolymerizing one or more of vinyl monomers having an acidic group, and one or more of vinyl monomers having no acidic group.

As the (SP-3) specific polymer compound in the invention, a compound obtained by polymerization according to the known conventional method using these vinyl monomers and the compound represented by the formula (3-4) is preferable. The compound represented by the formula (3-4) in the invention functions as a chain transfer agent, and is simply referred to as "chain transfer agent" hereinafter.

For examples, the (SP-3) specific polymer compound may be obtained by utilizing a method of dissolving these vinyl monomers and the chain transfer agent in a suitable solvent, and adding a radical polymerization initiator thereto to polymerize the monomer in a solution at about 50° C. to 220° C. (solution polymerization method).

An example of a suitable solvent used in the solution polymerization method and the suspension polymerization method may be arbitrarily selected depending on solubilities of a monomer used, and a produced copolymer. Examples include methanol, ethanol, propanol, isopropanol, butanol, ethylene glycol monomethyl ether, ethylene glycol monoethyl ether, 2-methoxyethyl acetate, 1-methoxy 2-propanol, 1-methoxy-2-propyl acetate, acetone, methyl ethyl ketone, methyl isobutyl ketone, cyclohexanone, methoxypropyl acetate, methyl lactate, ethyl lactate, ethyl acetate, acetonitrile, tetrahydrofuran, dimethylformamide, N,N-dimethylacetamide, dimethyl sulfoxide, ethylene dichloride, chloroform, and toluene. These solvents may be used by mixing two or more.

As the radical polymerization initiator, an azo compound such as 2,2'-azobis(isobutyronitrile) (AIBN), 2,2'-azobis-(2,4'-dimethylvaleronitrile), and dimethyl 2,2'-azobisisobutyrate, and a persulfate salt such as potassium persulfate, and ammonium persulfate may be utilized.

[Production of Processed Pigment]

A process for producing the processed pigment in which the specific polymer compound is covered in the invention will be explained below.

Production of the processed pigment of the invention is performed via a mixing i) a pigment, ii) a water-soluble inorganic salt, iii) a small amount of a water-soluble organic solvent which does not substantially dissolve ii) the water-soluble inorganic salt, and iv) the specific polymer compound, and mechanically kneading the mixture with a kneader or the like (this step is referred to as salt milling), a placing this mixture in water, and stirring this with a high speed mixer into a slurry and, further, a filtering this slurry, washing this with water, thereafter, drying it.

By such process, the processed pigment of the invention which is fine, and produces little aggregation of the pigment at drying is obtained.

The process for producing the processed pigment will be explained more specifically.

First, a small amount of iii) a water-soluble organic solvent as a wetting agent is added to a mixture of i) an organic pigment and ii) a water-soluble inorganic salt. After the mixture is strongly kneaded with a kneader, and this mixture is placed into water, and stirred with a high speed mixture into a slurry.

Herein, examples of the kneader used in salt milling include a two-roll, a three-roll, a ball mill, a tron mill, a disperser, a kneader, a cokneader, a homogenizer, a blender, and a monoaxial or biaxial extruder.

In the invention, by using iii) the organic solvent together with iv) the specific polymer compound at salt milling, the processed pigment which is finer, and in which a surface is covered with iv) the specific polymer compound, and aggregation of the pigment at drying occurs not frequently is obtained.

As timing of adding iv) the specific polymer compound, all of the compound may be added at an initial stage of a salt milling step, or may be added by dividing it.

Then, this slurry is filtered, washed with water and, if necessary, dried, thereby, a miniaturized pigment, that is, the processed pigment of the invention is obtained.

When the pigment is used by dispersing in an oily vanish, the treated pigment (called filtration cake) before drying may be also dispersed in the oily vanish while water is removed, by a method which is generally called flushing. Alternatively, when the pigment is dispersed in an aqueous vanish, it is not necessary to dry the treated pigment, and the filtration cake may be dispersed in a vanish as it is.

As a method of preventing drying aggregation, an alkali-soluble resin dissolved in an alkali aqueous solution is added to the slurry, and after sufficient stirring and mixing, this is neutralized with an acidic aqueous solution such as hydrochloric acid and sulfuric acid to sediment the resin on the pigment, or an aqueous solution of a water-soluble polyvalent metal salt such as potassium chloride and barium chloride is added to precipitate the resin so as to sediment on the pigment, thereby, drying aggregation may be also prevented.

Respective components used upon manufacturing of the processed pigment of the invention will be explained below.

[i) Pigment]

Various conventional inorganic pigments or organic pigments can be suitably selected and used for the pigment used in the present invention. High transmissivity is preferable for a pigment when the processed pigment of the present invention is used for the colored pattern of a color filter, and in consideration thereof, such a pigment is preferably an organic pigment and also preferably a pigment with as small a particle size as possible. When such factors as the handling characteristics of the photosensitive composition containing a pigment dispersion composition are taken into consideration, the average primary particle size of processed pigment is preferably 100 nm or less, 30 nm or less is more preferable, and 5 nm to 25 nm is the most preferable. Transmissivity is high and color characteristics are good when the particle size is within these ranges, and so such a pigment is effective for forming a color filter of the high contrast. The average primary particle size is derived by observation using a SEM or TEM, measuring the size of 100 particles in portions where particles are not aggregated together, and computing the average primary particle size thereof. It should be noted that the particle size of the pigment before milling is about 10 nm to 300 nm.

Examples of the inorganic pigment include metal oxides, metal complex salts, and other metal compounds. Specifically, the pigment is, for example, an oxide of a metal such as iron, cobalt, aluminum, cadmium, lead, copper, titanium, magnesium, chromium, zinc or antimony, or a complex oxide of the metal.

Examples of the Organic Pigment May Include:

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279;

C. I. Pigment Yellows 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214;

C. I. Pigment Orange 2, 5, 13, 16, 17:1, 31, 34, 36, 38, 43, 46, 48, 49, 51, 52, 55, 59, 60, 61, 62, 64, 71, 73;

C. I. Pigment Green 7, 10, 36, 37;

C. I. Pigment Blue 1, 2, 15, 15:1, 15:2, 15:3, 15:4, 15:6, 16, 22, 60, 64, 66, 79, a substituted one of Pigment Green 79 with hydroxyl group instead of chloro-group, 80;

C. I. Pigment Violet 1, 19, 23, 27, 32, 37, 42;

C. I. Pigment Brown 25, 28;

C. I. Pigment Black 1, 7.

However, in the invention, examples of the organic pigment are not limited to the described examples.

Among above, preferable examples of the organic pigment in the exemplary embodiments of the present invention may include:

C. I. Pigment Yellows 11, 24, 108, 109, 110, 138, 139, 150, 151, 154, 167, 180, 185;

C. I. Pigment Orange 36, 71;

C. I. Pigment Reds 122, 150, 171, 175, 177, 209, 224, 242, 254, 255, 264;

C. I. Pigment Violet 19, 23, 32;

C. I. Pigment Blues 15:1, 15:3, 15:6, 16, 22, 60, 66;

C. I. Pigment Green 7, 36, 37;

C. I. Pigment Black 1, 7.

These organic pigments may be used alone or, to raise the color purity, may be used in combinations of two or more thereof. Specific examples of such combinations are described below.

For example, red pigments that can be used as a single pigment include an anthraquinone pigment, a perylene pigment, and a diketopyrrolopyrrole pigment, and one or more of these pigments may be used in combination with a disazo yellow pigment, an isoindoline yellow pigment, a quinophthaline yellow pigment, or a perylene red pigment, an anthraquinone red pigment, and/or a diketopyrrolopyrrole pigment. For example, the anthraquinone pigment may be C. I. Pigment Red 177, the perylene pigment may be C. I. Pigment Red 155 or C. I. Pigment Red 224, and the diketopyrrolopyrrole pigment may be C. I. Pigment Red 254. From the viewpoint of color reproducibility, a combination thereof with C. I. Pigment Yellow 83, C. I. Pigment Yellow 139 or C. I. Pigment Red 177 is preferable. The ratio by mass of the red pigment to the yellow pigment is preferably from 100:5 to 100:80. When the ratio is 100:5 or below, it is difficult to suppress transmittance of light from 400 nm to 500 nm, and sometimes the color purity cannot be raised. Furthermore, if the ratio is 100:80 or above, then sometimes the color strength falls. In particular, the above mass ratio is optimally in the range of 100:10 to 100:65. When a combination of red pigments is used adjustments may be made according to the chromaticity thereof.

Examples of a green pigment that can be used include a halogenated phthalocyanine pigment used alone, and a halogenated phthalocyanine pigment used in combination with a disazo yellow pigment, a quinophthalone yellow pigment, an azomethine yellow pigment and/or an isoindoline yellow pigment.

Such examples include a mixture of C. I. Pigment Green 7, 36 or 37 with C. I. Pigment Yellow 83, 138, 139, 150, 180 or 185. The ratio by mass of green pigment to yellow pigment is preferably from 100:5 to 100:200. When the ratio is less than 100:5, it becomes difficult to suppress transmittance of light from 400 nm to 450 nm, and sometimes the color purity cannot be raised. Furthermore, if the ratio exceeds 100:200, the main wave length is biased to the long wavelength side, and sometimes there is a large difference to the target NTSC hue. The range of 100:20 to 100:150 is particularly preferable for the above mass ratio.

Examples of a blue pigment include a phthalocyanine pigment used alone, or a phthalocyanine pigment used in combination with a dioxazine violet pigment.

A preferable example is a combination of C. I. Pigment Blue 15:6 with C. I. Pigment Violet 23. The ratio by mass of the blue pigment to the violet pigment is preferably from 100:0 to 100:100, and 100:70 or below is more preferable.

Suitable pigments for use in a black matrix include carbon black, graphite, titanium black, iron oxide, or titanium oxide, either used singly or in combinations thereof, and a combination of carbon black and titanium black is preferable. The mass ratio of carbon black to titanium black is preferably in the range of 100:0 to 100:60. When the mass ratio is greater than 100:61 the dispersion stability may be reduced.

[ii] Water-Soluble Inorganic Salt]

The water-soluble inorganic salt used in the invention is not particularly limited as far as it is dissolved in water, but sodium chloride, barium chloride, potassium chloride, and sodium sulfate may be used, and it is preferable to use sodium chloride or sodium sulfate from a viewpoint of the cost.

It is preferable that an amount of the inorganic salt used upon salt milling is 1 to 30-fold by mass, particularly 5 to 25-fold by mass of an organic pigment from a viewpoint of both of treatment efficacy and production efficacy.

This is because as an amount ratio of the inorganic salt relative to the organic pigment is larger, miniaturization efficacy is high, but one time treatment amount of the pigment is reduced.

[iii] A Small Amount of a Water-Soluble Organic Solvent which Does Not Substantially Dissolve ii) a Water-Soluble Inorganic Salt]

The water-soluble organic solvent used in the invention functions to wet the pigment and the water-soluble inorganic salt, and the water-soluble organic solvent is not particularly limited as far as it is dissolved in (miscible with) water and does not substantially dissolve the water-soluble inorganic salt to be used together.

However, since a temperature is risen at salt milling, and the system is brought into the state where a solvent is easily evaporated, a high boiling point solvent having a boiling point of 120° C. or higher is preferable from a viewpoint of safety.

Examples of the water-soluble organic solvent used in the invention include 2-methoxyethanol, 2-butoxlyethanol, 2-(isopentyloxy)ethanol, 2-(hexyloxy)ethanol, ethylene glycol, diethylene glycol, diethylene glycol monoethyl ether, diethylene glycol monoethyl ether acetate, diethylene glycol monobutyl ether, triethylene glycol, triethylene glycol monomethyl ether, liquid polyethylene glycol, 1-methoxy-2-propanol, 1-etoxhy-2-propanol, dipropylene glycol, dipropylene glycol monomethyl ether, dipropylene glycol monoethyl ether, and liquid polypropylene glycol.

An addition amount of the water-soluble organic solvent is preferably 5% by mass to 50% by mass based on the water-soluble inorganic solvent, more preferably 10% by mass to 40% by mass based on the water-soluble inorganic salt, most suitably 15% by mass to 35% by mass based on the water-soluble inorganic salt. When the addition amount is less than 5% by mass, uniform kneading becomes difficult and a distribution of a particle size of the pigment becomes too large, being not preferable. When the addition amount is 50% by mass or more, since a kneaded composition becomes too soft, and it becomes difficult to impart shear to the kneaded composition, the sufficient miniaturization effect is not obtained.

In the invention, the water-soluble organic solvent may be added at its all amount at an initial stage of salt milling, or may be added by dividing it.

In addition, the water-soluble organic solvent may be used alone, or two or more may be used together.

In the invention, the specific polymer compound used in soft milling is used preferably in a range of pigment: specific polymer compound=1:0.01 to 1:2, more preferably in a range of 1:0.05 to 1:1, further preferably in a range of 1:0.1 to 1:0.6, as expressed by a mass ratio.

By using the compound in this range, generation of a secondary aggregate which is an aggregate of a primary particle of the pigment may be effectively suppressed, or an aggregating force of a secondary aggregate may be effectively weakened.

In addition, if necessary, in addition to the specific polymer compound, other polymer compound may be used together in such a range that the effect of the invention is not deteriorated.

As other polymer compound, a polymer compound which is solid at room temperature, and water-insoluble, and at least a part of which is soluble in the water-soluble organic solvent used in a wetting agent at salt milling is preferable, and a natural resin, a modified natural resin, a synthetic resin, a synthetic resin modified with a natural resin are used.

In the invention, when the dry processed pigment is obtained, as other polymer compound, a polymer compound which is solid at room temperature is preferable.

As the natural resin, rosin is representative, and examples of the modified natural resin include a rosin derivative, a cellulose derivative, a rubber derivative, a protein derivative and an oligomer thereof.

Examples of the synthetic resin include an epoxy resin, an acryl resin, a maleic acid resin, a butyral resin, a polyester resin, a melamine resin, a phenol resin, and a polyurethane resin. Examples of the synthetic resin modified with a natural resin include a rosin-modified maleic acid resin, and a rosin-modified phenol resin.

Examples of the synthetic resin include polyamidoamine and a salt thereof, polycarboxylic acid and a salt thereof, a high-molecular unsaturated acid ester, polyurethane, polyester, poly(meth)acrylate, a (meth)acryl-based copolymer, and a naphthalenesulfonic acid formalin condensate.

Upon manufacturing of the processed pigment of the invention, when the specific polymer compound and other polymer compound are used together, a ratio of other polymer compound is preferably 50% by mass or less, more preferably 15% by mass or less based on a total polymer compound.

Since the processed pigment of the invention manufactured as described above is excellent in adsorbability onto the pigment, and is covered with the specific polymer compound excellent in dispersibility in a solvent, when formulated into a pigment-dispersed composition as described below, the processed pigment may be made to be excellent in dispersibility and dispersion stability.

<Pigment-Dispersed Composition>

Then, the pigment-dispersed composition of the invention will be explained.

The pigment-dispersed composition of the invention is characterized in that the processed pigment of the invention is dispersed in an organic solvent.

In addition, when the processed pigment of the invention is dispersed in an organic solvent, it is a preferable form to use further (A) a pigment derivative, and (B) a pigment dispersant.

[Processed Pigment]

A content of the processed pigment of the invention in the pigment-dispersed composition of the invention is appropriately selected depending on utility of the pigment-dispersed composition. For example, when the pigment is used upon manufacturing of a color filter for utility of a liquid crystal color display, the content is preferably 5 to 50% by mass, more preferably 10 to 30% by mass, further preferably 10 to 20% by mass from a viewpoint of color reproduction region and handling property (viscosity).

In addition, in a general -use range, for example, a content of the processed pigment of the invention in the pigment-dispersed composition of the invention including application of the pigment-dispersed composition of the invention to an ink for ink jet is preferably 5 to 80% by mass.

[Organic Solvent]

There are no particular limitations to the organic solvent used with the pigment dispersion composition, and known organic solvents may be suitably selected. Examples thereof include: (poly)alkylene glycol monoalkyl ethers, such as 1-methoxy-2-propyl acetate, 1-methoxy-2-propanol, ethylene glycol monomethyl ether, ethylene glycol monoethyl ether, propylene glycol monomethyl ether, propylene glycol monoethyl ether, diethylene glycol monomethyl ether, and ethylene glycol monoethyl ether; acetate esters, such as ethyl acetate, n-propyl acetate, i-propyl acetate, n-butyl acetate, and i-butyl acetate; aromatic hydrocarbons, such as benzene, toluene and xylene; ketones, such as methyl ethyl ketone, acetone, methyl isobutyl ketone, and cyclohexanone; alcohols, such as ethanol, propanol, butanol, hexanol, cyclohexanol, ethylene glycol, diethylene glycol, and glycerin; and the like. Preferable examples from among these are alkylene glycol monoalkyl ethers, acetate esters thereof, acetate esters, and methyl ethyl ketone. These organic solvents may be used singly or in combinations of two or more thereof.

The amount contained of the organic solvent in the pigment dispersion composition of the present invention is suitably selected according to the application and the like of the pigment dispersion composition. When the pigment dispersion composition is used for preparation of the later described photosensitive composition, the solids concentration contained of the processed pigment and the dispersant and the like in the pigment dispersion composition may be 5 mass % to 50 mass %, from the standpoint of handling characteristics.

[Pigment Dispersant]

A known pigment dispersant can also be added to the pigment dispersion composition of the present invention, in order to further raise the dispersibility of the pigment. Examples of such known pigment dispersants include polymer dispersants, (such as, for example, polyamideamine and salts thereof, polycarboxylic acid and salts thereof, a high molecular weight unsaturated acid ester, a modified polyurethane, a modified polyester, a modified poly(meth)acrylate, a (meth)acrylate copolymer, or a naphthalenesulfonic acid formaldehyde condensate), and polyoxyethylene alkyl phosphate esters, polyoxyethylene alkylamines, alkanolamines and the like. Polymer dispersants can be further classified into straight chain polymers, terminal modified polymer compounds, graft type polymer compounds, and block polymer compounds according to their structures.

Polymer dispersants act by adsorbing to the surface of a processed pigment in combination with the specific polymer compound thereby preventing pigment re-aggregation. Examples of preferable structures thereof having an anchoring site to the pigment surface include terminal modified polymer compounds, graft polymer compounds, and block polymer compounds.

On the other hand, the pigment derivative, has the effect of promoting adsorption of the polymer dispersant by modifying a pigment surface.

The polymer dispersant, like the specific polymer compound of the invention, is adsorbed onto a surface of the pigment, and acts to prevent re-aggregation in a dispersing step. For this reason, a block-type polymer, a graft-type polymer, and a terminal modified-type polymer having an anchoring site onto a pigment surface may be exemplified as a preferable structure. On the other hand, the pigment derivative, has the effect of promoting adsorption of the polymer dispersant by modifying a pigment surface.

Explanation will now be given of block polymer compounds, graft type polymer compounds and terminal modified polymer compounds that are suitable as polymer dispersants for the present invention.

(Block Polymer Compound)
There are no particular limitations to block polymer compounds used as the polymer dispersant, and block polymers with pigment adsorbing blocks and block polymers with non-pigment adsorbing blocks can be used. There are no particular limitations to monomers which configure such pigment adsorbing blocks, and, for example, monomers can be used which have a pigment adsorbing functional group. Specific examples thereof include monomers having an organic dye structure or a heterocyclic structure, monomers having an acidic group, monomers having a basic nitrogen atom, and the like. Explanation will now be given of monomers having an organic dye structure or a heterocyclic structure, monomers having an acidic group, and monomers having a basic nitrogen atom, which are preferable monomers for configuring a pigment adsorbing block.

Examples of monomers having an organic dye structure or a heterocyclic structure include: phthalocyanine-, insolubule azo-, azo lake-, anthraquinone-, quinacridone-, dioxazine-, diketopyrolopyrrole-, anthrapyridine-, anthanthrone-, indanthrone-, flavanthrone-, perinone-, perylene- and thioindigo-dye structures; and heterocyclic structure such as thiophene, furan, xanthene, pyrrole, pyrroline, pyrrolidine, dioxolane, pyrazole, pyrazoline, pyrazolidine, imidazole, oxazol, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, succinic imide, phthalimide, naphthalimide, hydantoin, indole, quinoline, carbazole, acridine, acridone, and anthraquinone.

Although there are no particularly limitations, more specific examples of such a monomer include the following structures.

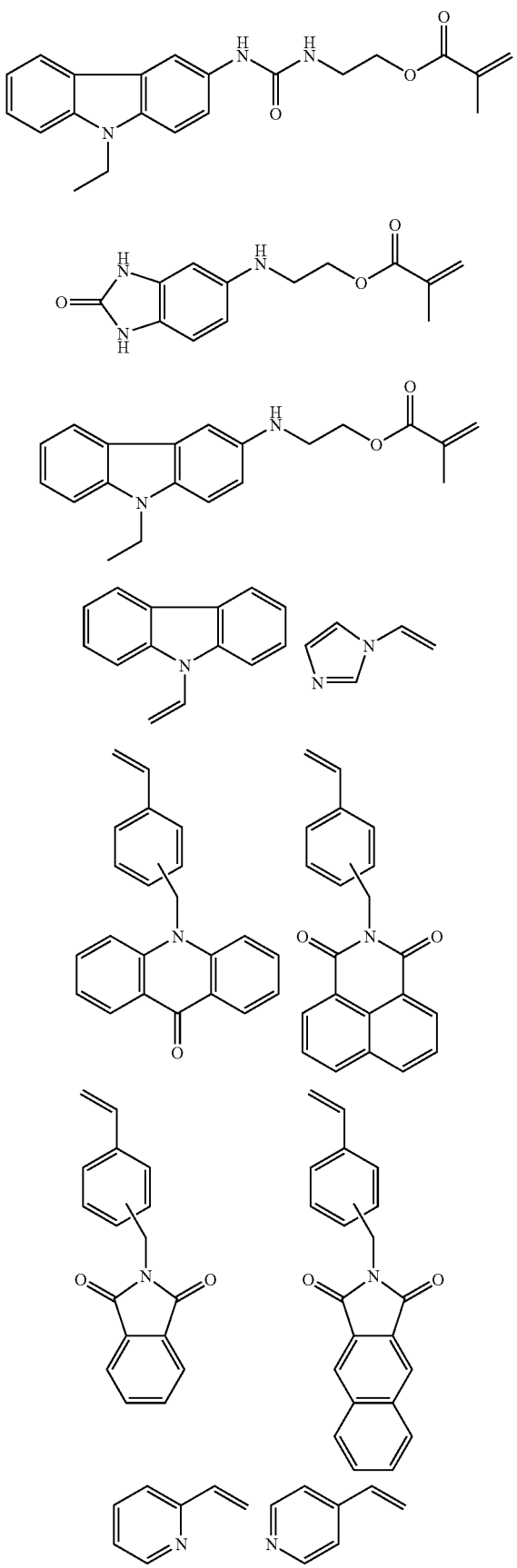

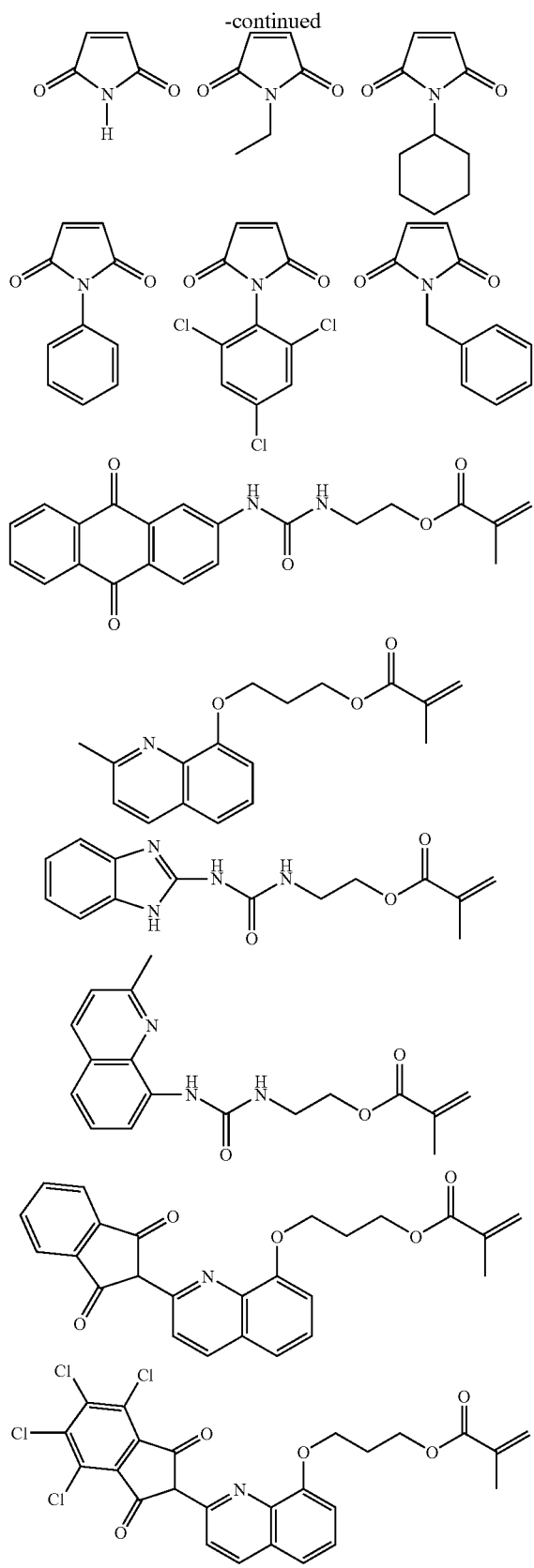

Examples of monomers having an acidic group include a vinyl monomer having a carboxyl group, a vinyl monomer having a sulfonic acid group, and a vinyl monomer having a phosphoric acid group. Examples of vinyl monomers having a carboxyl group include (meth)acrylic acid, vinylbenzoic acid, maleic acid, maleic acid monoalkyl ester, fumaric acid, itaconic acid, crotonic acid, cinnamic acid, an acrylic acid dimer and the like. Addition products of hydroxyl group containing monomers, such as 2-hydroxyethyl(meth)acrylate with cyclic anhydrides, such as maleic anhydride, phthalic anhydride, and cyclohexanedicarboxylic anhydride, may also be used, and co-carboxy-polycaprolactone mono(meth)acrylate and the like may also be used. Anhydride containing monomers, such as maleic anhydride, itaconic anhydride, and citraconic anhydride, may also be used as a precursor of a carboxyl group. (Meth)acrylic acid is particularly preferable from the standpoints of ability to form a copolymer, cost, solubility, and the like.

Examples of vinyl monomers having a sulfonic acid group include 2-acrylamido-2-methylpropanesulfonic acid and the like, and examples of vinyl monomers having a phosphoric acid group include phosphate mono(2-acryloyloxyethyl ester) and phosphate mono(1-methyl-2-acryloyloxyethyl ester), and the like.

Examples of monomers having a basic nitrogen atom that can be used include: hetrocycle containing monomers, such as vinylpyridine, vinylimidazole, vinyltriazole and the like; and (meth)acrylate esters, such as N,N-dimethylaminoethyl (meth)acrylate, N,N-dimethylaminopropyl(meth)acrylate, 1-(N,N-dimethylamino)-1,1-dimethylmethyl(meth)acrylate, N,N-dimethylaminohexyl(meth)acrylate, N,N-diethylaminoethyl(meth)acrylate, N,N-diisopropyl-aminoethyl(meth) acrylate, N,N-di-n-butylaminoethyl(meth)acrylate, N,N-diisobutylaminoethyl(meth)acrylate, morpholinoethyl(meth) acrylate, piperidinoethyl(meth)acrylate, 1-pyrrolidinoethyl (meth)acrylate, N,N-methyl-2-pyrrolidylaminoethyl(meth) acrylate, N,N-methyl-phenylaminoethyl(meth)acrylate, and the like; (meth)acrylamides, such as N—(N',N'-dimethylaminoethyl)acrylamide, N—(N',N'-dimethylaminoethyl)methacrylamide, N—(N',N'-diethyl aminoethyl)acrylamide, N—(N',N'-diethyl aminoethyl)methacrylamide, N—(N',N'-dimethylaminopropyl)acrylamide, N—(N',N'-dimethylaminopropyl)methacrylamide, N—(N',N'-diethylaminopropyl) acrylamide, N—(N',N'-diethylaminopropyl) methacrylamide, 2-(N,N-dimethylamino)ethyl(meth) acrylamide, 2-(N,N-diethylamino)ethyl(meth)acrylamide, 3-(N,N-diethylamino)propyl(meth)acrylamide, 3-(N,N-dimethylamino)propyl(meth)acrylamide, 1-(N,N-dimethylamino)-1,1-dimethylmethyl(meth)acrylamide and 6-(N,N-diethylamino)hexyl(meth)acrylamide, morpholino(meth) acrylamide, piperidino(meth)acrylamide, N-methyl-2-pyrrolidyl(meth)acrylamide; styrenes, such as N,N-dimethylamino styrene and N,N-dimethylamino methylstyrene; and the like.

A monomer having a hydrocarbon group with 4 or more carbon atoms containing a urea group, a urethane group, and an oxygen ligand, or a monomer containing an alkoxy silyl group, an epoxy group, an isocyanate group, or a hydroxyl group, can also be used.

Specifically, examples include monomers having an urea group, an urethane group, a hydrocarbon group with 4 or more carbon atoms having a coordinating oxygen atom, an alkoxysilyl group, an epoxy group, an isocyanate group, and a hydroxy group listed as the monomer usable upon synthesis of polymer compounds of (SP-1) or (SP-2).

Monomers containing an ionic functional group can be used. Examples of ionic vinyl monomers (anionic vinyl monomers and cationic vinyl monomers) include anionic vinyl monomers, such as alkali metal salts of the above vinyl monomers having acidic groups and salts of organic amines (for example, tertiary amines, such as triethylamine and dimethylamino ethanol), and cationic vinyl monomers, such as nitrogen-containing vinyl monomers quaternerized with: an alkyl halide (alkyl group: 1 to 18 carbon atoms, halogen atom: chlorine atom, bromine atom or iodine atom); a benzyl halide, such as benzyl chloride or benzyl bromide; an alkylsulfonate (alkyl group: 1 to 18 carbon atoms), such as methanesulfonate; an alkyl arylsulfonate (alkyl group: 1 to 18 carbon atoms), such as benzenesulfonate or toluenesulfonate; a dialkyl sulfate (alkyl group: 1 to 4 carbon atoms); or the like, and dialkyl diaryl ammonium salts and the like.

The above monomers having a functional group for adsorbing to the pigment may be selected appropriately according to the type of dispersed pigment, and may be used singly or in combinations of two or more thereof.

There are no particular limitations to the monomer configuring a non-pigment adsorbing block and monomers that can be used include, for example: (meth)acrylate esters, crotonic acid esters, vinyl esters, maleic acid diesters, fumarate diester, itaconic acid diesters, (meth)acrylamides, styrenes, vinyl ethers, vinyl ketones, olefins, maleimides, (meth)acrylonitrile and the like.

The monomers that configure a non-pigment adsorbing block may be used singly, or in combinations of two or more thereof. When applying to a pigment dispersion composition requiring alkaline development treatment, a monomer configuring a block which does not adsorb to the above pigment may be used together with a vinyl monomer having acidic group.

Examples of the (meth)acrylic acid esters, crotonic acid esters, vinyl esters, maleic acid diesters, fumaric acid diesters, itaconic acid diesters, (meth)acrylamides, styrenes, vinyl esters, vinyl ketones, olefins, maleimides, and (meth) acrylonitrile include an example of the vinyl monomer listed for construction of the $P^1$ polymer skeleton of the formula (3-1).

Examples of the vinyl monomer having an acidic group include the vinyl monomer having a carboxyl group, the vinyl monomer having a sulfonic acid group, and the vinyl monomer having a phosphoric acid group listed for construction of the $P^1$ polymer skeleton of the formula (3-1), and may be utilized.

The block polymer compound in the present invention can be obtained by employing conventional methods. For example, living polymerization, the iniferter method, and the like are known. Besides these, another known method is, when carrying out radical polymerization of a monomer having a pigment adsorbing group or a monomer having no pigment adsorbing group, to perform alkali treatment with an alkali, such as sodium hydroxide or ammonia, to a polymer obtained from polymerization in the presence of a compound containing a thioester and a thiol group within its molecule, such as thiol carboxylic acid, 2-acetylthioethyl ether or 10-acetylthiodecanethiol, forming a polymer which has a thiol group at one end terminal. Further radical polymerization of the monomer component of another block is then carried out in the presence of the obtained polymer which has a thiol group at one end terminal. Among these methods living polymerization is preferred.

Although the weight average molecular weight of the block polymer compound is not particularly limited, a weight average molecular weight within the range of from 3,000 to 100,000 is preferable, and the range of from 5,000 to 50,000 is more preferable. The stabilization effect can be more effectively obtained at a weight average molecular weight of 3,000 or more, and more effective adsorbing and good dispersibility can be demonstrated when the weight average molecular weight is 100,000 or less.

Commercially available products can also be used as the block polymer compound. Specific examples thereof include "DISPERBYK-2000 and 2001" (trade names, made by BYK Chemie), "EFKA 4330, 4340" (trade names, made by EFKA), and the like.

(Graft Polymer Compound)

In the present invention, there are no particular limitations to any graft polymer compound that may be used as the polymer dispersants. Preferable examples thereof include: compounds formed from the reaction of polyalkylene imine and polyester compounds, as described in JP-A No. 54-37082, JP-A No. 61-174939, and the like; weight average molecular weight compounds with a polyester modified amino group in the side chain of an allylamine polymer, as described in JP-A No. 9-169821; polyester polyol addition polyurethanes, as described in JP-A No. 60-166318 and the like. Graft polymer compounds which use a polymerizable oligomer (referred to below as a macro-monomer) as a copolymerization component, as in JP-A No. 9-171253, and Makuromonomaa no Kagaku to Kogyo [The Chemistry and Technology of Macromonomers] (IPC Publication 1989), are also preferable examples thereof.

Preferable branches of the graft polymer compound include polystyrene, polyethylene oxide, polypropylene oxide, poly(meth)acrylate ester, polycaprolactone, and the like. Among these, the graft polymer compounds having a branch with a structural unit represented by the following Formula (a) are more preferable.

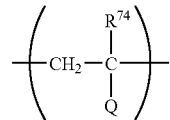

Formula (a)

In Formula (a), $R^{74}$ represents a hydrogen atom or an alkyl group of 1 to 8 carbon atoms, and Q represents a cyano group, an aryl group with 6 to 30 carbon atoms, or —COOR$^{75}$ (here, $R^{75}$ represents a hydrogen atom, an alkyl group with 1 to 22 carbon atoms, or an aryl group with 6 to 30 carbon atoms).

In Formula (a), an alkyl group represented with $R^{74}$ may have a substituent, an alkyl group of 1 to 6 carbon atoms is preferable, and a methyl group is particularly preferable. Examples of substituents which can be introduced into such an alkyl group include a halogen atom, a carboxyl group, an alkoxycarbonyl group, an alkoxy group, and the like. Specific examples of such an alkyl group include a methyl group, an ethyl group, a hexyl group, an octyl group, a trifluoromethyl group, a carboxymethyl group, a methoxycarbonylmethyl group, or the like. A hydrogen atom and a methyl group are particularly preferable for $R^{74}$.

In Formula (a), an aryl group represented with Q may have a substituent, an aryl group of 6 to 20 carbon atoms is preferable, and an aryl group of 6 to 12 carbon atoms is particularly preferable. Examples of substituents which can be introduced into such an aryl group include a halogen atom, an alkyl group, an alkoxy group, an alkoxycarbonyl group, or the like. Specific examples of such an aryl group include a phenyl group, naphthyl group, a tolyl group, a xylyl group, a propylphenyl group, a buthylphenyl group, an octylphenyl group, a dodecylphenyl group, a methoxyphenyl group, an ethoxyphenyl group, a butoxyphenyl group, a decyloxyphenyl group, a chlorophenyl group, a dichlorophenyl group, a bromophenyl group, a methoxycarbonylphenyl group, an ethoxycarbonylphenyl group, butoxycarbonylphenyl group, or the like. Among such aryl groups, a non-substituted aryl group or an aryl group substituted with a halogen atom, an alkyl group, or an alkoxy group are preferable, and a non-substituted aryl group or an aryl group substituted with an alkyl group are particularly preferable.

When Q of Formula (a) is —COOR$^{75}$, an alkyl group represented with R$^{75}$ may have a substituent, an alkyl group of 1 to 12 carbon atoms is preferable, and an alkyl group of 1 to 8 carbon atoms is particularly preferable. Examples of substituents which can be introduced into such an alkyl group include a halogen atom, an alkenyl group, an aryl group, a hydroxyl group, an alkoxy group, an alkoxycarbonyl group, an amino group, an acylamino group, carbamoyl group, or the like. Specific examples of such an alkyl group include a methyl group, an ethyl group, a propyl group, a butyl group, a heptyl group, a hexyl group, an octyl group, a decyl group, a dodecyl group, a tridecyl group, a tetradecyl group, a hexadecyl group, an octadecyl group, a 2-chloroethyl group, a 2-bromoethyl group, a 2-methoxycarbonylethyl group, a 2-methoxyethyl group, a 2-bromopropyl group, a 2-butenyl group, a 2-pentenyl group, a 3-methyl-2-pentenyl group, a 2-hexenyl group, a 4-methyl-2-hexenyl group, a benzyl group, a phenethyl group, a 3-phenylpropyl group, a naphthylmethyl group, a 2-naphthylethyl group, a chlorobenzyl group, a bromobenzyl group, methylbenzyl group, an ethylbenzyl group, a methoxybenzyl group, a dimethylbenzyl group, a dimethoxybenzyl group, a cyclohexyl group, a 2-cyclohexylethyl group, a 2-cyclopentylethyl group, a bicyclo[3.2.1]oct-2-yl group, a 1-adamanthyl group, a dimethylaminopropyl group, an acetylaminoethyl group, an N,N-dibutylamino carbamoylmethyl group, or the like. Among such alkyl groups, a non-substituted alkyl group or an alkyl group substituted with a halogen atom, an aryl group, or a hydroxyl group is preferable, and a non-substituted alkyl group is particularly preferable.

When Q of Formula (a) is —COOR$^{75}$, an aryl group represented with R$^{75}$ may have a substituent, an aryl group of 6 to 20 carbon atoms is preferable, and an aryl group of 6 to 12 carbon atoms is particularly preferable. Examples of substituent which can be introduced into such an aryl group include a halogen atom, an alkyl group, an alkenyl group, an alkoxy group, an alkoxycarbonyl group, an acylamino group, or the like. Specific examples of such an aryl group include a phenyl group, a naphthyl group, a tolyl group, a xylyl group, a propylphenyl group, a buthylphenyl group, an octylphenyl group, a dodecylphenyl group, a methoxyphenyl group, an ethoxyphenyl group, a butoxyphenyl group, a decyloxyphenyl group, a chlorophenyl group, a dichlorophenyl group, a bromophenylgroup, a methoxycarbonylphenyl group, an ethoxycarbonylphenyl group, a butoxycarbonylphenyl group, an acetamidophenyl group, a propioamidophenyl group, a dodecyloylamidophenyl group, or the like. Among such aryl groups, a non-substituted aryl group or an aryl group substituted with a halogen atom, an alkyl group, or an alkoxy group is preferable, and an alkyl group substituted aryl group is particularly preferable.

Among such R$^{75}$s, a hydrogen atom and an alkyl group of 1 to 22 carbon atoms are preferable, and a hydrogen atom and an alkyl group of 1 to 12 carbon atoms are particularly preferable.

Specific examples of the branch of a graft polymer compound having a branch of a structural unit represented with such Formula (a) include polymethyl(meth)acrylate, poly-n-butyl(meth)acrylate, poly-i-butyl(meth)acrylate, poly(methyl(meth)acrylate-co-benzyl(meth)acrylate), poly(methyl(meth)acrylate-co-styrene), poly(methyl(meth)acrylate-co-(meth)acrylate), poly(methyl(meth)acrylate-co-acrylonitrile), and the like.

Any known method may be used for the synthesis of the graft polymer compound having a branch of a structural unit represented with Formula (a).

A specific example thereof is copolymerization of a macro-monomer having a structural unit represented with Formula (a) with an ethylenically unsaturated monomer copolymerizable with such a macro-monomer.

Preferable examples of macro-monomers having a structural unit represented with Formula (a) are those represented by the following Formula (b).

Formula (b)

R$^{76}$ in Formula (b) represents a hydrogen atom or an alkyl group of 1 to 8 carbon atoms. W of Formula (b) represents a single bond, a linkage group shown below, or a linkage group configured with a given combination of the divalent groups shown below. A of Formula (b) represents a group which has a structural unit represented by Formula (a).

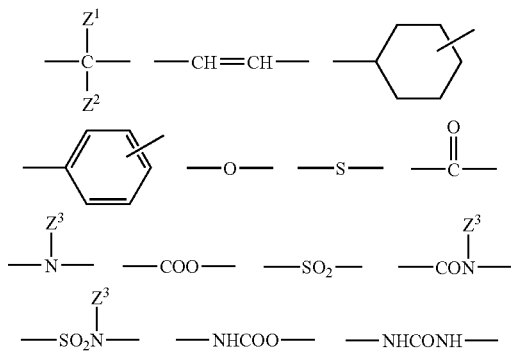

In the above linkage groups, Z$^1$ and Z$^2$ each independently represent, a hydrogen atom, a halogen atom, an alkyl group of 1 to 6 carbon atoms, a cyano group, or a hydroxyl group, and Z$^3$ represents a hydrogen atom, an alkyl group of 1 to 18 carbon atoms, or an aryl group of 6 to 20 carbon atoms.

Specific examples of macro-monomers represented by the Formula (b) are shown below.

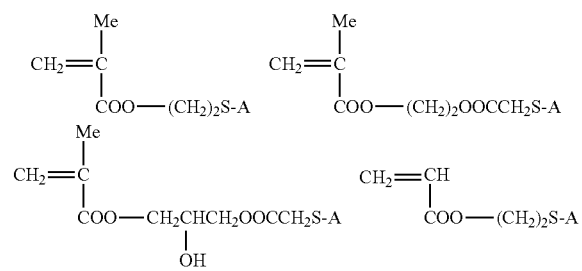

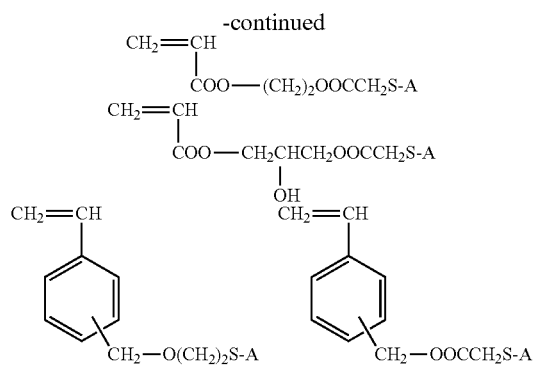

In the above structures of specific examples of the macro-monomer, A has the same meaning as A in Formula (b).

Commercially available examples of such macro-monomers include a polymethylmethacrylate oligomer methacryloylated at one end terminal (Mn=6,000, trade name: AA-6, made by Toagosei Chemical Industry Co., Ltd.), a poly-n-butyl acrylate oligomer methacryloylated at one end terminal (Mn=6,000, trade name: AB-6, made by Toagosei Chemical Industry Co., Ltd.), and a polystyrene oligomer methacryloylated at one end terminal (Mn=6,000, trade name: AS-6, made by Toagosei Chemical Industry Co., Ltd.).

The above macro-monomer preferably has a molecular weight of number average molecular weight (Mn) 1,000 to 20,000 using the polystyrene standard, and the molecular weight thereof is more preferably 2,000 to 15,000. When the number average molecular weight is in the above range a more effective steric repulsion effect as a pigment dispersant can be obtained.

The "monomers which configure a pigment adsorbing block" described above are preferably used for the ethylenically unsaturated monomer copolymerizable with the macro-monomer, in order to raise the dispersibility of the pigment, and the dispersion stability thereof. The "monomers which configure a non-pigment adsorbing block" described above may be used as the other copolymerization components for copolymerization.

The weight average molecular weight of the above graft polymer compound is not particularly limited, however, a molecular weight within the range of from 3,000 to 100,000 is preferable, and within the range of from 5,000 to 50,000 is more preferable. When the weight average molecular weight is 3,000 or more, the stabilization effect can be more effectively obtained, and when the weight average molecular weight is 100,000 or less there is more effective adsorbing and good dispersibility can be exhibited.

Commercial compounds which can be used for the graft polymer compound include "SOLSPERSE 24000, 28000, 32000, 38500, 39000, and 55000" (trade names, made by Lubrizol Corporation) and "DISPERBYK-161, 171, and 174" (trade names, made by BYK Chemie).

(Terminal Modified Polymer Compounds)

Examples of terminal modified polymer compounds used as the polymer dispersant include polymer compounds having a functional group at the terminal of the polymer, as described in JP-A No. 9-77994, JP-A No. 2002-273191 and the like.

There are no particular limitations to the method used for synthesis of a polymer compound having a functional group at the terminal of the polymer, however, examples thereof include the following methods.

1. A synthesis method of polymerization using an initiator for the functional group contained (for example, radical polymerization, anionic polymerization, cationic polymerization, and the like).

2. A synthesis method of radical polymerization using a chain transfer agent for the functional group contained.

Examples of the functional group introduced here include an adsorbing site represented with $B^1$ in Formula (3-2) (namely, a site selected from an organic dye structure, a heterocyclic structure, an acidic group, a group having a basic nitrogen atom, a urea group, a urethane group, the group that has an oxygen ligand, a hydrocarbon group with 4 or more carbon atoms, an alkoxy silyl group, an epoxy group, an isocyanate group, a hydroxyl group, and an ionic functional group). Functional groups from which such adsorption sites can be derived may also be used.

Examples of the polymerization initiator (polymerization initiator of the functional group contained) used in synthesizing method 1 to introduce a functional group at the polymer terminus include 2,2'-azobis(2-cyanopropanol), 2,2'-azobis(2-cyanopentanol), 4,4'-azobis(4-cyanovaleric acid), 4,4'-azobis(4-cyanovaleric acid chloride), 2,2'-azobis[2-(5-methyl-2-imidazoline-2-yl)propane], 2,2'-azobis[2-(2-imidazoline-2-yl)propane], 2,2'-azobis[2-(3,4,5,6-tetrahydropyrimidine-2-yl)propane], 2,2'-azobis{2-[1-(2-hydroxyethyl)-2-imidazoline 2-yl]propane}, 2,2'-azobis[2-methyl-N-(2-hydroxyethyl)-propionamide], and the like, and derivatives thereof.

Examples of the chain transfer agent (chain transfer agent of the functional group contained) used with the synthesizing method 2 to introduce a functional group at the polymer terminus include mercapto compounds (such as, for example, thioglycolic acid, thiomalic acid, thiosalicylic acid, 2-mercaptopropionic acid, 3-mercaptopropionic acid, 3-mercaptobutyric acid, N-(2-mercaptopropyonyl)glycine, 2-mercaptonicotinic acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, benzenethiol, toluenethiol, mercaptoacetophenone, naphthalenthiol, and naphthalenemethanethiol), disulfide compounds which are the oxidized compounds of the foregoing mercapto compounds, and halogenated compounds (such as, for example, 2-iodoethanesulfonic acid, and 3-iodopropanesulfonic acid).

The "monomer which configures a non-pigment adsorbing block" described above can be used, for example, as a radical polymerizable monomer for the monomer used for polymerization of the polymer compound having a functional group at the terminal of the polymer.

The molecular weight of the terminal modified polymer compound is preferably a weight average molecular weight of 1,000 to 50,000. The steric repulsion effect as a pigment dispersant can be more effectively obtained when the number average molecular weight is 1,000 or more, and when the number average molecular weight 50,000 or less the steric effect is more effectively suppressed and the duration of adhesion to a pigment can be shortened further.

Examples of commercial terminal modified polymer compounds which can be used include "SOLSPERSE 3000, 17000, and 27000" (trade names, made by Lubrizol Corporation).

A graft polymer compound and a terminal modified polymer compound are preferable as a pigment dispersant in the present invention, and among these, particularly preferable examples include, a graft polymer compound containing a copolymerization unit derived from a monomer having an organic dye structure or a heterocyclic structure, and a terminal modified polymer compound with an organic dye structure, a heterocyclic structure, an acidic group, a basic nitrogen atom containing group, a urea group, or a urethane group as the terminal group. In the present invention, the specific polymer compounds described above may be used as a general dispersant.

An addition amount of the pigment dispersant, in the case of the polymer dispersant, is preferably 0.5 to 100% by mass, more preferably 3 to 100% by mass, particularly preferably 5 to 80% by mass based on the processed pigment.

When an amount of the pigment dispersant is within this range, the sufficient pigment dispersing effect is obtained. An optimal addition amount of the dispersant is appropriately adjusted depending on a combination of the processed pigment used, and a solvent.

A ratio of the specific polymer compound covering the pigment and the pigment dispersant is not particularly limited, but when the pigment dispersant is the polymer dispersant, specific polymer compound/pigment dispersant=10/90 to 90/10 mass ratio is preferable, and 20/80 to 80/20 mass ratio is particularly preferable.

In the pigment dispersion composition of the present invention, dispersants besides the above dispersant, such as a surfactant, can also be used.

[Pigment Derivative]
A pigment derivative may be added, as required, to the pigment dispersion composition of the present invention. In the present invention, the processed pigment may be dispersed in the pigment dispersion composition as fine particles by adsorbing a pigment derivative, into which a portion having affinity to the dispersant or a polar group has been introduced, to the surface of the processed pigment, and using the pigment derivative as sites for adsorbing the dispersant, and re-aggregation thereof may also be prevented thereby. Namely, using the pigment derivative for improving the pigment surface has the effect of promoting adhesion of the polymer dispersant. Therefore, a pigment dispersion composition containing a pigment derivative is useful for forming a color filter with high contrast and excellent transparency.

The pigment derivative is specifically a compound having a matrix skeleton of an organic pigment, in which an acidic group, a basic group, and an aromatic group as a substituent are introduced into a side chain. Examples of the organic pigment which is to be a matrix skeleton include specifically a quinacridone-based pigment, a phthalocyanine-based pigment, an azo-based pigment, a quinophthalone-based pigment, an isoindoline-based pigment, an isoindolinone-based pigment, and a quinoline pigment, a diketopyrrolopyrrole pigment, and a benzimidazolone pigment.

The matrix skeleton generally includes a pale yellow aromatic polycyclic compound such as naphthalene system, anthraquinone system, triazine system, and quinoline system which are not called dye.

As the pigment derivative in the invention, pigment derivatives described in JP-A No. 11-49974, JP-A No. 11-189732, JP-A No. 10-245501, JP-A No. 2006-266528, JP-A No. 8-295810, JP-A No. 11-199796, JP-A No. 2005-234478, JP-A No. 2003-240938, and JP-A No. 2001-356210 may be used.

A content of the pigment derivative according to the invention in the pigment-dispersed composition is preferably 1 to 30% by mass, more preferably 3 to 20% by mass based on a mass of the pigment.

When the content is within the range, dispersion of the processed pigment may be performed better while a viscosity is suppressed low and, at the same time, dispersion stability of dispersing may be improved.

By applying this pigment-dispersed composition to manufacturing of a color filer, a color filter having high transmittance, excellent color property and high contrast may be obtained.

[Preparation of Pigment-Dispersed Composition]
The pigment dispersed composition of the invention may be prepared via a mixing dispersing step of performing mixing and dispersing using various mixing machines and dispersing machines.

The mixing and dispersing step preferably consists of kneading dispersing, followed by fine dispersing treatment, but kneading and dispersing may be omitted.

Specifically the pigment dispersion composition of the present invention can be prepared by, for example, mixing the processed pigment, and as required the dispersant, in advance with a homogenizer or the like, then carrying out micro-dispersion to the dispersion prepared in advance using a bead dispersion machine (for example, a DISPERMAT, trade name, made from GETZMANN) with zirconia beads or the like. The dispersion time is preferably about 3 to 6 hours. For the micro-dispersion treatment with beads, in the main a vertical sand grinder, a horizontal sand grinder, a pin mill, a slit mill, an ultrasonic dispersion machine and the like can be used, with a beads of particle size of 0.01 mm to 1 mm made from glass, zirconia, and the like.

Before beads dispersing, kneading and dispersing treatment may be performed while a strong shearing force is imparted, using at two-roll, a three-roll, a ball mill, a toron mill, disper, a kneader, a cokneader, a homogenizer, a blender, or a monoaxial or biaxial extruder. Details regarding mixing, kneading and dispersion are described in "Paint Flow and Pigment Dispersion", by T. C. Patton (published by John Wiley and Sons Co. 1964) and the like.

The pigment-dispersed composition of the invention, by containing the fine processed pigment of the invention, is excellent in dispersibility and dispersion stability of the processed pigment. Since such pigment-dispersed composition is better in the dispersion state of the pigment, a composition excellent in transmittance, that is, a coloring force is obtained. For this reason, this is suitable in a colored photosensitive composition used in manufacturing of the color filter, for which better color property is required.

<Colored Photosensitive Composition>
The colored photosensitive composition of the invention is characterized in that it contains the pigment-dispersed composition of the invention described above, a polymerizable compound, and a photopolymerization initiator. Further, if necessary, the composition may contain other component such as an alkali-insoluble resin.

Respective components constituting the colored photosensitive composition of the invention will be described in detail below.

[Pigment Dispersion Composition]
The amount contained of the pigment dispersion composition in the colored curable composition of the present invention is preferably an amount such that the amount contained of the processed pigment is in the range of 5 mass % to 50 mass % with respect to the total solids (mass) of the colored curable composition, and an amount such that the amount contained of the pigment is in the range of 10 mass % to 20 mass % is more preferable.

The amount contained of the pigment dispersion composition within these ranges is effective for securing sufficient color density and excellent color characteristics.

[Photopolymerizable Compound]
The photopolymerizable compound which configures the colored photosensitive composition of the present invention has at least one ethylenically unsaturated group at which addition polymerization is possible, a compound with a boiling temperature at normal pressure of 100° C. or above is preferable therefore, and an acrylate compound with four or more functions is more preferable.

Examples of compounds having an at least one ethylenically unsaturated group at which addition polymerization is possible and having a boiling temperature at normal pressure of 100° C. or above include: monofunctional acrylates and methacrylates, such as polyethylene glycol mono-(meth)acrylate, polypropylene glycol mono-(meth)acrylate, and phenoxyethyl(meth)acrylate; and polyfunctional acrylates and methacrylates, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexandiol(meth)acrylate, trimethylolpropane tri(acryloyloxypropyl)ether, tri(acryloyloxyethyl)isocyanurate, compounds obtained by (meth)acrylation after adding ethylene oxide or propylene oxide to a polyfunctional alcohol, such as glycerin, and trimethylolethane, compounds obtained by poly(meth)acrylation of pentaerythritol or dipentaerythritol described in JP-B No. 48-41708, JP-B No. 50-6034, and JP-A No. 51-37193, and the polyester acrylates, epoxy acrylates that are the resultant products of reacting an epoxy resin and (meth)acrylic acid described in JP-A No. 48-64183, JP-B No. 49-43191, JP-B No. 52-30490. The photo-curable monomers and oligomers introduced in Nippon Secchaku Kyokai Shi [Journal of the Adhesion Society of Japan] Vol. 20, No. 7 pages 300-308 can also be used.

The specific examples of Formula (1) and (2) in JP-A No. 10-62986A, and the described compounds therein obtained by (meth)acrylation after adding ethyleneoxide and propylene oxide in a polyfunctional alcohol, can also be used.

Preferable compounds also include urethane acrylates, such as those described in JP-B No. 48-41708, JP-A No. 51-37193, JP-A No. 2-32293, JP-A No. 2-16765, and urethane compounds which have an ethyleneoxide skeleton, as described in JP-B No. 58-49860, JP-B No. 56-17654, JP-B No. 62-39417, and JP-B No. 62-39418. Furthermore, polymerizable compositions with extremely excellent sensitization speed, depending on use, may be obtained by using the addition polymerizable compounds having an amino structure and a sulfide structure within their molecules, as described in JP-A No. 63-277653, JP-A No. 63-260909, and JP-A No. 1-105238. Examples of commercial products thereof include urethane oligomers UAS-10, UAB-140 (trade names, made by Sanyo-Kokusaku Pulp Co., Ltd.), UA-7200 (trade name, made by Shin Nakamura Kagaku Co., Ltd.), DPHA-40H (trade names, made by Nippon Kayaku Co., Ltd.), UA-306H, UA-306T, UA-306I, AH-600, T-600, AI-600 (trade names, made by Kyoeisha Co., Ltd.), and the like.

Ethylenically unsaturated compounds having an acidic group are also preferred, with commercial products thereof including TO-756, which is a carboxyl group containing 3-functional acrylate, and TO-1382, which is a carboxyl group containing 5-functional acrylate (trade names, made by Toagosei, Inc.), and the like.

Among these, dipentaerythritol penta(meth)acrylate, dipentaerythritol hexa(meth)acrylate, and compounds thereof structured with the acryloyl groups through ethylene glycol or a propylene glycol residue, are preferable. Oligomers thereof can also be used.

As well as using the photopolymerizable compound in the present invention singly, combinations of two or more thereof may also be used.

The amount contained of the photopolymerizable compound in the colored photosensitive composition is preferably 20 to 200 parts by mass with respect to total-solids of 100 parts by mass of the colored photosensitive composition, and 50 to 120 parts by mass thereof is more preferable. When the amount contained of the photopolymerizable compound is this within this range then sufficient curing reaction can carried out.

[Photopolymerization Initiator]

Examples of the photopolymerization initiator which composes the colored photosensitive composition of the present invention include, for example: a halomethyl oxadiazole, as described in JP-A No. 57-6096; activitated halogenated compounds, such as halomethyl-s-triazine described in JP-B No. 59-1281, JP-A No. 53-133428, and the like;
aromatic carbonyl compounds, such as ketal, acetal or benzoin alkyl ethers, as described in the specifications of U.S. Pat. No. 4,318,791 and European Patent Application Laid-Open No. EP-88050 and the like; aromatic ketone compounds, such as the benzophenone described in the specification of U.S. Pat. No. 4,199,420; (thio)xanthone compounds and acridine compounds, as described in the specification of Fr-2456741; coumarin compounds and biimidazole compounds, as described in JP-A No. 10-62986; and
organosulfonium boron complexes, such as those described in JP-A No. 8-015521; and the like.

Preferred examples of the photopolymerization initiator include acetophenone-, ketal-, benzophenone-, benzoin-, benzoyl-, xanthone-, activated halogenated compound-(triazine-, halomethyl oxadiazole-, coumarin-), acridines-, biimidazole-, and oxime ester-initiators.

Preferred examples of acetophenone -photopolymerization initiators include 2,2-diethoxyacetophenone, p-dimethylamino acetophenone, 2-hydroxy-2-methyl-1-phenyl-propan-1-one, p-dimethylamino acetophenone, 4'-isopropyl-2-hydroxy-2-methyl-propiophenone, 1-hydroxy-cyclohexyl phenyl ketone, 2-benzyl-2-dimethylamino-1-(4-morpholinophenyl)-butanone-1,2-tolyl-2-dimethylamino-1-(4-morpholinophenyl)-butanone-1, and 2-methyl-1-[4-(methylthio)phenyl]-2-morpholino-propanone-1.

Preferred examples of ketal-photopolymerization initiators include benzyl dimethyl ketal, benzyl-β-methoxy ethyl acetal, and the like.

Preferred examples of benzophenone-photopolymerization initiators include benzophenone, 4,4',-(bisdimethylamino)benzophenone, 4,4'-(bisdiethylamino)benzophenone, and 4,4'-dichloro benzophenone, 1-hydroxy-cyclohexyl-phenyl-ketone, 2-benzyl-2-dimethylamino-1-(4-morpholinophenyl)-butanone-1,2-tolyl-2-dimethylamino-1-(4-morpholinophenyl)-butanone-1,2-methyl-1-[4-(methyltio)phenyl]-2-morpholinopropanone-1.

Preferred examples of benzoin- or benzoyl-photopolymerization initiators include benzoin isopropyl ether, benzoin isobutyl ether, benzoin methyl ether, methyl-o-benzoylbenzoate, and the like.

Preferred examples of xanthone-photopolymerization initiators include diethylthioxanthone, diisopropylthioxantone, mono isopropyl thioxantone, chlorothioxantone, and the like.

Preferred examples of the activated halogen compounds (triazine-, oxadiazole-, coumarin-initiators) include 2,4-bis(trichloromethyl)-6-p-methoxyphenyl-s-triazine, 2,4-bis(trichloromethyl)-6-p-methoxy styryl-s-triazine, 2,4-bis(trichloromethyl)-6-(1-p-dimethylaminophenyl)-1,3-butadienyl-s-triazine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-di(trichloromethyl)-s-triazine, methoxystyryl 2,6-di(trichloromethyl)-s-triazine, 3,4-dimethoxystyryl-2,6-di(trichloromethyl)-s-triazine, 4-benzoxolane-2,6-di(trichloromethyl)-s-triazine, 4-(o-bromo-p-N,N-(diethoxy carbonylamino)-phenyl)-2,6-di(chloromethyl)-s-triazine, 4-(p-N,N-(diethoxycarbonylamino)-phenyl)-2,6-di(chloromethyl)-s-triazine, 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, 2-trichloromethyl-5-(4-styryl)styryl-1,3,4-oxodiazole, 3-methyl-5-amino-((s-triazine-2-yl)amino)-3-phenylcoumarin, 3-chloro-5-diethylamino-((s-triazine-2-yl)amino)-3-phenylcoumarin, 3-butyl-5-dimethylamino-((s-triazine-2-yl)amino)-3-phenylcoumarin, and the like.

Preferred examples acridine-photopolymerization initiators include 9-phenylacridine, 1,7-bis(9-acridinyl)heptane, and the like.

Preferred examples of biimidazole-photopolymerization initiators include 2-(o-chlorophenyl)-4,5-diphenyl imidazolyl dimer, 2-(o-methoxyphenyl)-4,5-diphenyl imidazolyl dimer, 2-(2,4-dimethoxyphenyl)-4,5-diphenyl imidazolyl dimer, and the like.

Other examples thereof, in addition to the above, include 1-phenyl-1,2-propanedione-2-(o-ethoxycarbonyl)oxime, O-benzoyl-4'-(benzmercapto)benzoyl-hexyl-ketoxime, 2,4,6-trimethyl phenylcarbonyl diphenylphosphonyl oxide, salts of hexafluoro-phosphoro-trialkylphenylphosphonium, and the like.

In the present invention, there is no limitation to the above photopolymerization initiators, and other known initiators can be used. Examples thereof include: vicinal polyketolaldonyl compounds, as described in the specification of U.S. Pat. No. 2,367,660; $\alpha$-carbonyl compounds, as described in the specification of U.S. Pat. Nos. 2,367,661 and 2,367,670; acyloin ethers, as described in the specification of U.S. Pat. No. 2,448,828; aromatic acyloin compounds substituted with an $\alpha$-hydrocarbon, as described in the specification of U.S. Pat. No. 2,722,512; polynuclear quinone compounds, as described in the specification of U.S. Pat. Nos. 3,046,127 and 2,951,758; combinations of triarylimidazole dimer/p-aminophenyl ketone, as described in the specification of U.S. Pat. No. 3,549,367; benzothiazole compound/trihalomethyl-s-triazine compound, as described in JP-B No. 51-48516; oxime ester compounds, as described in J. C. S. Perkin II (1979) 1653-1660, J. C. S. Perkin II (1979) 156-162, Journal of Photopolymer Science and Technology (1995) 202-232, and in JP-A No. 2000-66385; and the like. These photopolymerization initiators can also be used in combinations thereof.

The amount contained of photopolymerization initiator in the colored photosensutive composition is preferably 0.1 mass % to 10.0 mass %, and is more preferably 0.5 mass % to 5.0 mass %, with respect to the total solids of the composition. When the amount contained of photopolymerization initiator is within these ranges then there is good polymerization reaction promotion and film formation with good strength is possible.

[Sensitizing Dye]

If necessary, a sensitizing dye may be added to the colored photosensitive composition of the invention. The sensitizing dye may promote a radical generating reaction of the photopolymerization initiator, or a polymerization reaction of the photopolymerizable compound thereby, by exposure to light having a wavelength which may be absorbed by this sensitizing dye. Examples of such sensitizing dye include the known spectroscopic sensitizing dye or dye, and a dye or a pigment which absorbs light to interact with the photopolymerization initiator.

(Spectral Sensitizing Dye or Dye)

Examples of preferable spectral sensitizing dyes or colorants used for the sensitization dye for the present invention include: polynuclear aromatics (for example, pyrene, perylene, triphenylene); xanthenes (for example, fluorescein, eosin, erythrosin, rhodamine B, rose bengal; cyanines (for example, thiacarbocyanine, oxacarbocyanine); merocyanines (for example, merocyanine, carbomerocyanine); thiazines (for example, thionine, methylene blue and toluidine blue); acridines (for example, acridine orange, chloroflavin, acriflavine); phthalocyanines (for example, phthalocyanine, metal phthalocyanines); porphyrins (for example, tetraphenylporphyrin, central metal-substituted porphyrins); chlorophylls (for example, chlorophyll, chlorophyllin, central metal-substituted chlorophyll); metal complexes (for example, the following compounds); anthraquinones (for example, anthraquinone); squaryliums (for example, squarylium); and the like.

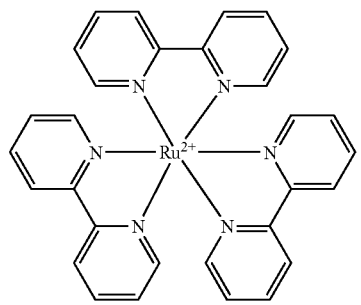

More preferable examples of the spectral sensitizing dyes include styryl-based dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinnamylidene derivatives described in JP-B No. 2-30321, cyanine-based dyes described in JP-A No. 1-287105, xanthene-based dyes described in JP-A No. 62-31844, JP-A No. 62-31848, and JP-A No. 62-143043, aminostyryl ketones described in JP-B No. 59-28325, dyes described in JP-A No. 2-179643, melocyanine dyes described in JP-A No. 2-244050, melocyanine dyes described in JP-B No. 59-28326, melocyanine dyes described in JP-A No. 59-89303, melocyanine dyes described in JP-A No. 8-129257, and benzopyran-based dyes described in JP-A No. 8-334897.

(Dyes Having Absorption Maximum Wavelength at 350 nm to 450 nm)

Examples of other preferable embodiments of sensitizing dyes include compounds belonging to the following groups of dyes having an absorption maximum wavelength at 350 nm to 450 nm. Examples include: polynuclear aromatics (for example, pyrene, perylene and triphenylene); xanthenes (for example, fluorescein, eosin, erythrosine, rhodamine B, and rose bengal); cyanines (for example, thiacarbocyanine and oxacarbocyanine); merocyanines (for example, merocyanine and carbomerocyanine); thiazines (for example, thionine, methylene blue and toluidine blue); acridines (for example, acridine orange, chloroflavin, acriflavine); anthraquinones (for example, anthraquinone); and squaryliums (for example, squarylium).

More preferable examples of sensitizing dyes include the compounds represented by the following Formulae (XIV) to (XVIII).

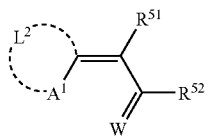

(XIV)

In Formula (XIV), $A^1$ represents a sulfur atom or $NR^{50}$, $R^{50}$ represents an alkyl group or an aryl group, $L^2$ represents a nonmetallic atom group which forms the basic nucleus of a dye in combination with adjoining $A^1$ and the adjacent carbon atom, $R^{51}$ and $R^{52}$ each independently represent a hydrogen atom or a monovalent group of nonmetallic atoms, and $R^{51}$ and $R^{52}$ may be joined together and form an acidic nucleus of a dye. W represents an oxygen atom or a sulfur atom.

Specific preferable examples of compounds represented by Formula (XIV) are shown in [(F-1) to (F-5)] below.

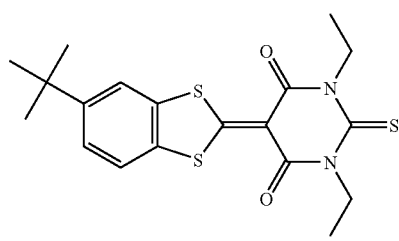

(F-1)

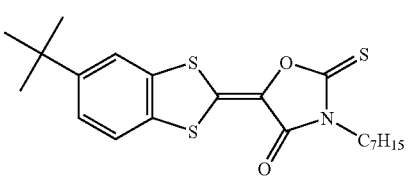

(F-2)

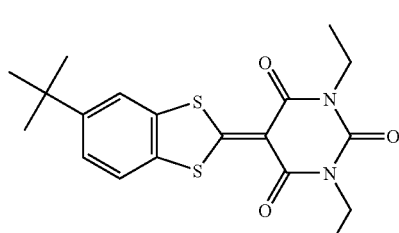

(F-3)

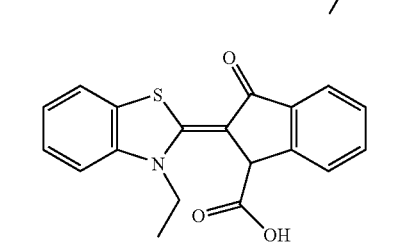

(F-4)

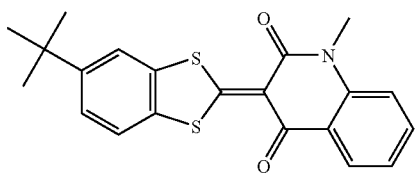

(F-5)

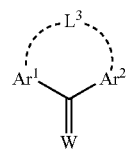

(XV)

(In Formula (XV), $Ar^1$ and $Ar^2$ each independently represents an aryl group, and $Ar^1$ and $Ar^2$ are connected together by -L3-. $L^3$ represents —O— or —S—. W has the same meaning as indicated for W in Formula (XIV).

Preferable examples of compounds represented by Formula (XV) are shown in [(F-6) to (F-8)] below.

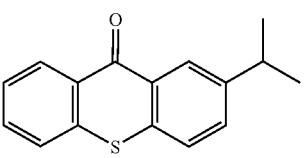

(F-6)

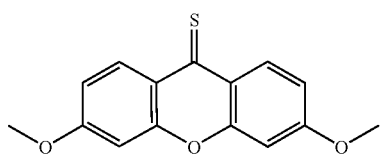

(F-7)

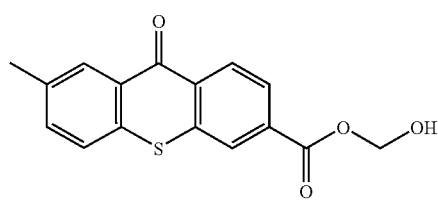

(F-8)

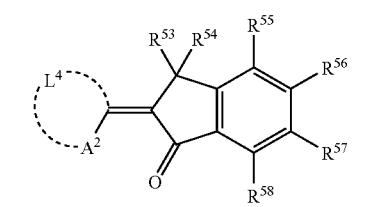

(XVI)

(In Formula (XVI), $A^2$ represents a sulfur atom or $NR^{59}$, $L^4$ represents a nonmetallic atom group which forms a basic nucleus of a dye in combination with adjoining $A^2$ and the adjacent carbon atom, $R^{53}$, $R^{54}$, $R^{55}$, $R^{56}$, $R^{57}$, and $R^{58}$ each independently represents a monovalent group of nonmetallic atoms, and $R^{59}$ represents an alkyl group or an aryl group. Preferable examples of compounds represented with Formula (XVI) are shown in [(F-9) to (F-11)] below.

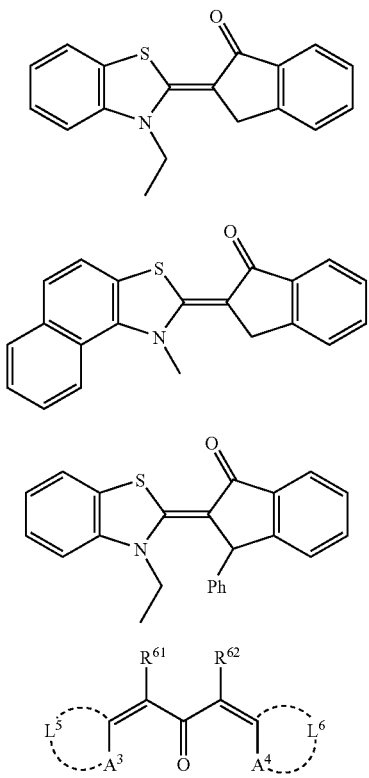

(F-9)

(F-10)

(F-11)

(XVII)

(In Formula (XVII), $A^3$ and $A^4$ each independently represents —S— or —$NR^{63}$, $R^{63}$ represents a substituted or unsubstituted alkyl group or a substituted or unsubstituted aryl group, $L^5$ and $L^6$ each independently represents a nonmetallic atom group and forms a basic nucleus of a dye in combination with the respective adjoining $A^3$, $A^4$ and adjacent carbon atom, $R^{61}$ and $R^{62}$ are each independently a monovalent group of nonmetallic atoms, or $R^{61}$ and $R^{62}$ are joined together to form an aliphatic or aromatic ring).

Preferable examples of compounds represented by Formula (XVII) are shown in [(F-12) to (F-15)] below.

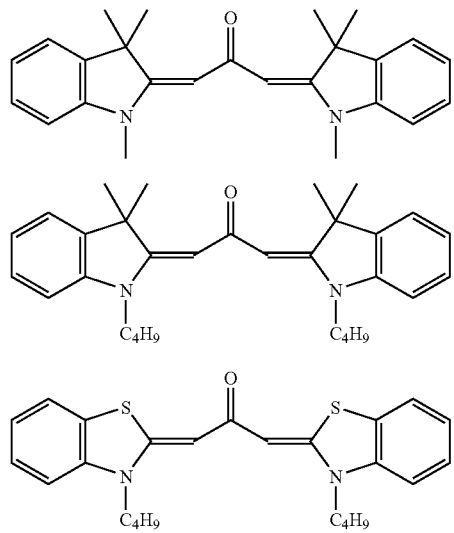

(F-12)

(F-13)

(F-14)

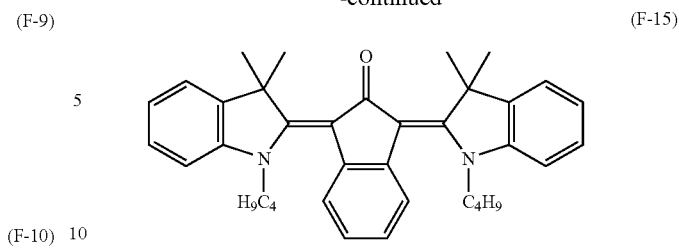

(F-15)

Compounds according to the following formula (XVIII) are also preferable examples of the sensitizing dye used for the present invention.

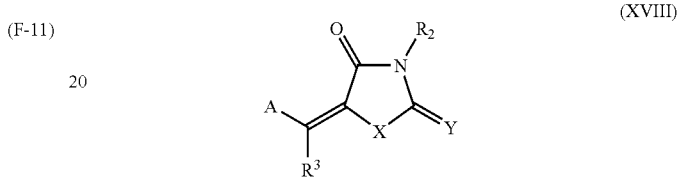

(XVIII)

In the formula (XVIII), A represents an optionally substituted aromatic ring or heterocycle, X represents an oxygen atom, a sulfur atom, or —$N(R^1)$—, and Y represents an oxygen atom or —$N(R^1)$—. $R^1$, $R^2$, and $R^3$ each independently represents a hydrogen atom or a monovalent group of nonmetal atoms. A, $R^1$, $R^2$, and $R^3$ may be combined with each other to form an aliphatic or aromatic ring.

When $R^1$, $R^2$, and $R^3$ each represents a monovalent group of nonmetal atoms, and preferably represents a substituted or unsubstituted alkyl group or aryl group.

Specific preferable examples of $R^1$, $R^2$, and $R^3$ are described below. Preferable examples of the alkyl group include linear, branched, and cyclic alkyl groups having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecy group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among them, linear alkyl groups having 1 to 12 carbon atoms, branched alkyl groups having 3 to 12 carbon atoms, and cyclic alkyl groups having 5 to 10 carbon atoms are more preferable.

As the substituent of the substituted alkyl group, a monovalent group of nonmetal atoms excluding hydrogen atoms is used, preferable examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, an ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylireido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group (—SO$_3$H) and conjugate base groups thereof (hereinafter, referred to as a sulfonate group), an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group (—PO$_3$H$_2$) and conjugate base groups thereof (hereinafter, referred to as a phosphonate group), a dialkylphosphono group (—PO$_3$(alkyl)$_2$), diarylphosphono group (—PO$_3$(aryl)$_2$), an alkylarylphosphono group (—PO$_3$(alkyl)(aryl)), a monoalkylphosphono group (—PO$_3$H(alkyl)) and conjugate base groups thereof (hereinafter, referred to as an alkylphosphonate group), a monoarylphosphono group (—PO$_3$H(aryl)) and conjugate base groups thereof (hereinafter, referred to as an arylphosphonate group), phosphonooxy group (—OPO$_3$H$_2$) and conjugate base groups thereof (hereinafter, referred to as a phosphonateoxy group), a dialkyl phosphonooxy group (—OPO$_3$(alkyl)$_2$), diarylphosphonooxy group (—OPO$_3$(aryl)$_2$), alkylarylphosphonooxy group (—OPO$_3$(alkyl)(aryl)), monoalkylphosphonooxy group (—OPO$_3$H(alkyl)) and conjugate base groups thereof (hereinafter, referred to as an alkylphosphonateoxy group), monoarylphosphonooxy group (—OPO$_3$H(aryl)) and conjugate base groups thereof (hereinafter, referred to as an arylphosphonateoxy group), a cyano group, a nitro group, an aryl group, a heteroaryl group, an alkenyl group, an alkynyl group, and a silyl group.

Specific examples of the alkyl group in these substituents include the above-described alkyl groups, which may be further substituted.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a phenyl group, a cyanophenyl group, a sulfophenyl group, a sulfonatephenyl group, a phosphonophenyl group, and a phosphonatephenyl group.

The heteroaryl group is a group derived from a monocyclic or polycyclic aromatic ring containing at least one of a nitrogen atom, an oxygen atom, and a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, prine, quinolizine, isoquinoline, phthalazine, naphthyridine, quinazoline, cinnoline, pteridine, carbazole, carboline, phenanthroline, acridine, perimidine, phenanthroline, phthalazine, phenarsazine, phenoxazine, and furazan, which may be further benzo-condensed ring, or may be substituted.

Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. Examples of G1 in the acyl group (G1CO—) include a hydrogen atom, and the above-described alkyl group and aryl group. Among these substituents, more preferable examples include a halogen atom (—F, —Br, —Cl, and —I), an alkoxy group, an aryloxy group, an alkylthio group, an arylthio group, a N-alkylamino group, a N,N-dialkyl amino group, an acyloxy group, a N-alkylcarbamoyloxy group, a N-arylcarbamoyloxy group, an acylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N-alkyl-N-arylcarbamoyl group, a sulfo group, a sulfonate group, a sulfamoyl group, a N-alkylsulfamoyl group, a N,N-dialkylsulfamoyl group, a N-arylsulfamoyl group, a N-alkyl-N-arylsulfamoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonateoxy group, an aryl group, an alkenyl group, and an alkylidene group (e.g. methylene group).

Examples of the alkylene group in the substituted alkyl group include a divalent organic residue obtained by removing any one of the hydrogen atoms on the above-described alkyl group having 1 to 20 carbon atoms, and preferable examples thereof include a linear alkylene group having 1 to 12 carbon atoms, a branched alkylene group having 3 to 12 carbon atoms, and a cyclic alkylene group having 5 to 10 carbon atoms.

Specific examples of the substituted alkyl group which is obtained by combining the above-described substituent with an alkylene group and is preferable as $R^1$, $R^2$, or $R^3$ include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylarninoethyl group, a diethylaminopropyl group, a morpholinopropyl group, an acetyloxymethyl group, a benzoyloxymethyl group, a N-cyclohexylcarbamoyloxyethyl group, a N-phenylcarbamoyloxyethyl group, an acetylaminoethyl group, a N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, a N-methylcarbamoylethyl group, a N,N-dipropylcarbamoylmethyl group, a N-(methoxyphenyl)carbamoylethyl group, a N-methyl-N-(sulfophenyl)carbamoylrnethyl group, a sulfobutyl group, a sulfonatepropyl group, a sulfonatebutyl group, a sulfamoylbutyl group, a N-ethylsulfamoylrnethyl group, a N,N-dipropylsulfamoylpropyl group, a N-tolylsulfamoylpropyl group, a N-methyl-N-(phosphonophenyl)sulfamoyloctyl group, a phosphonobutyl group, a phosphonatehexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an a-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the aryl group preferable as $R^1$, $R^2$, or $R^3$ include a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these groups, a phenyl group, and a naphthyl group are more preferable.

Specific examples of the substituted aryl group preferable as $R^1$, $R^2$, or $R^3$ include the above-described aryl group having a monovalent group of nonmetal atoms (excluding hydrogen atoms) as a substituent on the carbon atom forming the ring. Preferable examples of the substituent include the above-described alkyl group, substituted alkyl group, and examples of the substituents in the alkyl group. Specific preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, a N-cyclohexylcarbamoyloxyphenyl group, a N-phenylcarbamoyloxyphenyl group, an acetylaminophenyl group, a N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, a N-methylcarbamoylphenyl group, a N,N-dipropylcarbamoylphenyl group, a N-(methoxyphenyl)carbamoylphenyl group, a N-methyl-N-(sulfophenyl)carbamoylphenyl group, a sulfophenyl group, a sulfonatephenyl group, a sulfamoylphenyl group, a N-ethylsulfamoylphenyl group, a N,N-dipropylsulfamoylphenyl group, a N-tolylsulfamoylphenyl group, a N-methyl-N-(phosphonophenyl)sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and 3-butynylphenyl group.

Particularly preferable examples of $R^2$ and $R^3$ include a substituted or unsubstituted alkyl group. More preferable examples of $R^1$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

In the next place, A in the formula (XVIII) is further described. A represents an optionally substituted aromatic ring or heterocycle, and specific examples of the optionally substituted aromatic ring or heterocycle include the same examples as those listed in the above-described description of $R^1$, $R^2$, or $R^3$ in the formula (XVIII).

Among them, preferable examples of A include an aryl group having an alkoxy group, a thioalkyl group, or an amino group, and particularly preferable examples of A include an aryl group having an amino group.

In the next place, Y in the formula (XVIII) is further described. Y represents a group of nonmetal atoms necessary for forming a heterocycle together with the above-described A and the adjacent carbon atom. Examples of the heterocycle include a 5-, 6-, or 7-membered nitrogen-containing or sulfur-containing heterocycle which may have a condensed ring. Among them, a 5- or 6-membered heterocycle is preferable.

Preferable examples of the nitrogen-containing heterocycle include those known as a component of basic nuclei in melocyanine dyes described in L. G. Brooker et al., J. Am, Chem. Soc., vol. 73 (1951), pp. 5326-5358 and reference documents cited therein. Specific examples thereof include, thiazoles (e.g. thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (e.g. benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (e.g. naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, and 7-methoxynaphtho[1,2]thiazole), thianaphtheno-7',6',4,5-thiazoles (e.g. 4'-methoxythianaphtheno-7',6',4,5-thiazole), oxazoles (e.g. 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (e.g. benzoxazole, 5-chlorobenzoxazole, 5-methyl benzoxazole, 5-phenylbenzooxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthooxazoles (e.g. naphtho[1,2]oxazole and naphtho[2,1]oxazole), selenazoles(e.g. 4-methylselenazole and 4-phenylselenazole), benzoselenazoles (e.g. benzoselenazole, 5-chlorobenzoselenazole, 5-methoxybenzoselenazole, 5-hydroxybenzoselenazole, and tetrahydrobenzoselenazole), naphthoselenazoles (e.g. naphtho[1,2]selenazole, and naphtho[2,1]selenazole), thiazolines (e.g. thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl)thiazoline), 2-quinolines (e.g. quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (e.g. quinoline, 6-methoxyquinoline, 7-methylquinoline, and 8-methylquinoline), 1-isoquinolines (e.g. isoquinoline and 3,4-dihydroisoquinoline), 3-isoquinolines (e.g. isoquinoline), benzimidazoles (e.g. 1,3-dimethylbenzimidazole, 1,3-diethylbenzimidazole, and 1-ethyl-3-phenylbenzimidazole), 3,3-dialkylindolenines (e.g. 3,3-dimethylindolenine, 3,3,5-trimethylindolenine, and 3,3,7-trimethylindolenine), 2-pyridines (e.g. pyridine and 5-methyl pyridine), and 4-pyridine (e.g. pyridine). These ring substituents may be combined with each other to form a ring.

Examples of the sulfur-containing heterocycle include dithiol partial structures in dyes described in JP-A No. 3-296759. Specific examples thereof include benzodithiols (e.g. benzodithiol, 5-t-butylbenzodithiol, and 5-methylbenzodithiol), naphthodithiols (e.g. naphtho[1,2]dithiol and naphtho[2,1]dithiol), dithiols (e.g. 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiols, 4,5-dicyano dithiol, 4-methoxycarbonylmethyldithiol, and 4-carboxymethyldithiol).

In the formula (18), among the examples of nitrogen-containing or sulfur-containing heterocycles formed by Y together with the above-described A and adjacent carbon atom, the dye having a structure represented by the partial structural formula of the following formula (18-2) is particularly preferable because it offers a photosensitive composition having high sensitizing capacity and very excellent storage stability. Examples of the dye having the partial structure represented by the formula (18-2) is cited in detail as new compounds in a specification of Japanese Patent Application Laid-Open (JP-A) No. 2004-318049.

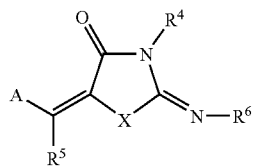

(XVIII-2)

In the formula (18-2), A represents an optionally substituted aromatic ring or heterocycle, and X represents an oxygen atom, a sulfur atom, or —N($R^1$)—. $R^1$, $R^4$, $R^5$, and $R^6$ each independently represents a hydrogen atom or a monovalent group of nonmetal atoms, and A, $R^1$, $R^4$, $R^5$, and $R^6$ may be combined with each other to form an aliphatic or aromatic ring. In the formula (18-2), A and $R^1$ are each equivalent to those in the formula (18), $R^4$ is equivalent to $R^2$ in the formula (18), $R^5$ is equivalent to $R^3$ in the formula (18), and $R^6$ is equivalent to $R^1$ in the formula (18).

In the next place, compound represented by the following formula (XVIII-3), which is a preferable exemplary embodiment of the compound represented by the formula (XVIII), is further described.

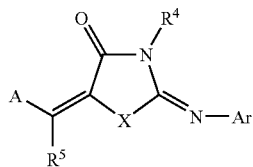

(XVIII-3)

In the formula (18-3), A represents an optionally substituted aromatic ring or heterocycle, and X represents an oxygen atom, a sulfur atom, or —N($R^1$)—. $R^1$, $R^4$, and $R^5$ are each independently a hydrogen atom or a monovalent group of nonmetal atoms, and A, $R^1$, $R^4$, and $R^5$ may be combined with each other to form an aliphatic or aromatic ring. Ar represents a substituted aromatic ring or heterocycle. The sum total of the Hammett's values of the substituents on the Ar skeleton must be greater than 0. The "sum total of Hammett's values is larger than 0" as used herein may be that one substituent is present and the Hammett's value of the substituent is larger than 0 or that a plurality of substituents are present and the sum total of the Hammett's values of these substituents is larger than 0.

In the formula (18-3), A and $R^1$ are equivalent to those in the formula (18), $R^4$ is equivalent to $R^2$ in the formula (18), and $R^5$ is equivalent to R3 in the formula (18). Ar represents a substituted aromatic ring or heterocycle, and specific examples thereof include the same specific examples of the substituted aromatic ring or heterocycle as those listed for A in the description of the formula (18). The total sum of the Hammett's values of the substituents to be introduced into Ar in the formula (18-3) must be 0 or more. Examples of the substituents include a trifluoromethyl group, a carbonyl group, an ester group, a halogen atom, a nitro group, a cyano group, a sulfoxide group, an amide group, and a carboxyl group. The Hammett's value of these substituents are as follows: trifluoromethyl group (—$CF_3$, m: 0.43, p: 0.54); carbonyl group (e.g. —COH, m: 0.36, p: 0.43); ester group (—$COOCH_3$, m: 0.37, p: 0.45); halogen atom (e.g. Cl, m: 0.37, p: 0.23); cyano group (—CN, m: 0.56, p: 0.66); sulfoxide group (e.g. —$SOCH_3$, m: 0.52, p: 0.45); amide group (e.g. —$NHCOCH_3$, m: 0.21, p: 0.00); and carboxyl group (—COOH, m: 0.37, p: 0.45). The site of the substituent in the aryl skeleton and the Hammett's value of the substituent are listed inside the parentheses, and (m: 0.50) means that the Hammett's value of the substituent upon introduction into the meta position is 0.50. Preferable examples of Ar include a substituted phenyl group, and preferable examples of the substituent on the Ar skeleton include an ester group and a cyano group. The substituent is particularly preferably located in the ortho position on the Ar skeleton.

Specific preferable examples of sensitizing dyes represented by Formula (XVIII) according to the present invention are shown in [exemplary compound (F-1) to exemplary compound (F-56)] below, however, the present invention is not limited thereto.

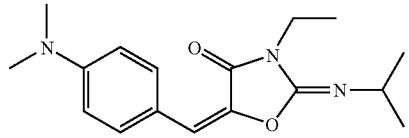

(F1)

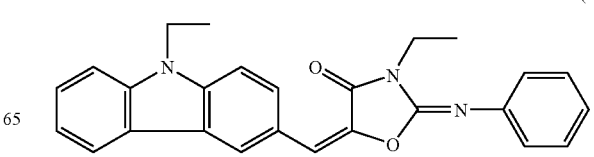

(F2)

-continued
(F3)
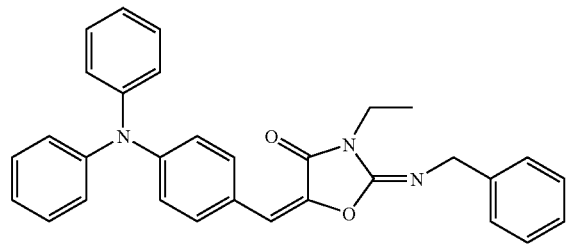
(F4)
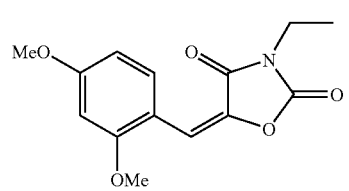
(F5)
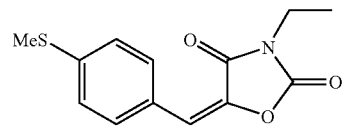
(F6)
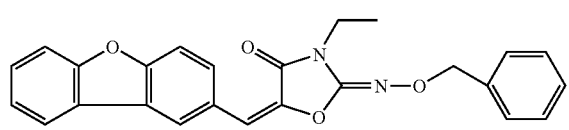
(F7)
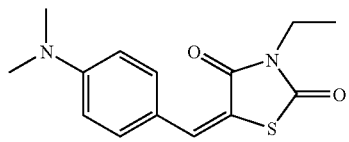
(F8)
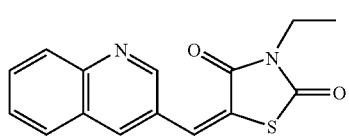
(F9)
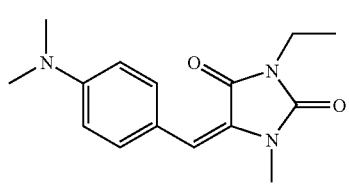
(F10)
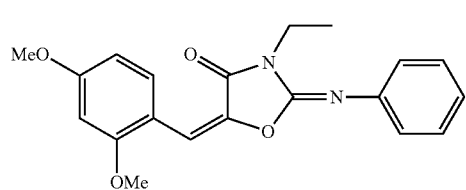
-continued
(F11)
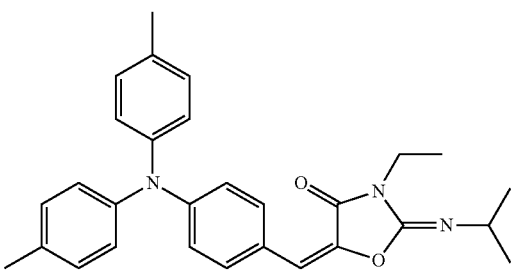
(F12)
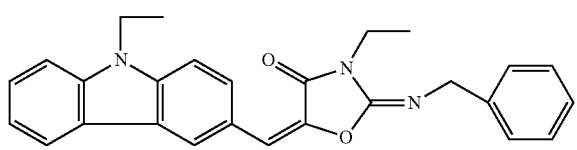
(F13)
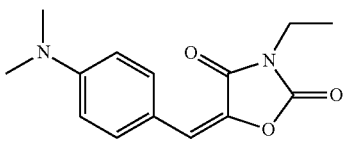
(F14)
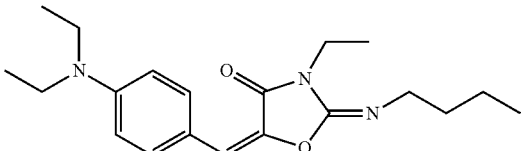
(F15)
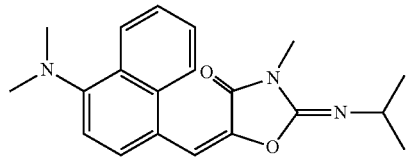
(F16)
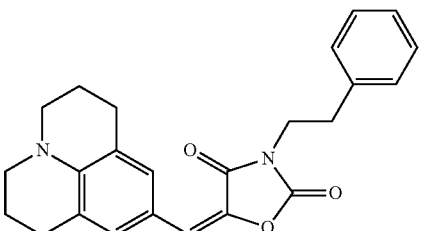
(F17)
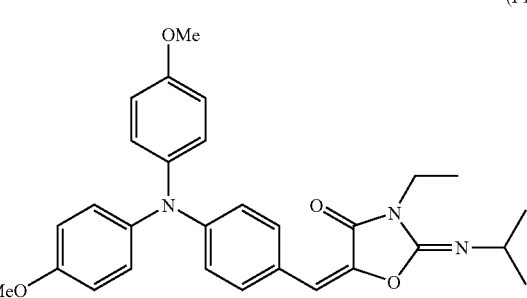

(F18) 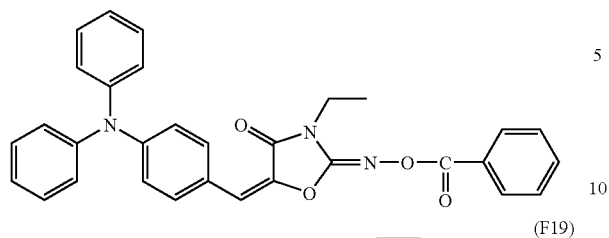
(F19) 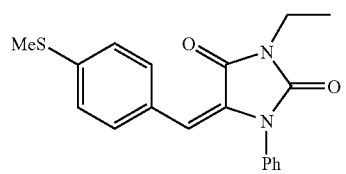
(F20) 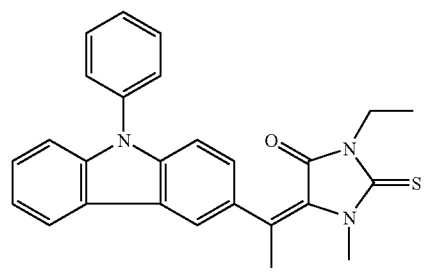
(F21) 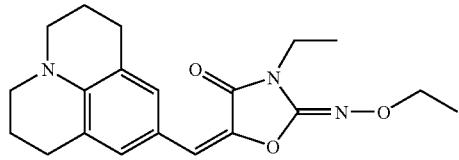
(F22) 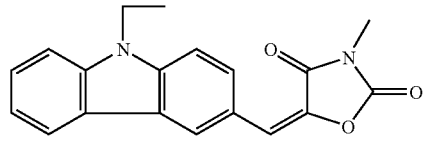
(F23) 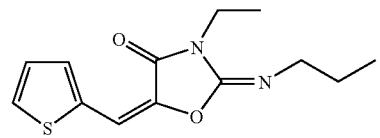
(F24) 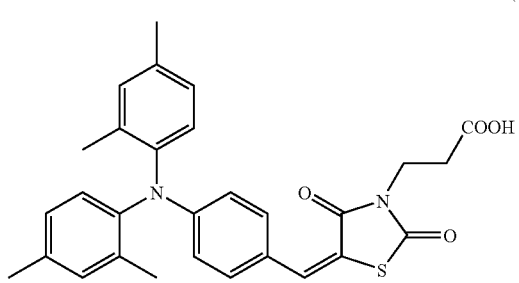
(F25) 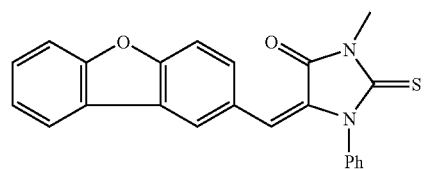
(F26) 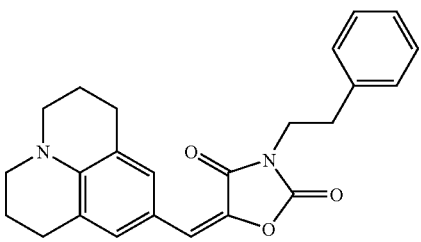
(F27) 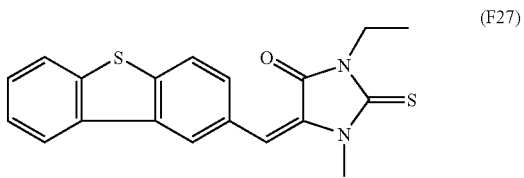
(F28) 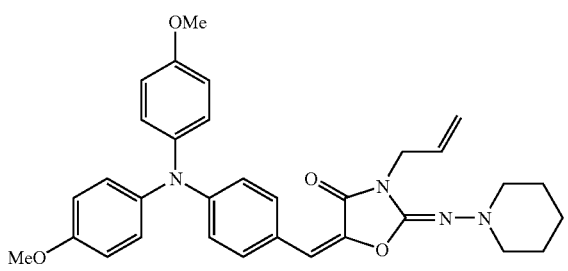
(F29) 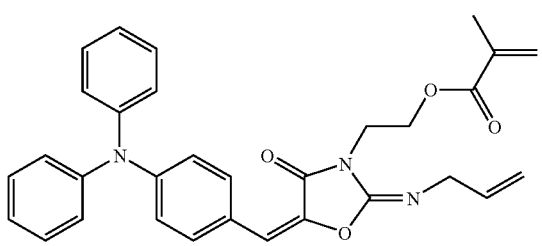
(F30) 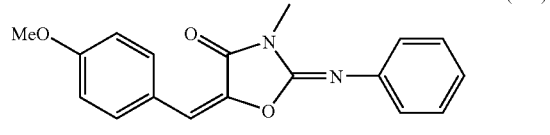
(F31) 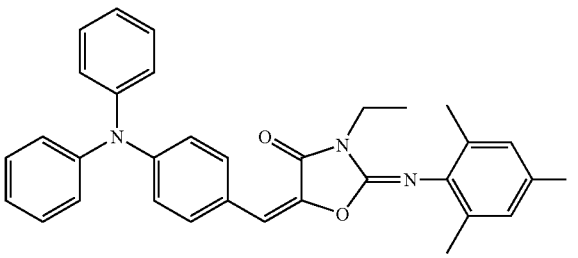
(F32) 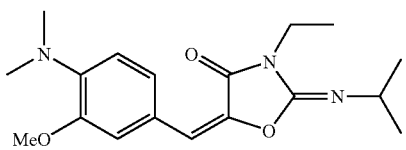

(F33) 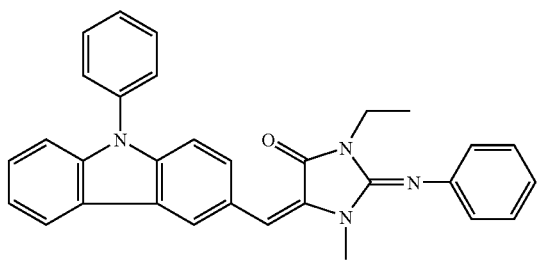
(F34) 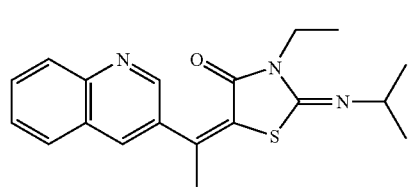
(F35) 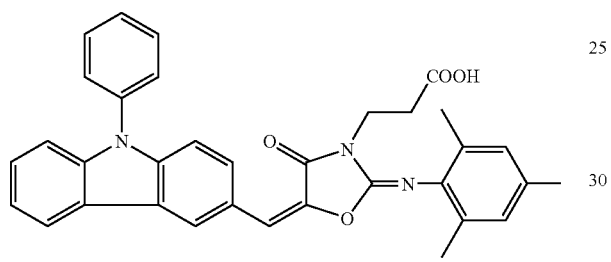
(F36) 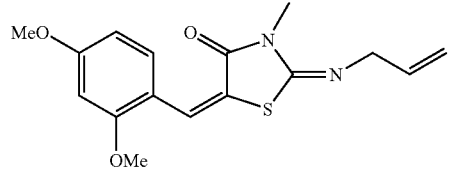
(F37) 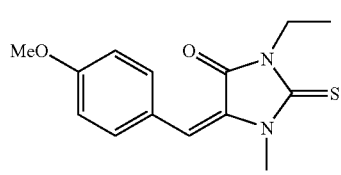
(F38) 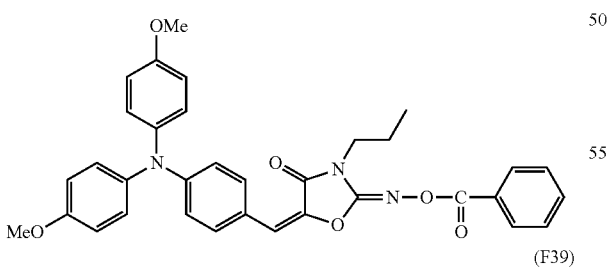
(F39) 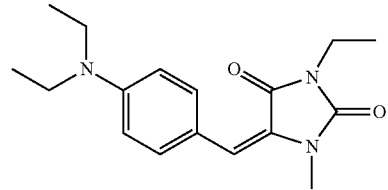
(F40) 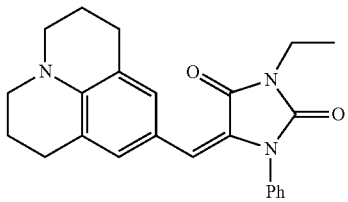
(F41) 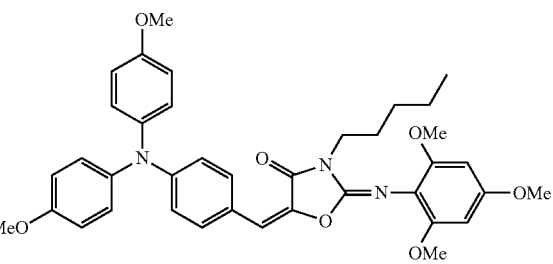
(F42) 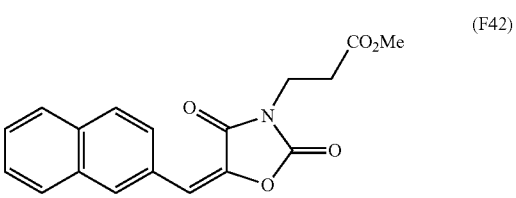
(F43) 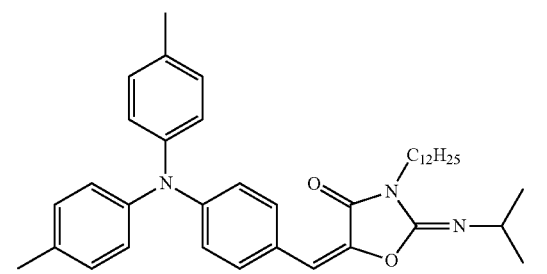
(F44) 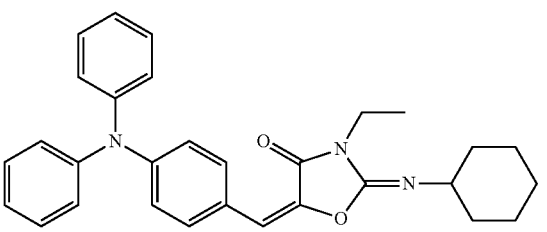
(F45) 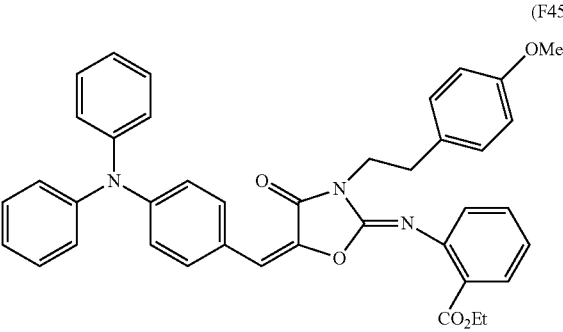

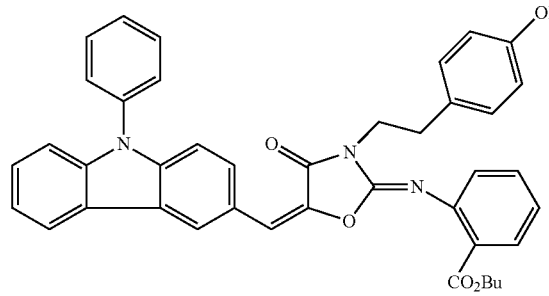
(F46)
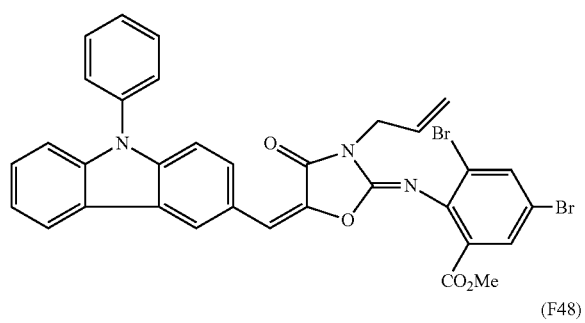
(F47)
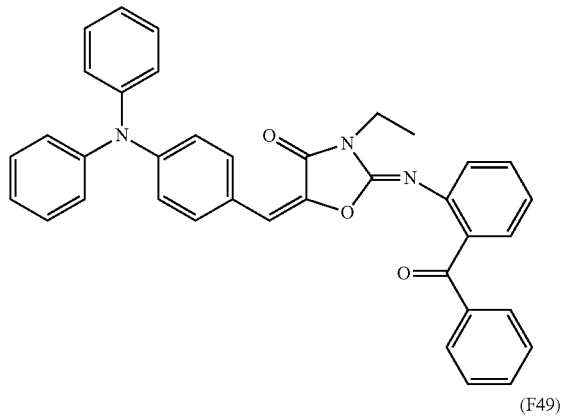
(F48)
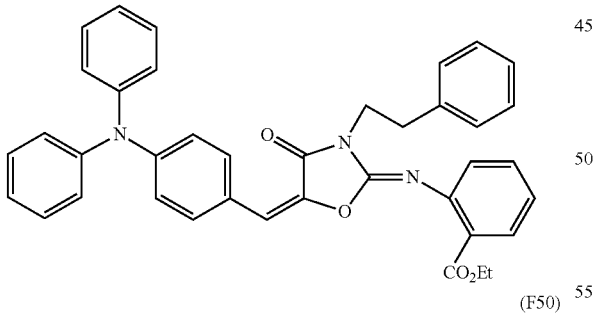
(F49)
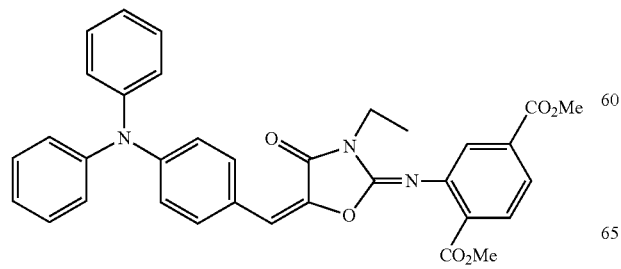
(F50)
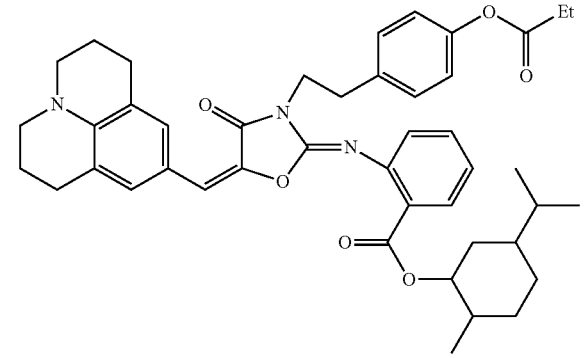
(F51)
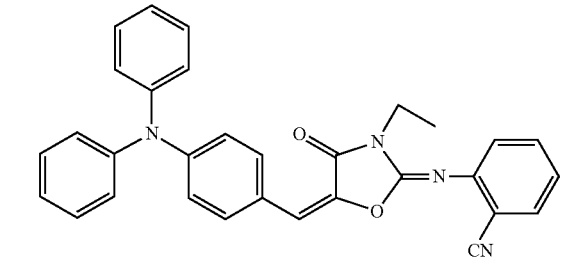
(F52)
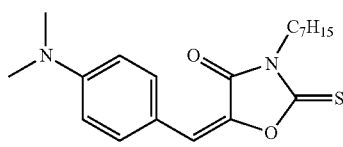
(F53)
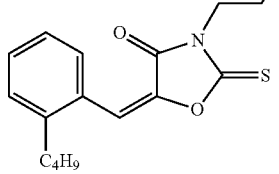
(F54)
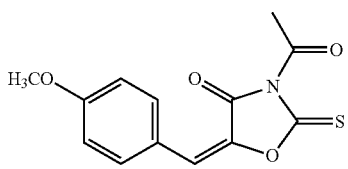
(F55)
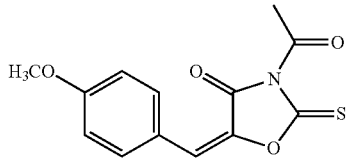
(f55)
(F56)
The compounds represented by Formula (XVIII) from among the sensitizing dyes applicable to the present invention are preferable from the standpoint of curability of the lower portions.

With respect to the sensitizing dyes, the following various chemical modifications may be performed thereto in order to improve the characteristics of the colored photosensitive composition of the present invention. For example, by combining the sensitizing dye with an additional polymerizable compound structure (for example, an acryloyl group or a methacryloyl group) using methods such as a covalent bond, an ionic bond, or a hydrogen bond, an improvement in the strength of the cross-linked curing layer and an improvement in the ability to suppress unwanted precipitation of the dye from the cross-linked curing layer can be obtained.

The amount contained of the sensitizing dye is preferably 0.01 mass % to 20 mass %, is more preferably 0.01 mass % to 10 mass %, and still more preferably 0.1 mass % to 5 mass %, with respect to the total solids of the colored photosensitive composition for color filters of the present invention.
The amount contained of the sensitizing dye within these ranges is preferable since there is high sensitivity to the exposure wavelengths of an ultrahigh pressure mercury lamp, and curability of the lower layer portions may be obtained, and these ranges are also preferable in terms of developing margin and pattern forming characteristics.

[Alkali Soluble Resin]

The colored photosensitive composition of the present invention includes an alkali soluble resin. The alkali soluble resin is a linear organic polymer, and may be suitably selected from an alkali soluble resin having at least one group within the molecule (preferably a molecule with an acrylic copolymer or a styrene copolymer as a main chain) promoting alkali solubility (such as, for example, a carboxyl group, a phosphoric acid group, or a sulfonic acid group).
Among these, resins which are soluble in an organic solvent and developable by a weak alkali aqueous solution are still more preferable.

A known radical polymerization method is, for example, applicable for production of the alkali soluble resin.
Polymerization conditions during manufacturing the alkali soluble resin with a radical polymerization method, such as the temperature, pressure, type of radical initiator and amount thereof, type of solvent, and the like are easily determined by a person skilled in the art, and the conditions can be derived experimentally.

The linear organic polymer preferably is a polymer having a carboxylic acid group in a side chain thereof. Preferable examples include, for example, a methacrylic acid copolymer, an acrylic acid copolymer, an itaconic acid copolymer, a crotonic acid copolymer, a maleic acid copolymer, a partially esterified maleic acid copolymer, or the like as described in JP-A No. 59-44615, JP-B No. 54-34327, JP-B No. 58-12577, JP-B No. 54-25957, JP-A No. 59-53836, and JP-A No. 59-71048, an acidic cellulose derivative having carboxylic acid in a side chain, and a polymer having a hydroxyl group to which an acid anhydride has been added, and a polymer which has an (meth)acryloyl group in a side chain.

Among these, a benzyl (meth)acrylate/(meth)acrylic acid copolymer, and a multi-component copolymer configured from benzyl (meth)acrylate/(meth)acrylic acid/another monomer are preferred.
Besides these, products produced by copolymerization with 2-hydroxyethyl methacrylate are also effective.

Besides the above, other examples include a 2-hydroxypropyl(meta)acrylate/polystyrene macro-monomer/benzyl methacrylate/methacrylic acid copolymer, and a 2-hydroxy-3-phenoxypropylacrylate/polymethylmethacrylate macro-monomer/benzyl methacrylate/methacrylic acid copolymer, a 2-hydroxyethyl methacrylate/polystyrene macro-monomer/methyl methacrylate/methacrylic acid copolymer, and a 2-hydroxyethyl methacrylate/polystyrene macro-monomer/benzyl methacrylate/methacrylic acid copolymer, as described in JP-A No. 7-140654, and the like.

Particularly suitable for the alkali soluble resin in the present invention are copolymers of (meth)acrylic acid with other monomers copolymerizable therewith. Here, (meth)acrylic acid is used as a general term to mean acrylic acid and/or methacrylic acid, and (meth)acrylate is used in a similar manner as a general term for acrylate and/or methacrylate.

Examples of other monomers copolymerizable with (meth)acrylic acid include alkyl(meth)acrylates, aryl(meth)acrylates, vinyl compounds, and the like. Here, the hydrogen atom(s) of the alkyl group and the aryl group may be substituted by a substituent. Specific examples of the alkyl(meth)acrylates and aryl(meth)acrylates include methyl(meth)acrylate, ethyl(meth)acrylate, propyl(meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl(meth)acrylate, naphthyl(meth)acrylate, and cyclohexyl(meth)acrylate.

Examples of the vinyl compounds include, for example, styrene, α-methylstyrene, vinyltoluene, glycidyl methacrylate, acrylonitrile, vinyl acetate, N-vinyl pyrrolidone, tetrahydrofurfiiryl methacrylate, a polystyrene macro-monomer, a polymethylmethacrylate macro-monomer, $CH_2=CR^1R^2$, $CH_2=C(R^1)(COOR^3)$ (wherein $R^1$ represents a hydrogen atom or an alkyl group of 1 to 5 carbon atoms, $R^2$ represents an aromatic hydrocarbon ring of 6 to 10 carbon atoms, and $R^3$ represents an alkyl group of 1 to 8 carbon atoms, or an aralkyl group of 6 to 12 carbon atoms.

These other copolymerizable monomers may be used singly or in combinations of two or more thereof.
Preferable other copolymerizable monomers include at least one monomer selected from $CH_2=CR^1R^2$, $CH_2=C(R^1)(COOR^3)$, phenyl(meth)acrylate, benzyl(meth)acrylate, and/or styrene, and particularly preferable is $CH_2=CR^1R^2$ and/or $CH_2=C(R^1)(COOR^3)$.

The amount contained of alkali soluble resin in the colored photosensitive composition, is preferably 1 to 15 mass % with respect to the total solids of the composition, is more preferably 2 to 12 mass %, and is particularly preferably 3 to 10 mass %.

[Solvent]

Generally the pigment dispersion composition or the colored photosensitive composition of the present invention can be appropriately prepared by using a solvent with each of the components described above.
Examples of solvents that may be used therefor include: esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate; 3-oxypropionic acid alkyl esters, such as methyl 3-oxypropionate, and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, ethyl 2-oxobutanoate; ethers, for example diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate and the like; ketones, for example, methyl ethyl ketone, cyclohexanone, 2-heptanone, and 3-heptanone; aromatic hydrocarbons, for example, toluene, such as xylene; and the like.

Preferable among these are methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate, and the like.

The solvents may be used singly or in combinations of two or more thereof.

[Other Components]

Various additives can be included in the colored photosensitive composition of the present invention, as required, as long as there is no detriment to the effect of the present invention. Examples of such additives include a chain transfer agent, a fluoro organic compound, a thermal-polymerization initiator, a thermal-polymerization component, a thermal-polymerization inhibitor, and also a filler, a polymer compounds other than the above alkali soluble resins, a surfactant, an adhesion promoter, an antioxidant, an ultraviolet absorber, an aggregation inhibitor, or the like.

(Chain Transfer Agent)

Examples of the chain transfer agent which can be added to the colored photosensitive composition of the present invention include, alkyl esters of N,N-dialkylamino benzoic acid, such as N,N-dimethylaminobenzoic acid ethyl ester, mercapto compounds that contain heterocycles, such as 2-mercaptobenzothiazole, 2-mercaptobenzoxazole, and 2-mercaptobenzimidazole, aliphatic polyfunctional mercapto compounds, and the like.

The chain transfer agents may be used singly or in combinations of two or more thereof.

(Fluoro Organic Compound)

By including a fluoro organic compound, liquid characteristics (in particular flowability) can be raised when the colored photosensitive composition of the present invention is a coating liquid, and the uniformity of coating thickness, and ability to save on liquid used can be improved. Namely, the colored photosensitive composition containing a fluoro organic compound has improved wettability to a coated face and the coatability of a coated face is improved, since the surface tension between the coated face and the coating liquid is reduced. Therefore, such an embodiment is effective for enabling film formation with little unevenness at a uniform thickness, even when a thin layer is formed of the order of several μm thickness using a small amount of liquid.

The fluorine content in the fluoro organic compound is preferably 3 mass % to 40 mass %, is more preferably 5 mass % to 30 mass %, and is particularly preferably 7 mass % to 25 mass %. Effective coating thickness uniformity and ability to save on liquid used is obtained when the fluorine content being this within these ranges, and the solubility with the composition is also good.

Examples of the fluoro organic compound include MEGAFAC F171, MEGAFAC F172, MEGAFAC F173, MEGAFAC F177, MEGAFAC F141, MEGAFAC F142, MEGAFAC F143, MEGAFAC F144, MEGAFAC R30, and MEGAFAC F437 (trade names, made by Dainippon Ink and Chemicals, Inc.), FLUORAD FC430, FLUORAD FC431 and FLUORAD FC171 (trade names, made by Sumitomo 3M), SURFLON S-382, SURFLON SC-101, SURFLON SC-103, SURFLON SC-104, SURFLON SC-105, SURFLON SC1068, SURFLON SC-381, SURFLON SC-383, SURFLON S393, SURFLON KH-40 (trade names, made by Asahi Glass Co., Ltd.), and the like.

Fluoro organic compounds having a fluoroalkyl group or a fluoroalkylene group at at least one of a terminal, main chain, and/or side chain of the compound are preferably used as the fluorosurfactant. Examples of specific commercial products thereof include MEGAFAC F142D, MEGAFAC F172, MEGAFAC F173, MEGAFAC F176, MEGAFAC F177, MEGAFAC F183, MEGAFAC 780, MEGAFAC 781, MEGAFAC R30, MEGAFAC R08, MEGAFAC F-472 SF, MEGAFAC BL20, MEGAFAC R-61, MEGAFAC R-90 (trade names, made by Dainippon Ink), FLUORAD FC-135, FLUORAD FC-170C, FLUORAD FC-430, FLUORAD FC-431, NOVEC FC-4430 (trade name, made by Sumitomo 3M), ASAHI GUARD AG7105, 7000, 950, 7600, SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, SURFLON SC-106 (trade names, made by Asahi Glass Co., Ltd.) and EFTOP EF351, EFTOP 352, EFTOP 801, EFTOP 802 (trade name, made by JEMCO), and the like.

The fluoro organic compound is particularly effective for prevention of coating unevenness or thickness unevenness when using the colored photosensitive composition of the present invention to form a thin coated layer. The fluoro organic compound is also effective when applying the colored photosensitive composition of the present invention to a slit coating in which readily causes lack of liquid.

The addition amount of the fluoro organic compound is preferably 0.001 mass % to 2.0 mass %, and is more preferably 0.005 mass % to 1.0 mass %, with respect to the total mass of colored photosensitive composition.

(Thermal Polymerization Initiator)

Including a thermal polymerization initiator in the colored photosensitive composition of the present invention is also effective. Examples of the thermal polymerization initiator include various kinds of azo compounds and peroxide compounds. Examples of the azo compounds include azobis compounds and examples of the peroxide compounds include ketone peroxide, peroxyketal, hydroperoxide, dialkyl peroxide, diacyl peroxide, peroxyester, and peroxydicarbonate.

(Thermal-Polymerization Component)

Including a thermal-polymerization component in the colored photosensitive composition of the present invention is also effective. An epoxy compound can be used as the thermal-polymerization component in order to raise the strength of the coated layer formed with the colored photosensitive composition of the present invention. Examples of the epoxy compounds include a compound having two or more epoxy rings in its molecule, such as bisphenol-A epoxy compounds, cresol novolac epoxy compounds, biphenyl epoxy compounds, and alicyclic epoxy compounds. Examples of bisphenol-A epoxy compounds include EPOTOHTO YD-115, YD-118T, YD-127, YD-128, YD-134, YD-8125, YD-7011R, ZX-1059, YDF-8170, YDF-170 (trade names, made by Tohto Kasei Co., Ltd.), DENACOL EX-1101, EX-1102, and EX-1103 (trade name, made by Nagase Kasei Co., Ltd.), PRAXEL GL-61, GL-62, G101, and G102 (trade names, made by Daicel Chemical Industries, Ltd.), and the like, and also similar bisphenol-F epoxy compounds and bisphenol-S epoxy compounds. Epoxy acrylates, such as EBECRYL, 3700, 3701, 600 (trade names, made by Daicel UCB Ltd.) can also be used.

Examples of cresol novolac epoxy compounds include EPOTOHTO YDPN-638, YDPN-701, YDPN-702, YDPN-703, YDPN-704 (trade name, made by Tohto Kasei Co., Ltd.), DENACOL EM-125 (trade name, made by Nagase Kasei Co., Ltd.); examples of biphenyl epoxy compounds include 3,5,3',5'-tetramethyl-4,4' diglycidyl biphenyl, and the like. Examples of alicyclic epoxy compounds include CELLOXIDE 2021, 2081, 2083, 2085, EPOLEAD GT-301, GT-302, GT-401, GT-403, EHPE-3150 (trade names, made by Daicel Chemical Industries, Ltd.), SUNTOHTO ST-3000, ST-4000, ST-5080, ST-5100 (trade names, made by Tohto Kasei Co., Ltd.), and the like. Other examples of compound that may be used include 1,1,2,2-tetrakis(p-glycidyloxy phenyl)ethane, tris(p-glycidyloxy phenyl)methane, triglycidyl tris(hydroxyethyl)isocyanurate, diglycidyl o-phthalate, diglycidyl terephthalate, as well as amine epoxy resins EPOTOHTO YH-434, YH-4341, and glycidyl esters with bisphenol-A epoxy resin skeletons thereof which have been modified with a dimer acid.

(Surfactant)

Various kinds of surfactants may be added to the colored photosensitive composition of the present invention in order to improve the coatability thereof. Besides the above fluorosurfactants, various nonionic surfactants, cationic surfactants, and anionic surfactants can also be used as such a surfactant. Preferable among these are fluorosurfactants which have a perfluoroalkyl group and are non-ionic surfactants, and non-ionic surfactants.

Particularly preferable examples of non-ionic surfactants include non-ionic surfactants, such as polyoxyethylene alkyl ethers, polyoxyethylene alkylaryl ethers, polyoxyethylene alkyl esters, sorbitan alkyl esters, monoglyceride alkyl esters, and the like. Specific non-ionic surfactants include: polyoxyethylene alkyl ethers, such as polyoxyethylene lauryl ether, polyoxyethylene stearyl ether, and polyoxyethylene oleyl ether; polyoxyethylene aryl ethers, such as polyoxyethylene octylphenyl ether, polyoxyethylene poly styrylated ether, polyoxyethylene tribenzyl phenyl ether, polyoxyethylene-propylene polystyryl ether, and polyoxyethylene nonylphenyl ether; polyoxyethylene dialkyl esters, such as polyoxyethylene dilaurate, polyoxyethylene distearate, sorbitan fatty acid esters, polyoxyethylene sorbitan fatty acid esters, ethylene diamine polyoxyethylene-polyoxypropylene condensates, and the like. Commercially available products thereof by Kao Corporation, NOF Corporation, Takemoto Oil and Fat Co., Ltd., Adeka Corporation, Sanyo Chemical Industries, Ltd, and the like can be suitably applied therefor. Besides these, the dispersants described above are also usable as the surfactant.

(Other Additives)

Various kinds of additives can be added to the colored photosensitive composition of the present invention besides those described above. Specific examples of such additives include: ultraviolet absorbers, such as 2-(3-t-butyl-5-methyl-2-hydroxyphenyl)-5-chlorobenzotriazole and alkoxybenzophenone; aggregation inhibitors, such as sodium polyacrylate; fillers, such as glass and alumina; alkali soluble resins, such as an itaconic acid copolymer, a crotonic acid copolymer, a maleic acid copolymer, a partially esterified maleic acid copolymer, an acidic cellulose derivative, a product formed by adding polymer having a hydroxyl group to an acid anhydride, an alcohol soluble nylon, a phenoxy resin formed from bisphenol A and epichlorohydrin, and the like.

The colored photosensitive composition of the invention preferably may further contain an organic carboxylic acid, which preferably has a low molecular weight of 1,000 or less, to accelerate dissolution of non-cured portions in alkali and further improve the developing property of the colored photosensitive composition. Specific examples thereof include aliphatic monocarboxylic acid, such as formic acid, acetic acid, propionic acid, butyric acid, valeric acid, pivalic acid, caproic acid, diethylacetic acid, enanthic acid, and caprylic acid; aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acid, such as tricarballylic acid, aconitic acid, and camphoronic acid; aromatic monocarboxylic acid, such as benzoic acid, toluic acid, cuminic acid, hemellitic acid, and mesitylenic acid; aromatic polycarboxylic acid, such as phthalic acid, isophthalic acid, terephthalic acid, trimellitic acid, trimesic acid, mellophanic acid, and pyromellitic acid; and other carboxylic acid, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

A thermal-polymerization inhibitor may be added to the colored photosensitive composition of the present invention. Examples of compounds that may be used as the thermal-polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol), 2-mercaptobenzimidazole, and the like.

The colored photosensitive composition of the invention may be prepared by adding a photopolymerizable compound and a photopolymerization initiator, and further if necessary, and an additive such as an alkali-soluble resin, a solvent and a surfactant to the pigment-dispersed composition of the invention described above.

Since the colored photosensitive composition of the invention contains the pigment-dispersed composition containing the processed pigment of the invention, it is excellent in dispersibility of the processed pigment, and is also excellent in color property.

For this reason, it is preferable that the composition is used for forming a colored region of the color filter which is required to have better color property.

<Color Filter>

The color filter of the invention is characterized in that it has a colored region using the colored photosensitive composition of the invention on a substrate.

Herein, the colored region includes both of three color or four color of colored pattern (pixel part), and a black matrix.

A process for manufacturing the color filter of the invention will be explained.

First, the colored photosensitive composition of the invention is coated on a substrate directly or via other layer by a coating method such as spinning coating, slit coating, casting coating, roll coating, and bar coating to form a coated film consisting of the colored photosensitive composition (coating step). Thereafter, the coated film is exposed to light via a predetermined mask pattern (light exposing step). After exposure to light, an uncured part of the coated film is developed and removed with a developer (developing step). By passing these steps, a colored pattern consisting of pixels of respective colors (3 color or 4 color) is formed, thereby, a color filter may be obtained.

Thereupon, as radiation used, ultraviolet ray such as g-ray, h-ray, i-ray and j-ray is particularly preferable. In the color filter for a liquid crystal displaying device, light exposure using mainly h-ray and i-ray with a proximity light exposing machine, a mirror projection light exposing machine is preferable and, in the color filter for a solid image pickup element, it is preferable to use mainly i-ray with a stepper light exposing machine.

By such method, the color filter used in the liquid crystal display element or the solid image pickup element may be manufactured with little difficulty in a process, and at high quality and low cost. Each step will be explained in detail below.

[Coating Process]

First, the substrate used in the coating process will be explained. Examples of substrates used for the color filter of the present invention include substrates used for liquid crystal display elements, such as alkali-free glass, soda glass, Pyrex (registered trademark) glass, and quartz glass, such substrates with a transparent conductive layer adhered thereto, and photoelectric conversion element substrates used for solid-state image sensing devices and the like, for example, silicon substrates and plastic substrates. A black matrix separating each pixel may be formed on these substrates and/or a transparent resin layer may be provided in order to promote adhesion and the like. A gas barrier layer and/or a solvent resistant layer is preferably provided on the surface of plastic substrates.

Besides these substrates, substrates for driving on which thin-film transistors (TFTs) have been disposed for thin-film transistor (TFT) color liquid crystal displays (referred to below as "substrates for TFT liquid crystal driving") can used, a colored pattern which uses the colored photosensitive composition of the present invention can also be formed on this substrate for driving, and a color filter can be produced thereby. Examples of substrates used for substrates for TFT liquid crystal driving include glass, silicone, polycarbonate, polyester, aromatic polyamides, polyamidoimides, and polyimides. These substrates may be subjected to appropriate pretreatment, such as chemical treatment with a silane coupling agent or the like, plasma treatment, ion plating, sputtering, vapor phase reaction, vacuum deposition, or the like, as desired. Substrates can be used with, for example, passivation films, such as a silicon nitride film, formed on the surface of substrates for TFT liquid crystal driving.

In the coating process, the method of coating the colored photosensitive composition of the present invention to the substrate is not particularly limited, and methods using slit-nozzles (referred to below as slit-nozzle coating methods), such as slit-and-spin coating methods and spinless coating methods, are preferable. In slit-nozzle coating methods, although conditions differ in slit-and-spin coating methods and spinless coating methods depending on the size of the coating substrate, when, for example, coating a fifth generation glass substrate (1100 mm×1250 mm) by a spinless coating method, the jetting amount of the colored photosensitive composition from the slit nozzle is usually 500 to 2000 microliters/second, and is preferably 800 to 1500 microliters/second, with the coating velocity usually being 50 to 300 mm/second and preferably being 100 to 200 mm/second. The solids content of the colored photosensitive composition used in the coating process is usually 10% to 20%, and preferably 13% to 18%.

When forming the coated layer on the substrate with the colored photosensitive composition of the present invention, the thickness of the coated layer (after prebaking treatment) is generally 0.3 µm to 5.0 µm, preferably 0.5 µm to 4.0 µm, and most preferably 0.5 µm to 3.0 µm. When the color filter is for a solid-state image sensing device the thickness of the coated layer (after prebaking treatment) is preferably within the range of 0.5 µm to 5.0 µm.

Prebaking treatment is usually preformed after carrying out coating in a coating process. Vacuum treatment can also be performed, as required, before prebaking. The amount of vacuum applied in vacuum drying is usually about 0.1 torr to 1.0 torr, and is preferably about 0.2 torr to 0.5 torr. Prebaking treatment can be performed using a hot plate, oven, or the like, under conditions of a temperature range of 50° C. to 140° C., preferably about 70° C. to 110° C., for 10 to 300 seconds. Radio frequency treatment or the like may be used together with the prebaking treatment. Radio frequency treatment may also be used independently thereof.

[Exposure Process]

In an exposure process, exposure via a specific mask pattern is carried out to the coated layer formed, as described above, from the colored photosensitive composition.

Ultraviolet rays, such as g-line, h-line, i-line, and j-line, are particularly preferable for the radiation used when carrying out exposure (light-exposure).

It should be noted that when manufacturing a color filter for a liquid crystal display, light-exposure mainly of h-line and i-line using a proximity light-exposure machine, or a mirror projection light-exposure machine, is preferable.

Light-exposure using a stepper light-exposure machine is preferable when manufacturing a color filter for a solid-state image sensing device mainly i-line.

When manufacturing a color filter using a substrate for TFT method liquid crystal driving, besides a photomask used for providing a pattern for forming pixels (colored pattern), a photomask for providing a pattern for forming a through hole or U-shaped indentation may usually be used.

[Development Process]

In a development process, after carrying out light-exposure, the non-cured portions of the coated layer are dissolved in the developing liquid, and only the cured portions are left remaining on the substrate. The developing temperature is usually 20☐ to 30☐, and the developing time is usually 20 to 90 seconds. Anything can be used as the developing liquid as long as cured portions are not dissolved when dissolving the non-cured portions of the coated layer formed from the colored photosensitive composition. Specifically, various combinations of organic solvents and various alkaline aqueous solutions can be used.

The above described solvents used when preparing the colored photosensitive composition of the present invention can also be used as organic solvents for developing. Examples of the alkaline aqueous solutions include those prepared by dissolving alkaline compounds (such as, for example, sodium hydroxide, potassium hydroxide, sodium carbonate, sodium hydrogencarbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-diazacyclo-[5,4,0]-7-undecene). The concentration of the alkaline aqueous solution is 0.001 mass % to 10 mass %, and is preferably 0.01 mass % to 1 mass %. A suitable quantity of, for example, a water soluble organic solvent, such as methanol and ethanol, a surfactant, or the like, can also be added to the alkaline aqueous solution.

Any one of a dip method, a shower method, a spray method, or the like can be used as the developing method, and these may be combined with a swing method, a spin method, an ultrasonic method, or the like. The surface to be developed may also be wetted with water or the like in advance before the developing liquid is contacted thereto, in order to prevent uneven development. The substrate may also be inclined and developed. Paddle development is also used when manufacturing a color filter for a solid-state image sensing device.

After developing, rinsing is carried out to wash away excess developing liquid and then drying is performed. Then heat-treatment (post bake) is undertaken to complete curing. Although pure water is usually used for performing rinsing, in order to save water a method may be used in which pure water is used in the final washing stage and such processed pure water is recycled and used in previous washing stages, in combination with the substrate being inclined for washing, and/or ultrasound irradiation thereto.

After rinsing, draining and drying, heat-treatment (at about 200☐ to 250☐) is usually performed. This heat-treatment (post bake) may be performed to the coated layer after developing by a continuous or batch heating method so as to achieve the above conditions using a heating device such as a hot plate, a convection oven (circulating hot air dryer), a radio frequency heating device, or the like.

By sequentially performing the above respective steps repetitively for every color in conformity with the desired color phase number, the color filter in which a cured film (colored pattern) colored with a plurality of colors may be manufactured.

Since the color filter of the invention has a high contrast, a small color concentration variation, and better color property, it may be suitable in the solid image pickup element or the liquid crystal display element.

With respect to the use of the colored photosensitive composition of the present invention, although explanation is mainly given focusing on application to a colored pattern of a color filter, the colored photosensitive composition is also applicable to formation of a black matrix separating colored patterns (pixels) configuring a color filter.

The black matrix can be formed on a substrate by carrying out each of the processes of coating, light-exposure, and developing using the colored curable composition containing processed pigments of black pigments, such as carbon black and titanium black, and then, as required, performing post bake thereto.

EXAMPLES

More specific explanation will now be given of the present invention using the Examples, however, the present invention is not limited the following Examples, as long as the main principles of the invention are not departed from. It should be noted that unless otherwise stated, "parts" refers to parts by mass.

Example of Synthesis of Polymer Compound Having Heterocycle on Side Chain

Synthesis of Specific Polymer Compound 1

Into a three-neck flask replaced with nitrogen were introduced 27.0 g of M-11, 126.0 g of MMA, 27.0 g of MAA, and 420.0 g of 1-methoxy-2-propanol, this was stirred with a stirrer (trade name Three One Motor, manufactured by Shinto Scientific Co. Ltd.), and a temperature was raised to 90° C. by heating while nitrogen was flown into the flask. To this was added 1.69 g of 2,2-azobis(2,4-dimethylvaleronitrile) (trade name V-65, manufactured by Wako Pure Chemical Industries, Ltd.), and the mixture was heated and stirred at 90° C. for 2 hours. After 2 hours, 1.69 g of V-65 was further added, the mixture was heated and stirred for 3 hours, thereafter, a 30 mass % solution of a specific polymer compound 1 was obtained.

A weight average molecular weight of the resulting polymer compound was measured by a gel permeation chromatography method (GPC) using polystyrene as a standard substance and, as a result, the weight average molecular weight was 2.0×10000. In addition, from titration using sodium hydroxide, an acid value per solid matter was 98 mgKOH/g.

Synthesis of Specific Polymer Compound 2

Into a three-neck flask replaced with nitrogen were introduced 27.0 g of M-6, 126.0 g of MMA, 27.0 g of MAA, and 420.0 g of 1-methoxy-2-propanol, the mixture was stirred with a stirrer (trade name Three One Motor, manufactured by Shinto Scientific Co. Ltd.), and a temperature was raised to 90° C. by heating while nitrogen was flown into the flask. To this was added 1.80 g of 2,2-azobis(2,4-dimethylvaleronitrile) (trade name V-65, manufactured by Wako Pure Chemical Industries, Ltd.), and mixture was heated and stirred at 90° C. for 2 hours. After 2 hours, 1.80 g of V-65 was further added, and after heating and stirring for 3 hours, a 30 mass % solution of a specific polymer compound 2 was obtained.

A weight average molecular weight of the resulting polymer compound was measured by a gel permeation chromatography method (GPC) using polystyrene as a standard substance and, as a result, the weight average molecular weight was 2.1×10000. In addition, from titration using sodium hydroxide, an acid value per solid matter was 99 mgKOH/g.

Hereinafter, specific polymer compounds No. 3 to No. 17 were synthesized according to the same manner except that, as a monomer of a starting substance, each of substances described in the following Table 1, and an addition amount of the polymerization initiator was appropriately changed.

A weight average molecular weight and an acid value of the resulting specific polymer compounds are described together in the following Table 1.

TABLE 1

| Specific polymer compound No. | Composition of specific polymer compound (wt %) | | | Weight average molecular weight | Acid value (mgKOH/g) |
|---|---|---|---|---|---|
| 1 | M-11 | MMA | MAA | 20,000 | 98 |
|   | 15 | 70 | 15 |   |   |
| 2 | M-6 | MMA | MAA | 21,000 | 99 |
|   | 15 | 70 | 15 |   |   |
| 3 | M-14 | MMA | MAA | 23,000 | 130 |
|   | 12 | 68 | 20 |   |   |
| 4 | M-1 | MMA | MAA | 19,000 | 115 |
|   | 10 | 72 | 18 |   |   |
| 5 | M-30 | MMA | MAA | 20,000 | 97 |
|   | 15 | 70 | 15 |   |   |

TABLE 1-continued

| Specific polymer compound No. | Composition of specific polymer compound (wt %) | | | | Weight average molecular weight | Acid value (mgKOH/g) |
|---|---|---|---|---|---|---|
| 6 | M-31 12 | MMA 43 | MAA 15 | BzMA 30 | 19,000 | 97 |
| 7 | M-15 10 | MMA 75 | MAA 15 | | 21,000 | 99 |
| 8 | M-11 15 | MMA 80 | MAA 5 | | 20,000 | 31 |
| 9 | M-11 15 | MMA 45 | MAA 40 | | 21,000 | 260 |
| 10 | M-6 15 | MMA 70 | MAA 15 | | 4,000 | 99 |
| 11 | M-6 15 | MMA 70 | MAA 15 | | 40,000 | 99 |
| 12 | M-11 5 | MMA 80 | MAA 15 | | 19,000 | 98 |
| 13 | M-11 60 | MMA 25 | MAA 15 | | 20,000 | 97 |
| 14 | M-25 15 | MMA 70 | MAA 15 | | 22,000 | 98 |
| 15 | M-32 15 | MMA 70 | MAA 15 | | 20,000 | 99 |
| 16 | M-33 12 | MMA 70 | MAA 18 | | 22,000 | 115 |
| 17 | M-4 16 | BzMA 69 | MAA 15 | | 23,000 | 97 |

In Table 1, MAA is methacrylic acid, MMA is methyl methacrylate, bzMA is benzyl methacrylate, and HEMA is 2-hydroxyethyl methacrylate.

<Example of Pigment Processing>

Into a stainless 1 gallon kneader (manufactured by INOUE MFG., INC.) were placed 50 g of each of pigments described in Table 2 to Table 7, 500 g of sodium chloride, 25 g of a specific polymer compound solution and 100 g of diethylene glycol, and the materials were kneaded for 9 hours. Then, this mixture was placed into 3 liter of water, this was stirred with a high speed mixer for about 1 hour, filtered, washed with water to remove sodium chloride and the solvent, and dried to obtain a processed pigment covered with a polymer compound.

[Measurement of Primary Particle Size of Pigment]

A primary particle size of the pigment was determined by observing the resulting processed pigment with a transmission electron microscope (TEM).

(Evaluation of Covering Degree of Pigment)

Into 100 mL, of 1-methoxy-2-propanol was placed 10 g of the resulting processed pigment, and this was shaken with a shaker at room temperature for 3 hours. Thereafter, the pigment was settled with a centrifuge at 80,000 rpm over 8 hours. A solid matter of the supernatant part was obtained by a drying method. An amount of the polymer compound released from the pigment was obtained, and a release rate (%) was calculated from a ratio relative to the polymer compound used in treatment. As the release ratio is smaller, a covering degree onto the pigment is higher.

TABLE 2

| Processed pigment No. | Pigment | Specific polymer compound | Pigment primary particle diameter (nm) | Release rate (%) |
|---|---|---|---|---|
| R-2 | PR254 | 1 | 20 | 2 |
| R-3 | PR254 | 2 | 20 | 5 |
| R-4 | PR254 | 3 | 20 | 5 |
| R-5 | PR254 | 4 | 20 | 7 |
| R-6 | PR254 | 5 | 20 | 13 |

TABLE 2-continued

| Processed pigment No. | Pigment | Specific polymer compound | Pigment primary particle diameter (nm) | Release rate (%) |
|---|---|---|---|---|
| R-7 | PR254 | 6 | 20 | 3 |
| R-8 | PR254 | 7 | 20 | 4 |
| R-9 | PR254 | 8 | 20 | 3 |
| R-10 | PR254 | 9 | 20 | 4 |
| R-11 | PR254 | 10 | 20 | 3 |
| R-12 | PR254 | 11 | 20 | 3 |
| R-13 | PR254 | 12 | 20 | 8 |
| R-14 | PR254 | 13 | 20 | 2 |
| R-15 | PR254 | 14 | 20 | 15 |
| R-16 | PR254 | 15 | 20 | 17 |
| R-17 | PR254 | P-1 | 20 | 70 |
| R-18 | PR254 | P-2 | 20 | 75 |
| R-19 | PR254 | P-3 | 20 | 80 |
| R-20 | PR254 | None | 20 | — |

TABLE 3

| Processed pigment No. | Pigment | Specific polymer compound | Pigment primary particle diameter (nm) | Release rate (%) |
|---|---|---|---|---|
| L-1 | PR177 | 1 | 18 | 5 |
| L-2 | PR177 | 2 | 18 | 8 |
| L-3 | PR177 | 4 | 18 | 9 |
| L-4 | PR177 | 5 | 18 | 15 |
| L-5 | PR177 | 16 | 18 | 5 |
| L-6 | PR177 | 7 | 18 | 6 |
| L-7 | PR177 | 14 | 18 | 20 |
| L-8 | PR177 | P-4 | 18 | 68 |
| L-9 | PR177 | P-2 | 18 | 76 |
| L-10 | PR177 | P-3 | 18 | 82 |
| L-11 | PR177 | None | 18 | — |

TABLE 4

| Processed pigment No. | Pigment | Specific polymer compound | Pigment primary particle diameter (nm) | Release rate (%) |
|---|---|---|---|---|
| G-1 | PG36 | 1 | 16 | 8 |
| G-2 | PG36 | 2 | 16 | 2 |
| G-3 | PG36 | 4 | 16 | 6 |
| G-4 | PG36 | 5 | 16 | 18 |
| G-5 | PG36 | 7 | 16 | 5 |
| G-6 | PG36 | 15 | 16 | 21 |
| G-7 | PG36 | P-1 | 16 | 72 |
| G-8 | PG36 | P-2 | 16 | 79 |
| G-9 | PG36 | P-3 | 16 | 85 |
| G-10 | PG36 | None | 16 | — |

TABLE 5

| Processed pigment No. | Pigment | Specific polymer compound | Pigment primary particle diameter (nm) | Release rate (%) |
|---|---|---|---|---|
| Y-1 | PY150 | 1 | 22 | 6 |
| Y-2 | PY150 | 2 | 22 | 3 |
| Y-3 | PY150 | 4 | 22 | 7 |
| Y-4 | PY150 | 5 | 22 | 16 |
| Y-5 | PY150 | 14 | 20 | 25 |
| Y-6 | PY150 | 15 | 22 | 30 |
| Y-7 | PY150 | P-4 | 18 | 70 |
| Y-8 | PY150 | P-2 | 22 | 73 |
| Y-9 | PY150 | P-3 | 22 | 82 |
| Y-10 | PY150 | None | 22 | — |

TABLE 6

| Processed pigment No. | Pigment | Specific polymer compound | Pigment primary particle diameter (nm) | Release rate (%) |
|---|---|---|---|---|
| B-1 | PB15:6 | 1 | 15 | 8 |
| B-2 | PB15:6 | 2 | 15 | 2 |
| B-3 | PB15:6 | 3 | 15 | 3 |
| B-4 | PB15:6 | 5 | 15 | 20 |
| B-5 | PB15:6 | 7 | 15 | 5 |
| B-6 | PB15:6 | 15 | 15 | 25 |
| B-7 | PB15:6 | P-4 | 18 | 79 |
| B-8 | PB15:6 | P-2 | 15 | 85 |
| B-9 | PB15:6 | P-3 | 15 | 88 |
| B-10 | PB15:6 | None | 15 | — |

TABLE 7

| Processed pigment No. | Pigment | Specific polymer compound | Pigment primary particle diameter (nm) | Release rate (%) |
|---|---|---|---|---|
| V-1 | PV23 | 1 | 23 | 3 |
| V-2 | PV23 | 2 | 23 | 5 |
| V-3 | PV23 | 17 | 23 | 3 |
| V-4 | PV23 | 5 | 23 | 16 |
| V-5 | PV23 | 7 | 23 | 5 |
| V-6 | PV23 | 15 | 23 | 22 |
| V-7 | PV23 | P-1 | 23 | 66 |
| V-8 | PV23 | P-2 | 23 | 70 |
| V-9 | PV23 | P-3 | 23 | 86 |
| V-10 | PV23 | None | 23 | — |

Details of compounds used in Tables 2 to 7 are as follows:
<Pigment>
PR254; C.I. Pigment red 254
PR177; C.I. Pigment Red 177
PG36; C.I. Pigment Green 36
PY150; C.I. Pigment Yellow 150
PB15: 6; C.I. Pigment Blue 15:6
PV23; C.I. Pigment Violet 23
<Specific Polymer Compound and Other Polymer Compound>

As the specific polymer compound, Nos. of the exemplified compounds are described in Table 1. Comparative polymer compounds are as follows:
P-1; Copolymer of methyl methacrylate/methacrylic acid=85/15 mass % having a weight average molecular weight of 20000, and an acid value of 98 mgKOH/g
P-2; Hydrogenated rosin ester (trade name Ester Gum HP, manufactured by Arakawa Chemical Industries, Ltd.)
P-3; Trimethylolpropane triacrylate
P-4; Copolymer of cyclohexyl methacrylate/methacrylic acid=85/15 mass % having a weight average molecular weight of 20000, and an acid value of 98 mgKOH/g
<Preparation of Pigment-Dispersed Composition>

Components having the following composition (1) were mixed, and stirred at a rotation number of 3,000 r.p.m. for 3 hours using a homogenizer to mix them, to prepare a mixed solution containing the pigment.

| [Composition (1)] | |
|---|---|
| Processed pigment (pigment described in Table 2) (82.7 parts in Comparative Example 4 and Comparative Example 5) | 95 parts |
| Derivative A (following structure [Chemical formula 13]) | 5 parts |
| Dispersant (30% 1-mthoxy-2-propyl acetate solution of dispersant described in Table 8) | (amount described in Table 8) |
| 1-Methoxy-2-propyl acetate | 750 parts |

Subsequently, the mixed solution obtained from the foregoing was dispersing-treated for 6 hours with a beads dispersing machine (trade name Dispermat, manufactured by GETZMANN) using 0.3 mmφ zirconia beads and, thereafter, further dispersing-treated under a pressure of 2,000 kg/cm³ at a flow rate of 500 g/min using a high pressure dispersing machine equipped with a pressure reducing mechanism (trade name NANO-3000-10, manufactured by Japan B.E.E Co. Ltd.). This dispersing treatment was repeated ten times to obtain a pigment-dispersed composition of Table 8.
<Evaluation of Pigment-Dispersed Composition>

The resulting pigment-dispersed composition was assessed as follows. Results are shown in Table 8.
(1) Measurement and Evaluation of Viscosity Regarding the resulting pigment-dispersed composition, a viscosity η1 of the pigment-dispersed composition immediately after dispersing, and a viscosity η2 of the pigment-dispersed composition after one week had passed from dispersing (at room temperature) were measured using an E-type viscometer, and a degree of increase in the viscosity was assessed. Herein, a low viscosity indicates that increase in the viscosity due to the dispersant is suppressed, and dispersibility and dispersion stability of the pigment are good.
(2) Measurement and Evaluation of Contrast The resulting pigment-dispersed composition was coated on a glass substrate, and a sample was prepared so that a coated film thickness after drying became 1 μm. The coated substrate was placed between two polarizing plates, a luminance when polarizing plates were parallel and a luminance when polarizing plates were orthogonal were measured with color luminance meter (trade name BM-5, manufactured by TOPCON CORPORATION), and a contrast was obtained as luminance at parallel/luminance at orthogonal. A higher contrast indicates that since the pigment is uniformly dispersed in the state where it is highly miniaturized, a transmittance, that is, a coloring force is higher.

(3) Evaluation of Precipitability

The resulting pigment-dispersed composition was coated on a 100 mm×100 mm glass sample (trade name 1737, manufactured by Corning) so that a film thickness became 2.0 ηm, and dried with an oven at 90° C. for 60 seconds. Thereafter, the coated film was subjected to heat treatment with an over at 230° C. for 30 minutes (post-baking), and the presence or the absence of precipitation on a pattern was confirmed with an optical microscope. The post-baking treatment was repeated, and observation was performed every time. A higher score indicates occurrence of precipitation with difficulty and to be good.

4: Precipitation at fourth time of post-baking
3: Precipitation at third time of post-baking
2: Precipitation at second time of post-baking
1: Precipitation at first time of post-baking <Preparation of Pigment-Dispersed Composition>

Components of the following composition (2) were mixed, and stirred at a rotation number of 3,000 r.p.m. for 3 hours using a homogenizer to mix them, to prepare a mixed solution containing the pigment.

| [Composition (2)] | |
|---|---|
| Processed pigment (pigment described in Table 4 or Table 6) (82.7 parts in Comparative Example 11 and Comparative Example 12) | 100 parts |
| Dispersant (30% 1-mthoxy-2-propyl acetate solution of dispersant described in Table 9) | (amount described in Table 9) |
| 1-Methoxy-2-propyl acetate | 750 parts |

Subsequently, the mixed solution obtained as described above was dispersing-treated for 6 hours with a beads dis-

TABLE 8

| | Processed pigment | Dispersant | | Initial viscosity (mPa · s) | Viscosity with time (mPa · s) | Contrast | Precipitability |
|---|---|---|---|---|---|---|---|
| Example 1 | R-2 | D-1 100 | Specific polymer compound 1 50 | 15 | 16 | 2500 | 4 |
| Example 2 | R-2 | D-1 150 | | 15 | 17 | 2400 | 4 |
| Example 3 | R-3 | D-1 150 | | 18 | 20 | 2200 | 4 |
| Example 4 | R-4 | D-1 150 | | 20 | 21 | 2200 | 4 |
| Example 5 | R-5 | D-1 150 | | 18 | 21 | 2300 | 4 |
| Example 6 | R-6 | D-1 150 | | 25 | 40 | 2000 | 3 |
| Example 7 | R-7 | D-1 150 | | 15 | 17 | 2300 | 4 |
| Example 8 | R-8 | D-1 150 | | 18 | 20 | 2400 | 4 |
| Example 9 | R-11 | D-1 150 | | 22 | 30 | 2300 | 3 |
| Example 10 | R-12 | D-1 150 | | 20 | 35 | 2300 | 3 |
| Example 11 | R-15 | D-1 150 | | 25 | 30 | 1900 | 3 |
| Example 12 | R-16 | D-1 150 | | 25 | 35 | 1800 | 2 |
| Comparative Example 1 | R-17 | D-1 150 | | 30 | 80 | 1500 | 2 |
| Comparative Example 2 | R-18 | D-1 150 | | 30 | 75 | 1200 | 1 |
| Comparative Example 3 | R-19 | D-1 150 | | 30 | 80 | 1200 | 1 |
| Comparative Example 4 | R-20 | D-1 150 | | 50 | 110 | 1100 | 1 |
| Comparative Example 5 | R-20 | D-1 100 | Specific polymer compound 1 92 | 30 | 70 | 1900 | 2 |

From the results of Table 8, it is seen that in the photosensitive compositions of Examples 1 to 12 using the processed pigment covered with the polymer compound having a heterocycle on a side chain of the invention, a contrast is high, and precipitation occurs with difficulty by post-baking, and increase in a viscosity with time is small.

persing machine (trade name Dispermat, manufactured by GETZMANN) using 0.3 mmφ zirconia beads and, thereafter, further dispersing-treated under a pressure of 2,000 kg/cm³ at a flow rate of 500 g/min using a high pressure dispersing machine equipped with a pressure reducing mechanism (trade name NANO-3000-10, manufactured by Japan B.E.E.

Co. Ltd.). This dispersing treatment was repeated ten times to obtain a pigment-dispersed composition of Table 9.

<Evaluation of Pigment-Dispersed Composition>

The resulting pigment-dispersed composition was assessed as follows. An experimental method and an evaluation method are the same as those of the composition (1). Results are shown in Table 9.
(1) Measurement and evaluation of viscosity
(2) Measurement and evaluation of contrast
(3) Evaluation of precipitability

| [Composition (3)] | |
|---|---|
| Processed pigment (pigment described in Table 10) | 120 parts |
| Dispersant (30% 1-mthoxy-2-propyl acetate solution of dispersant described in Table 10) | 250 parts |
| 1-Methoxy-2-propyl acetate | 750 parts |

Subsequently, the mixed solution obtained from the foregoing was dispersing-treated for 6 hours with a beads dispers-

TABLE 9

| | Processed pigment | Dispersant | | Initial viscosity (mPa·s) | Viscosity with time (mPa·s) | Contrast | Precipitability |
|---|---|---|---|---|---|---|---|
| Example 13 | G-2 | D2 100 | Specific polymer compound 2 50 | 30 | 32 | 8000 | 4 |
| Example 14 | G-2 | D-2 150 | | 30 | 32 | 8000 | 4 |
| Example 15 | G-5 | D-2 150 | | 32 | 35 | 7900 | 4 |
| Example 16 | G-6 | D-2 150 | | 40 | 50 | 7500 | 3 |
| Comparative Example 6 | G-7 | D-2 150 | | 50 | 65 | 5000 | 2 |
| Comparative Example 7 | G-8 | D-2 150 | | 45 | 65 | 5500 | 2 |
| Comparative Example 8 | G-10 | D-2 100 | Specific polymer compound 2 92 | 45 | 65 | 5800 | 2 |
| Example 17 | B-1 | D-2 150 | | 15 | 17 | 2300 | 4 |
| Example 18 | B-3 | D-2 100 | Specific polymer compound 2 50 | 15 | 16 | 2500 | 4 |
| Example 19 | B-3 | D-2 150 | | 15 | 16 | 2500 | 4 |
| Example 20 | B-6 | D-2 150 | | 18 | 20 | 2000 | 3 |
| Comparative Example 9 | B-7 | D-2 150 | | 30 | 40 | 1200 | 2 |
| Comparative Example 10 | B-9 | D-2 150 | | 30 | 40 | 1000 | 1 |
| Comparative Example 11 | B-10 | D-2 150 | | 50 | 70 | 900 | 1 |
| Comparative Example 12 | B-10 | D-2 100 | Specific polymer compound 2 92 | 40 | 55 | 1300 | 2 |

Since an absolute value of a contrast is different depending on a hue, comparison is performed between greens, and between blues in Table 9. From the results of Table 9, it is seen that, in the photosensitive compositions of Examples 13 to 16 and Examples 17 to 20 using the processed pigment covered with the polymer compound having a heterocycle on a side chain of the invention, increase in a viscosity with time is suppressed, and precipitation occurs with difficulty by post-baking.

<Preparation of Pigment-Dispersed Composition>

Components of the following composition (3) were mixed, and stirred at a rotation number of 3,000 r.p.m. for 3 hours using a homogenizer to mix them, to prepare a mixed solution containing the pigment.

ing machine (trade name Dispermat, manufactured by GETZ-MANN) using 0.3 mmϕ zirconia beads and, thereafter, further dispersing-treated under a pressure of 2,000 kg/cm$^3$ at a flow rate of 500 g/min using a high pressure dispersing machine equipped with a pressure reducing mechanism (trade name NANO-3000-10, manufactured by Japan B.E.E. Co. Ltd.). This dispersing treatment was repeated ten times to obtain a pigment-dispersed composition of Table 10.

TABLE 10

| Dispersion | Processed pigment | Dispersant |
|---|---|---|
| DR-1 | R-2 | D-1 |
| DR-2 | R-2 | D-4 |
| DR-3 | R-2 | D-5 |

TABLE 10-continued

| Dispersion | Processed pigment | Dispersant |
|---|---|---|
| DR-4 | R-2 | D-6 |
| DR-8 | R-9 | D-6 |
| DR-9 | R-10 | D-6 |
| DR-10 | R-13 | D-6 |
| DR-11 | R-14 | D-6 |
| DR-12 | R-17 | D-1 |
| DR-13 | R-18 | D-1 |
| DG-1 | G-2 | D-1 |
| DG-2 | G-2 | D-4 |
| DG-3 | G-2 | D-5 |
| DG-4 | G-2 | D-6 |
| DG-2 | G-7 | D-6 |
| DG-3 | G-9 | D-6 |
| DB-1 | B-5 | D-3 |
| DB-2 | B-7 | D-3 |
| DB-3 | B-8 | D-3 |

<Preparation of Colored Photosensitive Composition>

Using the resulting pigment-dispersed composition, the following colored photosensitive composition was prepared.

| | |
|---|---|
| Pigment dispersion (pigment dispersion described in Table 11) | 2000 parts |
| Dipentaerythritol hexaacrylate (Photopolymerizable compound) | 80 parts |
| 4-[o-Bromo-p-N,N-di(ethoxycarbonyl)aminophenyl]-2,6-di(trichloromethyl)-s-triazine (Photopolymerization initiator) | 30 parts |
| Propylene glycol monomethyl ether acetate solution (solid matter 30%) of benzyl methacrylate/methacrylic acid (=75/25 [mass ratio]) copolymer (weight average molecular weight: 12,000) (Alkali-soluble resin) | 300 parts |
| 1-Methoxy-2-propyl acetate (solvent) | 390 parts |

<Preparation of Color Filter Using Colored Photosensitive Composition>

The resulting colored photosensitive composition (color resist solution) was coated on a 100 mm×100 mm glass substrate (trade name 1737, manufactured by Corning) so that a x value as an index of a color concentration became 0.650 in Examples 21 to 24, 29 to 32 and Comparative Examples 13 and 14, a y value as an index of a color concentration became 0.600 in Examples 25 to 28 and Comparative Examples 15 and 16, and a y value as an index of a color concentration became 0.100 in Examples 33 and Comparative Examples 17 and 18, and this was dried with an oven at 90° C. for 60 seconds (pre-baking). Thereafter, a whole surface of the coated film was exposed to light at 200 mJ/cm² (illuminance 20 mW/cm²), and the coated film after light exposure was covered with a 1% aqueous solution of an alkali developer (trade name CDK-1, manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baking), and a colored pattern (colored resin film) for a color filter was formed on the glass substrate to manufacture a colored filter substrate (color filter).

<Evaluation of Color Filter>

The manufactured colored filter substrate (color filter) was assessed as described below. Results are shown in Table 11.

(1) Contrast

A polarizing plate was placed on the colored resin film of the colored filter substrate obtained above, the colored resin film was held, a luminance when polarizing plates were parallel, and a luminance when polarizing plates were orthogonal were measured using BM-5 manufactured by TOPCON CORPORATION, and a value obtained by dividing a luminance at parallel by a luminance at orthogonal (=luminance at parallel/luminance at orthogonal) was used as an index for assessing a contrast. A higher value indicates a higher contrast.

(2) Alkali Developer Solubility

Into a 150 ml of beaker was weighed 100 g of a 10% aqueous solution of an alkali developer (trade name: CDK-1, manufactured by Fuji Electronic Materials Co., Ltd.). The photocuring composition was coated on a 100 mm×100 mm glass substrate (trade name 1737, manufactured by Corning) so that a film thickness became 2.5 μm, and dried with an oven at 90° C. for 60 seconds (pre-baked), a glass of the glass substrate was cut into 25 mm×100 mm, two of cut glasses were piled with a coated surface on an outer side, immersion in the developer which had been prepared in advance, and an upper and lower motion of pulling up was repeated twenty times, and solubility, and the presence or the absence of a suspension in the developer were determined visually. As a score is higher, alkali solubility is better.

*Determination Method

Complete dissolution by 1 to 10 times upper and lower motions, and no suspension: 5
Complete dissolution by 11 to 20 times upper and lower motions, and no suspension: 4
Complete dissolution by 1 to 10 times upper and lower motions, but presence of a suspension: 3
Complete dissolution by 11 to 20 times upper and lower motions, but the presence of a suspension: 2
Undissolution by 20 times upper and lower motions: 1

(3) Precipitability Evaluation

The photocuring composition was coated on a 100 mm×100 mm glass substrate (trade name: 1737, manufactured by Coning) so that a film thickness became 2.0 μm, and this was dried (pre-baked) with an oven at 90° C. for 60 seconds. Thereafter, light exposure at 100 mJ/cm² (illuminance 20 mW/cm²) was performed with a mask having a line width of 20 μm, and development was performed at 25° C. using a 1% aqueous solution of an alkali developer (trade name: CDK-1, manufactured by Fuji Electronic Materials Co., Ltd.).

As described above, the coated film which had been subjected to photocuring treatment and development treatment was subjected to heat treatment (post baking) with an oven at 230° C. for 30 minutes, and the presence or the absence of precipitation on a pattern was confirmed with an optical microscope. This was further repeated three times, and the similar evaluation was performed. A higher score indicates precipitation with difficulty.

Precipitation at fourth post-baking: 4
Precipitation at third post-baking: 3
Precipitation at second post-baking: 2
Precipitation at first post-baking: 1

TABLE 11

| | Dispersion | Contrast | Solubility | Precipitability |
|---|---|---|---|---|
| Example 21 | DR-1 | 2400 | 5 | 4 |
| Example 22 | DR-2 | 2200 | 3 | 4 |
| Example 23 | DR-3 | 2300 | 5 | 3 |

TABLE 11-continued

| | Dispersion | Contrast | Solubility | Precipitability |
|---|---|---|---|---|
| Example 24 | DR-4 | 2300 | 5 | 3 |
| Example 29 | DR-8 | 2400 | 3 | 3 |
| Example 30 | DR-9 | 2200 | 5 | 3 |
| Example 31 | DR-10 | 2300 | 5 | 3 |
| Example 32 | DR-11 | 2100 | 3 | 3 |
| Comparative Example 13 | DR-12 | 1900 | 4 | 2 |
| Comparative Example 14 | DR-13 | 1700 | 3 | 1 |
| Example 25 | DG-1 | 7600 | 5 | 4 |
| Example 26 | DG-2 | 7200 | 3 | 4 |
| Example 27 | DG-3 | 7400 | 5 | 3 |
| Example 28 | DG-4 | 7400 | 5 | 3 |
| Comparative Example 15 | DG-2 | 6000 | 4 | 1 |
| Comparative Example 16 | DG-3 | 5500 | 2 | 1 |
| Example 33 | DB-1 | 2100 | 5 | 4 |
| Comparative Example 17 | DB-2 | 1700 | 2 | 2 |
| Comparative Example 18 | DB-3 | 1500 | 1 | 1 |

In Table 11, a hue of the color filter is different depending on a test level. Particularly, a contrast can not be compared between different hues. For this reason, comparison is performed between same hues, that is, between DRs, between DGs, and between DBs. It is seen that in Examples of the color filter using the processed pigment of the invention, a contrast is higher, alkali developer solubility is better, and precipitation is difficult by post-baking as compared with Comparative Examples.

<Preparation of Pigment-Dispersed Composition>

Components of the following composition (4) were mixed, and stirred at a rotation number of 3,000 r.p.m. for 3 hours using a homogenizer to mix them, thereby, a mixed solution containing the pigment was prepared.

| [Composition (4)] | |
|---|---|
| Processed pigment (processed pigment described in Table 12) | 110 parts |
| Dispersant D3 (30% 1-methoxy-2-propyl acetate solution) | 250 parts |
| Pigment derivative B ([Chemical formula 14] of the following structure) | 20 parts |
| 1-Methoxy-2-propyl acetate | 750 parts |

Subsequently, the mixed solution obtained above was further dispersing-treated for 6 hours with a beads dispersing machine (trade name Dispermat, manufactured by GETZ-MANN) using 0.3 mmϕ zirconia beads, and thereafter, was further dispersing-treated under a pressure of 2000 kg/cm³ at a flow rate of 500 g/min using a high pressure dispersing machine equipped with a pressure reducing mechanism (trade name NAMO-3000-10, manufactured by Japan B.E.E. Co., Ltd.). This dispersing treatment was repeated ten times to obtain a pigment-dispersed composition of Table 12.

TABLE 12

| Dispersion | Processed pigment |
|---|---|
| DL-1 | L-1 |
| DL-2 | L-5 |
| DL-3 | L-7 |
| DL-4 | L-9 |
| DL-5 | L-11 |
| DY-1 | Y-2 |
| DY-2 | Y-3 |
| DY-3 | Y-4 |
| DY-4 | Y-7 |
| DY-5 | Y-10 |
| DV-1 | V-3 |
| DV-2 | V-1 |
| DV-3 | V-6 |
| DV-4 | V-9 |
| DV-5 | V-10 |

<Preparation of Colored Photosensitive Composition>

Using the resulting pigment-dispersed composition, the following colored photosensitive composition was prepared.

| | |
|---|---|
| Pigment dispersion (pigment dispersion described in Table 13) | 2100 parts |
| Dipentaerythritol hexaacrylate (Photopolymerizable compound) | 90 parts |
| 4-[o-Bromo-p-N,N-di(ethoxycarbonyl)aminophenyl]-2,6-di(trichloromethyl)-s-triazine (Photopolymerization initiator) | 30 parts |
| Propylene glycol monomethyl ether acetate solution (solid matter 30%) of benzyl methacrylate/methacrylic acid (=75/35 [mass ratio]) copolymer (weight average molecular weight: 10,000) (Alkali-soluble resin) | 3000 parts |
| 1-Methoxy-2-propyl acetate (solvent) | 390 parts |

<Preparation of Color Filter Using Colored Photosensitive Composition>

The resulting colored photosensitive composition (color resist solution) was coated on a 100 mm×100 mm glass substrate (trade name 1737, manufactured by Corning) so that a x value as an index of a color concentration became 0.650 in Examples 34 to 36 and Comparative Examples 19 and 20, a y value as an index of a color concentration became 0.600 in Examples 37 to 39 and Comparative Examples 21 and 22, and a y value as an index of a color concentration became 0.100 in Examples 40 to 42 and Comparative Examples 23 and 24, and this was dried with an oven at 90° C. for 60 seconds (pre-baking). Thereafter, a whole surface of the coated film was exposed to light at 200 mJ/cm² (illuminance 20 mW/cm²), and the coated film after light exposure was covered with a 1% aqueous solution of an alkali developer (trade name CDK-1, manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baking), and a colored pattern (colored resin film) for a color filter was formed on a glass substrate to manufacture a colored filter substrate (color filter).

<Evaluation of Color Filter>

Regarding the manufactured colored filter substrate (color filter), a contrast and alkali developer solubility were assessed as in Table 11. Results are shown in Table 13.

(1) Contrast
(2) Alkali developer solubility
(3) Voltage Retainability rate

The photocurable composition was coated on a glass substrate equipped with an ITO electrode (trade name: 1737, manufactured by Corning) so that a film thickness became 2.0 µm, and this was dried with an oven at 90° C. for 60 seconds (pre-baking). Thereafter, the coated film was exposed to light at 100 mJ/cm² (illuminance 20 mW/cm²) not through a mask, and developed at 25° C. using a 1% aqueous solution of an alkali developer (trade name: CDK-1, manufactured by Fuji Electronic Materials Co., Ltd.), and this coating film was heat-treated with an oven at 230° C. for 30 minutes (post-baking). Then, this substrate on which a pixel had been formed and a substrate on which an ITO electrode had been merely deposited into a predetermined shape were laminated with a sealing agent with 5 µm glass beads mixed therein, and a liquid crystal (trade name: MJ971189, manufactured by Merck) was injected to manufacture a liquid crystal cell.

Then, the liquid crystal cell was placed in a constant temperature bath at 70° C. for 48 hours, and a voltage retainability rate of the liquid crystal cell was measured with a liquid crystal voltage retainability rate measuring system (trade name: VHR-1A-type, manufactured by Toyo corporation). A higher score indicates a higher voltage retainability rate and better electronic property.

Measurement Condition
Distance between electrodes: about 5 µm,
Applied voltage pulse amplitude: 5 V
Applied voltage pulse frequency: 60 Hz
Applied voltage pulse width: 16.67 msec
*Voltage retainability rate: A value of a voltage applied at a liquid crystal cell potential difference/0 msec after 16.7 msec
*Determination Method
90% or more: 5
85% or more and less than 90%: 4
80% or more and less than 85%: 3
75% or more and less than 80%: 2
Less than 75%: 1

TABLE 13

|  | Dispersion | Contrast | Solubility | Voltage retainability rate |
|---|---|---|---|---|
| Example 34 | DL-1 | 3500 | 5 | 5 |
| Example 35 | DL-2 | 3400 | 5 | 5 |
| Example 36 | DL-3 | 3200 | 4 | 4 |
| Comparative Example 19 | DL-4 | 2500 | 4 | 2 |
| Comparative Example 20 | DL-5 | 2000 | 3 | 1 |
| Example 37 | DY-1 | 5800 | 5 | 5 |
| Example 38 | DY-2 | 5700 | 5 | 4 |
| Example 39 | DY-3 | 5500 | 4 | 4 |
| Comparative Example 21 | DY-4 | 4500 | 3 | 2 |
| Comparative Example 22 | DY-5 | 3000 | 2 | 1 |
| Example 40 | DV-1 | 600 | 5 | 5 |
| Example 41 | DV-2 | 550 | 5 | 4 |
| Example 42 | DV-3 | 500 | 4 | 4 |
| Comparative Example 23 | DV-4 | 300 | 2 | 2 |
| Comparative Example 24 | DV-5 | 200 | 2 | 1 |

In Table 13, a hue of the color filter is different depending on a test level. Particularly, a contrast can not be compared between different hues. For this reason, comparison is performed between same colors, that is, between DLs, between DYs, and between DVs. It is seen that, in Examples of the color filter using the processed pigment of the invention, a contrast is higher, alkali developer solubility is better, and a voltage retainability rate is higher as compared with Comparative Examples.

<Preparation of Colored Photosensitive Composition>

Using the previously obtained pigment-dispersed composition, the following colored photosensitive composition was prepared.

| | |
|---|---|
| Pigment dispersion A (pigment dispersion described in Table 14 A column) | 2000 parts |
| Pigment dispersion B (pigment dispersion described in Table 14 B column) | 1000 parts |
| Dipentaerythritol hexaacrylate (Photopolymerizable compound) | 120 parts |
| 4-[o-Bromo-p-N,N-di(ethoxycarbonyl)aminophenyl]-2,6-di(trichloromethyl)-s-triazine (Photopolymerization initiator) | 50 parts |
| Propylene glycol monomethyl ether acetate solution (solid matter 30%) of benzyl methacrylate/methacrylic acid (=75/35 [mass ratio]) copolymer (weight average molecular weight: 10,000) (Alkali-soluble resin) | 300 parts |
| 1-Methoxy-2-propyl acetate (solvent) | 390 parts |

<Manufacturing of Color Filter Using Colored Photosensitive Composition>

The resulting colored photosensitive composition (color resist solution) was coated on a 100 mm×100 mm glass substrate (trade name: 1737, manufactured by Corning) so that a x value as an index of a color concentration became 0.650 in Examples 43 and 44 and Comparative Example 25, a y value as an index of a color concentration became 0.600 in Examples 45 and 46 and Comparative Example 26, and a y value as an index of a color concentration became 0.100 in Examples 47 and 48 and Comparative Example 27, and this was dried with an oven at 90° C. for 60 seconds (pre-baking). Thereafter, a whole surface of the coated film was exposed to light at 200 mJ/cm² (illuminance 20 mW/cm²), and the coated film after light exposure was covered with a 1% aqueous solution of an alkali developer (trade name: CDK-1, manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baking), and a colored pattern (colored resin film) for a color filter was formed on a glass substrate to manufacture a colored filter substrate (color filter).

<Evaluation of Color Filter>

The manufactured colored filter substrate (color filter) was assessed as follows: Results are shown in Table 14.

(1) Contrast
(2) Alkali developer solubility
(3) Crystal precipitability

The photocurable composition was coated on a glass substrate equipped with an ITO electrode (trade name: 1737, manufactured by Corning) so that a film thickness became 2.0 µm, and this was dried with an oven at 90° C. for 60 seconds (pre-baking). Thereafter, the coated film was exposed to light at 100 mJ/cm$^2$ (illuminance 20 mW/cm$^2$) not through a mask, and developed at 25° C. using a 1% aqueous solution of an alkali developer (trade name: CDK-1, manufactured by Fuji Electronic Materials Co., Ltd.), and the coated film was heat-treated with an oven at 230° C. for 30 minutes (post-baking). Then, this substrate on which a pixel had been formed, and a substrate on which an ITO-electrode had been deposited into a predetermined shape were placed in a high temperature bath at 70° C. and a humidity of 80% for 72 hours, crystal precipitability on the substrate was assessed visually, and this was summarized in Table 14. As a score is higher, a crystal is precipitated with difficulty, being better.

3: Crystal precipitation is not seen.

2: Slight crystal precipitation is seen.

1: Crystal precipitation is seen on a whole substrate surface.

TABLE 14

| | Dispersion | | | | Crystal |
|---|---|---|---|---|---|
| | A | B | Contrast | Solubility | precipitability |
| Example 43 | DR-1 | DL-2 | 2500 | 5 | 3 |
| Example 44 | DR-4 | DL-1 | 2300 | 4 | 3 |
| Comparative Example 25 | DR-13 | DL-4 | 1800 | 2 | 1 |
| Example 45 | DG-1 | DY-1 | 7200 | 5 | 3 |
| Example 46 | DG-1 | DY-3 | 7000 | 5 | 3 |
| Comparative Example 26 | DG-2 | DY-4 | 4500 | 2 | 2 |
| Example 47 | DB-1 | DV-1 | 3000 | 5 | 3 |
| Example 48 | DB-1 | DV-3 | 2900 | 5 | 3 |
| Comparative Example 27 | DB-9 | DV-5 | 1200 | 1 | 1 |

In Table 14, a hue of the color filter is different depending on a test level. Particularly, a contrast can not be compared between different hues. For this reason, comparison is performed between the same colors, that is, between DRs, between DGs, and DBs. It is seen that in Examples of the color filter using the processed pigment of the invention, a contrast is higher, alkali developer solubility is better, and a crystal is precipitated with difficulty at post-baking as compared with Comparative Examples.

<Preparation of Pigment-Dispersed Composition>

Components of the following composition (5) were mixed, and stirred at a rotation number of 3,000 r.p.m. for 3 hours using a homogenizer to mix them, to prepare a mixed solution containing the pigment.

| [Composition (5)] | |
|---|---|
| Processed pigment (pigment spices described in Table 15) | (amount described in Table 15) |
| Derivative A (following structure [Chemical formula 13]) | 20 parts |
| Dispersant (specific polymer compound described in Table 1, solid matter 100%) | (amount described in Table 15) |
| 1-Methoxy-2-propyl acetate | 750 parts |

Subsequently, the mixed solution obtained above was further dispersing-treated for 3 hours with a beads dispersing machine (trade name: Dispermat, manufactured by GETZ-MANN) using 0.8 mmφ zirconia beads and, thereafter, was further dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E. Co., Ltd.). This dispersing treatment was repeated five times to obtain a pigment-dispersed composition in Table 15.

The resulting pigment-dispersed composition was assessed as described below, and results are shown in Table 15.

A viscosity and precipitability were assessed as in Table 8.

The composition was coated on a 100 mm×100 mm glass substrate so that a x value as an index of a color concentration became 0.650 in Example 49 and Comparative Example 28, a y value as an index of a color concentration became 0.600 in Example 50 and Comparative Example 29, and a y value as an index of a color concentration became 0.100 in Example 51 and Comparative Example 30, this was dried with an oven at 90° C. for 60 seconds, and a contrast was measured as in Table 8.

TABLE 15

| | Processed pigment | Dispersant | Initial viscosity | Viscosity with time | Contrast | Precipitability |
|---|---|---|---|---|---|---|
| Example 49 | R-2 100 | None | 16 | 17 | 2000 | 4 |
| Comparative Example 28 | R-20 82.6 | Specific polymer compound 1 12.4 | 30 | 80 | 1200 | 2 |
| Example 50 | G-2 100 | None | 35 | 36 | 7000 | 4 |
| Comparative Example 29 | G-10 82.6 | Specific polymer compound 2 12.4 | 50 | 95 | 4500 | 2 |
| Example 51 | B-3 100 | None | 18 | 18 | 2000 | 4 |
| Comparative Example 30 | B-10 82.6 | Specific polymer compound 3 12.4 | 40 | 85 | 1100 | 2 |

From Table 15, it is seen that in the pigment-dispersed composition using the pigment covered with the specific polymer compound of the invention, dispersion stability of the pigment-dispersed composition is improved, a contrast is higher, and a crystal is precipitated with difficulty as compared with Comparative Example in which the specific polymer compound was added at a dispersing step.

<Compounds in Examples>

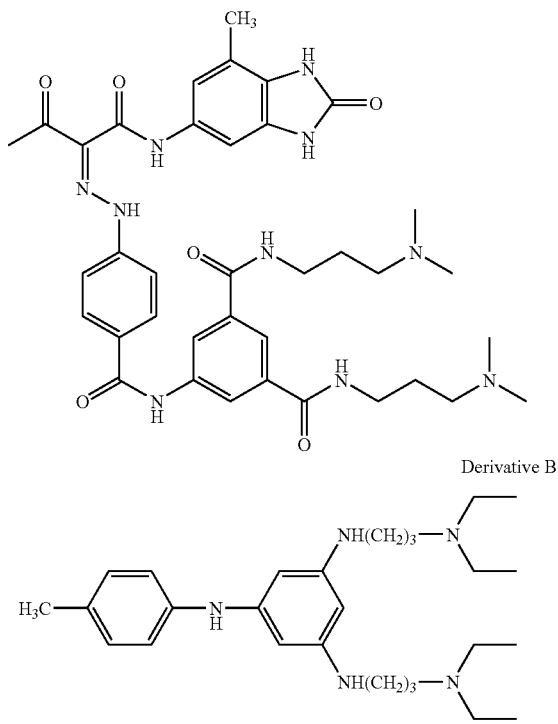

Derivative A

Derivative B

D-1: A polymer of MMS-1/A-1/MAA=20/65/15 mass %, a weight average molecular weight of 2.3×10,000, and an acid value of 100 mgKOH/g D-2: A polymer of MMS-2/A-1/BzMA/MAA=10/58/20/12 mass %, a weight average molecular weight of 2.3×10,000, and an acid value of 100 mgKOH/g D-3: Trade name Solsperse 24000, manufactured by Lubrizol D-4: A polymer of St/MAA=75/15 mass % having a weight average molecular weight of 2.0×10,000, and an acid value of 100 mg KOH/g D-5: A polymer of MM-1/BzMA/MAA=20/65/15 mass % having a weight average molecular weight of 2.0×10,000, and an acid value of 100 mgKOH/g D-6: A polymer of St/A-1/MAA=30/55/15 mass % having a weight average molecular weight of 2.5×10,000 and an acid value of 100 mgKOH/g A-1: Terminal methacryloylated polymethyl methacrylate (number average molecular weight 6,000)

MAA: Methacrylic acid

BzMA: Benzyl methacrylate

St: Styrene

MMS-1

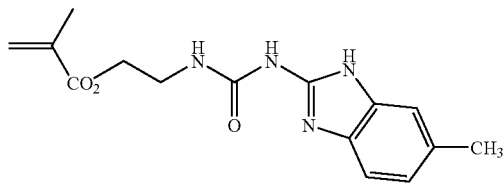

-continued

MMS-2

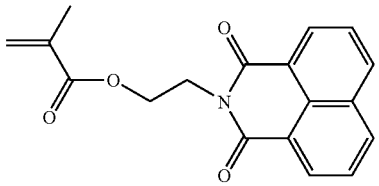

Synthesis of Specific Polymer Compound

Polymers Nos. 1 to 25 which are the specific polymer compound (SP-2) of the invention were synthesized by the methods shown below.

Synthesis Example 2-1

Synthesis of Polymer No. 1

Into a three-neck flask replaced with nitrogen were introduced 15.0 g of methyl methacrylate, 70.0 g of terminal methacryloylated polymethyl methacrylate [number average molecular weight of 6,000: trade name AA-6, manufactured by Toagosei Co., Ltd.; described as (MM-1) in Table 11], 15.0 g of methacrylic acid, and 334.0 g of 1-methoxy-2-propanol, and the materials were stirred with a stirrer (trade name: Three One Motor, manufactured by Shinto Scientific Co., Ltd.), and heated while nitrogen was flown into the flask to raise a temperature to 90° C.

To this was added 0.5 g of 2,2-azobis(2,4-dimethylvaleronitrile) (trade name: V-65, manufactured by Wako Pure Chemical Industries Ltd.), and the mixture was heated and stirred at 90° C. for 2 hours. After 2 hours, 0.5 g of V-65 was further added and, after heating and stirring for 3 hours, a 30% solution of a graft-type polymer compound (polymer No. 1) having a MM-1-derived side chain on a methyl methacrylate or methacrylic acid-derived main chain was obtained.

A weight average molecular weight of the resulting polymer compound (polymer No. 1) was measured by a gel permeation chromatography method (GPC) using polystyrene as a standard substance and, as a result, the molecular weight was 1.8×10,000.

In addition, according to titration using sodium hydroxide, an acid value per solid matter was 97 mgKOH/g.

Synthesis Example 2-2

Synthesis of Polymer No. 2

Into a three-neck flask replaced with nitrogen were introduced 15.0 g of terminal methacryloylated polycaprolactone [number average molecular weight 5,000: described as M-6 in Table 16], 70.0 g of MM-1 [the above compound (trade name: AA-6, manufactured by Toagosei Co., Ltd.)], 15.0 g of methacrylic acid, and 334.0 g of 1-methoxy-2-propanol, and the materials were stirred with a stirrer (trade name Three One Motor, manufactured by Shinto Scientific Co., Ltd.), and heated while nitrogen was flown into the flask, to raise a temperature to 90° C.

To this was added 0.4 g of 2,2-azobis(2,4-dimethylvalelonitrile) (trade name: V-65, manufactured by Wako Pure Chemical Industries Ltd.), and the mixture was heated and stirred at 90° C. for 2 hours. After 2 hours, 0.4 g of V-65 was further added, and the mixture was heated and stirred for 3 hours to obtain a 30% solution of a graft-type polymer compound (polymer No. 2) having a MM-6 and MM-1-derived side chain on a methacrylic acid-derived main chain.

A weight average molecular weight of the resulting polymer compound was measured by a gel permeation chromatography method (GPC) using polystyrene as a standard substance and, as a result, the molecular weight was 1.7×10,000.

In addition, an acid value per solid matter according to titration using sodium hydroxide was 98 mgKOH/g.

Hereinafter, according to the same manner except that as a monomer of a starting substance, a monomer described in the following Table 16 was used, and an addition amount of a polymerization initiator was appropriately changed, the specific graft-type polymer compound (polymer No. 3 to polymer No. 25) was synthesized.

A weight average molecular weight and an acid value of the resulting specific graft-type polymer compound are described together in the following Table 16.

TABLE 16

| Polymer No. | Composition of graft-type polymer compound (mass %) | | | | Weight average molecular weight | Acid value (mgKOH/g) |
|---|---|---|---|---|---|---|
| 1 | MM-1 70 | MMA 15 | MAA 15 | | 18,000 | 97 |
| 2 | MM-1 70 | M-6 15 | MAA 15 | | 17,000 | 98 |
| 3 | MM-2 65 | M-6 20 | MAA 15 | | 19,000 | 95 |
| 4 | MM-3 70 | M-1 15 | MAA 15 | | 18,000 | 97 |
| 5 | MM-4 70 | M-1 15 | MAA 15 | | 20,000 | 99 |
| 6 | MM-5 70 | M-1 15 | MAA 15 | | 21,000 | 100 |
| 7 | MM-6 68 | M-11 20 | MAA 12 | | 16,000 | 80 |
| 8 | MM-7 68 | M-11 20 | MAA 12 | | 17,000 | 77 |
| 9 | MM-1 63 | M-33 20 | MAA 17 | | 22,000 | 108 |
| 10 | MM-8 63 | M-33 20 | MAA 17 | | 23,000 | 107 |
| 11 | MM-9 63 | M-33 20 | MAA 17 | | 22,000 | 107 |
| 12 | MM-1 70 | M-25 15 | MAA 15 | | 20,000 | 97 |
| 13 | MM-1 70 | M-30 15 | MAA 15 | | 19,000 | 98 |
| 14 | MM-3 70 | BzMA 15 | MAA 15 | | 22,000 | 96 |
| 15 | MM-3 70 | DMAEM 15 | MAA 15 | | 21,000 | 97 |
| 16 | MM-1 70 | M-31 15 | MAA 15 | | 19,000 | 95 |
| 17 | MM-1 70 | M-4 15 | MAA 15 | | 21,000 | 97 |
| 18 | MM-1 70 | M-14 15 | MAA 15 | | 20,000 | 98 |
| 19 | MM-1 70 | M-32 15 | MAA 15 | | 21,000 | 99 |
| 20 | MM-1 80 | M-6 5 | MAA 15 | | 22,000 | 97 |
| 21 | MM-1 25 | M-6 60 | MAA 15 | | 21,000 | 97 |
| 22 | MM-1 10 | M-6 20 | MAA 15 | MMA 55 | 22,000 | 96 |
| 23 | MM-1 70 | M-6 20 | MAA 5 | MMA 5 | 21,000 | 31 |
| 24 | MM-1 70 | M-6 15 | MAA 15 | | 45,000 | 97 |
| 25 | MM-2 65 | M-6 20 | MAA 15 | | 5,000 | 96 |

Details of the monomer and the macromonomer used in synthesis of the specific graft-type polymer compound described in Table 16 are shown below.

MM-1: Terminal methacryloylated polymethyl methacrylate (number average molecular weight 6,000)
MM-2: Terminal methacryloylated methyl methacrylate/2-hydroxyethyl methacrylate copolymer (80/20 mass %) (number average molecular weight 3,000)
MM-3: Terminal methacryloylated methyl methacrylate/acrylonitrile copolymer (60/40 mass %) (number average molecular weight 5,000)
MM-4: Terminal methacryloylated polystyrene (number average molecular weight 6,000)
MM-5: Terminal methacryloylated methyl methacrylate/acrylamide copolymer (80/20 mass %) (number average molecular weight 3,000)
MM-6: Terminal methacryloylated polycaprolactone (number average molecular weight 5,000)
MM-7: Terminal methacryloylated polyethylene oxide (number average molecular weight 4,000)
MM-8: Terminal methacryloylated polymethyl methacrylate (number average molecular weight: 300)
MM-9: Terminal methacryloylated polymethyl methacrylate (number average molecular weight: 15,000)
MAA: Methacrylic acid
MMA: Methyl methacrylate
BzMA: Benzyl methacrylate
DMAEM: Dimethylaminomethyl methacrylate Examples 1-1 to 1-38

Comparative Examples 1-1 to 1-25

Into a stainless 1 gallon kneader (manufactured by INOUE MFG., INC.) were placed 50 g of one of pigments described in the following Table 17 to Table 22, 400 g of sodium chloride, 40 g of a solution (solid matter 30 mass %) of a specific graft-type polymer compound (polymer No. 1 to polymer No. 25) described in the following Table 17 to Table 22, and 100 g of diethylene glycol, and the mixture was kneaded for 6 hours. Then, this mixture was placed into about 3 liter of water, and this was stirred with a high speed mixer for about 1 hour, filtered, washed with water to remove sodium chloride and the solvent, and dried to obtain a processed pigment covered with the specific graft-type polymer compound (Examples 1-1 to 1-38).

In addition, according to the same manner except that the specific graft-type polymer compound was not added, or instead, a comparative polymer compound described in the following Table 17 to Table 22 was used, processed pigments of Comparative Example 1-1 to Comparative Example 1-25 were obtained.

(Measurement of Average Primary Particle Diameter of Processed Pigment)

An average primary particle diameter of the resulting processed pigment was obtained by observation with a transmittance electron microscope (TEM).

(Evaluation of Covering Degree of Processed Pigment)

Into 100 mL of 1-methoxy-2-propanol was placed 10 g of the resulting processed pigment, and this was shaken with a shaker at room temperature for 3 hours. Thereafter, the pigment was settled with a centrifuge at 80,000 rpm over 8 hours. A solid matter of the supernatant part was obtained by a drying method. An amount of the polymer compound released from the pigment was obtained, and a release rate (%) was calculated from a ratio relative to the polymer compound used in treatment. As the release rate is smaller, it is meant that a covering degree onto the pigment is higher.

TABLE 17

| | Processed pigment | Pigment | Specific polymer or comparative polymer | Average primary particle diameter of processed pigment (nm) | Release rate (%) |
|---|---|---|---|---|---|
| Example 1-1 | 2 R-1 | PR254 | 1 | 21 | 10 |
| Example 1-2 | 2 R-2 | PR254 | 2 | 21 | 2 |
| Example 1-3 | 2 R-3 | PR254 | 7 | 21 | 2 |
| Example 1-4 | 2 R-4 | PR254 | 8 | 21 | 9 |
| Example 1-5 | 2 R-5 | PR254 | 12 | 21 | 9 |
| Example 1-6 | 2 R-6 | PR254 | 13 | 21 | 15 |
| Example 1-7 | 2 R-7 | PR254 | 16 | 21 | 2 |
| Comparative Example 1-1 | 2 R-8 | PR254 | P-1 | 21 | 35 |
| Comparative Example 1-2 | 2 R-9 | PR254 | P-2 | 21 | 40 |
| Comparative Example 1-3 | 2 R-10 | PR254 | P-3 | 21 | 70 |
| Comparative Example 1-4 | 2 R-11 | PR254 | None | 21 | — |

TABLE 18

| | Processed pigment | Pigment | Specific polymer or comparative polymer | Average primary particle diameter of processed pigment (nm) | Release rate (%) |
|---|---|---|---|---|---|
| Example 1-8 | 2 L-1 | PR117 | 4 | 17 | 3 |
| Example 1-9 | 2 L-2 | PR117 | 5 | 17 | 4 |
| Example 1-10 | 2 L-3 | PR117 | 6 | 17 | 5 |
| Comparative Example 1-5 | 2 L-4 | PR117 | P-4B | 17 | 40 |
| Comparative Example 1-6 | 2 L-5 | PR117 | P-2 | 17 | 42 |
| Comparative Example 1-7 | 2 L-6 | PR117 | P-3 | 17 | 68 |
| Comparative Example 1-8 | 2 L-7 | PR117 | None | 17 | — |

TABLE 19

| | Processed pigment | Pigment | Specific polymer or comparative polymer | Average primary particle diameter of processed pigment (nm) | Release rate (%) |
|---|---|---|---|---|---|
| Example 1-11 | 2 G-1 | PG36 | 2 | 18 | 3 |
| Example 1-12 | 2 G-2 | PG36 | 3 | 18 | 5 |
| Example 1-13 | 2 G-3 | PG36 | 9 | 18 | 3 |
| Example 1-14 | 2 G-4 | PG36 | 10 | 18 | 10 |
| Example 1-15 | 2 G-5 | PG36 | 11 | 18 | 3 |
| Example 1-16 | 2 G-6 | PG36 | 14 | 18 | 12 |
| Example 1-17 | 2 G-7 | PG36 | 15 | 18 | 10 |
| Example 1-18 | 2 G-8 | PG36 | 19 | 18 | 14 |
| Example 1-19 | 2 G-9 | PG36 | 20 | 18 | 15 |
| Example 1-20 | 2 G-10 | PG36 | 21 | 18 | 3 |
| Example 1-21 | 2 G-11 | PG36 | 22 | 18 | 8 |
| Example 1-22 | 2 G-12 | PG36 | 23 | 18 | 9 |
| Example 1-23 | 2 G-13 | PG36 | 24 | 18 | 3 |
| Example 1-24 | 2 G-14 | PG36 | 25 | 18 | 10 |
| Comparative Example 1-10 | 2 G-15 | PG36 | P-1 | 18 | 40 |
| Comparative Example 1-11 | 2 G-16 | PG36 | P-2 | 18 | 39 |
| Comparative Example 1-12 | 2 G-17 | PG36 | P-5 | 18 | 38 |
| Comparative Example 1-13 | 2 G-18 | PG36 | None | 18 | — |

TABLE 20

| | Processed pigment | Pigment | Specific polymer or comparative polymer | Average primary particle diameter of processed pigment (nm) | Release rate (%) |
|---|---|---|---|---|---|
| Example 1-25 | 2 Y-1 | PY150 | 1 | 21 | 10 |
| Example 1-26 | 2 Y-2 | PY150 | 2 | 21 | 3 |
| Example 1-27 | 2 Y-3 | PY150 | 12 | 21 | 11 |
| Example 1-28 | 2 Y-4 | PY150 | 13 | 21 | 13 |
| Comparative Example 1-14 | 2 Y-5 | PY150 | P-4B | 21 | 38 |
| Comparative Example 1-15 | 2 Y-6 | PY150 | P-2 | 21 | 38 |
| Comparative Example 1-16 | 2 Y-7 | PY150 | P-3 | 21 | 68 |
| Comparative Example 1-17 | 2 Y-8 | PY150 | None | 21 | — |

TABLE 21

| | Processed pigment | Pigment | Specific polymer or comparative polymer | Average primary particle diameter of processed pigment (nm) | Release rate (%) |
|---|---|---|---|---|---|
| Example 1-29 | 2 B-1 | PB15:6 | 7 | 17 | 2 |
| Example 1-30 | 2 B-2 | PB15:6 | 8 | 17 | 4 |
| Example 1-31 | 2 B-3 | PB15:6 | 17 | 17 | 2 |
| Example 1-32 | 2 B-4 | PB15:6 | 18 | 17 | 2 |
| Example 1-33 | 2 B-5 | PB15:6 | 19 | 17 | 11 |
| Comparative Example 1-18 | 2 B-6 | PB15:6 | P-6 | 17 | 36 |
| Comparative Example 1-19 | 2 B-7 | PB15:6 | P-2 | 17 | 36 |
| Comparative Example 1-20 | 2 B-8 | PB15:6 | P-3 | 17 | 68 |
| Comparative Example 1-21 | 2 B-9 | PB15:6 | None | 17 | — |

TABLE 22

| | Processed pigment | Pigment | Specific polymer or comparative polymer | Average primary particle diameter of processed pigment (nm) | Release rate (%) |
|---|---|---|---|---|---|
| Example 1-34 | 2 V-1 | PV23 | 2 | 22 | 3 |
| Example 1-35 | 2 V-2 | PV23 | 9 | 22 | 4 |
| Example 1-36 | 2 V-3 | PV23 | 17 | 22 | 3 |
| Example 1-37 | 2 V-4 | PV23 | 18 | 22 | 3 |
| Example 1-38 | 2 V-5 | PV23 | 13 | 22 | 16 |
| Comparative Example 1-22 | 2 V-7 | PV23 | P-1 | 22 | 36 |
| Comparative Example 1-23 | 2 V-8 | PV23 | P-2 | 22 | 36 |
| Comparative Example 1-24 | 2 V-9 | PV23 | P-3 | 22 | 62 |
| Comparative Example 1-25 | 2 V-10 | PV23 | None | 22 | — |

Details of the pigment, the specific graft-type polymer compound (described as specific polymer in Table) and comparative polymer compounds P-1 to P-6 (described as comparative polymer in Table) described in Table 17 to Table 22 are as follows.

—Pigment—
PR254; C.I. Pigment Red 254
PR177; C.I. Pigment Red 177
PG36; C.I. Pigment Green 36
PY150; C.I. Pigment Yellow 150
PB15:6; C.I. Pigment Blue 15:6
PV23; C.I. Pigment Violet 23

—Specific Polymer Compound or Comparative Compound—

The specific polymer compound (1 to 25) is the specific graft-type polymer compound (polymer No. 1 to polymer No. 25) obtained in the aforementioned Synthesis Example.

In addition, polymer compounds P-1 to P-6 are a comparative polymer compound different from the specific graft-type polymer compound, and details are as follows.

P-1: A copolymer of methyl methacrylate/methacrylic acid=85/15 mass % (weight average molecular weight 20,000, acid value 98 mgKOH/g)

P-2: Hydrogenated rosin ester (trade name: Ester Gum HP, manufactured by Arakawa Chemical Industries, Ltd.)
P-3: Trimethylolpropane triacrylate
P-4B: A copolymer of cyclohexyl methacrylate/methacrylic acid=85/15 mass % having a weight average molecular weight of 2.4×10,000, and an acid value of 98 mgKOH/g
P-5: A copolymer of methyl methacrylate/M-6/methacrylic acid=70/15/15 mass % having a weight average molecular weight of 2.3×10,000, and an acid value of 98 mgKOH/g
P-6: A copolymer of methyl methacrylate/styrene/methacrylic acid=70/15/15 mass % having a weight average molecular weight of 2.0×10,000, and an acid value of 98 mgKOH/g Examples 2-1 to 2-7, and Comparative Examples 2-1 to 2-5

Preparation of Pigment-Dispersed Composition

Components of the following composition (1B) containing the processed pigment of the invention or a comparative processed pigment described in the following Table 23 [(2R-1) to (2R-11)] were mixed, and stirred at a rotation number of 3,000 r.p.m. for 3 hours using a homogenizer to mix them to prepare a mixed solution containing the pigment.

| [Composition (1B)] | |
|---|---|
| Processed pigment (described in the following Table 23) (A content of the pigment of Comparative Example 2-4 and Comparative Example 2-5 was 82.7 parts) | 90 parts |
| Pigment derivative A of the aforementioned structure | 10 parts |
| Pigment dispersant (described in the following Table 23) (30% 1-methoxy-2-propyl acetate solution) | amount described in Table 23 |
| 1-Methoxy-2-propyl acetate | 750 parts |

Subsequently, the mixed solution obtained as described above was further dispersing-treated for 6 hours with a beads dispersing machine (trade name: Dispermat, manufactured by GETZMANN) using 0.3 mmϕ zirconia beads and, thereafter, was further dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E. Co., Ltd.). This dispersing treatment was repeated ten times to obtain a pigment-dispersed composition.

<Evaluation of Pigment-Dispersed Composition>

Regarding the resulting pigment-dispersed composition, (1) a viscosity, (2) a contrast and (3) precipitability were assessed as follows. Results of these evaluation are summarized in Table 23.

(1) Measurement and Evaluation of Viscosity

Regarding the resulting pigment-dispersed composition, a viscosity η1 of the pigment-dispersed composition immediately after dispersing was measured under a temperature condition of 30° C. using an E-type viscometer (20 rpm, manufactured by Tokyo Keiki Kogyo Co., Ltd.) and, further, after dispersing, a viscosity η2 of the pigment-dispersed composition after one week had passed at room temperature was measured under the same condition as that described above, thereby, a degree of increase in a viscosity was assessed.

Herein, a low viscosity indicates that increase in a viscosity due to the dispersant is suppressed, and dispersibility and dispersion stability of the pigment are better.

(2) Measurement and Evaluation of Contrast

The resulting pigment-dispersed composition was coated on a glass substrate, and a sample was prepared so that a thickness of the coated film after drying became 1 μm. A sample substrate was placed between two polarizing plates, a luminance when polarizing plates were parallel, and a luminance when polarizing plates were orthogonal were measured with a color luminance meter (trade name: BM-5, manufactured by TOPCON CORPORATION), and a contrast was obtained as luminance at parallel/luminance at orthogonal Herein, a higher contrast indicates that since the pigment is uniformly dispersed in the state where it is highly miniaturized, a transmittance, that is, a coloring force is higher.

(3) Evaluation of Precipitability

The resulting pigment-dispersed composition was coated on a 100 mm×100 mm glass substrate (trade name: 1737, manufactured by Corning) so that a film thickness became 2.0 μm, and this was dried with an oven at 90° C. for 60 seconds. Thereafter, the coated film was subjected to heat treatment with an oven at 230° C. for 30 minutes (post-baking), and the presence or the absence of a precipitate on the cured film was confirmed with an optical microscope (manufactured by Olympus) at a magnification of 100. The same post-baking treatment was repeated to confirm the presence or the absence of a precipitate on a cured film every time.

An evaluation index is as follows. Herein, a larger index figure indicates that precipitation is more difficult, and transparency of a colored pattern is better.

—Evaluation Index—
4: Generation of precipitate at fourth post-baking
3: Generation of precipitate at third post-baking
2: Generation of precipitate at second post-baking
1: Generation of precipitate at first post-baking

TABLE 23

| | Processed pigment or comparative pigment | Polymer dispersant addition amount (part) | | Initial viscosity η1 (mPa·s) | Viscosity with time η2 (mPa·s) | Contrast | Precipitability |
|---|---|---|---|---|---|---|---|
| Example 2-1 | 2 R-1 | 2D-1 | 150 | 14 | 17 | 2300 | 3 |
| Example 2-2 | 2 R-2 | 2D-1 | 150 | 12 | 13 | 2500 | 4 |
| Example 2-3 | 2 R-3 | 2D-1 | 150 | 12 | 13 | 2500 | 4 |
| Example 2-4 | 2 R-4 | 2D-1 | 150 | 13 | 15 | 2400 | 3 |
| Example 2-5 | 2 R-5 | 2D-1 | 150 | 16 | 18 | 2300 | 3 |
| Example 2-6 | 2 R-6 | 2D-1 | 150 | 16 | 18 | 2300 | 3 |

TABLE 23-continued

| | Processed pigment or comparative pigment | Polymer dispersant addition amount (part) | | Initial viscosity η1 (mPa·s) | Viscosity with time η2 (mPa·s) | Contrast | Precipitability |
|---|---|---|---|---|---|---|---|
| Example 2-7 | 2 R-7 | 2D-1 150 | — | 12 | 13 | 2500 | 4 |
| Comparative Example 2-1 | 2 R-8 | 2D-1 150 | — | 19 | 22 | 2000 | 2 |
| Comparative Example 2-2 | 2 R-9 | 2D-1 150 | — | 20 | 25 | 1900 | 1 |
| Comparative Example 2-3 | 2 R-10 | 2D-1 150 | — | 20 | 30 | 1500 | 1 |
| Comparative Example 2-4 | 2 R-11 | 2D-1 150 | — | 30 | 40 | 1200 | 1 |
| Comparative Example 2-5 | 2 R-11 | 2D-1 150 | Polymer 2 57 | 25 | 35 | 1300 | 1 |

From results of Table 23, it is seen that in pigment-dispersed compositions of Examples 2-1 to 2-8 using the processed pigment covered with the specific graft-type polymer compound, a contrast is higher, precipitation by post-baking is suppressed and, further, increase in a viscosity with time is smaller as compared with Comparative Examples.

Examples 2-8 to 2-18, and Comparative Examples 2-6 to 2-15

Preparation of Pigment-Dispersed Composition

Components of the following composition (2B) containing each of the processed pigments described in Table 19 and Table 21 were mixed, and the mixture was stirred at a rotation number of 3,000 r.p.m. for 3 hours using a homogenizer to mix them to prepare a mixed solution containing the pigment.

[Composition (2B)]

| | |
|---|---|
| Processed pigment (described in the following Table 24) (A content in Comparative Examples 2-9, 2-10, 2-14, and 2-15 was made to be 82.7 parts) | 100 parts |

[Composition (2B)]

| | |
|---|---|
| Pigment dispersant (described in the following Table 24) (30% 1-methoxy-2-propyl acetate solution) | amount described in Table 24 |
| 1-Methoxy-2-propyl-acetate | 730 parts |

Subsequently, the mixed solution obtained as described above was further dispersing-treated for 6 hours with a beads dispersing machine (trade name: Dispermat, manufactured by GETZMANN) using 0.3 mmφ zirconia beads and, thereafter, further, was dispersing-treated under a pressure of 2,000 kg/cm³ at a flow rate of 500 g/min using a high pressure dispersing machine equipped with a pressure reducing mechanism (trade name: NANO-3000-10, manufactured by Japan B.E.E. Co., Ltd.). This dispersing treatment was repeated ten times to obtain a pigment-dispersed composition.

<Evaluation of Pigment-Dispersed Composition>

Regarding the resulting pigment-dispersed compositions, according to the same manner as that of Example 2-1, (1) a viscosity, (2) a contrast, and (3) precipitability were assessed. Evaluation results are summarized in Table 24.

TABLE 24

| | Processed pigment or comparative pigment | Polymer dispersant addition amount (part) | | Initial viscosity η1 (mPa·s) | Viscosity with time η2 (mPa·s) | Contrast | Precipitability |
|---|---|---|---|---|---|---|---|
| Example 2-8 | 2 G-1 | 2D-2 150 | — | 28 | 30 | 8200 | 4 |
| Example 2-9 | 2 G-2 | 2D-2 150 | — | 30 | 32 | 8000 | 3 |
| Example 2-10 | 2 G-3 | 2D-2 150 | — | 28 | 30 | 8200 | 4 |
| Example 1-11 | 2 G-6 | 2D-2 150 | — | 34 | 36 | 7900 | 3 |
| Example 2-12 | 2 G-7 | 2D-2 150 | — | 34 | 37 | 7800 | 3 |
| Example 2-13 | 2 G-8 | 2D-2 150 | — | 36 | 38 | 7700 | 3 |
| Comparative Example 2-6 | 2 G-15 | 2D-2 150 | — | 40 | 45 | 5000 | 2 |
| Comparative Example 2-7 | 2 G-16 | 2D-2 150 | — | 50 | 60 | 4500 | 1 |
| Comparative Example 2-8 | 2 G-17 | 2D-2 150 | — | 35 | 40 | 6000 | 2 |
| Comparative Example 2-9 | 2 G-18 | 2D-2 150 | — | 60 | 80 | 4000 | 1 |
| Comparative Example 2-10 | 2 G-18 | 2D-2 150 | Polymer 2 63 | 50 | 55 | 5000 | 2 |

TABLE 24-continued

|  | Processed pigment or comparative pigment | Polymer dispersant addition amount (part) |  | Initial viscosity η1 (mPa·s) | Viscosity with time η2 (mPa·s) | Contrast | Precipitability |
|---|---|---|---|---|---|---|---|
| Example 2-14 | 2 B-1 | 2D-2 100 | — | 13 | 14 | 2500 | 4 |
| Example 2-15 | 2 B-2 | 2D-2 100 | — | 15 | 18 | 2400 | 3 |
| Example 2-16 | 2 B-3 | 2D-2 100 | — | 12 | 13 | 2500 | 4 |
| Example 2-17 | 2 B-4 | 2D-2 100 | — | 12 | 13 | 2700 | 4 |
| Example 2-18 | 2 B-5 | 2D-2 100 | — | 18 | 20 | 2200 | 3 |
| Comparative Example 2-11 | 2 B-6 | 2D-2 100 | — | 30 | 40 | 1500 | 2 |
| Comparative Example 2-12 | 2 B-7 | 2D-2 100 | — | 50 | 65 | 1000 | 1 |
| Comparative Example 2-13 | 2 B-8 | 2D-2 100 | — | 60 | 70 | 900 | 1 |
| Comparative Example 2-14 | 2 B-9 | 2D-2 100 | — | 80 | 95 | 1000 | 1 |
| Comparative Example 2-15 | 2 B-9 | 2D-2 100 | Polymer 17 63 | 70 | 82 | 1200 | 2 |

In Table 24, in context of a hue, Examples 2-8 to 2-13 and Comparative Examples 2-6 to 2-10 are compared, and Examples 2-14 to 2-18 and Comparative Examples 2-11 to 2-15 are compared.

From results of Table 24, it is seen that in the pigment-dispersed composition of Examples using the processed pigment covered with the specific graft-type polymer compound, a contrast is higher, precipitation due to post-baking is suppressed and, further, increase in a viscosity with time is smaller as compared with Comparative Examples.

Examples 2-19 to 2-21, and Comparative Examples 2-16 to 2-18

Preparation of Pigment-Dispersed Composition

Components of the following composition (3B) were mixed, and stirred at a rotation number of 3,000 r.p.m. for 3 hours using a homogenizer to prepare a mixed solution containing the pigment.

[Composition (3B)]

| Processed pigment | (pigment/amount described in Table 25) |
|---|---|

[Composition (3B)]

| Dispersant (dispersant described in Table 25) (30% 1-methoxy-2-propyl acetate solution) | (amount described in Table 25) |
|---|---|
| 1-Methoxy-2-propyl acetate | 750 parts |

Subsequently, the mixed solution obtained as described above was further dispersing-treated for 3 hours with a beads dispersing machine (trade name: Dispermat, manufactured by GETZMANN) using 0.8 mmϕ zirconia beads, and thereafter, further, was dispersing-treated under a pressure of 2,000 kg/cm³ at a flow rate of 500 g/min using a high pressure dispersing machine equipped with a pressure reducing mechanism (trade name: NANO-3000-10, manufactured by Japan B.E.E. Co., Ltd.). This dispersing treatment was repeated ten times to obtain a pigment-dispersed composition of Table 25.

<Evaluation of Pigment-Dispersed Composition>

Regarding the resulting pigment-dispersed compositions, according to the same manner as that of Example 2-1, (1) a viscosity, (2) a contrast, and (3) precipitability were assessed. Evaluation results are summarized in Table 25.

TABLE 25

|  | Processed pigment or comparative pigment | | Polymer | | | | |
|---|---|---|---|---|---|---|---|
|  | Kind | Addition amount (part) | dispersant addition amount (Part) | Initial viscosity η1 (mPa·s) | Viscosity with time η2 (mPa·s) | Contrast | Precipitability |
| Example 2-19 | 2 R-3 | 100 | None | 16 | 17 | 2000 | 4 |
| Comparative Example 2-16 | 2 R-20 | 82.6 | Specific polymer 7 12.4 | 30 | 80 | 1200 | 2 |
| Example 2-20 | 2 G-1 | 100 | None | 35 | 36 | 7000 | 4 |
| Comparative Example 2-17 | 2 G-10 | 82.6 | Specific polymer 7 12.4 | 50 | 95 | 4500 | 3 |
| Example 2-21 | 2 B-1 | 100 | 2 D-2 150 | 18 | 18 | 2000 | 4 |

TABLE 25-continued

| | Processed pigment or comparative pigment | | Polymer | | | | |
|---|---|---|---|---|---|---|---|
| | Kind | Addition amount (part) | dispersant addition amount (Part) | Initial viscosity η1 (mPa·s) | Viscosity with time η2 (mPa·s) | Contrast | Precipitability |
| Comparative Example 2-18 | 2 B-10 | 8.26 | None | 40 | 85 | 1100 | 2 |

In Table 25, in context of a hue, Example 2-18 and Comparative Example 2-16, Example 2-19 and Comparative Example 2-17, and Example 2-20 and Comparative Example 2-18 are compared.

From results of Table 25, it is seen that in the pigment-dispersed compositions of Examples using the processed pigment covered with the specific graft-type polymer compound, a contrast is higher, precipitation due to post-baking is suppressed and, further, increase in a viscosity with time is smaller as compared with Comparative Examples in which the specific graft-type polymer compound is added as a conventional pigment dispersant.

Examples 3-1 to 3-17, and Comparative Example 3-1 to 3-6

Preparation of Pigment-Dispersed Composition

Components of the following composition (4B) containing the processed pigment described in Table 17, Table 19 and Table 21 were mixed, and stirred at a rotation number of 3,000 r.p.m. for 3 hours using a homogenizer to mixed them, to prepare a mixed solution containing the pigment.

| [Composition (4B)] | |
|---|---|
| Processed pigment (described in the following Table 26) | 130 parts |
| Pigment dispersant (described in the following Table 26) (30% 1-methoxy-2-propyl acetate solution) | amount described in Table 26 |
| 1-Methoxy-2-propyl acetate | 750 parts |

Subsequently, the mixed solution obtained as described above was further dispersing-treated for 6 hours with a beads dispersing machine (trade name: Dispermat, manufactured by GETZMANN) using 0.3 mmϕ zirconia beads and, thereafter, further, was dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition.

<Preparation of Colored-Photosensitive Composition>

Using the resulting pigment-dispersed composition, colored photosensitive compositions A-1 to A-22 of the following composition (A) were prepared.

| [Composition (A)] | |
|---|---|
| Pigment-dispersed composition (described in the following Table 26) | 2000 parts |
| Dipentaerythritol hexaacrylate (photopolymerizable compound) | 100 parts |

| -continued | |
|---|---|
| [Composition (A)] | |
| 4-[o-Bromo-p-N,N-di(ethoxycarbonyl)aminophenyl]-2,6-di(trichloromethyl)-s-triazine (photopolymerization initiator) | 30 parts |
| Propylene glycol monomethyl ether acetate solution (solid matter 30%) of benzyl methacrylate/methacrylic acid (=75/25 [mass ratio]) copolymer (weight average molecular weight: 12,000) (alkali-soluble resin) | 400 parts |
| 1-Methoxy-2-propyl-acetate (solvent) | 390 parts |

<Preparation of Color Filter Using Colored Photosensitive Composition>

The resulting colored photosensitive composition (color resist solution) was coated on a 100 mm×100 mm glass substrate (trade name: 1737, manufactured by Corning) so that a x value as an index of a color concentration became 0.650 in Examples 3-14 to 3-15 and Comparative Examples 3-3 to 3-4, a y value as an index of a color concentration became 0.60 in Examples 3-1 to 3-13 and Comparative Examples 3-1 to 3-2 and, further, a y value as an index of a color concentration became 0.10 in Examples 3-16 to 3-17 and Comparative Examples 3-5 to 3-6, and this was dried with an oven at 90° C. for 60 seconds (pre-baking). Thereafter, a whole surface of the coated film was exposed to light at 200 mJ/cm$^2$ (illuminance 20 mW/cm$^2$), and the coated film after light exposure was covered with a 1% aqueous solution of an alkali developer (trade name: CDK-1, manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baking), and a colored pattern for a color filter was formed on a glass substrate to obtain a color filter.

<Evaluation of Color Filter>

Regarding the manufactured color filter, (1) a contrast, (2) solubility in an alkali developer, and (3) precipitability were assessed as described below. These evaluation results are summarized in Table 26.

(1) Contrast

A polarizing plate was placed on a colored pattern of the resulting color filter, the colored pattern was held, a luminance when polarizing plates were parallel, and a luminance when polarizing plates were orthogonal were measured with a color luminance meter (trade name: BM-5, manufactured by TOPCON CORPORATION), and a value obtained by dividing a luminance at parallel by a luminance at orthogonal (=luminance at parallel/luminance at orthogonal) was used as an index for assessing a contrast.

Herein, a higher value indicates a higher contrast.

(2) Solubility in Alkali Developer

First, 100 g of a 10% aqueous solution of an alkali developer (trade name: CDK-1, manufactured by Fuji Electronic Materials Co., Ltd.) was weighed into a 150 ml of a beaker.

Then, the colored photosensitive composition obtained by the aforementioned method was coated on a 100 mm×100 mm glass substrate (trade name: 1737, manufactured by Corning) so that a film thickness became 2.5 μm, and this was dried with an oven at 90° C. for 60 seconds (pre-baking). The resulting glass substrate with a cured film was cut into 25 mm×100 mm, two of cut glasses were piled with the coated surface on an outer side, immersion in the alkali developer which had been prepared in advance, and an upper and lower motion of pulling up was repeated 20 times, and solubility of an uncured film, and the presence or absence of a suspension in the alkali developer were determined visually.

An evaluation index is as follows. Herein, as an index figure is larger, alkali solubility is better.

—Evaluation Index—

5. Complete dissolution of an uncured film at 1 to 10 times upper and lower motions, and no suspension in an alkali developer
4. Complete dissolution of an uncured film at 11 to 20 times upper and lower motions, and no suspension in an alkali developer
3. Complete dissolution of an uncured film at 1 to 10 times upper and lower motions, but presence of a suspension in an alkali developer.
2. Complete dissolution of an uncured film at 11 to 20 times upper and lower motions, but the presence of a suspension in an alkali developer.
1: Undissolution of an uncured film even at 20 times upper and lower motions.

(3) Evaluation of Precipitability

The photosensitive composition obtained by the aforementioned method was coated on a 100 mm×100 mm glass substrate (trade name: 1737, manufactured by Corning) so that a film thickness became 2.0 μm, and this was dried with an oven at 90° C. for 60 seconds (pre-baking). Thereafter, this was exposed to light at 100 mJ/cm$^2$ (illuminance 20 mW/cm$^2$) with a mask having a line width of 20 μm, and developed at 25° C. using a 1% aqueous solution of an alkali developer (trade name: CDK-1 manufactured by Fuji Electronic Materials Co., Ltd.).

As described above, the coated film which had been subjected to light exposure and developing treatment was heat-treated with an oven at 230° C. for 30 minutes (post-baking), and the presence or the absence of a precipitate on the cured film was confirmed with an optical microscope (manufactured by Olympus) at magnification of 100. In addition, the same post-baking treatment was repeated, and the presence or the absence of a precipitate on the cured film was confirmed every time.

An evaluation index is as follows. Herein, a larger index figure indicates that precipitation is difficult, and transparency of a colored pattern is better.

—Evaluation Index—

4: Generation of precipitate at fourth post-baking
3: Generation of precipitate at third post-baking
2: Generation of precipitate at second post-baking
1: Generation of precipitate at first post-baking

TABLE 26

|  | Colored photo-sensitive composition | Pigment-dispersed composition | | | Evaluation result of color filter | | |
|---|---|---|---|---|---|---|---|
|  |  | Dispersion No. | Processed pigment or comparative pigment | Polymer dispersant | Contrast | Solubility | Precipitability |
| Example 3-1 | A-1 | 2 DG-1 | 2 G-1 | 2 D-3 | 7600 | 5 | 4 |
| Example 3-2 | A-2 | 2 DG-2 | 2 G-1 | 2 D-2 | 7800 | 5 | 4 |
| Example 3-3 | A-3 | 2 DG-3 | 2 G-1 | 2 D-4 | 8100 | 5 | 4 |
| Example 3-4 | A-4 | 2 DG-4 | 2 G-9 | 2 D-4 | 7200 | 5 | 3 |
| Example 3-5 | A-5 | 2 DG-5 | 2 G-10 | 2 D-4 | 7600 | 4 | 4 |
| Example 3-6 | A-6 | 2 DG-6 | 2 G-11 | 2 D-4 | 7400 | 5 | 3 |
| Example 3-7 | A-7 | 2 DG-7 | 2 G-3 | 2 D-2 | 7500 | 5 | 4 |
| Example 3-8 | A-8 | 2 DG-8 | 2 G-4 | 2 D-2 | 7300 | 5 | 3 |
| Example 3-9 | A-9 | 2 DG-9 | 2 G-5 | 2 D-2 | 7300 | 4 | 3 |
| Example 3-10 | A-10 | 2 DG-10 | 2 G-12 | 2 D-2 | 7500 | 4 | 4 |
| Example 3-11 | A-11 | 2 DG-11 | 2 G-13 | 2 D-2 | 7600 | 4 | 4 |
| Example 3-12 | A-12 | 2 DG-12 | 2 G-14 | 2 D-2 | 7400 | 5 | 3 |
| Example 3-13 | A-17 | 2 DG-13 | 2 G-6 | 2 D-2 | 7000 | 5 | 3 |
| Comparative example 3-1 | A-17 | 2 DG-14 | 2 G-15 | 2 D-2 | 5500 | 3 | 1 |
| Comparative example 3-2 | A-18 | 2 DG-15 | 2 G-16 | 2 D-2 | 5000 | 2 | 1 |
| Example 3-14 | A-13 | 2 DR-1 | 2 R-1 | 2 D-2 | 2400 | 5 | 4 |
| Example 3-15 | A-14 | 2 DR-2 | 2 R-2 | 2 D-2 | 2700 | 5 | 3 |
| Comparative example 3-3 | A-19 | 2 DR-3 | 2 R-8 | 2 D-2 | 1500 | 3 | 1 |
| Comparative example 3-4 | A-20 | 2 DR-4 | 2 R-10 | 2 D-2 | 1200 | 2 | 1 |
| Example 3-16 | A-15 | 2 DB-1 | 2 B-3 | 2 D-1 | 2200 | 5 | 4 |
| Example 3-17 | A-16 | 2 DB-2 | 2 B-4 | 2 D-1 | 2300 | 5 | 4 |
| Comparative example 3-5 | A-21 | 2 DB-3 | 2 B-6 | 2 D-1 | 1000 | 3 | 1 |
| Comparative example 3-6 | A-22 | 2 DB-4 | 2 B-7 | 2 D-1 | 900 | 2 | 1 |

In Table 26, in context of a hue, Examples 3-1 to 3-13 and Comparative Examples 3-1 to 3-2 are compared, Examples 3-14 and 3-15, and Comparative Examples 3-3, and 3-4 are compared, and Examples 3-16, and 3-17, and Comparative Examples 3-5 and 3-6 are compared.

From results of Table 26, it is seen that in the color filter of Examples manufactured using the colored curing composition containing the processed pigment of the invention, a contrast is higher, solubility in an alkali developer is better, and precipitation due to post-baking is suppressed as compared with Comparative Examples.

Examples 3-18 to 3-29, and Comparative Examples 3-7 to 3-15

Preparation of Pigment-Dispersed Composition

Components of the following composition (5B) containing the processed pigment described in Table 18, Table 20 and Table 22 were mixed, and stirred for 3 hours at a rotation number of 3,000 r.p.m. using a homogenizer to mix them to prepare a mixed solution containing the pigment.

| [Composition (5B)] | |
|---|---|
| Processed pigment (described in the following Table 27) | 120 parts |
| Pigment dispersant D-1 (30% 1-methoxy-2-propyl acetate solution) | 250 parts |
| Pigment derivative B of the above structure | 25 parts |
| 1-Methoxy-2-propyl acetate | 750 parts |

Subsequently, the mixed solution obtained as described above was dispersing-treated for 6 hours with a beads dispersing machine (treat name: Dispermat, manufactured by GETZMANM) using 0.3 mmφ zirconia beads and, thereafter, further, was dispersing-treated under a pressure of 2,000 kg/cm$^3$ at a flow rate of 500 g/min using a high pressure dispersing machine equipped with the pressure mechanism (tread name: NANO3000-10, manufactured by Japan B.E.E.). This dispersion treatment is repeated 10 times to obtain the pigment-dispersed composition.

<Preparation of Colored Photosensitive Composition>

Using the resulting pigment-dispersed composition, colored photosensitive compositions B1 to B-21 of the following composition (B) were prepared.

| [Composition (B)] | |
|---|---|
| Pigment-dispersed composition (described in the following Table 27) | 2100 parts |
| Dipentaerythritol hexaacrylate (photopolymerizable compound) | 80 parts |
| 4-[o-Bromo-p-N,N-di(ethoxycarbonyl)aminophenyl]-2,6-di(trichloromethyl)-s-triazine (photopolymerization initiator) | 50 parts |
| Propylene glycol monomethyl ether acetate solution (solid matter 30%) of benzyl methacrylate/methacrylic acid (=75/25 [mass ratio]) copolymer (weight average molecular weight: 10,000) (alkali-soluble resin) | 300 parts |
| 1-Methoxy-2-propyl acetate (solvent) | 390 parts |

<Manufacturing of Color Filter Using Colored Photosensitive Composition>

The resulting colored photosensitive composition (color resist solution) was coated on a 100 mm×100 mm glass substrate (trade name: 1737, manufactured by Corning) so that a x value as an index of a color concentration became 0.650 in Examples 3-18 to 3-20 and Comparative Examples 3-7 to 3-9, a y value as an index of a color concentration became 0.60 in Examples 3-21 to 3-24 and Comparative Examples 3-10 to 3-12, and further, a y value as an index of a color concentration became 0.10 in Examples 3-25 to 3-29 and Comparative Examples 3-13 to 3-15, and this was dried with an oven at 90° C. for 60 seconds (pre-baking). Thereafter, a whole surface of the coated film was exposed to light at 200 mJ/cm$^2$ (illuminance 20 mW/cm$^2$), and the coated film after light exposure was covered with a 1% aqueous solution of an alkali developer (trade name: CDK-1, manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baking), and a colored pattern for a color filter was formed on a glass substrate to obtain a color filter.

<Evaluation of Color Filter>

Regarding the resulting color filter, according to the same manner as that of Example 3-1, (1) a contrast, and (2) solubility in an alkali developer were assessed.

Further, (4) voltage retainability was also assessed by the following method.

These evaluation results are summarized in Table 27.

(4) Voltage Retainability Rate

The photosensitive composition obtained by the aforementioned method was coated on a glass substrate equipped with an ITO electrode (trade name: 1737, manufactured by Corning) so that a film thickness became 2.0 μm, and this was dried with an oven at 90° C. for 60 seconds (pre-baking). Thereafter, this was exposed to light at 100 mJ/cm$^2$ (illuminance 20 mW/cm$^2$) not through a mask, and developed at 25° C. using a 1% aqueous solution of an alkali developer (trade name: CDK1 manufactured by Fuji Electronic Materials Co., Ltd.), and the coated film was heat-treated with an oven at 230° C. for 30 minutes (post-baking). Thereby, a glass substrate on which a cured film had been formed was obtained.

Then, this glass substrate on which the cured film had been formed and a substrate on which an ITO electrode had been merely deposited into a predetermined shape were laminated with a sealing agent with 5 μm glass beads mixed therein, and a liquid crystal (trade name: MJ971189, manufactured by Merck) was injected to manufacture a liquid crystal cell.

Then, the liquid crystal cell was placed into a constant temperature bath at 70° C. for 48 hours, and a voltage retainability rate of a liquid crystal cell was measured with a liquid crystal voltage retainability rate measuring system (trade name: VAH-1A-type, manufactured by TOYO Corporation.).

The voltage retainability rate is a value of a voltage applied at a liquid crystal cell potential difference/0 msec after 16.7 msec.

Conditions upon measurement of this voltage retainability rate were as follows.

—Measurement Condition—

Distance between electrodes: 5 μm
Applied voltage pulse amplitude: 5 V
Applied voltage pulse frequency: 60 Hz
Applied voltage pulse width: 16.67 msec An evaluation index is as follows. Herein, it is seen that as an index figure is larger, a voltage retainability rate is higher, and better electric property is exhibited.

—Evaluation Index—

5: 90% or more
4: 85% or more and less than 90%
3: 80% or more and less than 85%
2: 75% or more and less than 80%
1: Less than 75%

TABLE 27

| | Pigment-dispersed composition | | | Evaluation results of color filter | | |
|---|---|---|---|---|---|---|
| | Colored photosensitive composition | Dispersion No. | Processed pigment or comparative pigment | Contrast | Solubility | Voltage retainability rate |
| Example 3-18 | B-1 | 2 DL-1 | 2 L-1 | 3800 | 5 | 5 |
| Example 3-19 | B-2 | 2 DL-2 | 2 L-2 | 3800 | 4 | 5 |
| Example 3-20 | B-3 | 2 DL-3 | 2 L-3 | 3500 | 5 | 4 |
| Comparative example 3-7 | B-13 | 2 DL-4 | 2 L-5 | 2100 | 3 | 1 |
| Comparative example 3-8 | B-14 | 2 DL-5 | 2 L-6 | 1800 | 2 | 1 |
| Comparative example 3-9 | B-15 | 2 DL-6 | 2 L-7 | 1000 | 2 | 1 |
| Example 3-21 | B-4 | 2 DY-1 | 2 Y-1 | 5000 | 5 | 4 |
| Example 3-22 | B-5 | 2 DY-2 | 2 Y-2 | 6000 | 5 | 5 |
| Example 3-23 | B-6 | 2 DY-3 | 2 Y-3 | 5000 | 5 | 4 |
| Example 3-24 | B-7 | 2 DY-4 | 2 Y-4 | 5100 | 5 | 4 |
| Comparative example 3-10 | B-16 | 2 DY-5 | 2 Y-5 | 4100 | 3 | 1 |
| Comparative example 3-11 | B-17 | 2 DY-6 | 2 Y-6 | 3000 | 2 | 1 |
| Comparative example 3-12 | B-18 | 2 DY-7 | 2 Y-8 | 2000 | 2 | 1 |
| Example 3-25 | B-8 | 2 DV-1 | 2 V-1 | 700 | 5 | 5 |
| Example 3-26 | B-9 | 2 DV-2 | 2 V-2 | 650 | 4 | 5 |
| Example 3-27 | B-10 | 2 DV-3 | 2 V-3 | 700 | 5 | 4 |
| Example 3-28 | B-11 | 2 DV-4 | 2 V-4 | 800 | 5 | 5 |
| Example 3-29 | B-12 | 2 DV-5 | 2 V-5 | 500 | 5 | 4 |
| Comparative example 3-13 | B-19 | 2 DV-6 | 2 V-7 | 300 | 3 | 1 |
| Comparative example 3-14 | B-20 | 2 DV-7 | 2 V-9 | 200 | 2 | 1 |
| Comparative example 3-15 | B-21 | 2 DV-8 | 2 V-10 | 120 | 2 | 1 |

In Table 27, in context of a hue, Examples 3-18 to 3-20 and Comparative Examples 3-7 to 3-9 are compared, Examples 3-21 to 3-24 and Comparative Examples 3-10 to 3-12 are compared, and Examples 3-25 to 3-29 and Comparative Examples 3-13 to 3-15 are compared.

From results of Table 27, it is seen that in the color filter of Examples manufactured using the colored photosensitive composition containing the processed pigment of the invention, a contrast is higher, solubility in an alkali developer is better, and a voltage retainability rate is higher as compared with Comparative Examples.

Examples 3-30 to 3-35, and Comparative Examples 3-16 to 3-18

Preparation of Colored Photosensitive Composition

Using pigment-dispersed compositions described in Table 26 and Table 27 obtained as described above, colored photosensitive compositions, C-1 to C-9 of the following composition (C) were prepared.

| [Composition (C)] | |
|---|---|
| Pigment-dispersed composition A (described in the following Table 28) | 2000 parts |
| Pigment-dispersed composition B (described in Table 28) | 1200 parts |
| [Dipentaerythritol hexaacrylate (photopolymerizable compound) | 120 parts |

-continued

| [Composition (C)] | |
|---|---|
| 4-[o-Bromo-p-N,N-di(ethoxycarbonyl)aminophenyl]-2,6-di(trichloromethyl)-s-triazine (photopolymerization initiator) | 30 parts |
| Propylene glycol monomethyl ether acetate solution (solid matter 30%) of benzyl methacrylate/methacrylic acid (=75/25 [mass ratio]) copolymer (weight average molecular weight 9,000) (alkali-soluble resin) | 260 parts |
| 1-Methoxy-2-propyl acetate (solvent) | 390 parts |

<Manufacturing of Color Filter Using Colored Photosensitive Composition>

The resulting colored photosensitive composition (color resist solution) was coated on a 100 mm×100 mm glass substrate (trade name: 1737, manufactured by Corning) so that a x value as an index of a color concentration became 0.650 in Examples 3-30 to 3-31 and Comparative Example 3-16, a y value as an index of a color concentration became 0.60 in Examples 3-32 to 3-33 and Comparative Example 3-17 and, further, a y value as an index of a color concentration became 0.10 in Examples 3-34 to 3-35 and Comparative Example 3-18, and this was dried with an oven at 90° C. for 60 seconds (pre-baking). Thereafter, a whole surface of the coated film was exposed to light at 200 mJ/cm$_2$ (illuminance 20 mW/cm$_2$), and the coated film after light exposure was covered with a 1% aqueous solution of an alkali developer (trade name: CDK-1, manufactured by Fuji Electronic Materials Co., Ltd.), and allowed to stand for 60 seconds. After allowed to stand, pure water was sprayed in a shower-like manner to wash out the developer. Then, the coated film which had been subjected to light exposure and development as described above was heat-treated with an oven at 220° C. for 1 hour (post-baking), and a colored pattern for a color filter was formed on a glass substrate to obtain the color filter.

<Evaluation of Color Filter>

Regarding the resulting color filter, according to the same manner as that of Example 3-1, (1) a contrast, and (2) solubility in an alkali developer were assessed.

Further, (5) crystal precipitability was also assessed by the following method.

These evaluation results are summarized in Table 28.

(5) Crystal Precipitability

The colored photosensitive composition obtained by the above method was coated on a glass substrate equipped with an ITO electrode (trade name: 1737, manufactured by Corning) so that a film thickness became 2.0 μm, and this was dried with an oven at 90° C. for 60 seconds (pre-baking). Thereafter, this was exposed to light at 100 mg/cm$^2$ (illuminance 20 mW/cm$^2$) not through a mask, and developed at 25° C. using a 1% aqueous solution of an alkali developer (trade name: CDK-1, manufactured by Fuji Electronic Materials Co., Ltd.), and the coated film was heat-treated with an oven 230° C. for 30 minutes (post-baking). Thereby, a glass substrate on which a cured film had been formed, was obtained.

Then, this glass substrate on which a cured film had been formed, and a substrate on which an ITO electrode had been deposited into a predetermined shape were placed into a constant temperature bath at 70° C. and a humidity of 80% for 72 hours, and the presence or the absence of crystal precipitation on the cured film was assessed visually.

An evaluation index is as follows. Herein, it is seen that as an index figure is larger, transparency of a colored pattern is more excellent.

—Evaluation Index—

3: Crystal precipitation is not seen on the cured film.
2: Slight crystal precipitation is seen on the cured film.
1: Crystal precipitation is seen on a whole cured film.

2D-4: A polymer of M-1/MM-1/MAA=30/55/15 mass % having a weight average molecular weight of 1.8×10000 and an acid value of 97 mgKOH/g Herein, MAA represents methacrylic acid, and St represents styrene.
Polymer 2: Specific polymer compound No. 2
Polymer 17: Specific polymer compound No. 17

In Table 28, in context of a hue, Examples 3-30 and 3-31, and Comparative Example 3-16 are compared, Example 3-32 and Comparative Example 3-17 are compared, and Examples 3-33 to 3-35 and Comparative Example 3-18 are compared.

From results of Table 28, it is seen that in the color filter of Examples manufactured using the colored photosensitive composition containing the processed pigment of the invention, contrast is higher, solubility in an alkali developer is better and crystal precipitation at post-baking is suppressed as compared with Comparative Examples.

Examples 4-1 to 4-3, and Comparative Examples 4-1 to 4-3

Application to Solid Image Pickup Element

<Preparation of Under Coating Composition>

Components of the following composition were mixed and dissolved to prepare an under coating composition.

| (Composition of under coating composition) | |
|---|---|
| Propylene glycol monomethyl ether acetate | 19.20 parts |
| Ethyl lactate | 36.67 parts |
| 40% Propylene glycol monomethyl ether acetate (PGMEA) solution of benzyl methacrylate/methacrylic acid/2-hydroxyethyl methacrylate (molar ratio = 60/22/18) copolymer | 30.51 parts |
| Dipentaerythritol hexaacrylate | 12.20 parts |

TABLE 28

| | Colored photo- sensitive composition | Pigment-dispersed composition | | Evaluation results of color filter | | |
|---|---|---|---|---|---|---|
| | | A: Dispersion No. | B: Dispersion No. | Contrast | Solubility | Crystal precipitability |
| Example 3-30 | C-1 | 2 DR-2 | 2 DL-1 | 2800 | 5 | 3 |
| Example 3-31 | C-2 | 2 DR-1 | 2 DL-2 | 2500 | 4 | 3 |
| Comparative example 3-16 | C-7 | 2 DR-3 | 2 DL-5 | 1800 | 2 | 1 |
| Example 3-32 | C-3 | 2 DG-3 | 2 DY-2 | 7600 | 5 | 3 |
| Comparative example 3-17 | C-8 | 2 DG-15 | 2 DY-6 | 4500 | 2 | 2 |
| Example 3-33 | C-4 | 2 DG-2 | 2 DY-4 | 7200 | 5 | 3 |
| Example 3-34 | C-5 | 2 DB-2 | 2 DV-4 | 3200 | 5 | 3 |
| Example 3-35 | C-6 | 2 DB-1 | 2 DV-5 | 3000 | 5 | 3 |
| Comparative example 3-18 | C-9 | 2 DB-3 | 2 DV-7 | 1200 | 1 | 1 |

Details of pigment dispersants 2D-1 to 2D-4, and polymers 1, 2 and 17 described in Table 23 to Table 28 will be explained below.

2D-1: "Solsperse 24000" manufactured by The Lubrizol Corporation
2D-2: A polymer of St/MM-1/MAA=30/55/15 mass % having a weight average molecular weight of 2.1×10000 and an acid value of 97 mgKOH/g
2D-3: A polymer of St/MAA=85/15 mass % having a weight average molecular weight of 2.0×10000 and an acid value of 100 mgKOH/g -continued

| (Composition of under coating composition) | |
|---|---|
| Polymerization inhibitor (p-methoxyphenol) | 0.0061 part |
| Fluorine-based surfactant (trade name: F-475, manufactured by Dainippon Ink and Chemicals, Incorporated) | 0.83 parts |
| TAZ-107 (manufactured by Midori Kagaku Co., Ltd.) | 0.586 parts |

<Manufacturing of Silicon Wafer with Undercoating Layer>

A 6 inch silicon wafer was heat-treated in an oven at 200° C. for 30 minutes. Then, the undercoating solution was coated on this silicon wafer so that a dry film thickness became 1.5 μm, and this was heated to dry in an oven at 220° C. for 1 hour to form an undercoating layer, to obtain a silicon wafer substrate with an undercoating layer.

<Preparation of Pigment Dispersed Composition>

Components of the following composition (6B) were stirred at a rotation number of 3,000 r.p.m. for 3 hours using a homogenizer to mix them, to prepare a mixed solution containing the pigment.

| [Composition (6B)] | |
|---|---|
| Processed pigment | (pigment and amount described in Table 29) |
| Dispersant (30% 1-Methoxy-2-propyl acetate solution) | (amount described in Table 29) |
| 1-Methoxy-2-propyl acetate | 750 parts |

Subsequently, the mixed solution obtained as described above was further dispersing-treated for 3 hours with a beads dispersing machine (trade name: Dispermat, manufactured by GETZMANN) using 0.8 mmφ zirconia beads and, thereafter, further, was dispersing-treated under a pressure of 2,000 kg/cm$^3$ at a flown rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition of Table 29.

<Preparation of Colored Photosensitive Composition (Coating Solution)>

Using the pigment dispersion obtained as described above, components were stirred and mixed so that the following composition (D) was obtained, thereby, a solution of the colored photosensitive composition was prepared.

| (Composition (D)) | |
|---|---|
| The aforementioned pigment dispersion | 1000 parts |
| CGI-214 (Oxime-based photopolymerization initiator, manufactured by Ciba Specialty Chemicals) | 20 parts |
| Dipentaerythritol hexaacrylate [photopolymerizable compound] | 20 parts |
| TO-756 (photopolymerizable compound manufactured by Toagose Co. LTd.) | 35 parts |
| Propylene glycol monomethyl ether acetate | 20 parts |

<Manufacturing of color filter>

(1) Formation of Pattern

The colored photosensitive composition prepared as described above was coated on an undercoating layer of the silicon wafer with an undercoating layer obtained as described above to form a colored layer (coated film). Then, this was heat-treated using a hot plate at 100° C. for 120 seconds, so that a dry film thickness of the coated film became 0.7 μm (pre-baking).

Then, using an i ray stepper light exposing apparatus (trade name: FPA-3000i5+, manufactured by Canon), light exposure was performed at a light exposure amount of 200 mJ/cm$^2$ at a wavelength of 365 nm through an Island pattern mask in which a pattern was 1.5 μm square.

Thereafter, a silicon wafer substrate on which the coated film after light exposure had been formed, was placed on a horizontal rotating table of a spin/shower developing machine (trade name: DW-30-type, manufactured by Chemitronics Co., Ltd.), and paddle development was performed at 23° C. for 60 seconds using CD-2000 (manufactured by Fuji Electronic Materials Co., Ltd.) to form a colored pattern on the silicon wafer.

The silicon wafer on which the colored pattern had been formed was fixed on the horizontal rotating table in a vacuum chuck manner, this was rinse-treated by supplying pure water in a shower-like manner through an ejection nozzle from an upper part of a rotation center while the silicon wafer was rotated with a rotation apparatus at a rotation number of 50 r.p.m. and, thereafter, spray dried.

(2) Evaluation of Sensitivity

A minimum light exposure amount at which a film thickness of a region irradiated with light at a light exposing step of the light exposure was 95% or more relative to a film thickness 100% before light exposure was assessed as a light exposure sensitivity. A smaller value of light exposure sensitivity indicates that sensitivity is higher.

(3) Evaluation of Color Variation

The curing composition was coated on an undercoating layer of the silicon wafer with the undercoating layer to form a colored layer (coated film). This was heat-treated for 120 seconds using a hot plate at 100° C. so that a dry film thickness of the coated film became 0.7 μm (pre-baking). A photograph of a luminance distribution of this coated silicon wafer was taken with a microscope (trade name: MX-50, manufactured by Olympus) to obtain an image, which was analyzed.

The luminance distribution was analyzed by the aforementioned method, and a color variation was assessed based on a ratio of pixels in which deviation from an average was within ±5% relative to the total pixel number. Evaluation criteria are as follows.

—Evaluation Criteria—

A: pixels in which deviation from an average is within ±5% is 99% or more among the total pixel number.
B: pixels in which deviation from an average is within ±5% is 95% or more and less than 99% among the total pixel number.
C: pixels in which deviation from an average is within ±5% is less than 95% among the total pixel number.

TABLE 29

| | Processed pigment or comparative pigment | | (part) of polymer dispersant | Sensitivity (mJ/cm$^2$) | Color variation |
|---|---|---|---|---|---|
| | Kind | Addition amount (part) | | | |
| Example 4-1 | 2 R-3 | 100 | None | 800 | A |
| Comparative example 4-1 | 2 R-20 | 82.6 | Specific polymer 7 12.4 | 900 | B |

TABLE 29-continued

| | Processed pigment or comparative pigment | | Addition amount (part) of polymer dispersant | Sensitivity (mJ/cm$^2$) | Color variation |
|---|---|---|---|---|---|
| | Kind | Addition amount (part) | | | |
| Example 4-2 | 2 G-1 | 100 | None | 700 | A |
| Comparative example 4-2 | 2 G-10 | 82.6 | Specific polymer 7 12.4 | 800 | B |
| Example 4-3 | 2 B-1 | 100 | 2D-2 150 | 700 | A |
| Comparative example 4-3 | 2 B-10 | 8.26 | None | 800 | B |

In Table 29, in context of a hue, Example 4-1 and Comparative Example 4-1 are compared, Example 4-2 and Comparative Example 4-2 are compared, and Example 4-3 and Comparative Example 4-3 are compared.

From results of Table 29, it is seen that in the solid image pickup element manufactured using the colored curing composition containing the processed pigment of the invention, a colored pattern may be manufactured at a high sensitivity, and color variation is suppressed.

Synthesis Specific Polymer Compound

By the following method, specific polymer compounds C-1 to C-12 of the invention were synthesized.

Synthesis of Mercaptan Compound Represented by the Formula (3-4)

Chain transfer agents B-1 to B-3, B-5 to B-8, and B-11 (the aforementioned mercaptan compound represented by the formula (3-4)) were synthesized as described below.

Synthesis Example B-1

In 93.60 parts of dimethylformamide were dissolved 7.87 parts of dipentaerythritol hexakis(3-mercaptopropionate) [following compound (33), trade name: DPMP, manufactured by Sakai Chemical Industry Co., Ltd.], and 15.75 parts of a compound having an adsorption site and having a carbon-carbon double bond (following compound (A-1)), and this was heated to 70° C. under a nitrogen stream. To this was added 0.06 parts of 2,2'-azobis(2,4-dimethylvaleronitrile) [trade name: V-65, manufactured by Wako Pure Chemical Industries, Ltd.], and this was heated for 3 hours. Further, 0.06 parts of V-65 was added, and materials were reacted at 70° C. for 3 hours under a nitrogen stream. Cooling to room temperature afforded a 20% solution of a mercaptan compound (chain transfer agent B-1) according to the invention shown below.

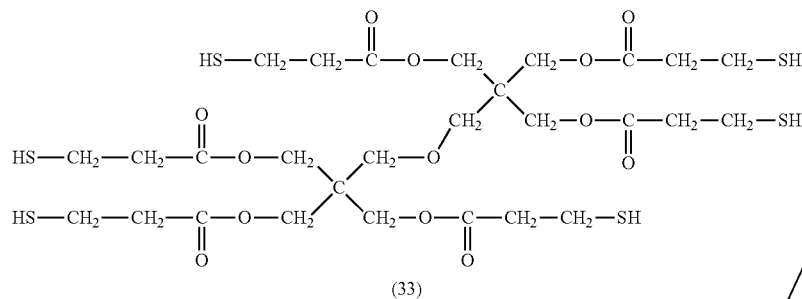

(33)

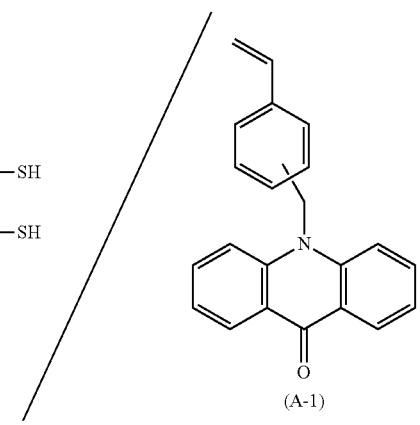

(A-1)

B-1 (1/5 Adduct)

Synthesis Example B-2

According to the same manner as that of the Synthesis Example B-1 except that 15.57 parts of the compound (A-1) having an adsorption site and having a carbon-carbon double bond, and 93.60 parts of dimethylformamide were changed to 14.61 parts of a compound (A-2) having an adsorption site and having a carbon-carbon double bond and 89.78 parts of dimethylformamide in the Synthesis Example B-2, a 20% solution of a mercaptan compound (chain transfer agent B-2) according to the invention shown below was obtained.

Synthesis Example B-5

According to the same manner as that of the Synthesis Example B-1 except that 15.57 parts of the compound (A-1) having an adsorption site and having a carbon-carbon double bond, and 93.60 parts of dimethylformamide were changed to 12.44 parts of a compound (A-5) having an adsorption site and having a carbon-carbon double bond, and 47.30 parts of 1-methoxy-2-propanol in the Synthesis Example B-5, a 30% solution of a mercaptan compound (chain transfer agent B-5) according to the invention shown below was obtained.

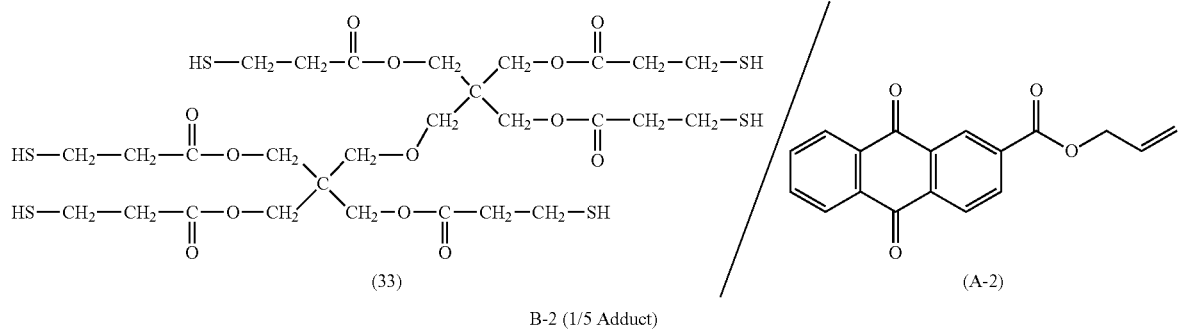

B-2 (1/5 Adduct)

Synthesis Example B-3

According to the same manner as that of the Synthesis Example B-1 except that 15.57 parts of the compound (A-1) having an adsorption site and having a carbon-carbon double bond, and 93.60 parts of dimethylformamide were changed to 17.52 parts of a compound (A-3) having an adsorption site and having a carbon-carbon double bond and 101.4 parts of dimethylformamide in the Synthesis Example B-3, a 20% solution of a mercaptan compound (chain transfer agent B-3) according to the invention shown below was obtained.

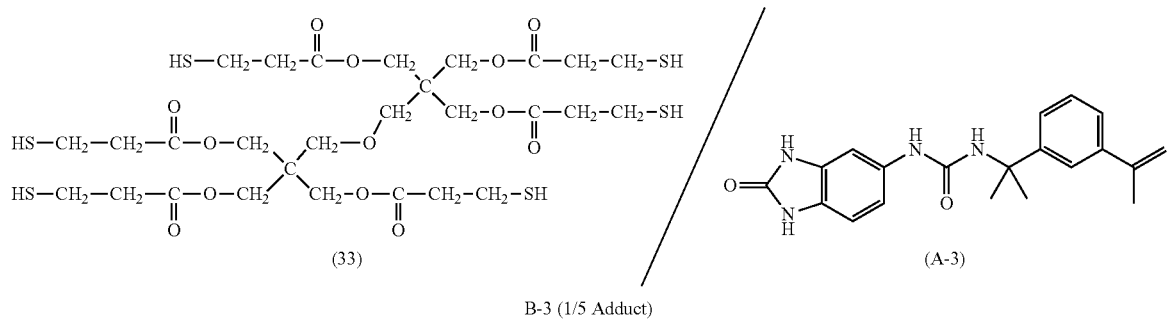 [SMILES: O=C(CCS)OCC(COCC(COC(=O)CCS)(COC(=O)CCS)COC(=O)CCS)(COC(=O)CCS)COC(=O)CCS ; C=C(C)c1cccc(C(C)(C)NC(=O)Nc2ccc3[nH]c(=O)[nH]c3c2)c1 ; "(A-3)"]

B-3 (1/5 Adduct)

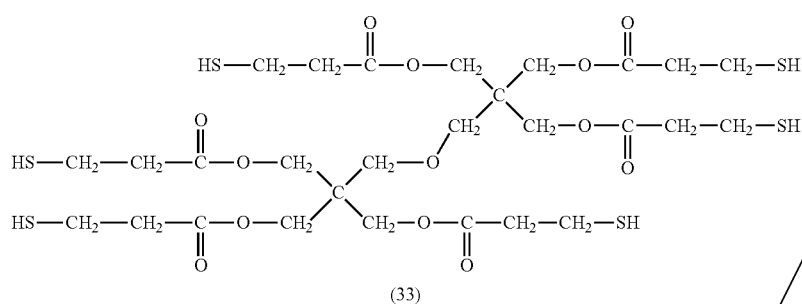
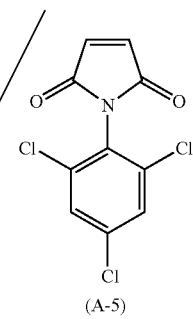

B-5 (1/4.5 Adduct)

Synthesis Example B-6

In 77.20 parts of dimethylformamide were dissolved 4.89 parts of pentaerythritol tetrakis(3-mercaptopropionate) [trade name: PEMP, manufactured by Sakai Chemical Industry Co., Ltd., following compound (27)], and 14.41 parts of a compound (following compound (A-6)) having an adsorption site and having a carbon-carbon double bond, and this was heated to 70° C. under a nitrogen stream. To this was added 0.04 parts of 2,2'-azobis(2,4-dimethylvaleronitrile) [trade name: V-65, manufactured by Wako Pure Chemical Industries, Ltd.], and this was heated for 3 hours. Further, 0.04 parts of V-65 was added, and the materials were reacted at 70° C. for 3 hours under a nitrogen stream. Cooling to room temperature afforded a 20% solution of a mercaptan compound (chain transfer agent B-6) according to the invention shown below.

Synthesis Example B-7

According to the same manner as that of the Synthesis Example B-1 except that 15.57 parts of a compound (A-1) having an adsorption site and having a carbon-carbon double bond, and 93.60 parts of dimethylformamide were changed to 4.71 parts of a compound (A-7) having an adsorption site and having a carbon-carbon double bond, and 29.25 parts of 1-methoxy-2-propanol in the Synthesis Example B-7, a 30% solution of a mercaptan compound (chain transfer agent B-7) according to the invention shown below was obtained.

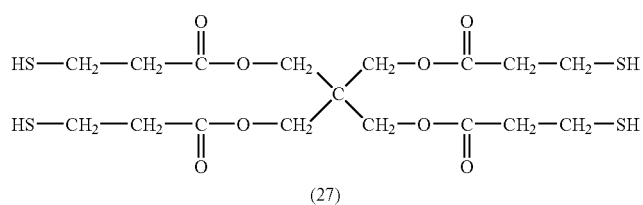
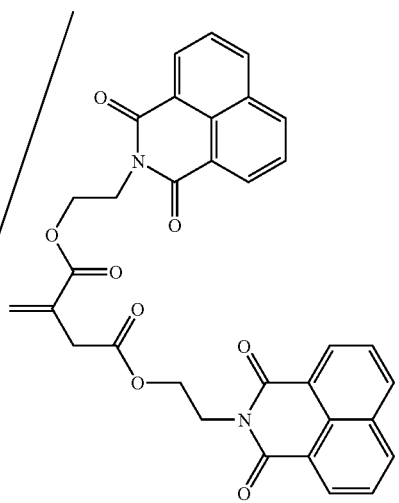

B-6 (1/2.5 Adduct)

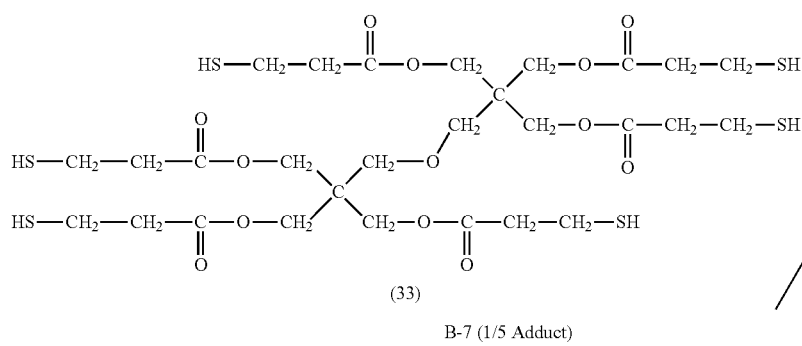
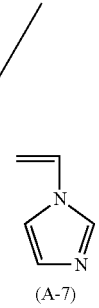

B-7 (1/5 Adduct)

Synthesis Example B-8

In 33.45 parts of 1-methoxy-2-propanol were dissolved 7.83 parts of dipentaerythritol hexakis(3-mercaptopropionate) [trade name: DPMP, manufactured by Sakai Chemical Industry Co., Ltd., following compound (33)], and 6.51 parts of a compound (following compound (A-8)) having an adsorption site and having a carbon-carbon double bond, and this was heated to 70° C. under a nitrogen stream. To this was added 0.06 parts of 2,2'-azobis(2,4-dimethylvaleronitrile) [trade name: V-65, manufactured by Wako Pure Chemical Industries, Ltd.], and this was heated for 3 hours. Further, 0.06 parts of V-65 was added, and the materials were reacted at 70° C. for 3 hours under a nitrogen stream. Cooling to room temperature afforded a 30% solution of a mercaptan compound (chain transfer agent B-8) according to the invention.

Synthesis Example B-11

According to the same manner as that of the Synthesis Example B-8 except that 6.51 parts of a compound (A-8) having an adsorption site and having a carbon-carbon double bond, and 33.45 parts of 1-methoxy-2-propanol were changed to 7.86 parts of a compound (A-11) having an adsorption site and having a carbon-carbon double bond, and 36.61 parts of 1-methoxy-2-propanol in Synthesis Example B-11, a 30% solution of a mercaptan compound (chain transfer agent B-11) according to the invention shown below was obtained.

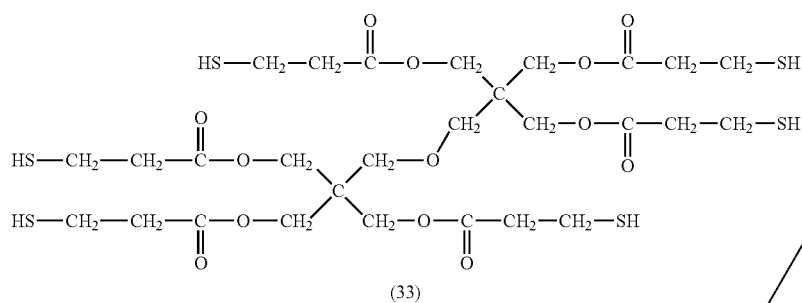
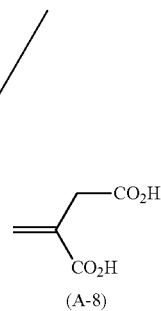

B-8 (1/5 Adduct)

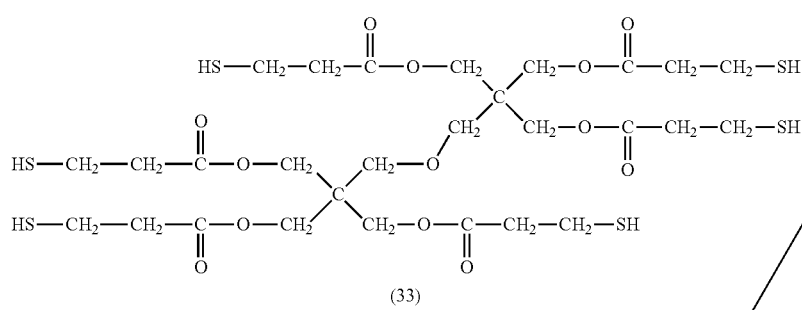

(33)

B-11 (1/5 Adduct)

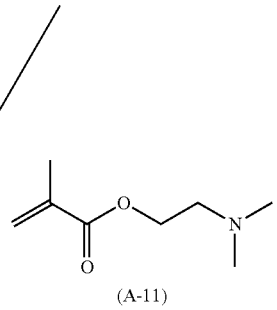

(A-11)

Synthesis Example C1

A mixed solution of 46.80 parts of the 20% solution of a chain transfer agent B-1 obtained in the Synthesis Example B-1, 6.0 parts of methacrylic acid, and 14.4 parts of methyl methacrylate (MMA; monomer) was heated to 80° C. under a nitrogen stream. To this was added 0.013 parts of 2,2'-azobis (isobutyronitrile) [trade name: AIBN, manufactured by Wako Pure Chemical Industries, Ltd.], this was heated for 3 hours, and 0.013 parts of AIBN was added again to react the materials at 80° C. for 3 hours under a nitrogen stream. Thereafter, the resultant was cooled to room temperature, and diluted with acetone. A large amount of methanol was used to precipitate the material again, and this was vacuum-dried to obtain 20 parts of a polymer compound. The resulting polymer compound was dissolved in 67 parts of 2-acetoxy-1-methoxypropane to obtain a polymer compound C-1 having a solid matter of 30% by mass.

A weight average molecular weight of the resulting polymer compound was measured by a gel permeation chromatography method (GPC) using polystyrene as a standard substance and, as a result, a molecular weight was 1.8×10000.

In addition, from titration using sodium hydroxide, an acid value per solid matter was 115 mgKOH/g.

Synthesis Examples C-2 to C-12

According to the same manner as that of the Synthesis Example C-1 except that the chain transfer agent used, and the monomer and an amount of the monomer were changed as shown in the following Table 30 and, further, an amount of AIBN and a re-precipitating method were appropriately changed in a synthesis method of the Synthesis Examples C-2 to C-12, specific polymer compounds C-2 to C-12 were synthesized.

A weight average molecular weight and an acid value of the resulting specific polymer compounds C-2 to C-12 are also described in the following Table 30.

TABLE 30

| Synthesis Example | Chain transfer agent | Monomer | | Acid value (mgKOH/g) | Weight average molecular weight |
|---|---|---|---|---|---|
| C-1 | B-1 solution 46.80 parts | MMA 14 parts | MAA 6 parts | 115 | 18,000 |
| C-2 | B-2 solution 46.80 parts | MMA 14 parts | MAA 6 parts | 113 | 15,000 |
| C-3 | B-3 solution 46.80 parts | MMA 14 parts | MAA 6 parts | 114 | 19,000 |
| C-4 | B-5 solution 46.80 parts | MMA 14 parts | MAA 6 parts | 116 | 20,000 |
| C-5 | B-6 solution 46.80 parts | MMA 14 parts | MAA 6 parts | 114 | 17,000 |
| C-6 | B-7 solution 46.80 parts | MMA 14 parts | MAA 6 parts | 115 | 16,000 |
| C-7 | B-8 solution 46.80 parts | MMA 14 parts | MAA 6 parts | 119 | 16,000 |
| C-8 | B-11 solution 46.80 parts | MMA 14 parts | MAA 6 parts | 118 | 17,000 |
| C-9 | B-6 solution 46.80 parts | MMA 18 parts | MAA 2 parts | 38 | 16,000 |
| C-10 | B-6 solution 46.80 parts | MMA 8 parts | MAA 12 parts | 231 | 17,000 |
| C-11 | B-1 solution 46.80 parts | MMA 14 parts | MAA 6 parts | 114 | 5,000 |
| C-12 | B-1 solution 46.80 parts | MMA 14 parts | MAA 6 parts | 115 | 40,000 |

MMA: Methyl methacrylate

MAA: Methacrylic Acid

Structures of specific polymer compounds C-2 to C-12 obtained by the Synthesis Examples C-1 to C-12 are shown below.

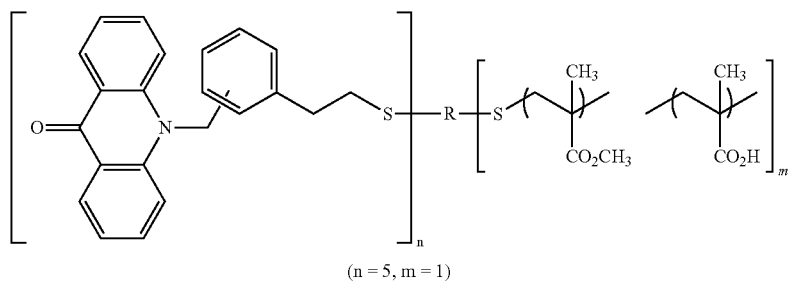
(n = 5, m = 1)
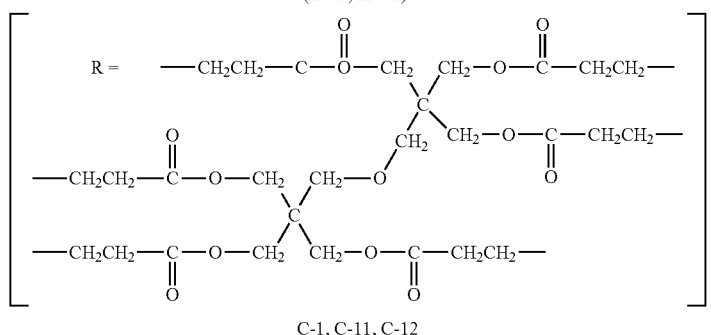
C-1, C-11, C-12
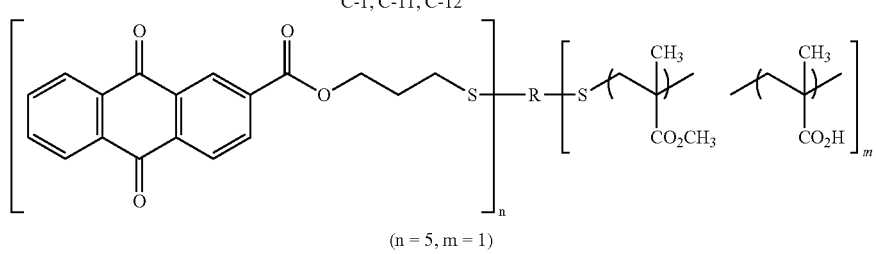
(n = 5, m = 1)
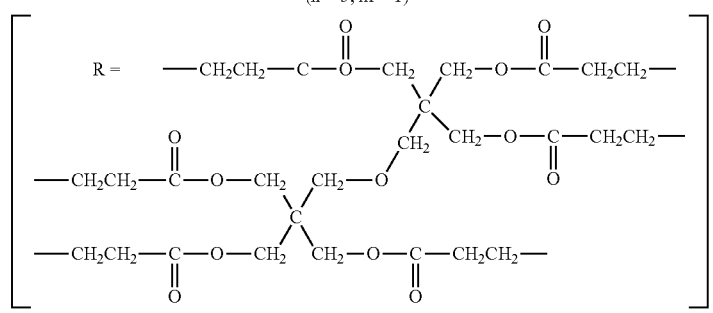
C-2
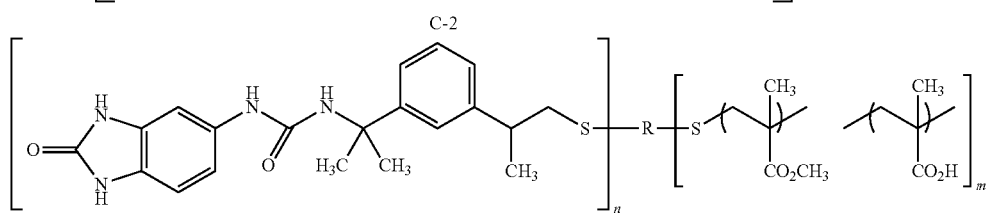
(n = 5, m = 1)
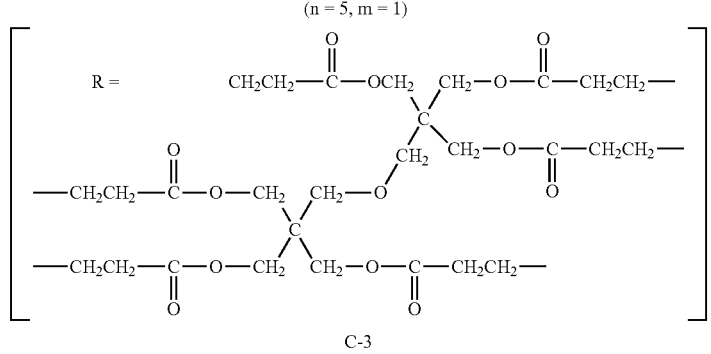
C-3

-continued
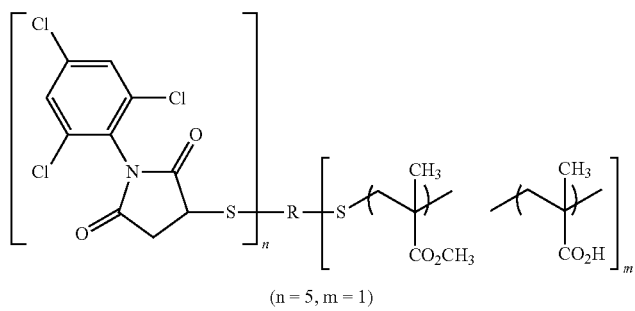
(n = 5, m = 1)
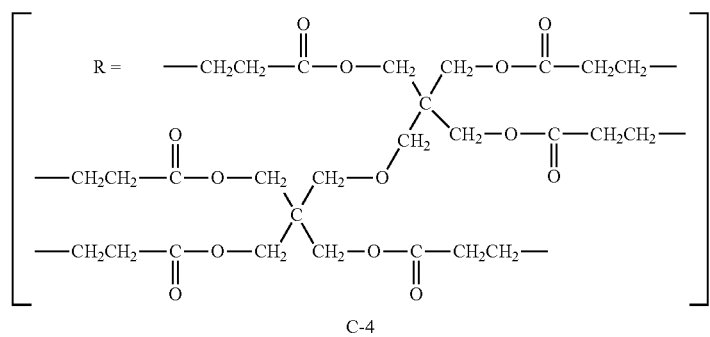
C-4
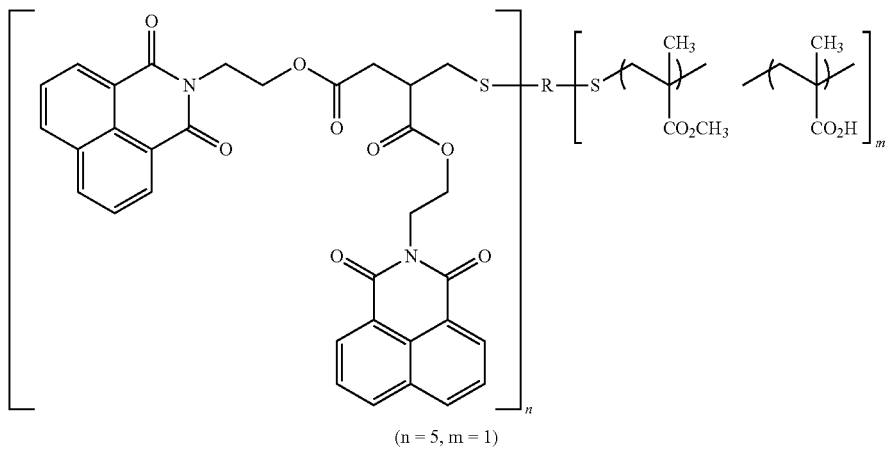
(n = 5, m = 1)
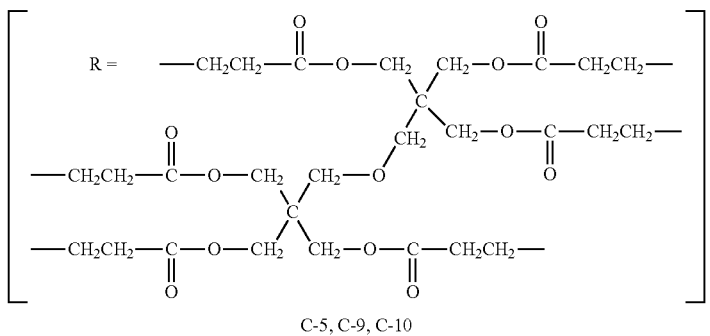
C-5, C-9, C-10
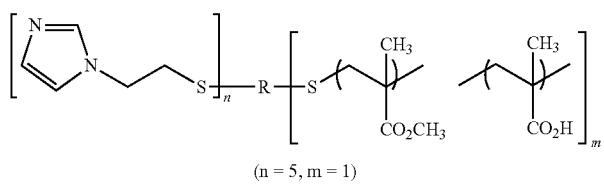
(n = 5, m = 1)

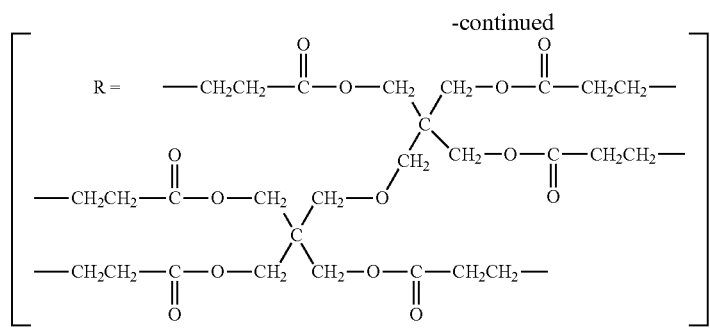

C-6

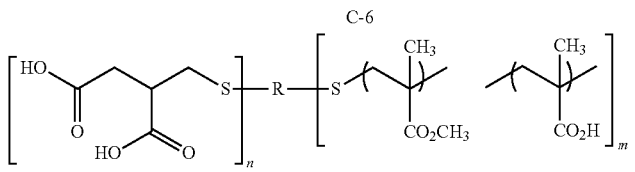

(n = 5, m = 1)

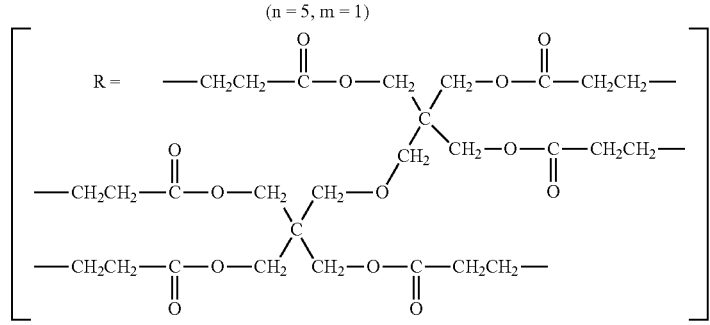

C-7

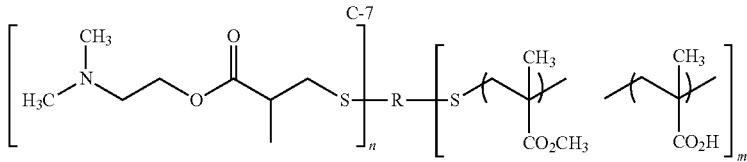

(n = 5, m = 1)

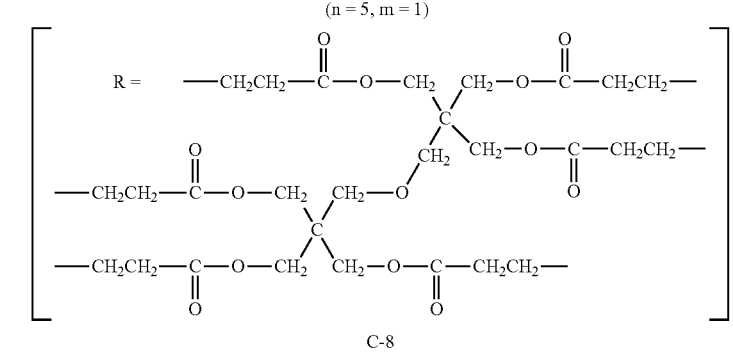

C-8

Examples 1b-1 to 1b-35

Comparative Examples 1b-1 to 1b-22

Into a stainless 1 gallon kneader (manufactured by INOUE MANUFACTURING CO., LTD.) were placed 50 g of each of the pigments described in the following Table 31 to Table 36, 500 g of sodium chloride, 25 g of a solution (solid matter 30 mass %) of specific polymer compounds C-1 to C-12 described in the following Table 31 to Table 36, and 100 g of diethylene glycol, and the mixture was kneaded for 9 hours. Then, this mixture was placed into an about 3 liter of water, and this was stirred with a high speed mixer for about 1 hour, filtered, washed with water to remove sodium chloride and the solvent, and dried to obtained a processed pigment covered with the specific polymer compound (Examples 1b-1 to 1b-35).

In Comparative Examples 1B-1 to 1B-22, according to the same manner as that described above except that the specific polymer compound was replaced with one of comparative compounds P-1B to P-4, or the specific polymer compound was not used, a processed pigment was obtained.

(Measurement of Average Primary Particle Diameter of Processed Pigment)

An average primary particle diameter of the resulting processed-pigment was obtained by observation with a transmission-type electron microscope (TEM).

(Evaluation of Covering Degree of Processed Pigment)

Into 100 mL of 1-methoxy-2-propanol was placed 10 g of the resulting processed pigment, and this was shaken with a shaker at room temperature for 3 hours. Thereafter, the pigment was settled with a centrifuge at 80,000 rpm over 8 hours. A solid matter of the supernatant part was obtained by a drying method. A mass of the polymer compound adsorbed onto the pigment was obtained, and a release amount (mass %) was calculated from a ratio relative to a mass of the polymer compound used in salt milling treatment, a release amount (mass %) was calculated. As the release amount is smaller, it is meant that a covering degree onto the pigment is higher.

TABLE 31

| | Processed pigment No. | Pigment | Polymer compound | Average primary particle diameter of processed pigment (nm) | Release amount (mass %) |
|---|---|---|---|---|---|
| Example 1b-1 | 3 R-1 | PR254 | C-1 | 18 | 6 |
| Example 1b-2 | 3 R-2 | PR254 | C-2 | 18 | 5 |
| Example 1b-3 | 3 R-3 | PR254 | C-3 | 18 | 12 |
| Example 1b-4 | 3 R-4 | PR254 | C-4 | 18 | 11 |
| Example 1b-5 | 3 R-5 | PR254 | C-5 | 18 | 2 |
| Example 1b-6 | 3 R-6 | PR254 | C-6 | 18 | 10 |
| Example 1b-7 | 3 R-7 | PR254 | C-7 | 18 | 8 |
| Example 1b-8 | 3 R-8 | PR254 | C-8 | 18 | 8 |
| Example 1b-9 | 3 R-9 | PR254 | C-9 | 18 | 5 |
| Example 1b-10 | 3 R-10 | PR254 | C-10 | 18 | 2 |
| Example 1b-11 | 3 R-11 | PR254 | C-11 | 18 | 5 |
| Example 1b-12 | 3 R-12 | PR254 | C-12 | 18 | 2 |
| Comparative example 1b-1 | 3 R-13 | PR254 | P-1B | 18 | 36 |
| Comparative example 1b-2 | 3 R-14 | PR254 | P-2 | 18 | 38 |
| Comparative example 1b-3 | 3 R-15 | PR254 | P-3 | 18 | 69 |
| Comparative example 1b-4 | 3 R-16 | PR254 | None | 18 | — |

TABLE 32

| | Processed pigment No. | Pigment | Polymer compound | Average primary particle diameter of processed pigment (nm) | Release amount (mass %) |
|---|---|---|---|---|---|
| Example 1b-13 | 3 L-1 | PR177 | C-1 | 16 | 6 |
| Example 1b-14 | 3 L-2 | PR177 | C-2 | 16 | 5 |
| Example 1b-15 | 3 L-3 | PR177 | C-3 | 16 | 3 |
| Comparative example 1b-5 | 3 L-4 | PR177 | P-4 | 16 | 39 |
| Comparative example 1b-6 | 3 L-5 | PR177 | P-2 | 16 | 46 |
| Comparative example 1b-7 | 3 L-6 | PR177 | P-3 | 16 | 68 |
| Comparative example 1b-8 | 3 L-7 | PR177 | None | 16 | — |

TABLE 33

| | Processed pigment No. | Pigment | Polymer compound | Average primary particle diameter of processed pigment (nm) | Release amount (mass %) |
|---|---|---|---|---|---|
| Example 1b-16 | 3 G-1 | PG36 | C-1 | 16 | 4 |
| Example 1b-17 | 3 G-2 | PG36 | C-2 | 16 | 6 |
| Example 1b-18 | 3 G-3 | PG36 | C-3 | 16 | 5 |
| Example 1b-19 | 3 G-4 | PG36 | C-4 | 16 | 11 |
| Example 1b-20 | 3 G-5 | PG36 | C-5 | 16 | 2 |
| Example 1b-21 | 3 G-6 | PG36 | C-6 | 16 | 13 |
| Example 1b-22 | 3 G-7 | PG36 | C-7 | 16 | 10 |
| Example 1b-23 | 3 G-8 | PG36 | C-8 | 16 | 14 |
| Comparative example 1b-9 | 3 G-15 | PG36 | P-1 | 16 | 38 |
| Comparative example 1b-10 | 3 G-16 | PG36 | P-2 | 16 | 43 |
| Comparative example 1b-11 | 3 G-18 | PG36 | None | 16 | — |

TABLE 34

| Processed pigment No. | Pigment | Polymer compound | Average primary particle diameter of processed pigment (nm) | Release amount (mass %) |
|---|---|---|---|---|
| Example 1b-24 | 3 Y-1 | PY150 | C-2 | 20 | 8 |
| Example 1b-25 | 3 Y-2 | PY150 | C-3 | 20 | 5 |
| Example 1b-26 | 3 Y-3 | PY150 | C-4 | 20 | 14 |
| Comparative example 1b-12 | 3 Y-5 | PY150 | P-4 | 20 | 38 |
| Comparative example 1b-13 | 3 Y-6 | PY150 | P-2 | 20 | 48 |
| Comparative example 1b-14 | 3 Y-7 | PY150 | P-3 | 20 | 70 |
| Comparative example 1b-15 | 3 Y-8 | PY150 | None | 20 | — |

TABLE 35

| Processed pigment No. | Pigment | Polymer compound | Average primary particle diameter of processed pigment (nm) | Release amount (mass %) |
|---|---|---|---|---|
| Example 1b-27 | 3 B-1 | PB15:6 | C-1 | 15 | 6 |
| Example 1b-28 | 3 B-2 | PB15:6 | C-2 | 15 | 9 |
| Example 1b-29 | 3 B-3 | PB15:6 | C-3 | 15 | 5 |
| Example 1b-30 | 3 B-4 | PB15:6 | C-4 | 15 | 12 |
| Example 1b-31 | 3 B-5 | PB15:6 | C-5 | 15 | 2 |
| Example 1b-32 | 3 B-6 | PB15:6 | C-6 | 15 | 15 |
| Example 1b-33 | 3 B-7 | PB15:6 | C-7 | 15 | 10 |
| Example 1b-34 | 3 B-8 | PB15:6 | C-8 | 15 | 11 |
| Comparative example 1b-16 | 3 B-9 | PB15:6 | P-2 | 15 | 38 |
| Comparative example 1b-17 | 3 B-10 | PB15:6 | P-3 | 15 | 69 |
| Comparative example 1b-18 | 3 B-11 | PB15:6 | None | 15 | — |

TABLE 36

| Processed pigment No. | Pigment | Polymer compound | Average primary particle diameter of processed pigment (nm) | Release amount (mass %) |
|---|---|---|---|---|
| Example 1b-35 | 3 V-1 | PV23 | C-2 | 20 | 8 |
| Example 1b-36 | 3 V-2 | PV23 | C-3 | 20 | 2 |
| Example 1b-37 | 3 V-3 | PV23 | C-4 | 20 | 15 |
| Comparative example 1b-19 | 3 V-4 | PV23 | P-1B | 20 | 36 |
| Comparative example 1b-20 | 3 V-5 | PV23 | P-2 | 20 | 39 |
| Comparative example 1b-21 | 3 V-6 | PV23 | P-3 | 20 | 65 |
| Comparative example 1b-22 | 3 V-7 | PV23 | None | 20 | — |

Details of the pigments, and polymer compounds C-1 to C-12, and P-1B to P-4 described in Table 31 to Table 36 are as follows.

—Pigment—

PR254; C.I. Pigment Red 254

PR177; C.I. Pigment Red 177

PG36; C.I. Pigment Green 36

PY150; C.I. Pigment Yellow 150

PB15:6; C.I. Pigment Blue 15:6

PV23; C.I. Pigment Violet 23

—Specific Polymer Compound or Comparative Compound—

Polymer compounds C-1 to C-12 are specific polymer compounds C-1 to C-12 synthesized in the Synthesis Examples C-1 to C-12.

In addition, polymer compounds P-1B to P-4 are comparative compounds different from the specific polymer compound, and details are as follows.

P-1B: Copolymer of methyl methacrylate/methacrylic acid=85/15 mass % (weight average molecular weight 2.4× 10000, acid value 98 mgKOH/g)

P-2: Hydrogenated rosin ester (trade name: Ester Gum HP, manufactured by Arakawa Chemical Industries, Ltd.)

P-3: Trimethylolpropane triacrylate
P-4: Copolymer of cyclohexyl methacrylate/methacrylic acid=85/15 mass % (weight average molecular weight 20000, acid value 98 mgKOH/g)

Examples 2b-1 to 2b-8, and Comparative Examples 2b-1 to 2b-5

Preparation of Pigment-Dispersed Composition

Components of the following composition (1C) containing the processed pigment described in Table 31 were mixed, and stirred at a rotation number of 3,000 r.p.m. for 3 hours using a homogenizer to prepare a mixed solution containing the pigment.

| [Composition (1C)] | |
|---|---|
| Processed pigment (described in the following Table 37) (In Comparative Example 2b-4 and Comparative Example 2b-5, an amount of the processed pigment was 82.7 parts) | 95 parts |
| Pigment derivative A of the above structure | 5 parts |
| Pigment dispersant (described in the following Table 37) (30% 1-methoxy-2-propyl acetate solution) | amount described in Table 37 |
| 1-Methoxy-2-propyl acetate | 750 parts |

Subsequently, the mixed solution obtained as described above was further dispersing-treated for 6 hours with a beads dispersing machine (trade name: Dispermat, manufactured by GETZMANN) using 0.3 mmφ zirconia beads and, thereafter, further, dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition.

<Evaluation of Pigment-Dispersed Composition>

Regarding the resulting pigment-dispersed composition, (1) a viscosity, (2) a contrast, and (3) precipitability were assessed as follows. These evaluation results are summarized in Table 37.

(1) Measurement and Evaluation of Viscosity

Regarding the resulting pigment-dispersed composition, using an E-type viscometer (manufactured by Tokyo Keiki Kogyo Co., Ltd.), a viscosity η1 of the pigment-dispersed composition immediately after dispersing, and a viscosity η2 of the pigment-dispersed composition after one week had passed after dispersing (at room temperature) were measured under the condition of 20 rpm and 30° C., and a degree of increase in a viscosity was assessed.

Herein, a low viscosity indicates that increase in a viscosity due to the dispersant is suppressed, and dispersibility and dispersion stability of the pigment are better.

(2) Measurement and Evaluation of Contrast

The resulting pigment-dispersed composition was coated on a glass substrate, and a sample was prepared so that a thickness of a coated film after drying became 1 μm. The sample substrate was placed between two polarizing plates, a luminance when polarizing plates were parallel and a luminance when polarizing plates were orthogonal were measured with a color luminometer (trade name: BM-5, manufactured by TOPCON CORPORATION), and a contrast was obtained by luminance at parallel/luminance at orthogonal.

Herein, a higher contrast indicates that since the pigment is uniformly dispersed in the state where it is highly miniaturized, a transmittance, that is, a coloring force is high.

(3) Evaluation of Precipitability

The resulting pigment-dispersed composition was coated on a 100 mm×100 mm glass substrate (trade name: 1737, manufactured by Corning) so that a film thickness became 2.0 μm, and this was dried with an oven at 90° C. for 60 seconds. Thereafter, the coated film was subjected to heat treatment with an oven at 230° C. for 30 minutes (post-baking), and the presence or the absence of a precipitate (pigment) on the cured film was confirmed with an optical microscope (manufacture by Olympus) at magnification of 100. The same post-baking treatment was repeated, and the presence or the absence of a precipitate on the cured film was confirmed every time.

An evaluation index is as follows. Herein, a larger index figure indicates that precipitation is difficult, and transparency of the colored cured film is better.

—Evaluation Index—
4: Generation of precipitate at fourth post-baking
3: Generation of precipitate at third post-baking
2: Generation of precipitate at second post-baking
1: Generation of precipitate at first post-baking

TABLE 37

| | Pigment-dispersed composition | | Evaluation results | | | |
|---|---|---|---|---|---|---|
| | Processed pigment | Pigment dispersant (content) | Initial viscosity η1 (mPa·s) | Viscosity with time η2 (mPa·s) | Contrast | Precipitability |
| Example 2b-1 | 3 R-1 | 3D-1 120 parts | — | 10 | 11 | 2300 | 4 |
| Example 2b-2 | 3 R-2 | 3D-1 120 parts | — | 12 | 15 | 2100 | 3 |
| Example 2b-3 | 3 R-3 | 3D-1 120 parts | — | 10 | 11 | 2300 | 4 |
| Example 2b-4 | 3 R-4 | 3D-1 120 parts | — | 15 | 18 | 2000 | 3 |
| Example 2b-5 | 3 R-5 | 3D-1 120 parts | — | 10 | 11 | 2400 | 4 |
| Example 2b-6 | 3 R-6 | 3D-1 120 parts | — | 15 | 18 | 1900 | 3 |
| Example 2b-7 | 3 R-7 | 3D-1 120 parts | — | 14 | 17 | 2000 | 3 |
| Example 2b-8 | 3 R-8 | 3D-1 120 parts | — | 14 | 17 | 2000 | 3 |

TABLE 37-continued

|  | Pigment-dispersed composition | | | Evaluation results | | | |
| --- | --- | --- | --- | --- | --- | --- | --- |
|  | Processed pigment | Pigment dispersant (content) |  | Initial viscosity η1 (mPa·s) | Viscosity with time η2 (mPa·s) | Contrast | Precipitability |
| Comparative example 2b-1 | 3 R-13 | 3D-1 120 parts | — | 20 | 30 | 1000 | 2 |
| Comparative example 2b-2 | 3 R-14 | 3D-1 120 parts | — | 25 | 40 | 900 | 1 |
| Comparative example 2b-3 | 3 R-15 | 3D-1 120 parts | — | 30 | 50 | 800 | 1 |
| Comparative example 2b-4 | 3 R-16 | 3D-1 120 parts | — | 40 | 62 | 500 | 1 |
| Comparative example 2b-5 | 3 R-16 | 3D-1 120 parts | C-1 57 parts | 35 | 52 | 700 | 1 |

From results of Table 37, it is seen that in pigment-dispersed compositions of Examples 2b-1 to 2b-8 using the processed pigment covered with the specific polymer compound, a contrast is higher, precipitation due to post-baking is suppressed and, further, increase in a viscosity with time is small as compared with Comparative Examples.

Examples 2b-9 to 2b-19, and Comparative Examples 2b-6 to 2b-13

Preparation of Pigment-Dispersed Composition

Components of the following composition (2C) containing each of the processed pigments described in Table 33 and Table 35 were mixed, and stirred at a rotation number of 3,000 r.p.m. for 3 hours using a homogenizer to prepare a mixed solution containing the pigment.

| [Composition (2C)] | |
| --- | --- |
| Processed pigment (described in the following Table 38) (provided that, in Comparative Example 2b-8, Comparative Example 2b-9, Comparative Example 2b-12, and Comparative Example 2b-13, an amount of the processed pigment was 82.7 parts) | 120 parts |
| Pigment dispersant (described in the following Table 38) (30% 1-methoxy-2-propyl acetate solution) | amount described in Table 38 |
| 1-Methoxy-2-propyl acetate | 730 parts |

Subsequently, the mixed solution obtained as described above was further dispersing-treated for 6 hours with a beads dispersing machine (trade name: Dispermat, manufactured by GETZMANN) using 0.3 mmφ zirconia beads and, thereafter, further dispersing-treated under a pressure of 2,000 kg/cm$^3$ and a flow rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition.

<Evaluation of Pigment-Dispersed Composition>

Regarding the resulting pigment-dispersed composition, according to the same manner as that of Example 2b-1, (1) a viscosity, (2) a contrast, and (3) precipitability were assessed. Evaluation results are summarized in Table 38.

TABLE 38

|  | Pigment-dispersed composition | | Evaluation results | | | |
| --- | --- | --- | --- | --- | --- | --- |
|  | Processed pigment | Pigment dispersant (content) | Initial viscosity η1 (mPa·s) | Viscosity with time η2 (mPa·s) | Contrast | Precipitability |
| Example 2b-9 | 3 G-1 | 3D-2 150 parts | 25 | 27 | 8100 | 4 |
| Example 2b-10 | 3 G-2 | 3D-2 150 parts | 28 | 30 | 7700 | 4 |
| Example 2b-11 | 3 G-3 | 3D-2 150 parts | 25 | 27 | 8000 | 4 |
| Example 2b-12 | 3 G-4 | 3D-2 150 parts | 30 | 34 | 7600 | 3 |
| Example 2b-13 | 3 G-5 | 3D-2 150 parts | 24 | 26 | 8200 | 4 |
| Example 2b-14 | 3 G-6 | 3D-2 150 parts | 30 | 36 | 7600 | 3 |
| Example 2b-15 | 3 B-1 | 3D-2 100 parts | 13 | 14 | 2600 | 4 |
| Example 2b-16 | 3 B-2 | 3D-2 100 parts | 15 | 17 | 2400 | 4 |
| Example 2b-17 | 3 B-3 | 3D-2 100 parts | 13 | 14 | 2600 | 4 |

TABLE 38-continued

| | Pigment-dispersed composition | | | Evaluation results | | | |
|---|---|---|---|---|---|---|---|
| | Processed pigment | Pigment dispersant (content) | | Initial viscosity η1 (mPa·s) | Viscosity with time η2 (mPa·s) | Contrast | Precipitability |
| Example 2b-18 | 3 B-4 | 3D-2 100 parts | — | 20 | 22 | 2100 | 3 |
| Example 2b-19 | 3 B-5 | 3D-2 100 parts | — | 13 | 14 | 2700 | 4 |
| Comparative example 2b-6 | 3 G-9 | 3D-2 150 parts | — | 50 | 61 | 5100 | 2 |
| Comparative example 2b-7 | 3 G-10 | 3D-2 150 parts | — | 58 | 74 | 4500 | 1 |
| Comparative example 2b-8 | 3 G-11 | 3D-2 150 parts | — | 70 | 89 | 3000 | 1 |
| Comparative example 2b-9 | 3 G-11 | 3D-2 150 parts | C-5 63 parts | 61 | 71 | 3200 | 1 |
| Comparative example 2b-10 | 3 B-9 | 3D-2 100 parts | — | 30 | 38 | 1000 | 1 |
| Comparative example 2b-11 | 3 B-10 | 3D-2 100 parts | — | 51 | 64 | 900 | 1 |
| Comparative example 2b-12 | 3 B-11 | 3D-2 100 parts | — | 62 | 84 | 800 | 1 |
| Comparative example 2b-13 | 3 B-11 | 3D-2 100 parts | C-3 63 parts | 54 | 74 | 900 | 1 |

In Table 38, in context of a hue, Examples 2b-9 to 2b-14 and Comparative Examples 2b-6 to 2b-9 are compared, and Examples 2b-15 to 2b-19 and Comparative Examples 2b-10 to 2b-13 are compared.

From results of Table 38, it is seen that in the pigment-dispersed composition of Examples using the processed pigment covered with the specific polymer composition, a contrast is higher, precipitation due to post-baking is suppressed and, further, increase in a viscosity with time is smaller as compared with Comparative Examples.

Examples 2b-20 to 2b-21, and Comparative Examples 2b-14 to 2b-16

Preparation of Pigment-Dispersed Composition

Components of the following composition (3C) containing one of the processed pigments described in Table 31, Table 33 and Table 35 were mixed, and stirred at a rotation number of 3,000 r.p.m. for 3 hours using a homogenizer to prepare a mixed solution containing the pigment.

[Composition (3C)]

| | |
|---|---|
| Processed pigment (described in the following Table 39) | amount described in Table 39 |

[Composition (3C)]

| | |
|---|---|
| Pigment dispersant (described in the following Table 39) (30% 1-methoxy-2-propyl acetate solution) | amount described in Table 39 |
| 1-Methoxy-2-propyl acetate | 750 parts |

Subsequently, the mixed solution obtained as described above was further dispersing-treated for 6 hours with a beads dispersing machine (trade name: Dispermat, manufactured by GETZMANN) using 0.3 mmφ zirconia beads and, thereafter, further, dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition.

<Evaluation of Pigment-Dispersed Composition>

Regarding the resulting pigment-dispersed compositions, according to the same manner as that of Examples 2b-1, (1) a viscosity, (2) a contrast, and (3) precipitability were assessed. Evaluation results are summarized in Table 39.

TABLE 39

| | Pigment-dispersed composition | | Evaluation results | | | |
|---|---|---|---|---|---|---|
| | Processed pigment | Pigment dispersant (content) | Initial viscosity η1 (mPa·s) | Viscosity with time η2 (mPa·s) | Contrast | Precipitability |
| Example 2b-20 | 3 R-3 100 parts | None | 16 | 17 | 2000 | 4 |
| Comparative example 2b-14 | 3 R-16 82.6 parts | C-3 12.4 parts | 30 | 80 | 1200 | 2 |

TABLE 39-continued

| | Pigment-dispersed composition | | Evaluation results | | | |
|---|---|---|---|---|---|---|
| | Processed pigment | Pigment dispersant (content) | Initial viscosity $\eta 1$ (mPa·s) | Viscosity with time $\eta 2$ (mPa·s) | Contrast | Precipitability |
| Example 2b-21 | 3 G-1 100 parts | None | 35 | 36 | 7000 | 4 |
| Comparative example 2b-15 | 3 G-11 82.6 parts | C-1 12.4 parts | 50 | 95 | 4500 | 2 |
| Example 2b-22 | 3 B-1 100 parts | None | 18 | 18 | 2000 | 4 |
| Comparative example 2b-16 | 3 B-11 82.6 parts | C-7 12.4 parts | 40 | 85 | 1100 | 2 |

In Table 39, in context of a hue, Example 2b-20 and Comparative Example 2b-14 are compared, Example 2b-21 and Comparative Example 2b-15 are compared, and Example 2b-22 and Comparative Example 2b-16 are compared.

From results of Table 39, it is seen that in the pigment-dispersed composition of Examples using the processed pigment covered with the specific polymer compound, a contrast is higher, precipitation due to post-baking is suppressed, further, increase in a viscosity with time is smaller as compared with Comparative Examples in which the specific polymer compound was added as a pigment dispersant when the pigment-dispersed composition is prepared.

Examples 3b-1 to 3b-16, and Comparative Examples 3b-1 to 3b-4

Preparation of Pigment-Dispersed Composition

Components of the following composition (4C) containing one of the processed pigments described in Table 31, Table 33, and Table 35 were mixed, and stirred at a rotation number of 3,000 r.p.m. for 3 hours using a homogenizer.

| [Composition (4C)] | |
|---|---|
| Processed pigment (described in the following Table 40) | 130 parts |
| Pigment dispersant (described in the following Table 40) (30% 1-methoxy-2-propyl acetate solution) | 280 parts |
| 1-Methoxy-2-propyl acetate | 750 parts |

Subsequently, the mixed solution obtained as described above was further dispersing-treated for 6 hours with a beads dispersing machine (trade name: Dispermat, manufactured by GETZMANN) using 0.3 mmϕ zirconia beads, and, thereafter, further, dispersing-treated under a pressure of 2,000 kg/cm³ and a flow rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition.

<Preparation of Colored Photosensitive Composition>

Using the resulting pigment-dispersed composition, colored photosensitive compositions a-1 to a-20 of the following composition (A2) were prepared.

| [Composition (A2)] | |
|---|---|
| Pigment-dispersed composition (described in the following Table 40) | 2000 parts |
| Dipentaerythritol hexaacrylate (photopolymerizable compound) | 90 parts |
| 4-[o-Bromo-p-N,N-di(ethoxycarbonyl)aminophenyl]-2,6-di(trichloromethyl)-s-triazine (photopolymerization initiator) | 20 parts |
| Propylene glycol monomethyl ether acetate solution (solid matter 30%) of benzyl methacrylate/methacrylic acid (=75/25 [mass ratio]) copolymer (weight average molecular weight: 13,000) (alkali-soluble resin) | 300 parts |
| 1-Methoxy-2-propyl acetate (solvent) | 390 parts |

<Preparation of Color Filter Using Colored Photosensitive Composition>

The resulting colored photosensitive composition (color resist solution) was coated on a 100 mm×100 mm glass substrate (trade name: 1737, manufactured by Corning) so that a x value as an index of a color concentration became 0.650 in Examples 3b-1 to 3b-12 and Comparative Example 3b-3, a y value as an index of a color concentration became 0.60 in Examples 3b-13 to 3b-14 and Comparative Examples 3b-1 to 3b-2 and, further, a y value as an index of a color concentration became 0.10 in Examples 3b-15 to 3b-16 and Comparative Example 3b-4, and this was dried with an oven at 90° C. for 60 seconds (pre-baking). Thereafter, a whole surface of the coated film was exposed to light at 200 mJ/cm² (illuminance 20 mw/cm²), and the coated film after light exposure was covered with a 1% aqueous solution of an alkali developer CDK-1 (manufactured by Fuji Electronic Materials Co., Ltd.), and allowed to stand for 60 seconds. After allowing to stand, pure water was sprayed in a shower like to wash out the developer. Then, the coated film which had been subjected to light exposure and development as described above was heat-treated with an oven at 220° C. for 1 hour (post-baking), and a colored pattern for a color filter was formed on a glass substrate to obtain a color filter.

<Evaluation of Color Filter>

Regarding the manufactured color filter, (1) a contrast, (2) solubility in an alkali developer, and (3) precipitability were assessed as follows. These evaluation results are summarized in Table 40.

(1) Contrast

A polarizing plate was placed on the colored pattern of the resulting color filter, the colored resin film was held, a luminance when polarizing plates are parallel and a luminance when polarizing plates are orthogonal were measured with a color luminance meter (trade name: BM-5, manufactured by TOPCON CORPORATION), and a value obtained by dividing a luminance at parallel by a luminance at orthogonal (=luminance at parallel/luminance at orthogonal) was used as an index for assessing a contrast.

Herein, a larger value indicates a higher contrast.

(2) Solubility in Alkali Developer

First, 100 g of a 10% aqueous solution of an alkali developer (trade name: CDK-1, manufactured by Fuji Electronic Materials Co., Ltd.) was weighed into a 150 ml beaker.

Then, the colored photosensitive composition obtained by the aforementioned method was coated on a 100 mm×100 mm glass substrate (trade name: 1737, manufactured by Corning) so that a film thickness became 2.5 μm, and this was dried with an oven at 90° C. for 60 seconds (pre-baking). The resulting glass substrate with the cured film was cut into 25 mm×100 mm, two of cut glasses were piled with a coated surface on an outer side, immersion in the alkali developer which had been prepared in advance, and upper and lower motion of pulling up was repeated twenty times, and solubility of an uncured film, and the presence or the absence of a suspension in the alkali developer were determined visually.

An evaluation index is as follows. Herein, as an index figure is larger, alkali solubility is better.

—Evaluation Index—

5: Complete dissolution of an uncured film at 1 to 10 times upper and lower motions, and no suspension in an alkali developer
4: Complete dissolution of an uncured film at 11 to 20 times upper and lower motions, and no suspension in an alkali developer
3: Complete dissolution of an uncured film at 1 to 10 times upper and lower motions, but the presence of a suspension in an alkali developer
2: Complete dissolution of an uncured film at 11 to 20 times upper and lower motions, but the presence of a suspension in an alkali developer
1: Undissolution of an uncured film even at 20 times upper and lower motions.

(3) Evaluation of Precipitability

The photosensitive composition obtained by the aforementioned method was coated on a 100 mm×100 mm glass substrate (trade name: 1737, manufactured by Corning) so that a film thickness became 2.0 μm, and this was dried with an oven at 90° C. for 60 seconds (pre-baking). Thereafter, this was exposed to light at 100 mJ/cm$^2$ (illuminance 20 mW/cm$^2$) with a mask having a line width of 20 μm, and developed using a 1% aqueous solution of an alkali developer (trade name: CDK-1, manufactured by Fuji Electronic Materials Co., Ltd.) at 25° C.

As described above, the coated film which had been subjected to light exposure and developing treatment was heat-treated with an oven at 230° C. for 30 minutes (post-baking), and the presence or the absence of a precipitate (pigment) on the cured film was confirmed with an optical microscope (manufactured by Olympus). Thereafter, the same post-baking treatment was repeated three times and the presence or the absence of a precipitate on the cured film was confirmed every time.

An evaluation index is as follows. Herein, a larger index figure indicates that precipitation is difficult and transparency of a colored film is better.

—Evaluation Index—

4: Generation of precipitate at fourth post-baking
3: Generation of precipitate at third post-baking
2: Generation of precipitate at second post-baking
1: Generation of precipitate at first post-baking

TABLE 40

| | Colored photosensitive composition | Pigment-dispersed composition | | | Evaluation results of color filter | | |
|---|---|---|---|---|---|---|---|
| | | No. | Processed pigment | Pigment dispersant | Contrast | Solubility | Precipitability |
| Example 3b-1 | a-1 | 3DR-1 | 3R-1 | 3 D-2 | 2800 | 5 | 4 |
| Example 3b-2 | a-2 | 3DR-2 | 3R-2 | 3 D-2 | 2600 | 5 | 4 |
| Example 3b-3 | a-3 | 3DR-3 | 3R-3 | 3 D-2 | 2800 | 5 | 4 |
| Example 3b-4 | a-4 | 3DR-4 | 3R-4 | 3 D-2 | 2500 | 5 | 3 |
| Example 3b-5 | a-5 | 3DR-5 | 3R-5 | 3 D-2 | 3000 | 5 | 4 |
| Example 3b-6 | a-6 | 3DR-6 | 3R-6 | 3 D-2 | 2500 | 5 | 3 |
| Example 3b-7 | a-7 | 3DR-7 | 3R-7 | 3 D-2 | 2500 | 5 | 3 |
| Example 3b-8 | a-8 | 3DR-8 | 3R-8 | 3 D-2 | 2400 | 5 | 3 |
| Example 3b-9 | a-9 | 3DR-9 | 3R-9 | 3 D-2 | 2700 | 4 | 3 |
| Example 3b-10 | a-10 | 3DR-10 | 3R-10 | 3 D-2 | 2700 | 5 | 3 |
| Example 3b-11 | a-11 | 3DR-11 | 3R-11 | 3 D-2 | 2600 | 5 | 3 |
| Example 3b-12 | a-12 | 3DR-12 | 3R-12 | 3 D-2 | 2800 | 4 | 4 |
| Example 3b-13 | a-13 | 3DG-1 | 3G-5 | 3 D-1 | 8400 | 5 | 4 |
| Example 3b-14 | a-14 | 3DG-2 | 3G-8 | 3 D-1 | 8000 | 5 | 3 |
| Example 3b-15 | a-15 | 3DB-1 | 3B-3 | 3 D-4 | 2400 | 5 | 4 |
| Example 3b-16 | a-16 | 3DB-2 | 3B-7 | 3 D-4 | 2200 | 5 | 3 |
| Comparative example 3b-1 | a-17 | 3DG-3 | 3G-9 | 3 D-1 | 5600 | 3 | 1 |
| Comparative example 3b-2 | a-18 | 3DG-4 | 3G-10 | 3 D-1 | 4800 | 3 | 1 |
| Comparative example 3b-3 | a-19 | 3DR-13 | 3R-15 | 3 D-2 | 1200 | 2 | 1 |
| Comparative example 3b-4 | a-20 | 3DB-3 | 3B-9 | 3 D-4 | 1000 | 2 | 1 |

In Table 40, in context of a hue, Examples 3b-1 to 3b-12 and Comparative Example 3b-3 are compared, Examples 3b-13 and 3b-14 and Comparative Examples 3b-1 and 3b-2 are compared, and Examples 3b-15 and 3b-16 and Comparative Example 3b-4 are compared.

From results of Table 40, it is seen that in the color filter of Examples manufactured using the colored curing composition containing the processed pigment of the invention, a contrast is higher, solubility in an alkali developer is better, and precipitation due to post-baking is suppressed as compared with Comparative Examples.

Examples 3b-17 to 3b-25, and Comparative Examples 3b-5 to 3b-13

Preparation of Pigment-Dispersed Composition

Components of the following composition (5C) containing one of the processed pigments described in Table 32, Table 34 and Table 36 were mixed, and stirred at a rotation number of 3,000 r.p.m. for 3 hours using a homogenizer to prepare a mixed solution containing the pigment.

| [Composition (5C)] | |
|---|---|
| Processed pigment (described in the following Table 41) | 100 parts |
| Pigment dispersant 3D-1 (30% 1-methoxy-2-propyl acetate solution) | 280 parts |
| Pigment derivative B of the above structure | 20 parts |
| 1-Methoxy-2-propyl acetate | 750 parts |

Subsequently, the mixed solution obtained as described above was further dispersing-treated for 6 hours with a beads dispersing machine (trade name: Dispermat, manufactured by GETZMANN) using 0.3 mmϕ zirconia beads and, thereafter, further, dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E.). This dispersing treatment was repeated ten times to obtain a pigment-dispersed composition.

<Preparation of Colored Photosensitive Composition>

Using the resulting pigment-dispersed composition, colored photosensitive compositions b-1 to b-18 of the following composition (B2) were prepared.

| [Composition (B2)] | |
|---|---|
| Pigment-dispersed composition (described in the following Table 41) | 2000 parts |
| Dipentaerythritol hexaacrylate (photopolymerizable composition) | 70 parts |
| 4-[o-bromo-p-N,N-di(ethoxycarbonyl)aminophenyl]-2,6-di(trichloromethyl)-s-triazine (photopolymerization initiator) | 40 parts |
| Propylene glycol monomethyl ether acetate solution (solid matter 30%) of benzyl methacrylate/methacrylic acid (=75/25[mass ratio]) copolymer (weight average molecular weight: 10,000) (alkali-soluble resin) | 300 parts |
| 1-Methoxy-2-propyl acetate (solvent) | 390 parts |

<Manufacturing of Color Filter Using Colored Photosensitive Composition>

The resulting colored photosensitive composition (color resist solution) was coated on a 100 mm×100 mm glass substrate (trade name: 1737, manufactured by Corning) so that a x value as an index of a color concentration became 0.650 in Examples 3b-17 to 3b-19 and Comparative Examples 3b-5 to 3b-7, a y value as an index of a color concentration became 0.60 in Examples 3b-20 to 3b-22 and Comparative Examples 3b-8 to 3b-10 and, further, a y value as an index of a color concentration became 0.10 in Examples 3b-23 to 3b-25 and Comparative Examples 3b-11 to 3b-13, and this was dried with an oven at 90° C. for 60 seconds (pre-baking). Thereafter, a whole surface of the coated film was exposed to light at 200 mJ/cm$^2$ (illuminance 20 mW/cm$^2$), and the coated film after light exposure was covered with a 1% aqueous solution of an alkali developer CDK-1 (manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baling), and a colored pattern for a color filter was formed on a glass substrate to obtain a color filter.

<Evaluation of Color Filter>

Regarding the resulting color filter, according to the same manner as that of Example 3b-1, (1) a contrast and (2) solubility in an alkali developer were assessed.

Further, by the following method, (4) a voltage retainability rate was also assessed.

These evaluation results are summarized in Table 41.

(4) Voltage Retainability Rate

The photosensitive composition obtained by the aforementioned method was coated on a glass substrate with an ITO electrode (trade name: 1737, manufactured by Corning) so that the film thickness became 2.0 μm, and this was dried with an oven at 90° C. for 60 seconds (pre-baking). Thereafter, this was exposed to light at 100 mJ/cm$^2$ (illuminance 20 mW/cm$^2$) not through a mask, and developed at 25° C. using a 1% aqueous solution of an alkali developer (trade name: CDK-1, manufactured by Fuji Electronic Materials Co., Ltd.), and the coated film was heat-treated with an oven at 230° C. for 30 minutes (post-baking). Thereby, a glass substrate on which the cured film had been formed, was obtained.

Then, this glass substrate on which the cured film had been formed and a substrate on which an ITO electrode had been merely deposited into a predetermined shape were laminated with a sealing agent with 5 μm glass beads mixed therein, and a liquid crystal (trade name: MJ1711989, manufactured by Merck) was injected to manufacture a liquid crystal cell.

Then, the liquid crystal cell was placed in a constant temperature bath at 70° C. for 48 hours, and a voltage retainability rate of the liquid crystal cell was measured with a liquid crystal voltage retainability rate measuring system (trade name: VHR-1A-type, manufactured by TOYO Corporation).

The voltage retainability rate is a value of a voltage applied at liquid crystal cell potential difference/0 msec after 16.7 msec.

In addition, conditions upon measurement of this voltage retainability rate are as follows.

—Measurement Condition—

Distance between electrodes: 5 μm
Applied voltage pulse amplitude: 5 v
Applied voltage pulse frequency: 60 Hz
Applied voltage pulse width: 16.67 msec An evaluation index is as follows. Herein, it is seen that as an index figure is larger, a voltage retainability rate is higher, and better electric property is exhibited.

—Evaluation Index—

5: 90% or more
4: 85% or more and less than 90%
3: 80% or more and less than 85%
2: 75% or more and less than 80%
1: less than 75%

TABLE 41

| | Colored photosensitive composition | Pigment-dispersed composition No. | Processed pigment | Evaluation results of color filter | | |
|---|---|---|---|---|---|---|
| | | | | Contrast | Solubility | Voltage retainability rate |
| Example 3b-17 | b-1 | 3DL-1 | 3 L-1 | 3700 | 5 | 5 |
| Example 3b-18 | b-2 | 3DL-2 | 3 L-2 | 3500 | 5 | 4 |
| Example 3b-19 | b-3 | 3DL-3 | 3 L-3 | 3700 | 5 | 5 |
| Example 3b-20 | b-4 | 3DY-1 | 3 Y-1 | 5000 | 5 | 4 |
| Example 3b-21 | b-5 | 3DY-2 | 3 Y-2 | 5200 | 5 | 5 |
| Example 3b-22 | b-6 | 3DY-3 | 3 Y-3 | 4800 | 5 | 4 |
| Example 3b-23 | b-7 | 3DV-1 | 3 Y-4 | 1000 | 5 | 4 |
| Example 3b-24 | b-8 | 3DV-2 | 3 V-1 | 1200 | 5 | 5 |
| Example 3b-25 | b-9 | 3DV-3 | 3 V-2 | 900 | 5 | 4 |
| Comparative example 3b-5 | b-10 | 3DL-4 | 3 L-5 | 2000 | 2 | 1 |
| Comparative example 3b-6 | b-11 | 3DL-5 | 3 L-6 | 1900 | 1 | 1 |
| Comparative example 3b-7 | b-12 | 3DL-6 | 3 L-7 | 1500 | 1 | 1 |
| Comparative example 3b-8 | b-13 | 3DY-4 | 3 Y-5 | 2500 | 2 | 1 |
| Comparative example 3b-9 | b-14 | 3DY-5 | 3 Y-6 | 2300 | 2 | 1 |
| Comparative example 3b-10 | b-15 | 3DY-6 | 3 Y-7 | 1900 | 1 | 1 |
| Comparative example 3b-11 | b-16 | 3DV-4 | 3 V-5 | 500 | 2 | 1 |
| Comparative example 3b-12 | b-17 | 3DV-5 | 3 V-6 | 500 | 1 | 1 |
| Comparative example 3b-13 | b-18 | 3DV-6 | 3 V-7 | 250 | 1 | 1 |

In Table 41, in context of a hue, Examples 3b-17 to 3b-19 and Comparative Examples 3b-5 to 3b-7 are compared, Examples 3b-20 to 3b-22 and Comparative Examples 3b-8 to 3b-10 are compared, and Examples 3b-23 to 3b-25 and Comparative Examples 3b-11 to 3b-13 are compared.

From results of Table 41, it is seen that in the color filter of Examples manufactured using the colored curing composition containing the processed pigment of the invention, a contrast is higher, solubility in an alkali developer is better, and a voltage retainability rate is higher as compared with Comparative Examples.

Examples 3b-26 to 3b-31, and Comparative Examples 3b-14 to 3b-16

Preparation of Colored Photosensitive Composition

Using pigment-dispersed compositions described in Table 40 and Table 41 obtained as described above, colored photosensitive compositions c-1 to c-9 of the following composition (C2) were manufactured.

| [Composition (C2)] | |
|---|---|
| Pigment-dispersed composition A (described in the following Table 42) | 2000 parts |
| Pigment-dispersed composition B (described in the following Table 42) | 1000 parts |
| Dipentaerythritol hexaacrylate (photopolymerizable compound) | 100 parts |
| 4-[o-bromo-p-N,N-di(ethoxycarbonyl)aminophenyl]-2,6-di(trichloromethyl)-s-triazine (photopolymerization initiator) | 30 parts |

| -continued | |
|---|---|
| [Composition (C2)] | |
| Propylene glycol monomethyl ether acetate solution (solid matter 30%) of benzyl methacrylate/methacrylic acid (=75/25 [mass ratio]) copolymer (weight average molecular weight: 9,000) (alkali-soluble resin) | 280 parts |
| 1-Methoxy-2-propyl acetate (solvent) | 390 parts |

<Manufacturing of Color Filter Using Colored Photosensitive Composition>

The resulting colored photosensitive composition (colored resist solution) was coated on a 100 mm×100 mm glass substrate (trade name: 1737, manufactured by Corning) so that a x value as an index of a color concentration became 0.650 in Examples 3-26 to 3-27 and Comparative Example 3-14, a y value as an index of a color concentration became 0.60 in Examples 3-28 to 3-29 and Comparative Example 3-15 and, further, a y value as an index of a color concentration became 0.10 in Examples 3-30 to 3-31 and Comparative Example 3-16, and this was dried with an oven at 90° C. for 60 seconds (pre-baking). Thereafter, a whole surface of the coated film was exposed to light at 200 mJ/cm$^2$ (illuminance 20 mW/cm$^2$), and the coated film after light exposure was covered with a 1% aqueous solution of an alkali developer CDK-1 (manufactured by Fuji Electronic Materials Co., Ltd.), and allowed to stand for 60 seconds. After allowing to stand, pure water was sprayed in a shower-like manner to wash out the developer. Then, the coated film which had been subjected to light exposure and development as described above was heat-treated with an oven at 220° C. for 1 hour (post-baking), a colored pattern for a color filter was formed on the glass substrate to obtain a color filter.

<Evaluation of Color Filter>

Regarding the resulting color filter, according to the same manner as that of Example 3b-1, (1) a contrast, and (2) solubility in an alkali developer were assessed.

Further, by the following method, (5) crystal precipitability was also assessed.

These evaluation results are summarized in Table 42.

(5) Crystal Precipitability

The colored photosensitive composition obtained by the aforementioned method was coated on a glass substrate with an ITO electrode (trade name: 1737, manufactured by Corning) so that a film thickness became 2.0 μm, and this was dried with an oven at 90° C. for 60 seconds (pre-baking). Thereafter, this was subjected to light exposure at 100 mJ/cm$^2$ (illuminance 20 mW/cm$^2$) not through a mask, and developed at 25° C. using a 1% aqueous solution of an alkali developer (trade name: CDK-1, manufactured by Fuji Electronic Materials Co., Ltd.), and the coated film was heat-treated with an oven at 230° C. for 30 minutes (post-baking). Thereby, a glass substrate on which the cured film had been formed, was obtained.

Then, this glass substrate on which the cured film had been formed was placed in a constant temperature bath at 70° C. and a humidity of 80% for 72 hours, and the presence or the absence of crystal precipitation on the cured film was assessed visually.

An evaluation index is as follows. Herein, it is seen that an index figure is larger, transparency of a colored cured film is higher.

—Evaluation Index—
3: Crystal precipitation on the cured film is not seen.
2: Slight crystal precipitation on the cured film is seen
1: Crystal precipitation is seen on a whole cured film.

TABLE 42

| Colored photosensitive composition | Pigment-dispersed composition A: No. | B: No. | Evaluation results of color filter Contrast | Solubility | Crystal precipitability |
|---|---|---|---|---|---|
| Example 3b-26 c-1 | 3 DR-5 | 3DL-1 | 2800 | 5 | 4 |
| Example 3b-27 c-2 | 3 DR-2 | 3DL-2 | 2500 | 5 | 3 |
| Example 3b-28 c-3 | 3 DG-1 | 3DY-2 | 7600 | 5 | 4 |
| Example 3b-29 c-4 | 3 DG-2 | 3DY-1 | 7200 | 5 | 3 |
| Example 3b-30 c-5 | 3 DB-1 | 3DV-2 | 3200 | 5 | 4 |
| Example 3b-31 c-6 | 3 DB-2 | 3DV-3 | 3000 | 5 | 3 |
| Comparative example 3b-14 c-7 | 3 DR-4 | 3DL-4 | 1400 | 2 | 1 |
| Comparative example 3b-15 c-8 | 3 DG-13 | 3DY-4 | 3400 | 2 | 1 |
| Comparative example 3b-16 c-9 | 3 DB-3 | 3DV-5 | 1600 | 1 | 1 |

In Table 42, in context of a hue, Examples 3b-26 and 3b-27 and Comparative Example 3b-14 are compared, Examples 3b-28 and 3b-29 and Comparative Example 3b-15 are compared, and Examples 3b-30 and 3b-31 and Comparative Example 3b-16 are compared.

Form results of Table 42, it is seen that in the color filter of Examples manufactured using the colored curing composition containing the processed pigment of the invention, a contrast is higher, solubility in an alkali developer is better, and crystal precipitation due to post-baking is suppressed as compared with Comparative Examples.

Examples 4b-1 to 4b-3

Comparative Examples 4b-1 to 4b-3

1. Preparation of Resist Solution

Components of the following composition were mixed and dissolved to prepare a resist solution.

| (Composition of resist solution) | |
|---|---|
| Propylene glycol monomethyl ether acetate | 19.20 parts |
| Ethyl lactate | 36.67 parts |
| 40% Propylene glycol monomethyl ether acetate (PGMEA) solution of benzyl methacrylate-methacrylic acid/2-hydroxyethyl methacrylate (molar ratio = 60/22/18) copolymer | 30.51 parts |
| Dipentaerythritol hexaacrylate | 12.20 parts |
| Polymerization inhibitor (p-methoxyphenol) | 0.0061 parts |
| Fluorine-based surfactant (trade name: F-475, manufactured by Dainippon Ink and Chemicals, Incorporated) | 0.83 parts |
| TAZ-107 (manufactured by Midori Kagaku Co., Ltd.) | 0.586 parts |

2. Manufacturing of Silicon Wafer with Undercoating Layer

A 6 inch silicon wafer was heat-treated in an oven at 200° C. for 30 minutes. Then, the resist solution was coated on this silicon wafer so that a dry film thickness became 1.5 μm and, further, this was heated to dry in an oven at 220° C. for 1 hour to form an undercoating layer to obtain a silicon wafer substrate with an undercoating layer.

3. Preparation of Pigment-Dispersed Composition

Components of the following composition (6) were mixed, and stirred at a rotation number of 3,000 r.p.m. for 3 hours using a homogenizer to prepare a mixed solution containing the pigment.

| [Composition (6)] | |
|---|---|
| Processed pigment (described in the following Table 43) | amount described in Table 43 |

-continued

| [Composition (6)] | |
|---|---|
| Pigment dispersant (described in the following Table 43) (30% 1-methoxy-2-propyl acetate solution) | amount described in Table 43 |
| 1-Methoxy-2-propyl acetate | 750 parts |

Subsequently, the mixed solution obtained as described above was further dispersing-treated for 3 hours with a beads dispersing machine (trade name: Dispermat, manufactured by GETZMANN) using 0.8 mmϕ zirconia beads and, thereafter, further, dispersing-treated under a pressure of 2,000 kg/cm$^3$ at a flow rate of 500 g/min using a high pressure dispersing machine equipped with a pressure reducing mechanism (trade name: NANO-3000-10, manufactured by Japan B.E.E.). This dispersing treatment was repeated five times to obtain a pigment-dispersed composition.

4. Preparation of Colored Photosensitive Composition (Coating Solution)

The pigment-dispersed composition obtained as described above was used to perform stirring and mixing so that the following composition (D2) is obtained, to prepare colored photosensitive compositions d-1 to d-6.

| [Composition (D2)] | |
|---|---|
| Pigment-dispersed composition (described in the following Table 43) | 1000 parts |
| CGI-124 (manufactured by Ciba Specialty Chemicals) (Oxime-based photopolymerization initiator) | 20 parts |
| Dipentaerythritol hexaacrylate (photopolymerizable compound) | 20 parts |
| TO-756 (manufactured by TOAGOSEI CO., LTD) (photopolymerizable compound) | 35 parts |
| Propylene glycol monomethyl ether acetate solvent | 20 parts |

5. Manufacturing and Evaluation of Color Filter From Colored Photosensitive Composition (5.1) Formation of Colored Pattern, and Evaluation of Sensitivity The colored photosensitive composition prepared as described above was coated on the undercoating layer of the silicon wafer with the undercoating layer obtained in 2. to form a coated film. Then, the coated film was heat-treated for 120 seconds using a hot plate at 100° C. (pre-baking) so that a dried film thickness of this coated film became 0.7 μm.

Then, the film was exposed to light at various light exposure amounts in a range of 50 to 1200 mJ/cm$^2$ through an Island pattern mask having a 1.5 μm square pattern at a wavelength of 365 nm using an i ray stepper light exposing apparatus (trade name: FPA-3000i5+, manufactured by Canon).

Thereafter, the silicon wafer substrate on which the coated film after light exposure had been formed was placed on a horizontal rotating table of a spin/shower developing machine (trade name: DW-30-type, manufactured by Chemitronics Co., Ltd.), and paddle development was performed at 23° C. for 60 seconds using CD-2000 (manufactured by Fuji Electronic Materials Co., Ltd.) to form a colored pattern on the silicon wafer.

The silicon wafer on which the colored pattern had been formed was fixed on the horizontal rotating table in a vacuum chuck manner, this was rinse-treated by supplying pure water in a shower-like manner through an ejection nozzle from an upper part of a rotation center while the silicon wafer was rotated with a rotating device at a rotation number of 50 r.p.m. and, thereafter, spray-dried.

Herein, a minimum light exposure amount at which a film thickness after development of a region irradiated with light at a light exposing step was 95% or more relative to a film thickness 100% before light exposure. A smaller value of light exposure sensitivity indicates higher sensitivity was assessed as a light exposure sensitivity. Evaluation results are shown in Table 43.

(5.2) Evaluation of Color Variation

Color variation was assessed by the following method.

The colored photosensitive composition prepared as described above was coated on the undercoating layer of the silicon wafer equipped with the undercoating layer obtained in 2. to form a coated film. Then, the coated film was heat-treated for 120 seconds using a hot plate at 100° C. (pre-baking) so that a dried film thickness of this coated film became 0.7 μm.

The thus obtained colored film for a monochromic color filter was arranged between an observation lens of an optical microscope and a light source, light was irradiated towards the observation lens, and the transmitted light state was observed with an optical microscope provided with a digital camera at magnification of 1000. The digital camera provided in the optical microscope is mounted with CCD of 1280000 pixels, and a photograph of surface of the colored film in the transmitted light state was taken. The taken image was stored as data digitally converted in a bit map format of 8 bit (digital image). Photographing of a surface of the colored film was performed on arbitrarily selected 20 regions.

In addition, digitally converted data was stored by digitalizing each luminance of three primary colors of RGB of the taken image as a concentration distribution of 256 gradations of from 0 to 255.

Then, the stored digital image was divided into a lattice so that one lattice size corresponds to 2 μm square on the actual substrate, and a luminance in one section was averaged.

In the present Example, since an image at optical 1000 magnification was taken with a digital camera of 1280000 pixels, 2 μm on the actual substrate becomes 2 mm on the taken image, and an image size on the display was 452 mm×352 mm, therefore, a total section number in one region was 39776.

Regarding all sections of each region, a luminance of an arbitrary one section, and an average luminance of all adjacent sections thereto were measured. A section having a difference between the luminance thereof and the average luminance of adjacent sections of 5 or more was recognized to be a significant difference section, and an average total number of significant difference sections of all regions, and a ratio of an average total number of significant difference sections of all regions relative to all section number (39776) of each region were calculated.

An evaluation standard is as follows. Evaluation results are shown in Table 43.

—Evaluation Standard—

A: Deviation from average is less than 2%.

B: Deviation from average is 2% or more and less than 5%.

C: Deviation from average is 5% or more.

TABLE 43

|  | Colored photosensitive composition | Pigment-dispersed composition | | Evaluation results | |
| --- | --- | --- | --- | --- | --- |
|  |  | Processed pigment | Pigment dispersant | Sensitivity | Color variation |
| Example 4b-1 | d-1 | 3 R-3 100 parts | None | 900 | A |
| Comparative example 4b-1 | d-2 | 3 R-16 82.6 parts | C-3 12.4 parts | 1000 | B |
| Example 4b-2 | d-3 | 3 G-1 100 parts | None | 700 | A |
| Comparative example 4b-2 | d-4 | 3 G-11 82.6 parts | C-1 12.4 parts | 850 | B |
| Example 4b-3 | d-5 | 3 B-1 100 parts | None | 750 | A |
| Comparative example 4b-3 | d-6 | 3 B-11 82.6 parts | C-7 12.4 parts | 850 | B |

In Table 43, in context of a hue, Example 4b-1 and Comparative Example 4b-1 are compared, Example 4b-2 and Comparative Example 4b-2 are compared, and Example 4b-3 and Comparative Example 4b-3 are compared.

From results of Table 43, it is seen that in the colored curing composition containing the processed pigment of the invention, sensitivity is high, and a color variation is not generated in the colored film obtained from the colored curing composition.

Details of pigment dispersants 3D-1 to 3D-4, and pigment dispersants C-1, C-3, C-5, and C-7 used in the present Example will be explained below.

3D-1: "Solsperse 24000" manufactured by The Lubrizol Corporation 3D-2: A polymer of St/MM-1/MAA=30/55/15 mass % having a weight average molecular weight of 2.1×10000 and an acid value of 97 mgKOH/g 3D-3: A polymer of St/MAA=75/15 mass % having a weight average molecular weight of 2.0×10000, and acid value of 100 mgKOH/g 3D-4: A polymer of M-1/MM-1/MAA=30/55/15 mass % having a weight average molecular weight of 1.8×10000 and an acid value of 97 mgK.OH/g Herein, MAA indicates methacrylic acid, and St indicates styrene.

In addition, C-1, C-3, C-5, and C-7 used as the pigment dispersants are specific polymer compounds C-1, C-3, C-5, and C-7 synthesized in the Synthesis Example C-1, C-3, C-5, and C-7 described above, respectively.

According to the invention, the processed pigment in which formation of a secondary aggregate is suppressed even in a miniaturized pigment, dispersibility is excellent by dispersion in the primary particle state, and further, dispersion stability is excellent by stable maintenance of a dispersed primary particle may be provided.

In addition, according to the invention, the pigment-dispersed composition excellent in the dispersibility and dispersion stability of the pigment using the processed pigment and, further, the colored photosensitive composition using the pigment-dispersed composition may be provided.

Further, according to the invention, a color filter using the colored photosensitive composition and having a high contrast, a small color concentration variation, and better color property, and a liquid crystal display element and a solid pickup element provided with a color filter may be provided.

Namely, the invention is capable of providing the following items <1> to <15>.

<1>. A processed pigment in which a pigment is covered with at least one of a specific polymer compound selected from the following (SP-1) to (SP-3);

(SP-1) A polymer compound having a heterocycle on a side chain, (SP-2) A graft-type polymer compound having a weight average molecular weight of from 1,000 to 100000, (SP-3) A polymer compound represented by the following formula (3-1),

Formula (3-1)

wherein in the formula (3-1), $R^C$ represents a (m+n)-valent organic linkage group; $R^D$ represents a single bond or a divalent organic linkage group; $A^1$ represents a monovalent organic group containing at least one of a site selected from an organic dye structure, a heterocyclic structure, an acidic group, a group having a basic nitrogen atom, an urea group, an urethane group, a group having a coordinating oxygen atom, a hydrocarbon group having 4 or more carbon atoms, an alkoxysilyl group, an epoxy group, an isocyanate group, a hydroxy group, and an ionic functional group; n $A^1$s and $R^D$s may be each independently the same or different; m represents 1 to 8; n represents 2 to 9; m+n satisfies 3 to 10; $P^1$ represents a polymer skeleton; and m $P^1$s may be the same or different.

<2>. The processed pigment of item <1> in which the at least one specific polymer compound is the polymer compound of (SP-1).

<3>. The processed pigment of item <1> in which the at least one specific polymer compound is the polymer compound of (SP-2).

<4>. The processed pigment of item <1> in which the at least one specific polymer compound is the polymer compound of (SP-3).

<5>. The processed pigment of any one of items <1> to <4> in which an average primary particle diameter is from 5 to 25 nm.

<6>. The processed pigment of any one of items <1> to <5> in which the specific polymer compound further has a carboxyl group in a range of from 50 to 200 mgKOH/g.

<7>. The processed pigment of any one of items <1> to <6> in which a release amount of the specific polymer compound when the processed pigment is washed with 1-methoxy-2-prepanol is 30% by mass or less.

<8>. The processed pigment of any one of items <1> to <7> in which the processed pigment is produced by adding the specific polymer compound when miniaturizing the pigment.

<9>. A pigment-dispersed composition in which the processed pigment of any one of items <1> to <8> is dispersed in an organic solvent.

<10>. The pigment-dispersed composition of item <9>, wherein the composition further comprises a pigment dispersant.

<11>. The pigment-dispersed composition of item <9> or item <10> which is used in forming a colored region in a color filter.

<12>. A colored photosensitive composition comprising the pigment-dispersed composition of any one of items <9> to <11>, a photopolymerizable compound, and a photopolymerization initiator.

<13>. A color filter having a colored region formed by the colored photosensitive composition of item <12> on a substrate.

<14>. A liquid crystal display element comprising the color filter of item <13>.

<15>. A solid image pickup element comprising the color filter of item <13>.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated.

All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. A processed pigment in which a pigment is covered with at least one of a specific polymer compound selected from the following (SP-1) to (SP-3):
   (SP-1) a polymer compound having a heterocycle on a side chain,
   (SP-2) a graft polymer compound having a weight average molecular weight of from 1,000 to 100000, wherein the graft polymer compound is a copolymer in which monomers including a macromonomer and a monomer having an acidic group are copolymerized,
   (SP-3) a polymer compound represented by the following formula (3-3),

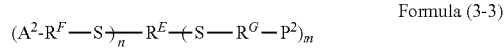

wherein in the formula (3-3), $A^2$ represents a monovalent organic group containing at least one site selected from an organic dye structure, a heterocyclic structure, an acidic group, a group having a basic nitrogen atom, a urea group, a urethane group, a group having a coordinating oxygen atom, a hydrocarbon group with 4 or more carbon atoms, an alkoxysilyl group, an epoxy group, an isocyanate group, and a hydroxy group, and n $A^2$s may be the same or different; $R^F$ and $R^G$ each represent independently a single bond or a divalent organic linkage group, n $R^F$s may be the same or different and m $R^G$s may be the same or different; $R^E$ represents a (m+n)-valent organic linkage group; m represents 1 to 8; n represents 2 to 9; m+n satisfies 3 to 10; and $P^2$ represents a polymer skeleton and m $P^2$s may be the same or different, wherein
(i) the processed pigment is produced via a salt milling step of mechanically kneading a mixture containing a pigment, a water-soluble inorganic salt, a small amount of a water-soluble organic solvent which does not substantially dissolve the water-soluble inorganic salt, and the specific polymer compound,
(ii) the polymer compound of (SP-1) includes a polymerization unit derived from a monomer represented by formula (1), maleimide or a maleimide derivative:

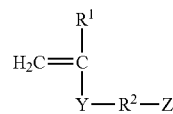

Formula (1)

wherein in the formula (1), $R^1$ represents a hydrogen atom, or a substituted or unsubstituted alkyl group; $R^2$ represents a single bond, or a divalent linkage group; Y represents —CO—, —C(=O)O—, —CONH—, —OC(=O)—, or a phenylene group; and Z represents a group having a nitrogen-containing heterocycle structure,
(iii) a main chain of the graft polymer compound of (SP-2) is polystyrene, polyethylene oxide, polypropylene oxide, poly(meth)acrylic acid ester, polycaprolactone, or polyester.

2. The processed pigment of claim 1 in which the at least one specific polymer compound is the polymer compound of (SP-1).

3. The processed pigment of claim 1 in which the at least one specific polymer compound is the polymer compound of (SP-2).

4. The processed pigment of claim 1 in which the at least one specific polymer compound is the polymer compound of (SP-3).

5. The processed pigment of claim 1 in which an average primary particle diameter is from 5 to 25 nm.

6. The processed pigment of claim 1 in which the specific polymer compound further has a carboxyl group in a range of from 50 to 200 mgKOH/g.

7. The processed pigment of claim 1 in which a release amount of the specific polymer compound when the processed pigment is washed with 1-methoxy-2-propanol is 30% by mass or less.

8. A pigment-dispersed composition in which the processed pigment of claim 1 is dispersed in an organic solvent.

9. The pigment-dispersed composition of claim 8, wherein the composition further comprises a pigment dispersant.

10. The pigment-dispersed composition of claim 8 which is used in forming a colored region in a color filter.

11. A colored photosensitive composition comprising the pigment-dispersed composition of claim 8, a photopolymerizable compound, and a photopolymerization initiator.

12. A color filter having a colored region formed by the colored photosensitive composition of claim 11 on a substrate.

13. A liquid crystal display element comprising the color filter of claim 12.

14. A solid image pickup element comprising the color filter of claim 12.

15. The processed pigment of claim 1, wherein the macromonomer is a compound represented by formula (5):

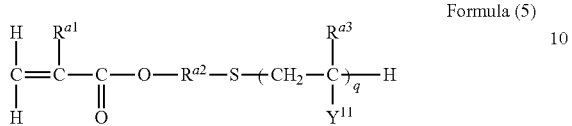

Formula (5)

wherein $R^{a1}$ and $R^{a3}$ each represent independently a hydrogen atom or a methyl group;

$R^{a2}$ represents a linkage group containing an alkylene group with 1 to 12 carbon atoms;

$Y^{11}$ represents a phenyl group optionally having a substituent, —COOR$^{a4}$, a cyano group, or —CONR$^{a5}$R$^{a6}$, wherein $R^{a4}$ represents an alkyl with 1 to 12 carbon atoms, a phenyl group or an aryl alkyl group with 7 to 10 carbon atoms, $R^{a5}$ and $R^{a6}$ represent a hydrogen atom, or an alkyl group with 1 to 6 carbon atoms; and q represents an integer of 10 to 200.

* * * * *